(12) United States Patent
Daniels

(10) Patent No.: US 7,799,369 B2
(45) Date of Patent: *Sep. 21, 2010

(54) ORGANIC AND INORGANIC LIGHT ACTIVE DEVICES AND METHODS FOR MAKING THE SAME

(76) Inventor: John J. Daniels, 511 Foot Hills Rd., Higganum, CT (US) 06441

( * ) Notice: Subject to any disclaimer, the term of this patent is extended or adjusted under 35 U.S.C. 154(b) by 1044 days.

This patent is subject to a terminal disclaimer.

(21) Appl. No.: 11/453,627

(22) Filed: Jun. 14, 2006

(65) Prior Publication Data

US 2007/0014916 A1 Jan. 18, 2007

Related U.S. Application Data

(62) Division of application No. 10/716,794, filed on Nov. 19, 2003, now Pat. No. 7,378,124.

(51) Int. Cl.
B05D 5/06 (2006.01)
B05D 1/06 (2006.01)
H05C 1/00 (2006.01)
C08F 2/46 (2006.01)

(52) U.S. Cl. ............... 427/66; 427/71; 427/256; 427/466; 427/472; 427/474; 427/510

(58) Field of Classification Search .............. 427/66, 427/256, 286, 510, 466, 472, 474
See application file for complete search history.

(56) References Cited

U.S. PATENT DOCUMENTS 5,247,190 A 9/1993 Friend et al.
5,858,561 A 1/1999 Epstein et al.
5,991,456 A 11/1999 Rahman et al.
6,117,567 A 9/2000 Andersson et al.

(Continued)

FOREIGN PATENT DOCUMENTS

GB 2 344 691 * 6/2000

(Continued)

OTHER PUBLICATIONS

E. Land, An Alternative Technique for the Computation of the Designator in the Retinex Theory of Color Vision, Proceedings of the National Academy of Science,vol. 83,3078-3080.

(Continued)

Primary Examiner—Timothy H Meeks
Assistant Examiner—James Lin
(74) Attorney, Agent, or Firm—Michaud-Kinney Group LLP

(57) ABSTRACT

A light active device includes a semiconductor particulate dispersed within a carrier material. A first contact layer is provided so on application of an electric field charge carriers having a polarity are injected into the semiconductor particulate through the carrier material. A second contact layer is provided so on application of the electric field to the second contact layer charge carriers having an opposite polarity are injected into the semiconductor particulate through the carrier material. The semiconductor particulate comprises at least one of an organic and an inorganic semiconductor. The semiconductor particulate may comprise an organic light active particulate. When constructed as a light emitting device, an electric field applied to the semiconductor particulate through the carrier causes charge carriers of opposite polarity to be injected into the semiconductor particulate. The charge carriers combine to form carrier pairs which decay and give off light.

4 Claims, 60 Drawing Sheets

U.S. PATENT DOCUMENTS

| | | |
|---|---|---|
| 6,433,355 B1 | 8/2002 | Riess et al. |
| 6,445,126 B1 | 9/2002 | Arai et al. |
| 2002/0001053 A1* | 1/2002 | Nakao et al. .................. 349/89 |
| 2002/0106529 A1* | 8/2002 | Okunaka et al. ............ 428/690 |
| 2002/0106531 A1* | 8/2002 | Naito ......................... 428/690 |
| 2003/0032361 A1* | 2/2003 | Murasko et al. ............... 445/24 |

FOREIGN PATENT DOCUMENTS

| | | | |
|---|---|---|---|
| WO | WO 02/42832 | * | 5/2002 |

OTHER PUBLICATIONS

E. Land, Color Vision and The Natural Image, Proceedings of the National Academy of Science, vol. 45, pp. 115-129, 1959.

Soppimath et al., Biodegradable Polymeric Nanoparticles as Drug Delivery Devices, K. S., Journal of Controlled Release, 70(2001) 1-20.

G. Collins, Liquid-Crystal Holograms Form Photonic Crystals, Scientific American, Jul. 2003.

* cited by examiner

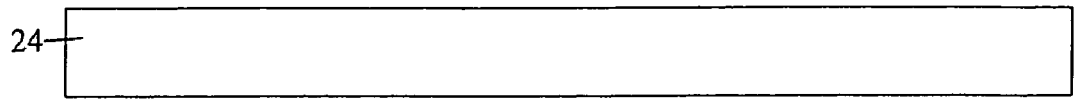
Figure 22
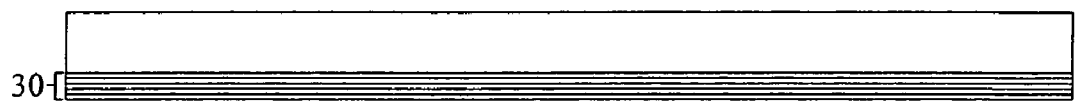
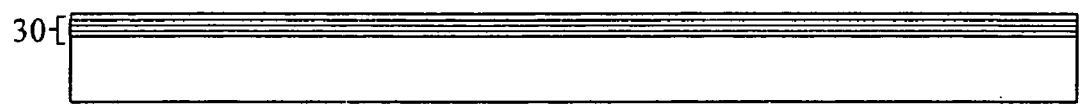
Figure 23
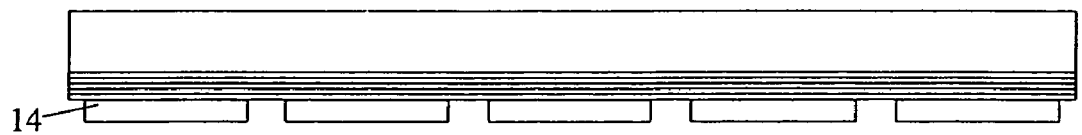
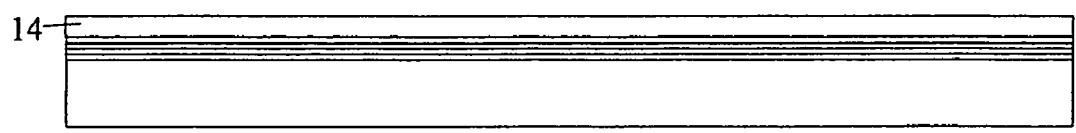
Figure 24

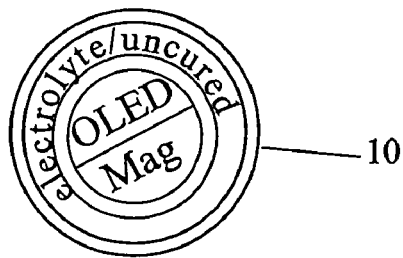
Figure 28
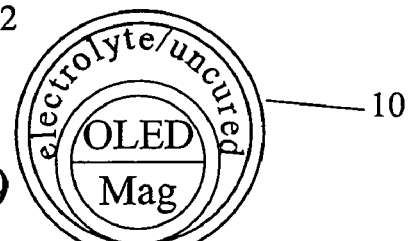
Figure 29
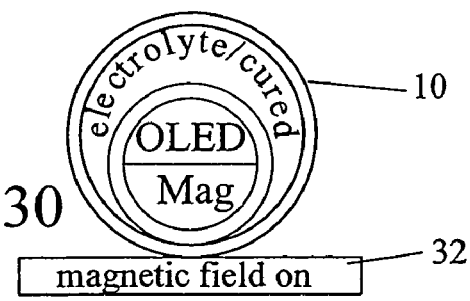
Figure 30
Figure 31
Figure 32
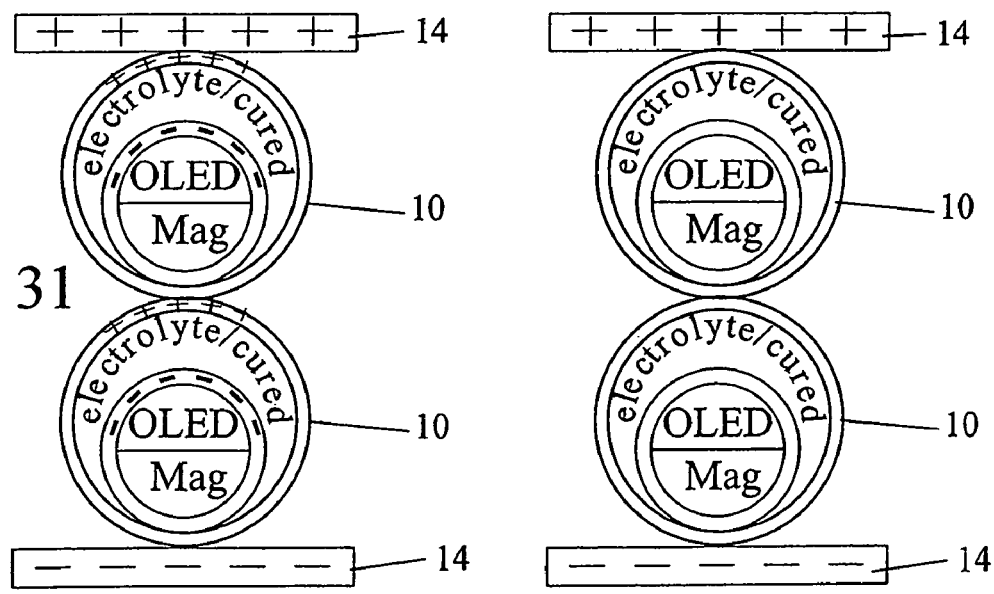

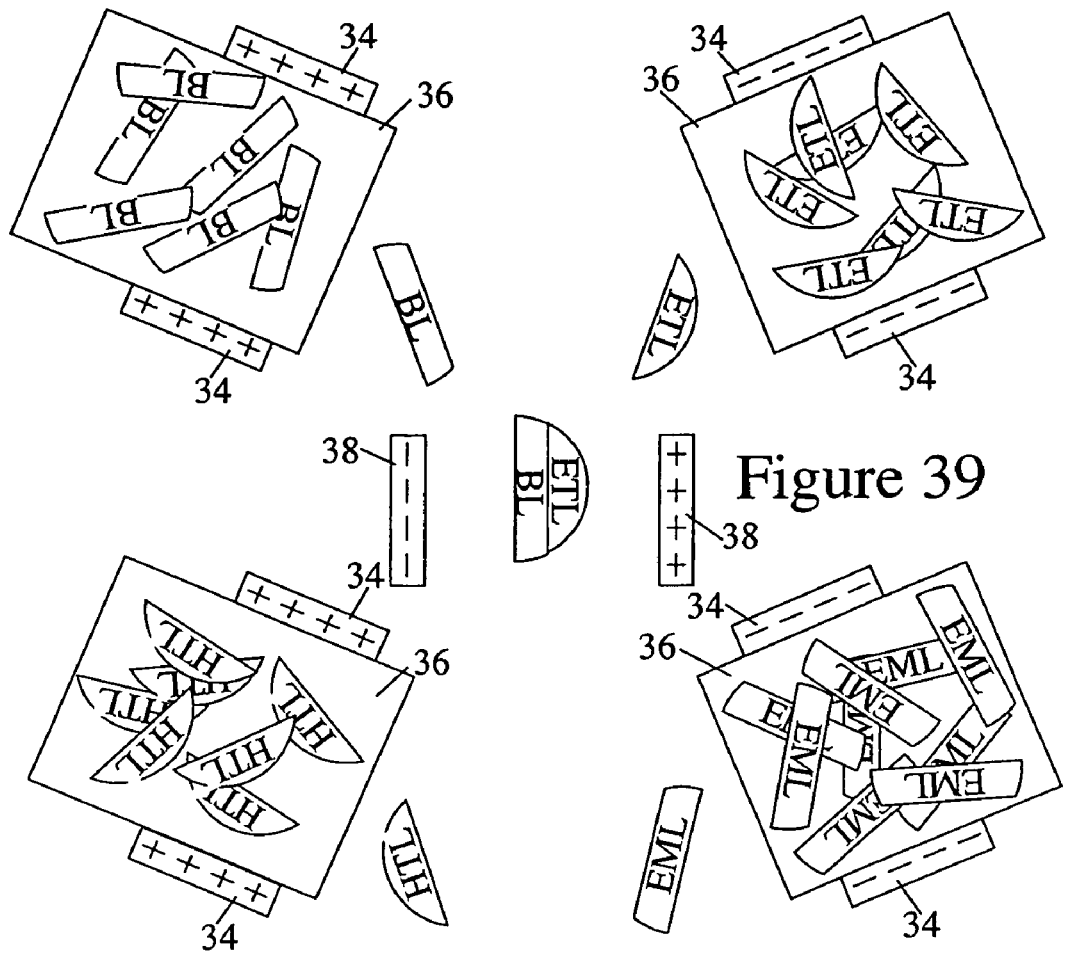
Figure 39
Figure 40
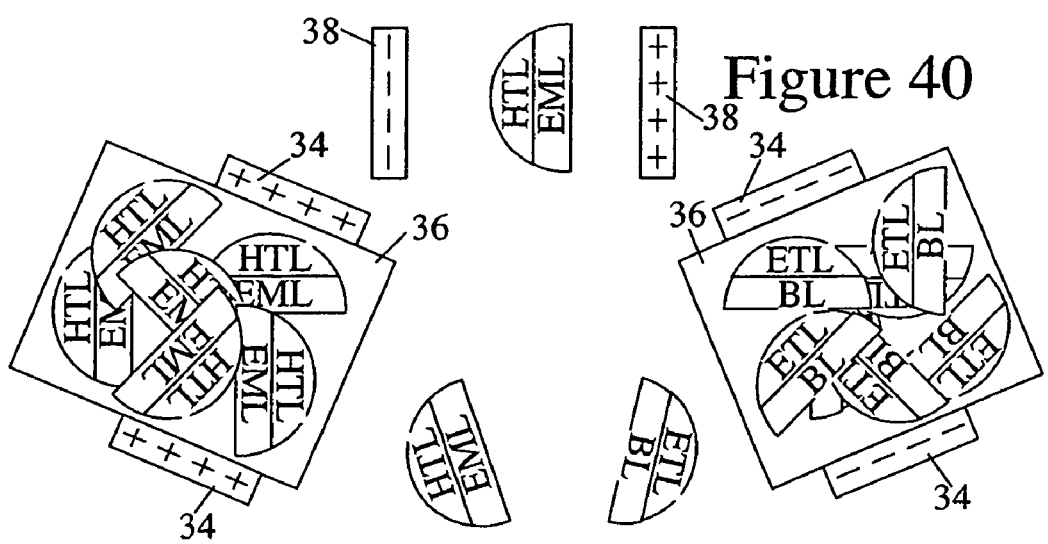
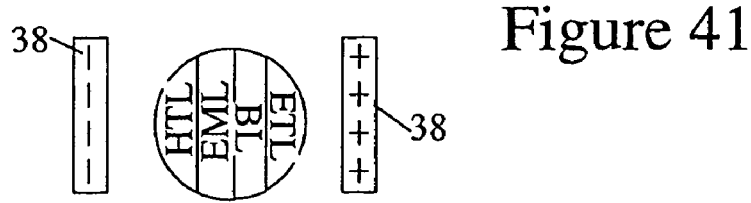
Figure 41

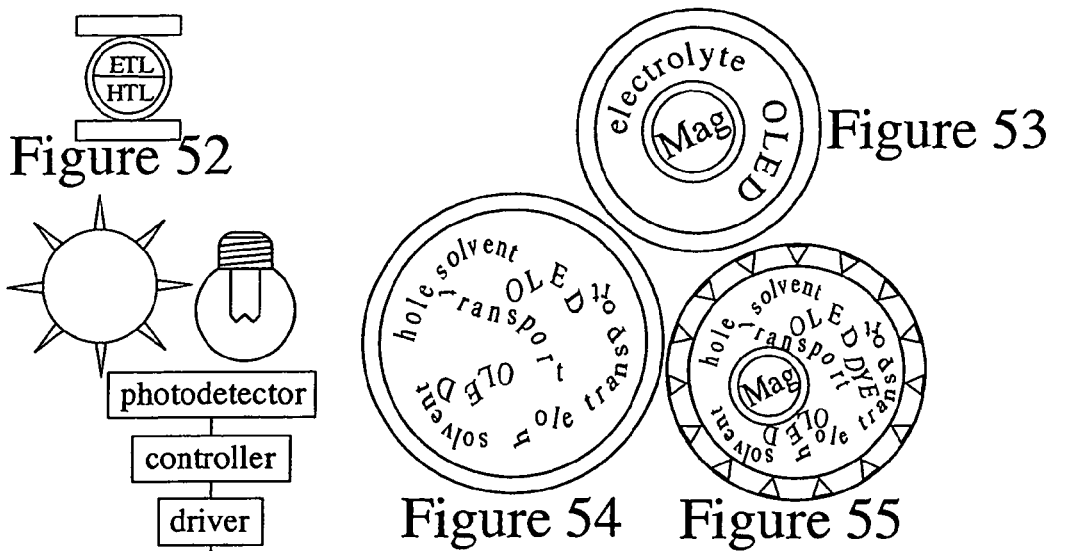
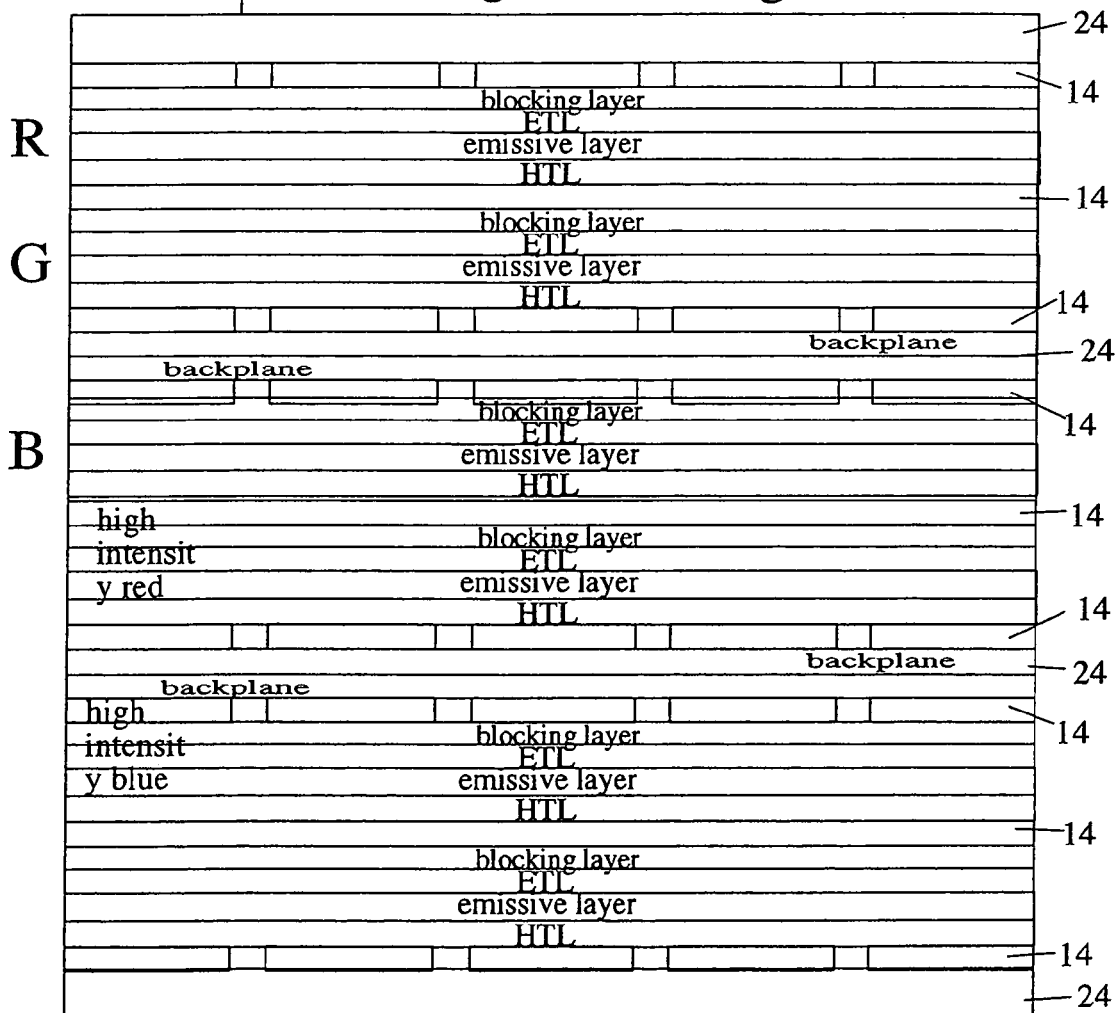

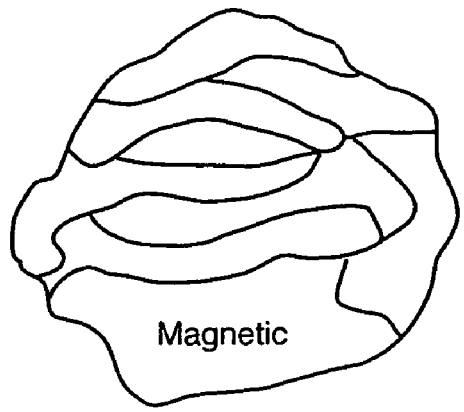
Figure 76
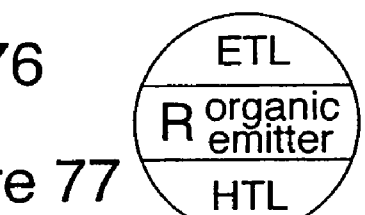
Figure 77
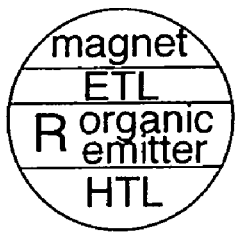 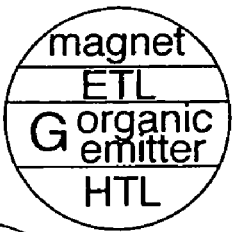
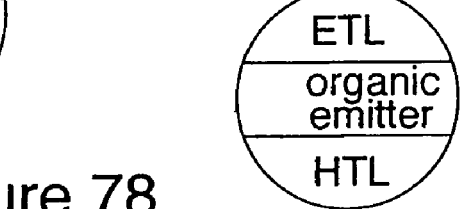
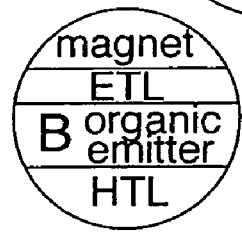
Figure 78
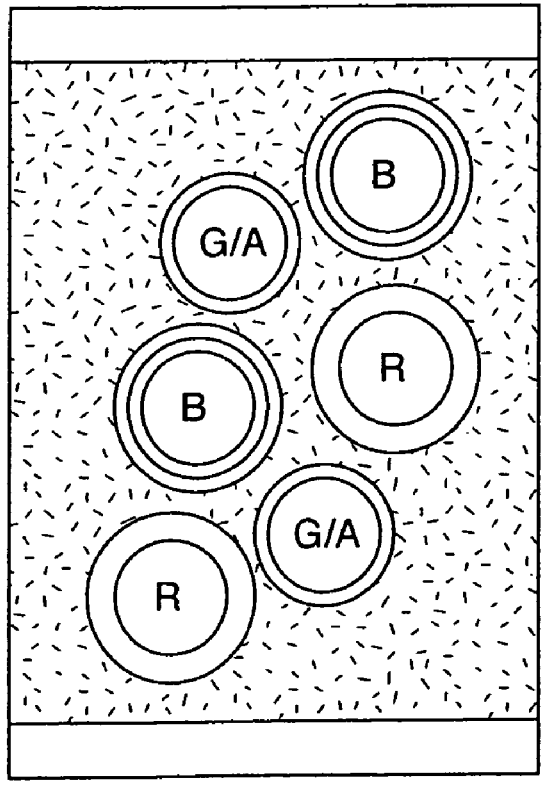
Figure 79

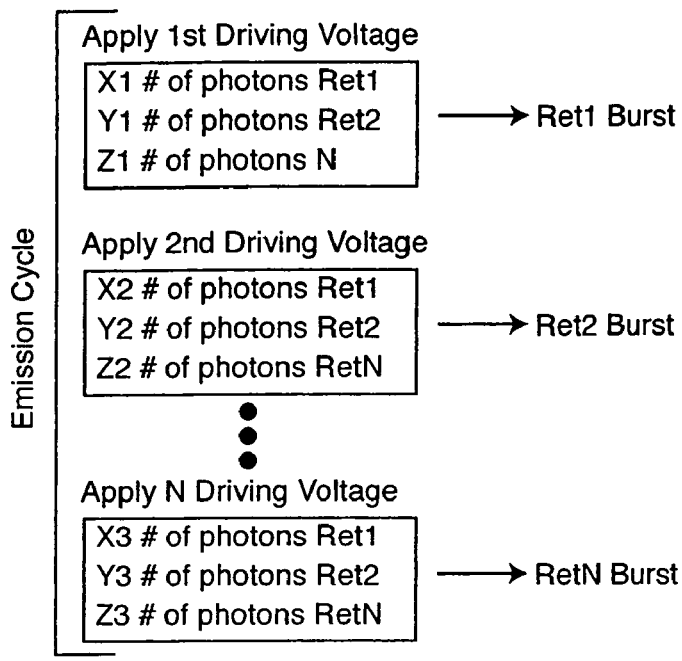
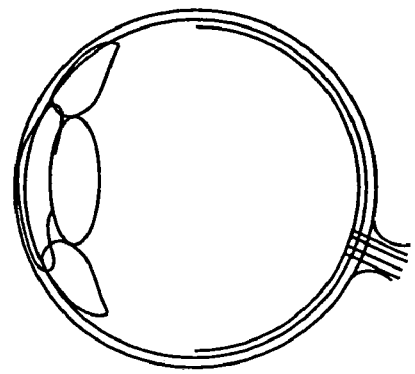
Figure 84
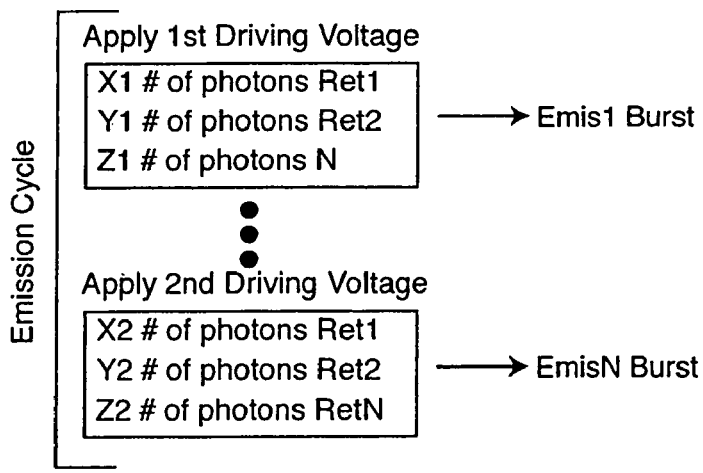
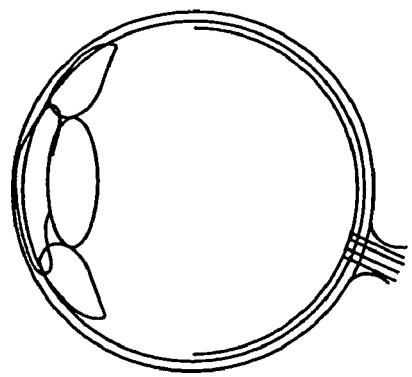
Figure 85

| | |
|---|---|
| Form a first mixture of a first organic light active material component and a first carrier fluid | Step One |
| Form a second mixture of a second organic light active material component and a second carrier | Step Two |
| Generate a first charged mist of the first mixture in an atmosphere | Step Three |
| Generate a second oppositely mist of the first mixture in an atmosphere | Step Four |
| Form a first mixture of a first organic light active material component and a first carrier fluid | Step Five |
| Allow the first particulate and the second particulate to commingle and attract together in the atmosphere to form a first layered organic light active material particulate | Step Six |

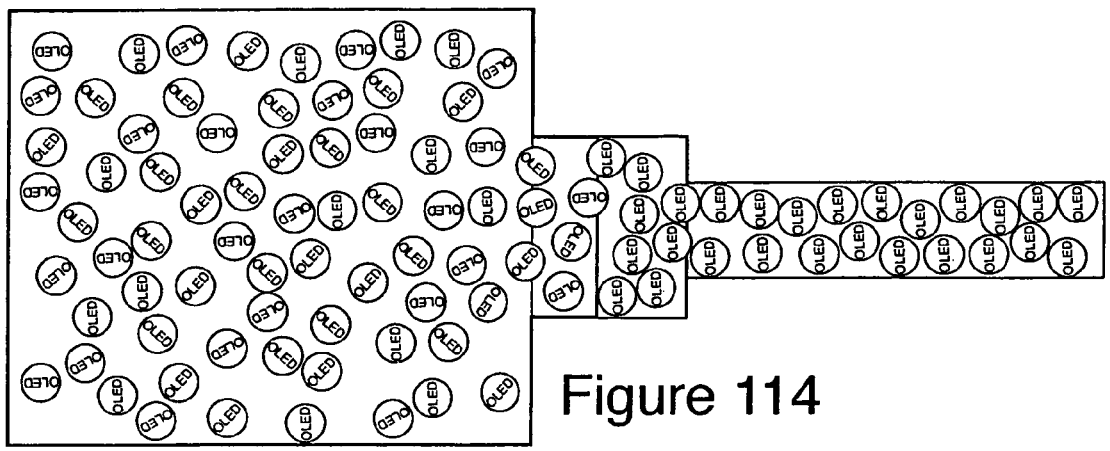
Figure 114
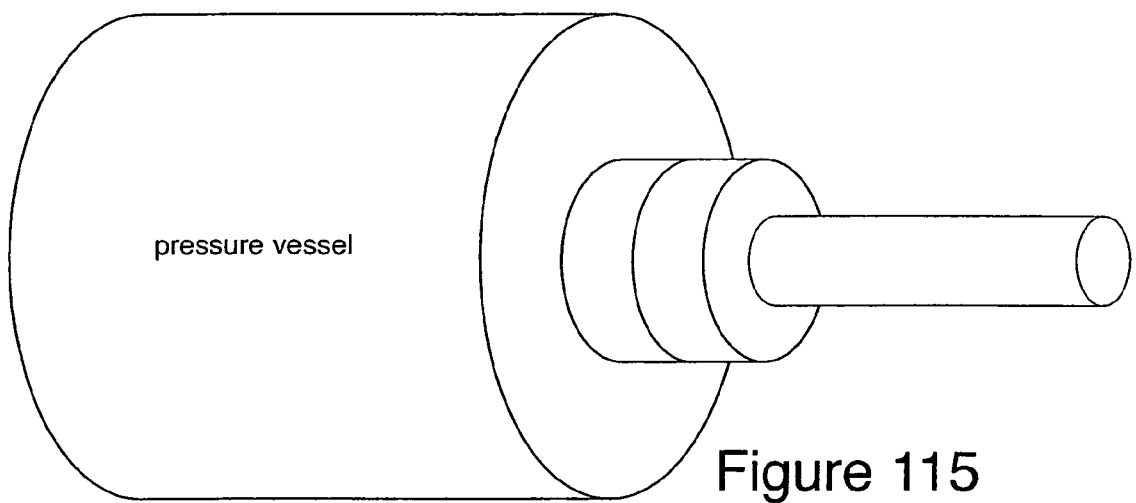
Figure 115
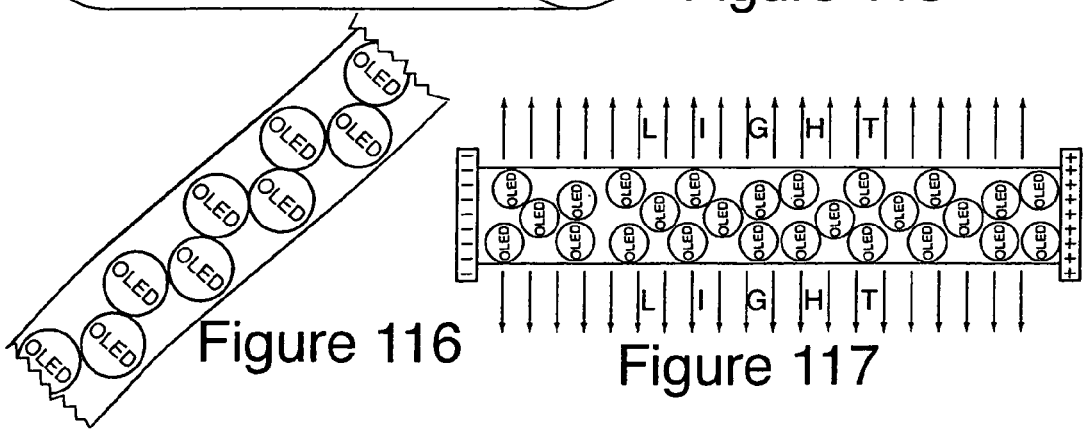
Figure 116
Figure 117

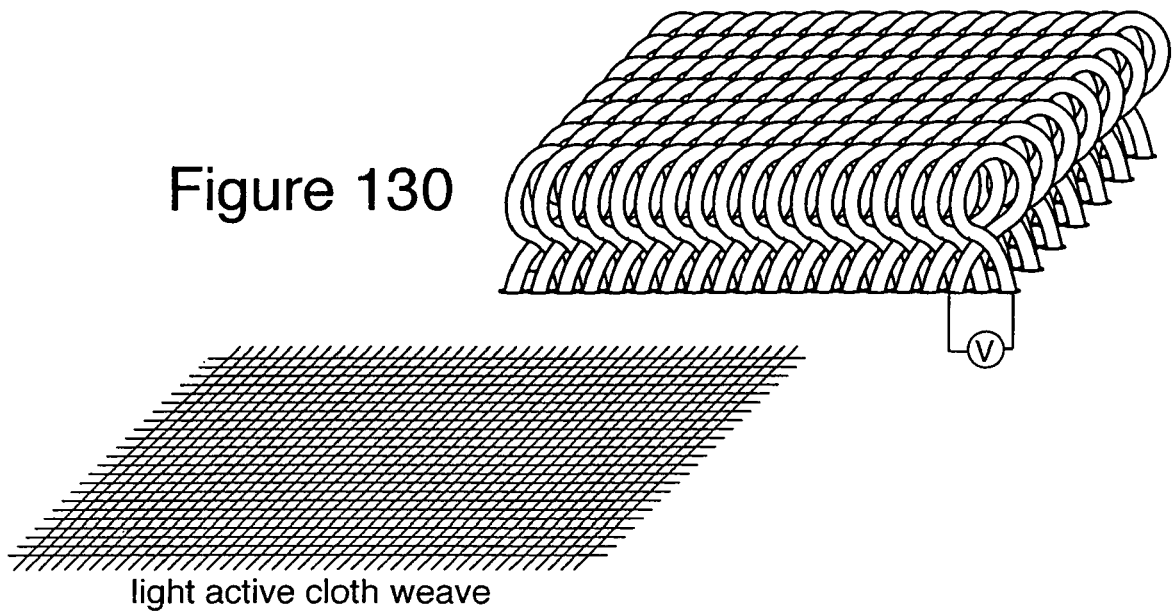
Figure 130
light active cloth weave
Figure 131
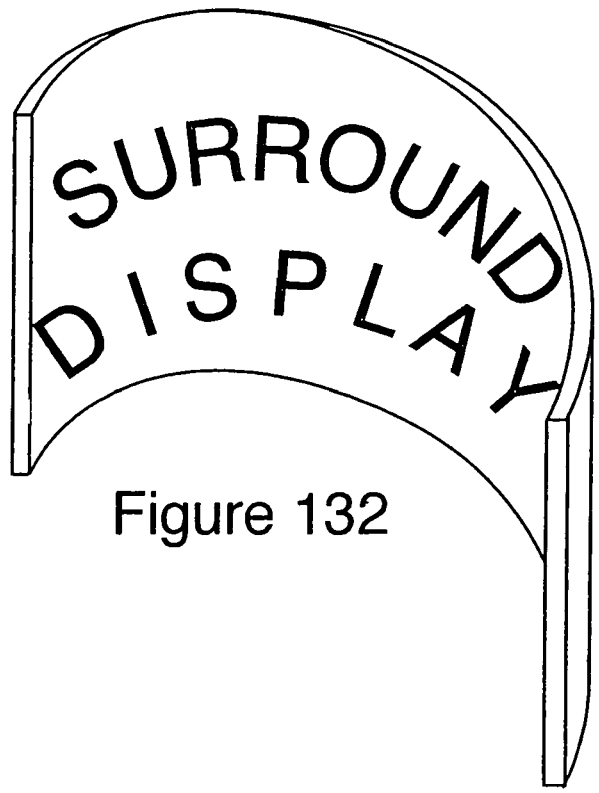
Figure 132

Step Three: Irradiate polymerization pattern

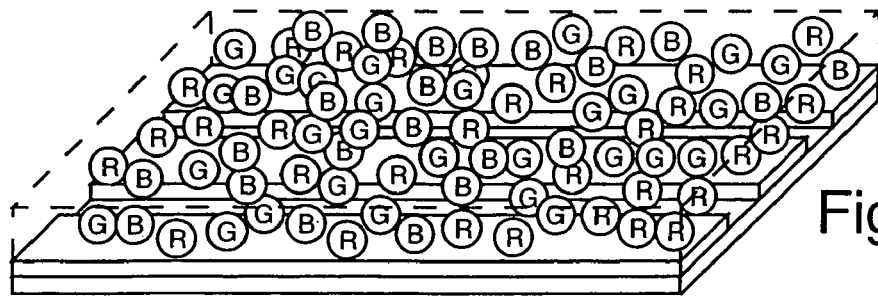
Figure 151
Figure 152
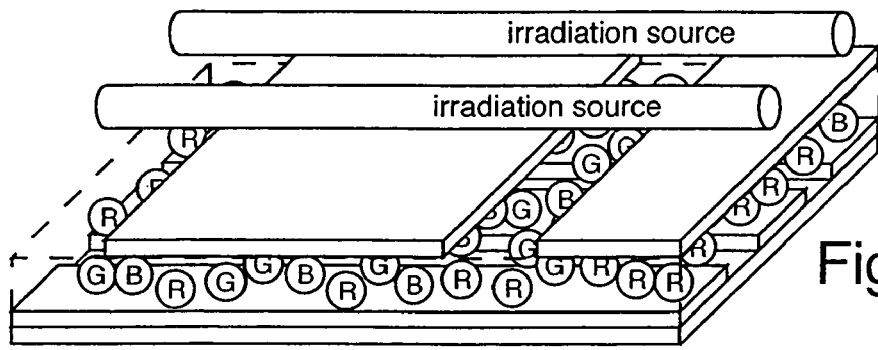
Figure 153
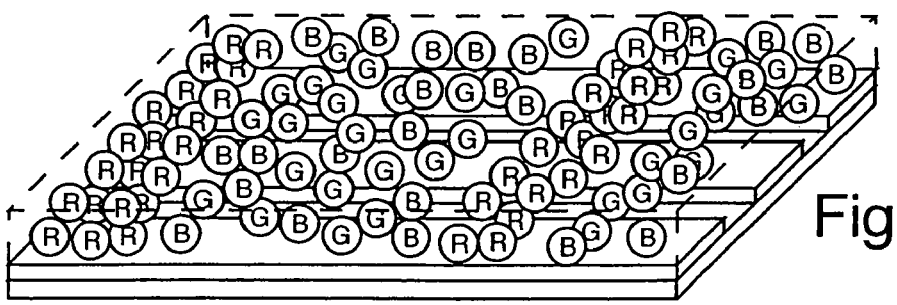
Figure 154
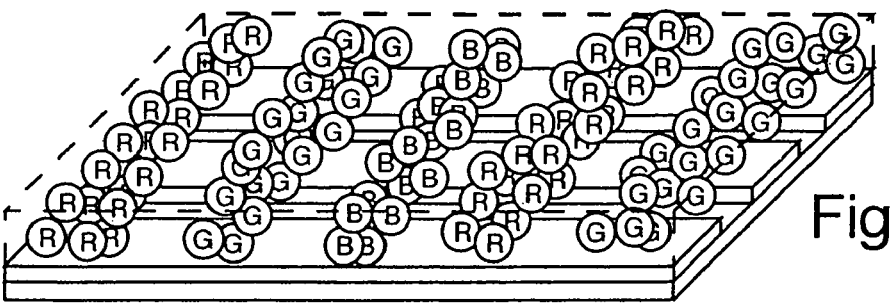
Figure 155

ⓔⓟ = emitter particle  Ⓒ = conductor monomer

ORGANIC AND INORGANIC LIGHT ACTIVE DEVICES AND METHODS FOR MAKING THE SAME

CROSS-REFERENCE TO RELATED APPLICATIONS

This is a divisional application of U.S. Ser. No. 10/716,794, filed Nov. 19, 2003, which is a utility application of provisional application Ser. No. 60/469,667, filed May 12, 2003, and is a continuation-in-part of U.S. Utility patent application Ser. No. 10/375,161, filed Feb. 26, 2003, which is a continuation-in-part of U.S. Utility patent application Ser. No. 10/321,161, filed Dec. 17, 2002 which is the U.S. Utility patent application of a Provisional Patent Application Ser. No. 60/427,333, filed Nov. 19, 2002. This application is related to co-pending patent application Ser. No. 10/234,302 filed Sep. 4, 2002 and U.S. patent application Ser. No. 10/234,301 filed Sep. 4, 2002, the subject matter of these patent documents is incorporated by reference herein in its entirety.

BACKGROUND OF THE INVENTION

The present invention pertains to organic and inorganic light active devices, and hybrids thereof, and methods of making the same. More particularly, the present invention pertains to devices and methods for fabricating light active devices that can be used for applications such as general lighting, display backlighting, video displays, Internet appliances, electronic books, digital newspapers and maps, stereoscopic vision aides, head mounted displays, advanced vehicle windshields, solar cells, cameras and photodetectors. A multi-color single layer light active device is disclosed. Also disclosed is a sequential burst driving scheme for a multi-color single layer display. Further disclosed are methods for making light active material particulate, as well as an organic light active fiber. Still further disclosed are methods for fabricating injection and other plastic molded organic light active devices. Further still there are disclosed compositions for light active material.

A polymer is made up of organic molecules bonded together. For a polymer to be electrically conductive it must act like a metal with the electrons in the bonds mobile and not bound to the atoms making up the organic molecules. A conductive polymer must have alternate single and double bonds, termed conjugated double bonds.

Polyacetylene is a simple conjugated polymer. It is made by the polymerization of acetylene. In the early 1970's, a researcher named Shirakawa was studying the polymerization of acetylene. When too much catalyst was added, the mixture seemed to have a metallic appearance. But unlike metals, the resulting polyacetylene film was not an electrical conductor. In the mid-1970's this material was reacted with iodine vapor. The result was an extreme increase in the conductivity of the polymer film, and ultimately resulted in a Nobel Prize in Chemistry for the researchers who discovered it.

Although polyacetylene can be made as conductive as some metals, its conductivity drops rapidly in contact with air. This has led to the development of more stable, conjugated polymers, for example, polypyrrol, polyaniline and polytiophene.

There is now intensive development working with conjugated polymers in their un-doped, semiconductive state. It was found that some conjugated polymers exhibit electroluminescence when a voltage is applied. Further, the absorption of light by the semiconductive polymer results in positive and negative charges that produce an electric current. Thus, conjugated polymers can be used to make solar cells and light detectors.

Organic light active material ("OLAM.TM.") makes use of the relatively recent discovery that polymers can be made to be conductors. Organic light emitting diodes ("OLED") convert electrical energy into light, behaving as a forward biased pn junction. OLAMs can be light emitters or light detectors, depending on the material composition and the device structure. For the purpose of this disclosure, the term OLAM and OLED can be interchanged. In its basic form, an OLED is comprised of a layer of hole transport material upon which is formed a layer of electron transport material. The interface between these layers forms a heterojunction. These layers are disposed between two electrodes, with the hole transport layer being adjacent to an anode electrode and the electron transport layer being adjacent to a cathode electrode. Upon application of a voltage to the electrodes, electrons and holes are injected from the cathode electrode and the anode electrode. The electron and hole carriers recombine at the heterojunction forming excitons and emitting light.

The basic structure of an OLED display is similar to a conventional LCD, where the reactive material (in the LCD case, a liquid crystal, in the OLED case, a conjugated polymer) is sandwiched between electrodes. When an electric field is applied by the electrodes, the OLED material is brought into an excited energy state, this energy state drops down by the emission of photons, packets of light. Thus, each pixel of the OLED display can be controlled to emit light as needed to create a displayed image.

OLEDs used as pixels in flat panel displays have significant advantages over backlit active-matrix LCD displays. OLED displays have a greater viewing angle, lighter weight, and quicker response. Since only the part of the display that is actually lit up consumes power, OLEDs use less power. Based on these advantages, OLEDs have been proposed for a wide range of display applications including computer monitors, televisions, magnified microdisplays, wearable, head-mounted computers, digital cameras, personal digital assistants, smart pagers, virtual reality games, and mobile phones as well as medical, automotive, and other industrial applications. The unstoppable march of technology often changes the way we see the world. Now, the way we see the world is about to be transformed by a new kind of display technology. The discovery of organic light emitting polymer technology (OLED) is creating a new class of flat panel displays that are set to change not only the nature of the display products that are all around us, but how they are manufactured as well. Articulated Technologies, has developed an advanced full color OLED display fabrication method. One of the biggest challenges to the OLED display industry is from contamination by water and oxygen. The materials involved in small molecule and polymer OLEDs are vulnerable to contamination by oxygen and water vapor, which can trigger early failure. This issue is exacerbated when non-glass substrates are used. Since OLEDs offer the promise of a bendable display, attempts have been made to use plastic substrates in place of glass. Elaborate barrier mechanisms have been proposed to encapsulate the OLED device and protect the organic stack from the ingress of water and oxygen. Also, desiccants have been used to reduce the contamination. Neither of these solutions is adequate, adding to the cost and complexity of forming an OLED device. In the end, the problems caused by the ingress of water and oxygen to the organic stack continue to pose serious technical issues. FIG. 111 illustrates a prior art OLED device. Very basically, an OLED is comprised of extremely thin layers of organic material forming an organic stack. These layers are sandwiched between an anode electrode and a cathode electrode. When voltage is applied to the electrodes, holes and electrons are injected into the organic stack. The holes and electrons combine to from unstable excitons. When the excitons decay, light is emitted.

The current state of every available OLED fabrication technology requires the formation of very thin films of organic light emitting material. These thin films are formed by a variety of known techniques such as vacuum deposition, screen printing, transfer printing and spin coating, or by the re-purposing of existing technology such as ink jet printing. In any case, the current state of the art has at its core the formation of very thin film layers of organic material. These thin films must be deposited uniformly and precisely. Such thin layers of organic material are susceptible to major problems, such as loss of film integrity, particularly when applied to a flexible substrate. FIG. 112 illustrates a prior art OLED device wherein a dust spec creates an electrical short between the electrodes. The extreme thinness of the layers of organic material between conductors also results in electrical shorts easily forming due to even very small specks of dust or other contaminants. Because of this limitation, costly cleanroom facilities must be built and maintained using the conventional OLED thin film fabrication techniques. Currently, inkjet printing has gained ground as a promising fabrication method for making OLED displays. However, there are some serious disadvantages to the adapting of inkjet printing to OLED display fabrication. Inkjet printing does not adequately overcome the problem of material degradation by oxygen and water vapor. FIG. 113 illustrates a prior art OLED device wherein the thin organic film stack is degraded by the ingress of oxygen and/or water. Elaborate and expensive materials and fabrication processes are still required to provide adequate encapsulation to protect and preserve the thin organic films. It is difficult to align display pixel-sized electrodes and inkjet printed OLED material with the accuracy needed to effect a high resolution display.

Besides attractive picture quality, an OLED display device consumes less power than liquid crystal display technologies because it emits its own light and does not need backlighting. OLED displays are thin, lightweight, and may be able to be manufactured on flexible materials such as plastic.

Unlike liquid-crystal displays, OLEDs emit light that can be viewed from any angle, similar to a television screen. As compared to LCDs, OLEDs are expected to be much less expensive to manufacture, use less power to operate, emit brighter and sharper images, and "switch" images faster, meaning that videos or animation run more smoothly.

Recently, an effort has been made to create equipment and provide services for manufacturing OLED screens. The potential OLED display market includes a wide range of electronic products such as mobile phones, personal digital assistants, digital cameras, camcorders, micro-displays, personal computers, Internet appliances and other consumer and military products.

There is still a need, for example, for a thin, lightweight, flexible, bright, wireless display. Such a device would be self-powered, robust, include a built-in user-input mechanism, and ideally functional as a multipurpose display device for Internet, entertainment, computer, and communication use. The discovery of the OLED phenomenon puts this goal within sight.

However, there are still some technical hurdles that remain to be solved before OLED displays will realize their commercial potential. OLED's light emitting materials do not have a long service life. Presently, optimum performance in commercially viable volume production is achievable only for small screens, around 3.5 inches square or less. Storage lifetimes of at least 5 years are typically required by most consumer and business products, and operating lifetimes of >20,000 hours are relevant for most applications.

Organic light emitting diode technology offers the prospect of flexible displays on plastic substrates and roll-to-roll manufacturing processes. One of the biggest challenges to the OLED display industry is from contamination by water and oxygen. The materials involved in small molecule and polymer OLEDs are vulnerable to contamination by oxygen and water vapor, which can trigger early failure. As an example of an OLED device, U.S. Pat. No. 5,247,190 issued to Friend et al., teaches an electroluminescent device comprising a semiconductor layer in the form of a thin dense polymer film comprising at least one conjugated polymer sandwiched between two contact layers that inject holes and electrons into the thin polymer film. The injected holes and electrons result in the emission of light from the thin polymer film.

There has been recent activity in developing thin, flexible displays that utilize pixels of electro-luminescent materials, such as OLEDs. Such displays do not require any back lighting since each pixel element generates its own light. Typically, the organic materials are deposited by solution processing such as spin-coating, by vacuum deposition or evaporation. As examples, U.S. Pat. No. 6,395,328, issued to May, teaches an organic light emitting color display wherein a multi-color device is formed by depositing and patterning thin layers of light emissive material. U.S. Pat. No. 5,965,979, issued to Friend, et al., teaches a method of making a light emitting device by laminating two self-supporting components, at least one of which has a thin layer of light emitting layer. U.S. Pat. No. 6,087,196, issued to Strum, et al., teaches a fabrication method for forming organic semiconductor devices using ink jet printing for forming thin layers of organic light emitting material. U.S. Pat. No. 6,416,885 B1, issued to Towns et al., teaches an electro-luminescent device wherein a conductive polymer thin layer is disposed between an organic light emitting thin layer and a charge-injecting thin layer that resists lateral spreading of charge carriers to improve the display characteristics. U.S. Pat. No. 6,420,200 B1, issued to Yamazaki et al., teaches a method of manufacturing an electro-optical device using a relief printing or screen printing method for printing thin layers of electro-optical material. U.S. Pat. No. 6,402,579 B1, issued to Pichler et al., teaches an organic light-emitting device in which a multi-layer structure is formed by DC magnetron sputtering to form multiple thin layers of organic light emitting material.

Electrophoretic displays are another type of display that has recently been the subject of research. U.S. Pat. No. 6,422,687 B1, issued to Jacobson, teaches an electronically addressable microencapsulated ink and display. In accordance with the teachings of this reference, microcapsules are formed with a reflective side and a light absorbing side. The microcapsules act as pixels that can be flipped between the two states, and then keep that state without any additional power. In accordance with the teaching of this reference, a reflective display is produced where the pixels reflect or absorb ambient light depending on the orientation of the microcapsules.

Other examples of OLED-type displays include U.S. Pat. No. 5,858,561, issued to Epstein et al. This reference teaches a light emitting bipolar device consisting of a thin layer of organic light emitting material sandwiched between two layers of insulating material. The device can be operated with AC voltage or DC voltage. U.S. Pat. No. 6,433,355 B1, issued to Riess et al., teaches an organic light emitting device wherein a thin organic film region is disposed between an anode electrode and a cathode electrode, at least one of the electrodes comprises a non-degenerate wide band-gap semiconductor to improve the operating characteristic of the light emitting device. U.S. Pat. No. 6,445,126 B1, issued to Arai et al., teaches an organic light emitting device wherein an organic thin layer is disposed between electrodes. An inorganic electrode or hole injecting thin film is provided to improve efficiency, extend effective life and lower the cost of the light emitting device.

It is known to form a thin OLED layer by various methods including vacuum deposition, evaporation or spin coating. Thin layers of hole transport material and then electron transport material are formed by these known methods over a grid of anode electrodes. The anode electrodes are formed on a glass plate. A grid of cathode electrodes is then placed adjacent to the electron transport material supported by a second glass plate. Thus, the basic OLED organic stack is sandwiched between electrodes and glass plate substrates. It is generally very difficult to form the electrodes with the precise alignment needed for forming a pixilated display. This task is made even more difficult in a multicolor display, where the OLED pixels emitting, for example, red, green and blue, are formed side-by-side to fabricate a full color display. Because the OLED material and electrodes can be made transparent, it is possible to stack the color OLED pixels on top of each other, allowing for a higher pixel packing density and thus the potential for a higher resolution display. However, the electrode alignment issue still poses a problem. Typically, the well-known use of shadow masks are employed to fabricate the pixel components. Aligning the shadow masks is difficult, and requires extreme precision.

Currently, inkjet printing has gained ground as a promising fabrication method for making OLED displays. The core of this technology is very mature, and can be found in millions of computer printers around the world. However, there are some serious disadvantages to the adapting of inkjet printing to OLED display fabrication. It is still difficult to lay down precise layers of material using the spray heads of inkjet printers. Inkjet printing does not adequately overcome the problem of material degradation by oxygen and water vapor. Elaborate and expensive materials and fabrication processes are needed to provide adequate encapsulation of the display elements to prevent early degradation of the OLED material due to water and oxygen ingress. As an attempt to solve this contamination problem, Vitex Systems, Sunnyvale, Calif., has developed a barrier material in which a monomer vapor is deposited on a polymer substrate, and then the monomer is polymerized. A thin layer of aluminum oxide a few hundred angstroms thick is deposited on the polymerized surface. This process is repeated a number of times to form an encapsulation barrier over an OLED display. This elaborate encapsulation barrier is an example of the effort taken to prevent water and oxygen from contaminating the easily degraded OLED films that form a conventional OLED display device. Even with this elaborate encapsulation process, the edges of the OLED display still need to be sealed.

It is difficult to align display pixel-sized electrodes and inkjet printed OLED material with the accuracy needed to effect a high resolution display. All of the known fabrication methods for manufacturing an OLED device require the formation and preservation of very thin layers of reactive organic material. These ultra thin layers are disposed between oppositely charged electrodes. Electrical shorts and the destruction of pixels result from the inclusion of even miniscule foreign particles when forming the organic thin film layers. To limit this serious drawback, the conventional fabrication processes requires the use of expensive clean room or vacuum manufacturing facilities. Even with a gh clean room or vacuum chamber, the typical OLED display device either has to use glass substrates or an elaborate encapsulation system to overcome the problems of water and oxygen ingress. Accordingly there is an urgent need for an improved fabrication method for forming OLED devices.

There is also a need for a multi-color OLED structure whereby two or more colors of light can be produced from a single pixel or OLED device. U.S. Pat. No. 6,117,567, issued to Andersson et al, teaches a light emitting polymer device for obtaining voltage controlled colors based on a thin polymer film incorporating more than one electroluminescent conjugated polymer. The polymer thin film is sandwiched between two electrodes. Upon application of different voltages to the electrodes, different colors of light are emitted from the conjugated polymers contained in the thin film. It is hoped that multiple color OLED films will somehow facilitate the formation of a full color emissive display screen. Typically, a full color display is obtained by forming pixels comprised of three separately controllable subpixels. Each subpixel is capable of controlling the emission of a wavelength of one of the three primary colors light, red, green and blue.

Edwin Land introduced a theory of color vision based on center/surround retinex (see, An Alternative Technique for the Computation of the Designator in the Retinex Theory of Color Vision," Proceedings of the National Academy of Science, Volume 83, pp. 3078-3080, 1986). Land disclosed his retinex theory in "Color Vision and The Natural Image," Proceedings of the National Academy of Science, Volume 45, pp. 115-129, 1959. These retinex concepts are models for human color perception. Others have shown that a digital image can be improved utilizing the phenomenon of retinex (see, U.S. Pat. No. 5,991,456 issued to Rahman et al, the disclosure of which is incorporated by reference herein). The inventors of the U.S. Pat. No. 5,991,456 used Land's retinex theory and devised a method of improving a digital image where the image is initially represented by digital data indexed to represent positions on a display. According to the inventors of the U.S. Pat. No. 5,991,456 patent, an improved digital image can then be displayed based on the adjusted intensity value for each i-th spectral band so-filtered for each position. For color images, a novel color restoration step is added to give the image true-to-life color that closely matches human observation.

Nanoparticles are used in unrelated applications, such as drug deliver devices. Others have shown that very small polymer-based particles can be made by a variety of methods. These drug delivery nanoparticles vary in size from 10 to 1000 nm. A drug can be dissolved, entrapped, encapsulated or attached to a nanoparticle matrix. Depending on the method of preparation, nanparticles, nanospheres or nanocapsules can be obtained. (see, Biodegradable Polymeric Nanoparticles as Drug Delivery Devices, K. S., Soppimath et al., Journal of Controlled Release, 70(2001) 1-20).

Recently, researchers have demonstrated a process for making a composite material comprised of polymer interspersed with liquid-crystal droplets. The optical response of this material can be controlled by applying a voltage, and has been used to create photonic crystals that modulate the transmission of light. (see, Liquid-Crystal Holograms Form Photonic Crystals, by Graham P. Collins, Scientific American, July, 2003). A mixture of monomer molecules and liquid-crystal molecules are disposed between two sheets of a substrate. The substrate can be, for example, glass plated with a thin layer of conducting material. The mixture is irradiated with two or more laser beams. The laser beams are aligned and polarized to generate a specific holographic interference pattern having alternating dark and light areas. At the bright regions in the pattern, the monomers undergo polymerization. As the polymerization reaction progresses, the monomer migrates from the dark regions to the bright regions, causing the liquid crystal to become concentrated in the dark regions. The end result is a solid polymer with droplets of liquid crystal embedded in a pattern corresponding to the dark regions of the holographic interference pattern.

The current state of the OLED fabrication technology requires the formation of very thin films of organic light emitting material. These thin films are formed by known techniques such as vacuum deposition, screen printing, transfer printing and spin coating, or by the re-purposing of existing technology such as ink jet printing. In any case, the current state of the art has at its core the formation of very thin film layers of organic material. These thin films must also be deposited very uniformly and precisely, which has proven extremely difficult to do. These thin layers of organic material are susceptible to major problems, such as shortened device lifetime due to ingress of water and oxygen, and delamination, particularly when applied to a flexible substrate. The extreme thinness of the layers of organic material between conductors also results in electrical shorts easily forming due to even very small specks of dust or other contaminants. Because of this limitation, costly cleanroom facilities must be built and maintained using the conventional OLED thin film fabrication techniques. Organic light emitting devices offer tremendous potential due to the inherent qualities of the organic materials, however, the current state of the art fabrication methods are limiting the delivery of this potential to the consumer.

SUMMARY OF THE INVENTION

It is an object of the present invention to overcome the drawbacks of the prior art. It is an object of the present invention to provide a method of fabricating a light active device by dispersing three dimensionally a semiconductor particulate within a carrier material. The resulting structure has individual point sources of light emission dispersed within a protective barrier material. The barrier material provides strength to the device and adhesion to the electrodes and/or other films and prevents contamination of the semiconductor particulate. The inventive fabrication method also allows multiple colors to be emitted from the inventive mixture between a single pair of electrodes forming a pixel or device. In an inventive display driving scheme, an array of such pixels is driven so that bursts of color emissions occur in rapid succession resulting in the perception by the human eye of a range of colors in the visible spectrum. Thus, in accordance with this aspect of the invention, a single emissive layer and pair of electrodes can be used to create a full color video display. The inventive Organic Light Active Material (OLAM.TM.) structure can also be used to detect a spectrum of colors when the device is constructed as a photodetector.

It is another object of the present invention to provide a light active fiber that has the advantages of the OLED phenomenon. The inventive light active fiber includes an elongated hardened conductive carrier material. A semiconductor particulate is dispersed within the conductive carrier material. A first contact area is provided so that on application of an electric field charge carriers of a first type are injected into the semiconductor particulate through the conductive carrier material. A second contact layer is provided so that on application of an electric field to the second contact layer charge carriers of a second type are injected into the semiconductor particulate through the conductive carrier material. The semiconductor particulate may comprise at least one of an organic and an inorganic semiconductor.

The conductive carrier material may comprise a binder material with one or more characteristic controlling additives. The characteristic controlling additives are a particulate and/or a fluid and may include a dessicant; a conductive phase, a semiconductive phase, an insulative phase, a mechanical strength enhancing phase, an adhesive enhancing phase, a hole injecting material, an electron injecting material, a low work metal, a blocking material, and an emission enhancing material.

The first and the second contact may comprise a first conductive member disposed longitudinally within the elongated hardened conductive carrier material. The other of the first and the second contact may comprises a second conductive member disposed adjacent to the first conductive member so that at least a portion of the semiconductor particulate is disposed between the first conductive and the second conductive member.

The first conductive member comprises a conductive material comprised of at least one of a metal and a conductive polymer disposed in the interior of the elongated hardened conductive carrier material; and the second conductive member comprises a conductive material comprised of at least one of a metal and a conductive polymer disposed as a coating on the exterior of the elongated hardened conductive carrier material.

In accordance with another aspect of the present invention, an injection moldable light active material is provided comprising: a semiconductor light active particulate dispersed within a hardenable carrier material. The semiconductor light active particulate may include at least one of an organic and an inorganic semiconductor. The organic light active particulate can include particles including at least one of hole transport material, organic emitter, and electron transport material. The organic light active particulate can include particles including a polymer blend. The polymer blend may include an organic emitter blended with at least one of a hole transport material, an electron transport material and a blocking material. Additional organic emitters can be included within the polymer blend. The organic light active particulate can comprise microcapsules including a polymer shell encapsulating an internal phase comprised of a polymer blend.

The carrier material can be a hardenable binder material with one or more characteristic controlling additives. The characteristic controlling additives may include at least one of a particulate and a fluid. The characteristic controlling additives may include a dessicant, a scavenger, a conductive phase, a semiconductive phase, an insulative phase, a mechanical strength enhancing phase, an adhesive enhancing phase, a hole injecting material, an electron injecting material, a low work metal, a blocking material, and an emission enhancing material. The particulate may include at least one of an organic emitter, an inorganic emitter, hole transport material, blocker material, electron transport material, and performance enhancing materials. The carrier may include at least one of an organic emitter; an inorganic emitter, hole transport material, blocker material, electron transport material, and performance enhancing materials (e.g., the characteristic controlling additives).

In accordance with the present invention, the injection moldable light active material can be provided wherein the semiconductive light active particulate is comprised of first emitting particles for emitting a number of photons of a first color in response to a first turn-on voltage applied to the electrodes and emitting a different number of photons of the first color in response to other turn-on voltages. The semiconductive light active particulate may further include second emitting particles. The second emitting particles emit a number of photons of a second color in response to a second turn-on voltage and a different number of photons of the second color in response to other turn-on voltages. By this composition and construction, a multi-colored light active material is obtained.

The particulate can be composed so as to have a first end having an electrical polarity and a second end having an opposite electrical polarity. The particulate is alignable within the conductive carrier so that charge carriers of a first type are more easily injected into the first end and charge carriers of a second type are more easily injected into the second end.

In accordance with another aspect of the present invention, a photon receptive light active device is provided. A first electrode and a second electrode are provided disposed adjacent defining a gap there between. A light active mixture is provided comprised of a carrier material and a photon receptive particulate for receiving a photon of light and converting the photon of light into electrical energy. The light active mixture being disposed within the gap between the first electrode and the second electrode so that when light energy is received by the photon receptive particulate, electrical energy is produced that can be derived from an electrical connection with the first electrode and the second electrode. With this composition and construction, a light-to-energy device is obtained from which a solar cell, photodetector or camera element can be made.

The photon receptive particulate may include at least one of an organic photon receiver; an inorganic photon receiver, hole transport material, blocker material, electron transport material, and performance enhancing materials. The carrier can include at least one of an organic photon receiver; an inorganic photon receiver, hole transport material, blocker material, electron transport material, and performance enhancing materials. Further, additional layers may be formed within the gap between the first electrode and the second electrode. These additional layers help to define the mechanical, electrical and optical characteristics of the inventive device. The additional layers may include at least one of an organic photon receiver; an inorganic photon receiver, hole transport material, blocker material, electron transport material, and performance enhancing materials (e.g., the characteristic controlling additives).

Applicants have discovered that the ultra thin film nature of a conventional organic light active device results in many disadvantages. These disadvantages include, but are not limited to, electrical shorts caused by the inclusion of small foreign particles, cross talk among pixels in a display array, delamination of the thin film, deterioration of the thin film by the ingress of oxygen and water, and other serious failings. In accordance with the present invention, the disadvantages caused by having an extremely small gap distance between electrodes is overcome by expanding this gap distance. Thus, in accordance with the present invention, an organic light active device includes a first electrode and a second electrode disposed adjacent to the first electrode. The first and second electrode define a gap there between. An organic emissive layer is disposed within said gap. To overcome the thin film issues, and to enhance the performance of the inventive device, a gap expanding composition is also disposed within said gap. This gap expanding composition is effective to increase the gap distance between the top and bottom electrode.

The gap expanding composition may include at least one of an insulator, a conductor and a semiconductor. The gap expanding composition can include at least one additional layer formed between the first electrode and the second electrode. The additional layers may include at least one of an organic photon receiver; an inorganic photon receiver, hole transport material, blocker material, electron transport material, radiation emitting material and performance enhancing materials. The gap expanding composition can include at least one of a dessicant; a scavenger, a conductive material, a semiconductive material, an insulative material, a mechanical strength enhancing material, an adhesive enhancing material, a hole injecting material, an electron injecting material, a low work metal, a blocking material, and an emission enhancing material.

The emissive layer can comprise an emissive particulate dispersed within a carrier.

The emissive particulate has a first end having an electrical polarity and a second end having an opposite electrical polarity. The particulate can be alignable within the conductive carrier so that charge carriers of a first type are more easily injected into the first end and charge carriers of a second type are more easily injected into the second end.

The emissive layer may be an organic thin film layer. The gap expanding composition can include a conductive, insulative and/or semiconductive material composition that reduces the emission efficiency of the emissive layer while increasing the light active device effectiveness by expanding the gap distance between the electrodes. With a careful selection of constituent components, this reduction in efficiency can be limited so that the benefits of expanding the gap distance between the electrodes can be obtained without too much cost in device efficiency.

In accordance with another aspect of the present invention, a light active device includes a semiconductor particulate dispersed within a carrier material. A first contact layer is provided so that on application of an electric field, charge carriers having a polarity are injected into the semiconductor particulate through the conductive carrier material. A second contact layer is provided so that on application of the electric field to the second contact layer, charge carriers having an opposite polarity are injected into the semiconductor particulate through the conductive carrier material. The semiconductor particulate comprises at least one of an organic and an inorganic semiconductor. The semiconductor particulate may comprise an organic light active particulate that includes at least one conjugated polymer. When an electric field is applied between the first and second contact layers to the semiconductor particulate through the conductive carrier material, the second contact layer becomes positive relative to the first contact layer and charge carriers of opposite polarity are injected into the semiconductor particulate. The opposite polarity charge carriers combine to form in the conjugated polymer charge carrier pairs which decay radiatively so that radiation is emitted from the conjugated polymer. In this case, the inventive light active device acts as a light emitting diode.

Importantly, the present invention can be used with small molecule OLED materials as well as large molecule OLED materials. It is very difficult or impossible to dissolve small molecule OLED materials in a liquid and so the current state-of-the-art requires such material to be vacuum deposited as a very thin film to form an OLED device, using for example, a process similar to the fabrication of a computer microprocessor chip. But because the displays are typically much larger than chips, that fabrication process is prohibitively expensive for forming a large display. However, in accordance with the present invention, particulate of the small molecule OLED material can be mixed with the carrier material and disposed within the gap between the electrodes. The particulate can include other materials, such as organic and inorganic characteristic enhancing materials to control the electrical, chemical, optical, mechanical and magnetic properties of the light active device.

The organic light active particulate may include particles comprised from a polymer blend. The polymer blend including at least one organic emitter blended with at least one of a hole transport material, a blocking material, and an electron transport material. The organic light active particulate may include microcapsules having a polymer shell encapsulating an internal phase. The internal phase and/or the shell can be comprised of a polymer blend including an organic emitter blended with at least one of a hole transport material, a blocking material, and an electron transport material.

To form a display device, the first contact layer and the second contact layer can be arranged to form an array of pixel electrodes. Each pixel includes a portion of the semiconductor particulate dispersed within the conductive carrier material. Each pixel is selectively addressable by applying a driving voltage to the appropriate first contact electrode and the second contact electrode.

Another aspect of the present invention provides a voltage controlled light active device for emitting two or more colors of light. A first electrode and a second electrode are disposed adjacent to each other with a gap between them. A mixture of an organic light active particulate and a conductive carrier material is disposed within the gap. Because of the particulate/carrier mixture, the gap between the electrodes (or whatever layers are sandwiching the organic emissive layer) can be much wider than the thickness of the emissive particulate. The particulate is dispersed three dimensionally throughout a conductive carrier. By this construction, many of the drawbacks, such as electrical shorts, delamination, etc., that plague the very thin polymer film fabrication methods are overcome.

In the voltage controlled multi-color embodiment, the organic light active particulate is comprised of first emitting particles including a first electroluminescent conjugated polymer. The first emitting particles emit a number of photons of a first color in response to a first turn-on voltage applied to the electrodes. The first emitting particles also emit a different number of photons, zero or more, of the first color in response to other turn-on voltages. The organic light active particulate further comprises second emitting particles including a second conjugated polymer. The second emitting particles emit a number of photons of a second color in response to a second turn-on voltage and a different number of photons of the second color in response to other turn-on voltages. Thus, in the case of a multi-colored diode or display, different colors are perceivable by the human eye depending on the applied turn-on voltage.

The organic light active layer may also include third emitting particles including a third electroluminescent conjugated polymer. The third emitting particles emit a number of photons of a third color and/or intensity in response to a third turn-on voltage applied to the electrodes and a different number of photons of the third color and/or intensity in response to other turn-on voltages. A full color display can be obtained by incorporating an array of pixels, each capable of emitting different colors, such as a first color red, a second color green and a third color blue. The color emitters can be a mix of organic and inorganic materials. For example, an organic conjugated polymer emitter can be used as a red emitter and an inorganic rare earth metal or metal alloy, or doped inorganic semiconductor, can be used as a green emitter. This combination of organic and inorganic emitters may expand the potential candidates for emissive materials enabling the inventive device to be tuned for specific applications.

The voltage controlled organic light active device can be constructed as a display. In this case, the first electrode is part of an x-grid of electrodes and the second electrode is part of a y-grid of electrodes. The mixture of the organic light active particulate and the conductive carrier material in the gap between the first electrode and the second electrode make up an emissive component of a pixel of a display device. Depending on the device structure it can be driven as a passive matrix or an active matrix device.

In accordance with the present invention, an organic light active display device includes a substrate with a first grid of driving electrodes formed on the substrate. A second grid of electrodes is disposed adjacent to the first grid of electrodes and defines a gap there-between. A mixture of an organic light active particulate and a conductive carrier material is disposed within the gap. The organic light active particulate includes first particles including a first electroluminescent conjugated polymer having a first turn-on voltage and second particles including a second electroluminescent conjugated polymer having a second turn-on voltage different than the first turn-on voltage. When the first turn-on voltage is applied, a first color is emitted by the first electroluminescent conjugated polymer. Light having a second color is emitted by the second electroluminescent conjugated polymer in response to the second turn-on voltage applied to the first electrode and the second electrode. Additional color emitters can be included, including emitters that emit photons predominately in the visible and/or non-visible range of the photon radiation spectrum. Also, the color emitters can be comprised of other organic or inorganic materials.

In accordance with the present invention, a method is provided for driving a multi-color light emitting device, the multi-color light emitting device is capable of emitting two or more colors in sequence. Each color is emitted in response to a respective different applied turn-on voltage. During an emission cycle, a first turn-on voltage is applied having a duration to the light emitting device so that a first burst of a predominant number of photons of a first color are emitted. A second turn-on voltage is then applied during the emission cycle having a duration and at least one of a magnitude and a polarity different than a magnitude and polarity of the first turn-on voltage. For example, a 5 volt turn-on voltage may cause a predominate emission of red photons, and a 10 volt turn-on voltage may cause a predominate emission of green photons. In response to the second turn-on voltage duration, a second burst of a predominant number of photons of a second color are emitted. In this way, during the emission cycle the first burst and the second burst, (and possibly third or more burst), occur in rapid succession. A human eye and vision system receiving the first burst and the second burst, and so on, is stimulated to perceive a color that is different than the first color and the second color (the emitted burst colors).

In accordance with another aspect of the present invention, a method is provided for forming a layered organic light active material particulate. This layered organic light active material particulate is mixed with the conductive carrier material and disposed between the electrodes to form the inventive light emitting devices. To form the particulate, a first mixture is formed of a first organic light active component material and a first carrier fluid. A second mixture is formed of a second organic light active component material and a second carrier fluid. A first mist is generated of the first mixture in an environment so that a first particulate of the first organic light active component material is temporarily suspended in the environment. A second mist of the second mixture is generated in the environment so that a second particulate of the second organic light active component material is temporarily suspended in the environment. The first particulate and the second particulate are allowed to commingle and attract together in the environment to form a first layered organic light active material particulate. A charge of opposite polarity can be applied to the constituents in each mist to promote electrical attraction. When the charged particles join together an electrically neutral organic light active particulate is obtained. The layered organic light active particulate has a first layer made up of the first organic light active component material and a second layer made up of the second organic light active component material. Additional layers can be added to the multilayered structure by forming another mixture of another organic light active component material and another carrier fluid and forming yet another mixture of a previously formed layered organic light active material particulate and yet another carrier fluid. The resulting particles are suspended in the environment as described above and allowed to commingle and attract together to form the multilayered particulate structure. This method can be repeated to build up multilayered organic light active material particulate having a range of selectable electrical, optical, mechanical and chemical attributes. Further, depending on the desired particulate characteristics, the constituents of the multilayered structure may be organic and/or inorganic materials. The use of organic and inorganic materials broadens the potential candidates of materials that can be combined to form the multilayered particulate. Further, the inventive method may be applied for making multilayered particles for other applications, such as drug delivery vehicles, electrical circuit components, bi-polar electrophoretic microdevices, nanomachines, etc.

The environment in which the particulate is formed can be an inert gas, reactive gas, a vacuum, a liquid or other suitable medium. For example, it may be advantageous for the environment to include elements that perform a catalytic function to promote a chemical reaction in or between the constituents in the mists. A characteristic enhancing treatment may be performed on the formed layered organic light active material particulate. The treatment may be a temperature treatment, a chemical treatment, a light energy treatment to cause, for example, light activated cross-linking, a shell forming treatment, or other characteristic enhancing treatment to impart desired attributes to the formed particulate. Further, it may be beneficial to form the particulate under controlled conditions such as weightlessness. The treatments can be performed on the constituent materials and/or the multilayered particles to impart specific characteristics or improved qualities. For example, a heat treatment may be performed to drive out moisture or oxygen or other contaminants to increase the lifetime and emission efficacy of the particulate. A hot isostatic heat treatment can be performed to enhance the interface between the constituent particle layers. The particles can be brought up to about 80% of the melt temperature and placed under pressure in an inert atmosphere. The interface between the multilayers can then become diffused which may result in enhancements of the particulate characteristics.

In accordance with the present invention, an OLED device includes a first electrode and a second electrode. The second electrode is disposed adjacent to the first electrode so that a gap is defined between them. Unlike the prior art, the present invention does not require the formation and preservation of thin films of OLED material with extremely wide surface area (as compared to the film thickness) and very little material between the electrodes. Instead, the present invention utilizes OLED particulate dispersed within a conductive carrier. The OLED particulate is dispersed within the carrier material, which is disposed within the gap between the electrodes. When an electric potential is applied to the electrodes, the electrical energy passes through the carrier material raising the energy state of the OLED particulate, resulting in the emission of light.

In a simple form, the OLED particulate may comprise layered organic particles, each particle including a hole transport layer and an electron transport layer. A heterojunction is formed at the interface between the hole transport layer and the electron transport layer. Each layered organic particle may also include a blocking layer adjacent to the electron transport layer and an emissive layer adjacent to the hole transport layer (or other stack order and component layers), thereby forming a stacked organic layered structure. The blocking layer is provided for facilitating the injection and combining of electrons and holes, and the emissive layer is provided for facilitating the emission of photons when the energy state of the OLED particulate is raised.

In accordance with an aspect of the present invention, the OLED particulate comprises microcapsules. Each microcapsule includes an internal phase and a shell.

The internal phase and/or the shell include the OLED material. The internal phase and/or the shell may also include a field reactive material. Depending on the OLED fabrication method and the desired OLED characteristics, the field reactive material may be an electrostatic material and/or a magnetically reactive material.

As described further herein, the microcapsule or particulate composition may be effective for enabling a "self healing" capability of the fabricated OLED device. In this case, the microcapsule includes a composition that causes the microcapsule to rupture or otherwise change shape if electrical energy above a threshold is applied to the microcapsule. For example, a particular microcapsule may end up positioned so that during use of the OLED device, it becomes a short between the electrodes. The microcapsule may end up positioned adjacent to a dust particle or other foreign inclusion, creating such a short. In this case, electrical energy exceeding a predetermined threshold will pass through the microcapsule causing the capsule to become disrupted and disconnect the short. By this construction, the microcapsule is automatically removed from the path of conduction of electrical energy in the event of a short. Further, a particulate mixture can include different species of emitters. The different species can each have a particular turn-on voltage. Two or more of the species can emit the same color of light, but have different turn-on voltages. Typically, different color emitters have different service lifetimes. For example, a blue emitter may have a shorter service life than a red emitter, and a green emitter may have a service life between the other two. As the emitters of one color lose their potency, the display loses its color vibrancy and display effectiveness. However, in accordance with this aspect of the invention, more than one species of a specific color OLED particulate can be included in the particulate mixture. Each species has a different turn-on voltage at which it most effectively emits the colored light. The loss of intensity of, say, the blue emitter, can be detected and the other blue emitter species driven by altering the pixel driving voltage.

In accordance with another aspect of the invention, the microcapsule shell and/or internal phase may include a composition effective to provide a barrier against degradation of the OLED material. The OLED microcapsules are dispersed within a carrier fluid. This carrier fluid also provides a barrier against the intrusion of substances which degrade the OLED material.

The OLED microcapsules can have constituent parts including at least one of hole transport material, electron transport material, field reactive material, solvent material, color material, shell forming material, barrier material, desiccant material, scavenger material, and heat meltable material. The constituent parts form at least one internal phase and at least one shell. The constituent parts are selected so as to have electrical characteristics that result in a preferred path of electrical conduction through the hole transport material and the electron transport material. By this construction, the microcapsule behaves, for example, as a pn junction upon application of an electrical potential to the first electrode and the second electrode.

The OLED device can be constructed of suitably chosen materials so that the carrier material is relatively less electrically conductive than the OLED particulate, this ensures that the OLED particulate offers a path of less electrical resistance than the carrier material. Thus, the electric potential applied to the electrodes will pass through the carrier material, which has some electrical conductivity, and through the OLED particulate, which has relatively higher electrical conductivity. In this way, the preferred path of electrical conduction is through the OLED particulate. Likewise, the shell of the OLED microcapsules are relatively less electrically conductive than the OLED material itself, so that the OLED material offers a path of less electrical resistance than the shell.

The typical OLED includes an OLED component that is a hole transport material and an OLED component that is an electron transport material. In accordance with a formulation of the inventive microcapsules, the shell comprises an OLED component material that is either the hole transport material or the electron transport material, and the internal phase of the microcapsule includes the OLED component material that is the other of the hole transport material and the electron transport material. Depending on the desired optical qualities of the fabricated OLED device, the carrier material can be selected so that it has optical properties during use of the OLED device that are transparent, diffusive, absorptive, and/or reflective to light energy. During the hardening process of the carrier, it can be selectively cured so that it is more light transmissive through the volume between the top and bottom electrodes and less light transmissive or more light absorbing through the volume that is not between the electrodes. With this construction, the contrast of the display is improved and ambient light is absorbed rather than reflected from the display to reduce glare. Also, depending on the composition of the carrier material and characteristic enhancing material incorporated in it, the selective curing of the carrier fluid can control the conduction of electrical energy through it. In this way, the volume between the pixels is controlled to be less conductive than the volume between the top and bottom electrodes of each pixel. This mechanism further reduces cross talk between the pixels. Further, the OLED particulate may be more conductive than the carrier material. The composition of the OLED particulate can be selected so that the electrical characteristics of the OLED particulate includes an electro or magneto rheological characteristic. This rheological characteristic is effective for causing the OLED particulate to move within the carrier and orient in response to an applied electrical or magnetic field. By migrating the OLED particulate to the regions of the pixels during the particulate aligning step, the carrier material volume between the pixels will have a lower conductivity than the volume between the top and bottom electrodes. This will also reduce cross talk between the pixels.

In accordance with another composition of the OLED microcapsule, the internal phase comprises OLED material and a magnetically reactive material disposed within a first shell. An electrolyte and a curable fluid material are disposed surrounding the shell. A second shell encapsulates the first shell, the electrolyte and the curable material. In response to an applied magnetic field, the position of the first shell is changeable relative to the second shell. Upon curing the curable material, the position of the first shell relative to the second shell is locked in place. As is described in detail herein, this microcapsule structure can be used to form capacitor/OLED microcapsules which may be particularly effective for use in passive matrix displays. This construction can be used to form other electronically active microcapsules for forming electronic circuit components. For example, semiconductor characteristics of the OLED-type polymers and/or inorganic materials can enable transistor, capacitor and other electronic circuit elements to form, for example, memory, processing, transceivers, power supplies and other electronic circuit devices.

In accordance with the present invention, a method for forming an OLED device is provided. A top electrode and a bottom electrode are provided defining a gap there between. Within the gap, a field reactive OLED particulate is disposed randomly dispersed within a fluid carrier. An aligning field is applied between the top electrode and the bottom electrode to form a desired orientation of the field reactive OLED particulate within the fluid carrier. The fluid carrier comprises a hardenable material. While the desired orientation of the field reactive OLED particulate is maintained, the carrier is cured to form a hardened support structure within which is locked in position the OLED particulate. In some cases it may not be necessary to align the particles by migration through the carrier fluid. They can remain randomly dispersed, or simply rotated so that the bipolar particulate, for example, is properly oriented between the electrodes to improve the electrical to light or light to electrical energy conversion.

The OLED particulate may comprise a bipolar OLED microcapsule. The OLED particulate is formed by the steps of first providing a first particle comprised of a hole transport material. The hole transport material has a net first electrical charge. A second particle comprised of an electron transport material is provided having a net second electrical charge. The first electrical charge is of opposite polarity from the second electrical charge. The first particle and the second particle are brought together to form a unified OLED particulate having a hole transport layer and an electron transport layer forming a heterojunction between them. The first particle may further include a photon-active layer. This photon-active layer may be a light emissive layer in which case the OLED forms a light emitting device, or a light receptive layer, in which case the OLED forms a light detecting device.

The OLED particulate can be formed by microencapsulating an internal phase within a shell. The internal phase or the shell includes an OLED material and either the internal phase or the shell includes a field reactive material. The field reactive material comprises either or both an electrostatic and a magnetically reactive material. In accordance with another composition of the inventive microcapsule, the internal phase comprises an OLED emitter material and other materials (such as an OLED hole transport material) dispersed in solution and/or suspension, or a polymer blend. Color dyes may also be included within the internal phase or shell. The fluid within the internal phase may be a carrier fluid or solvent. In order to provide the alignment capabilities of the microcapsules, either the internal phase or the shell may include a field reactive component.

In accordance with another aspect of the present invention, a stacked OLED device is provided. The inventive OLED device includes a first OLED pixel layer comprised of a first layer electrode. A second layer electrode is disposed adjacent to the first layer electrode. A first layer gap is defined between the electrodes. An OLED particulate is dispersed within a carrier and contained within the first layer gap. At least one subsequent OLED pixel layer is formed over the first OLED pixel layer.

Each subsequent OLED pixel layer includes a first subsequent layer electrode. A second subsequent layer electrode is disposed adjacent to the first subsequent layer electrode defining a second layer gap there between. An OLED particulate in a carrier material is disposed between the electrodes.

To achieve a full color OLED display, the OLED particulate of the first OLED pixel layer emits light of a first wavelength range in response to a drive voltage being applied to the first layer electrode and the second layer electrode. Each subsequent OLED pixel layer emits light of a different wavelength range in response to the driving voltage applied to the respective electrode pairs so that an RGB color display can be formed.

Further, a dichromatic pixel layer can be formed adjacent to the last subsequent OLED pixel layer. The dichromatic pixel layer can be formed from an LCD display-type layer or from a electrophoretic microcapsule display layer along the lines described in the U.S. Pat. No. 6,50,687 B1 issued to Jacobson. This dichromatic pixel layer, as described more fully herein, results in a display that can viewed in direct bright sunlight as well as with improved contrast in indoor ambient lighting conditions. Further, additional subsequent OLED pixel layers can be provided which emit light in additional color range having a color and/or light intensity different from the color and/or light intensity of the other OLED pixel layers. In this construction, the display can be driven, for example, as an infrared display for stealth night-vision applications.

Further, the inventive OLED device can be configured so as to detect light impinging on a pixel grid formed in accordance with the present invention. In this case, the OLED particulate of a first OLED pixel layer emits an electrical energy in response to the reception of photons and applies the electrical energy as a detectable signal to the first and second layer electrodes. Further, a full color CCD-type camera can be formed by tuning the wavelength range at which subsequent layers of OLED pixels are photo reactive.

In accordance with another aspect of the present invention, a method is provided for making a light active device. A mixture is provided containing a monomer and light active material. The light active material contains at least one of a energy-to-light material for emitting light in response to an applied electrical energy and a radiation-to-energy material and generating electrical energy in response to irradiation. The monomer is selectively cross-linked in a pattern to form a polymer. As the cross-linking reaction progresses, the monomer migrates in response to the selective cross-linking pattern, causing the cross-linked monomer (a polymer) and the light active material to become concentrated in separate regions. The end result is a solid polymer with light active regions embedded in a pattern corresponding to the selective cross-linking pattern.

In accordance with another aspect of the present invention, a light active device is provided. Light active material is provided in a first region. A polymer is provided in a second region. The polymer is formed by selectively cross-linking a monomer from a mixture containing the monomer and the light active material. The selective cross-linking causes a concentration of the light active material at the first region and a concentration of the polymer at the second region.

In accordance with another aspect of the present invention, a method is provided for making a light emitting device. The inventive steps include providing a bottom substrate, with a bottom electrode over the bottom substrate. An emissive layer is disposed over the bottom electrode. The emissive layer includes a mixture of a dispersed OLED particulate in a monomer fluid carrier. The monomer is selectively polymerized causing the OLED particulate to concentrate in emissive regions and the polymerized monomer to concentrate in polymerization regions.

In accordance with another aspect of the invention, a method is provided for making a light emitting device. A bottom substrate is provided and a bottom electrode provided over the bottom substrate. An emissive layer comprising a mixture including an emissive/more-conductive material and a non-emissive/less-conductive material is disposed over the bottom substrate. The mixture is selectively patterned causing the emissive/more-conductive material to concentrate in emissive regions and the non-emissive/less-conductive material to concentrate in non-emissive regions.

BRIEF DESCRIPTION OF THE DRAWINGS

FIG. 22 illustrates step one of an embodiment of the inventive OLED device fabrication method;

FIG. 23 illustrates step two of an embodiment of the inventive OLED device fabrication method;

FIG. 24 illustrates step three of an embodiment of the inventive OLED device fabrication method;

FIG. 28 shows a magnetically reactive OLED microcapsule for forming a capacitor OLED microcapsule with the aligning field turned off;

FIG. 29 shows a magnetically reactive OLED microcapsule for forming a capacitor OLED microcapsule with the magnetic aligning field turned on with uncured electrolyte mixture;

FIG. 30 shows a magnetically reactive OLED microcapsule for forming a capacitor OLED microcapsule with the magnetic aligning field turned on with cured electrolyte mixture;

FIG. 31 shows a pixel comprised of a chain of capacitor OLED being charged by a charging voltage;

FIG. 32 shows a pixel comprised of a chain of capacitor OLED being triggered for light emission by a trigger voltage;

FIG. 39 illustrates a first step in forming a multi-layered OLED particulate;

FIG. 40 illustrates a second step in forming a multi-layered OLED particulate;

FIG. 41 illustrates a third step in forming a multi-layered OLED particulate;

FIG. 51 shows an inventive OLED display fabricated with thin films of organic material with photodetection elements and photodetection pixel elements;

FIG. 52 shows an OLED microcapsule wherein the shell is slightly less conductive than the encapsulated OLED material;

FIG. 53 shows an OLED microcapsule wherein the OLED material is encapsulated along with an electrolyte and a magnetic inner microcapsule having an electrically insulative shell;

FIG. 54 shows an OLED microcapsule wherein the OLED material and the hole transport material are contained in solution within a conductive shell;

FIG. 55 shows the OLED microcapsules shown in FIG. 54 including a magnetically active material and color dye in the inner phase and heat meltable material in the shell;

FIG. 76 illustrates a polymer blend organic light active particulate having a field attractive constituent for aligning the particle in an aligning field;

FIG. 77 illustrates composite microcapsules containing multilayered organic light active particles, each having a different light wavelength emission and turn-on voltage;

FIG. 78 illustrates another composite microcapsule containing multilayered organic light active particles, at least one having a field attractive constituent;

FIG. 79 illustrates three light emitting microcapsule species, each species having a turn-on voltage controlled by the internal phase composition and the encapsulating shell composition;

FIG. 84 illustrates the inventive retinex burst driving method for producing a perceived full color image by the rapid and sequential bursts of colored light emission;

FIG. 85 illustrates the inventive adjusted color burst driving method for producing a perceived full color image by the rapid and sequential bursts of adjusted colored light emission;

FIG. 86 is a flow chart showing the steps of the inventive method for forming a multilayered organic light active material particulate;

FIG. 91 illustrates a layered organic light active material particulate formed by the commingling of a particle of blocking material with a particle of electron transport material;

FIG. 92 illustrates the inventive method of forming a layered organic light active material particulate from a blocking constituent and an electron transport constituent;

FIG. 101 illustrates a multi-layered organic light active material particulate formed by the commingling of a layered particle of field attractive/electron transport material with a layered particle of emissive layer/hole transport material;

FIG. 102 illustrates the inventive method of forming a multi-layered organic light active material particulate from a field attractive/electron transport constituent and a hole transport/emissive layer constituent;

FIG. 114 is a cross sectional schematic view illustrating the extrusion of light active fiber having aligned OLED particulate;

FIG. 115 is a perspective schematic view illustrating the extrusion of light active fiber;

FIG. 116 is a cross section of a segment of extruded light active fiber FIG. 117 is a schematic view of the segment of extruded light active fiber driven by a voltage applied between electrodes;

FIG. 118 is a cross sectional schematic view illustrating an extruded light active fiber having a conductive electrode core and a transparent electrode coating;

FIG. 119 is a perspective schematic view illustrating the extrusion of the light active fiber having a conductive electrode core and a transparent electrode coating;

FIG. 120 illustrates an extruded light active fiber having a conductive electrode core and a transparent electrode coating connected with a voltage source;

FIG. 121 is a cross sectional schematic view illustrating the extrusion of light active ribbon having aligned OLED particulate;

FIG. 122 is a perspective schematic view illustrating the extrusion of light active ribbon;

FIG. 123 is a segment of extruded light active ribbon;

FIG. 124 is a cross-sectional view of the segment of extruded light active ribbon having wire electrodes incorporated within the ribbon and driven by a voltage applied between electrodes;

FIG. 125 illustrates a light active fiber extrusion and chopping mechanism for forming uniform lengths of OLED light active fiber;

FIG. 126 illustrates OLED light active fiber randomly dispersed between two electrodes;

Figures 125, 126, 127, 128, 129:
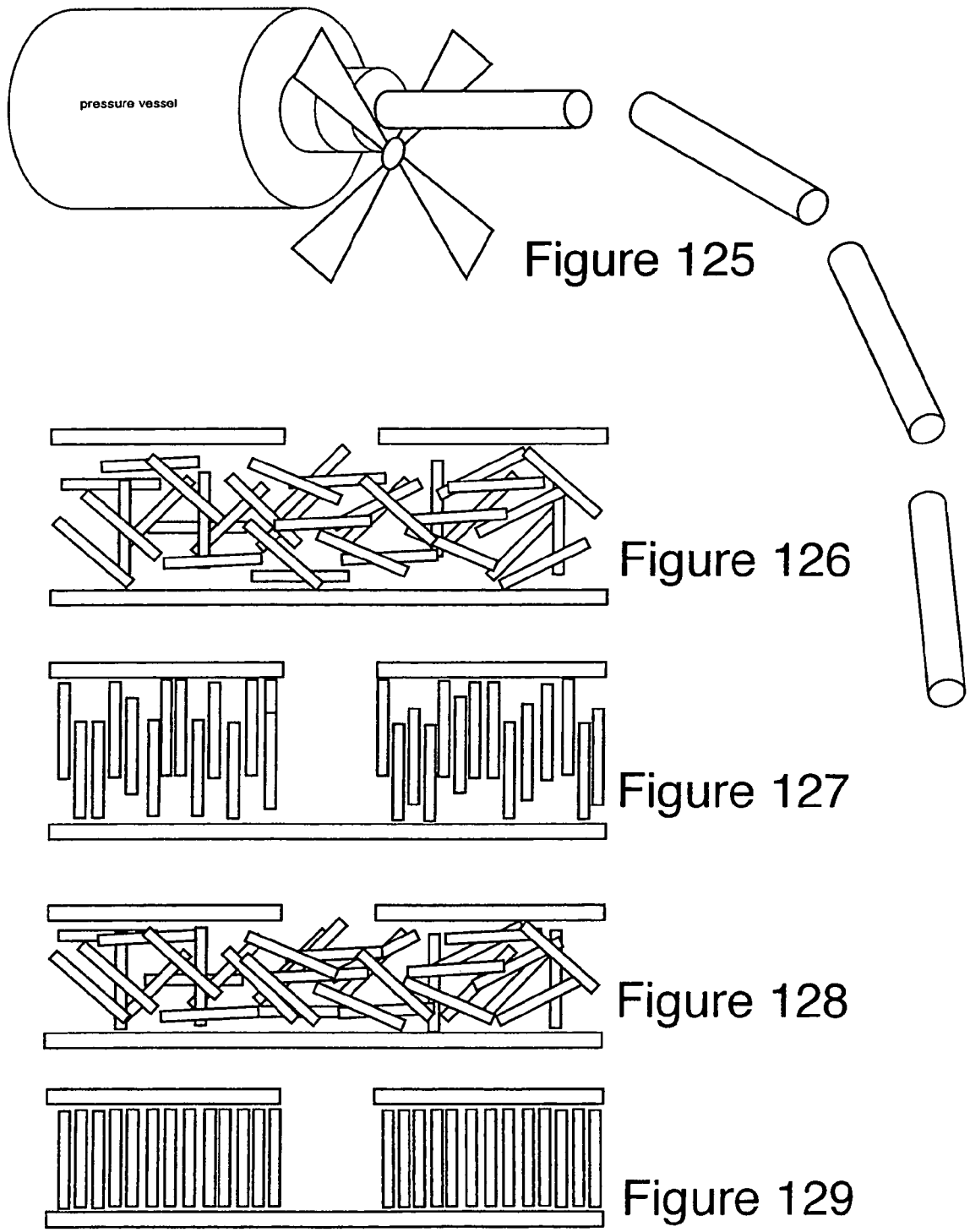
Figure 133:
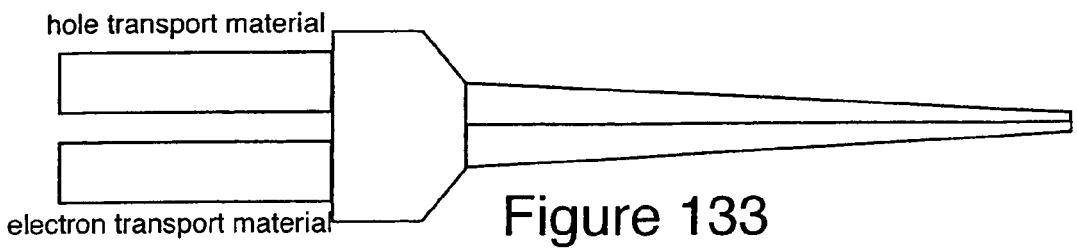
Figure 134:
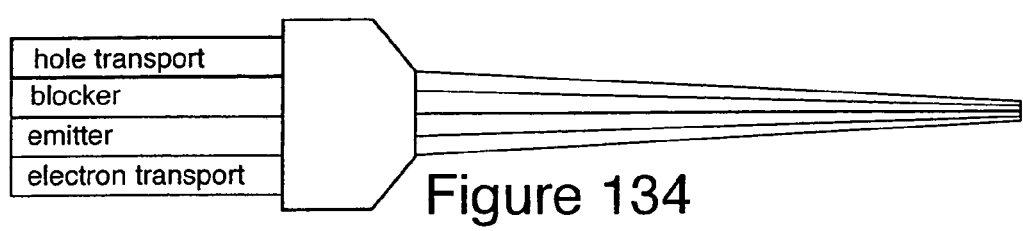
Figure 135:
Figure 136:
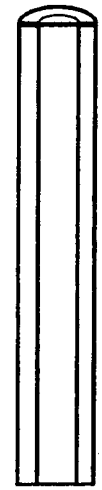
Figure 137:
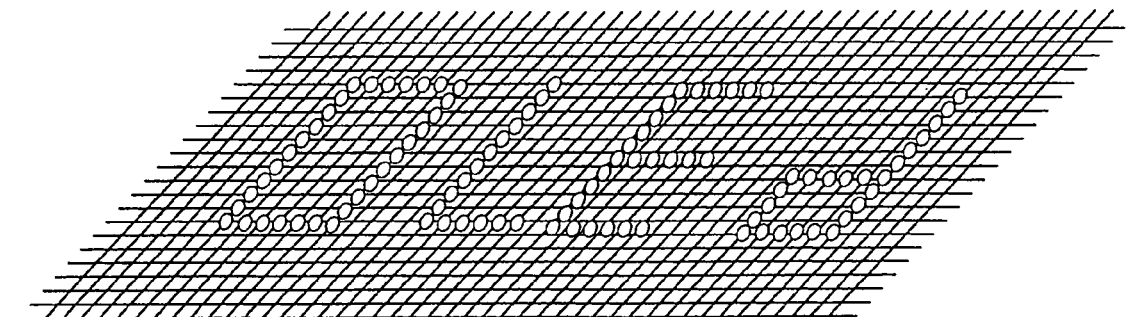
Figure 138:
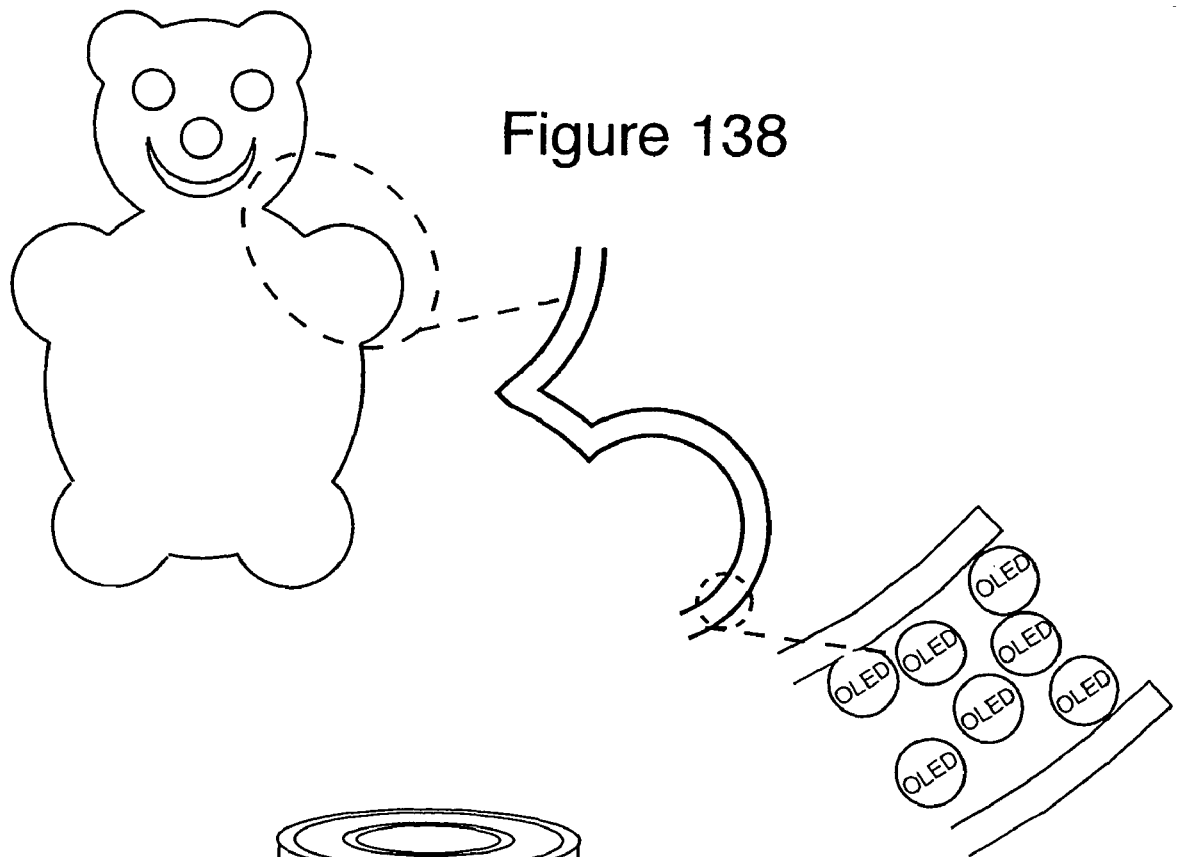
Figure 139:
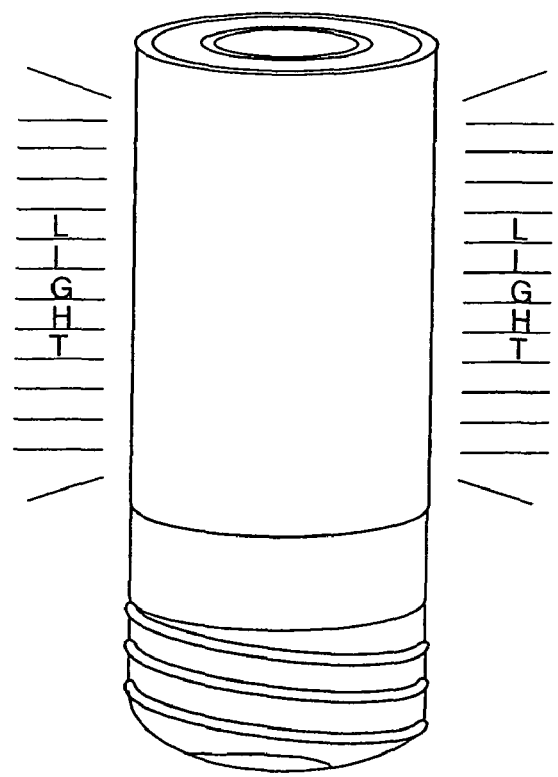
Figure 140:
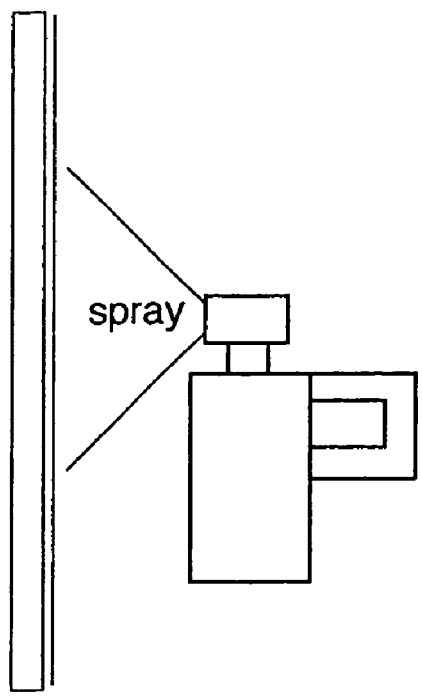
Figure 141:
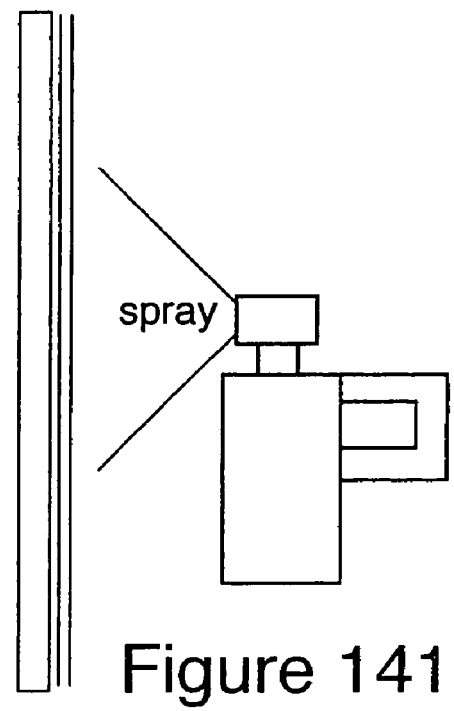
Figure 142:
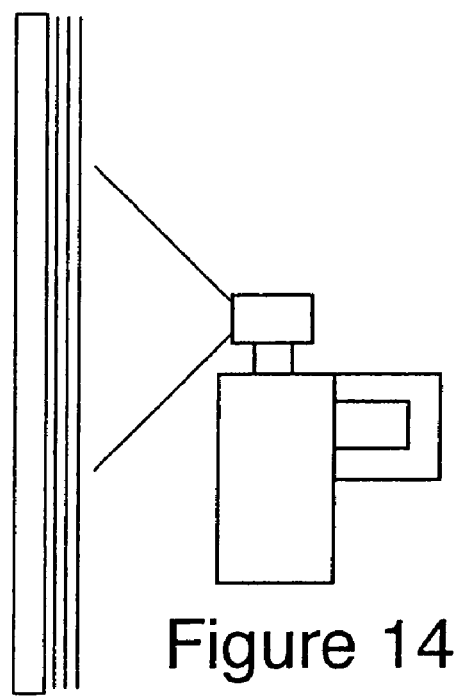
Figure 143:
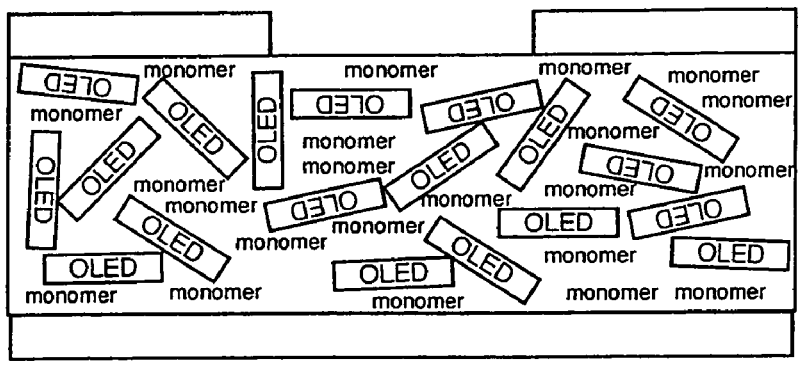
Figure 144:
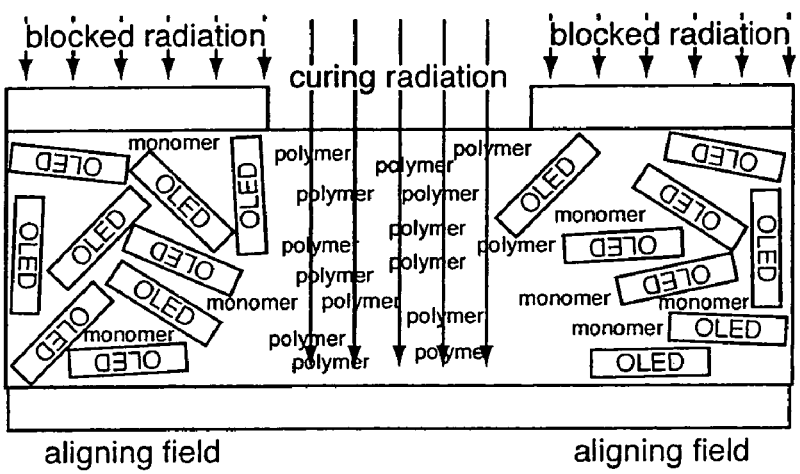
Figure 145:
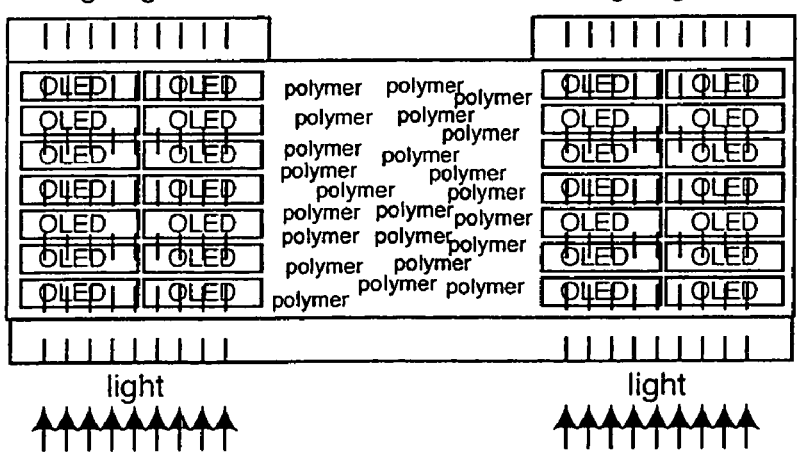
Figure 146:
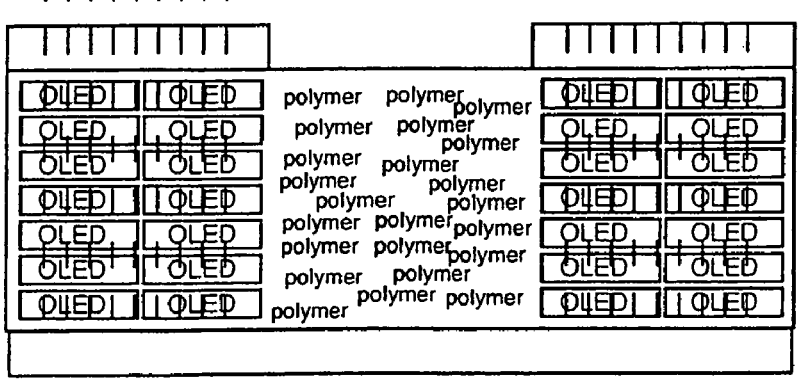
Figure 147:
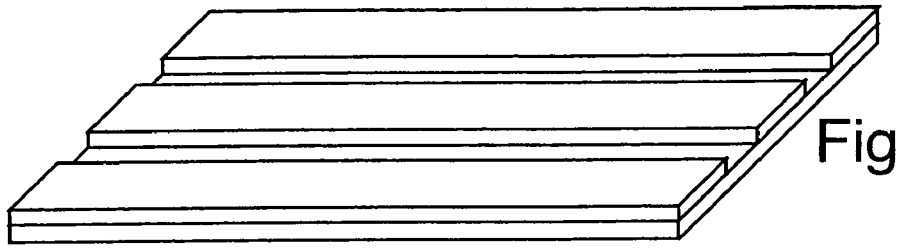
Figure 148:
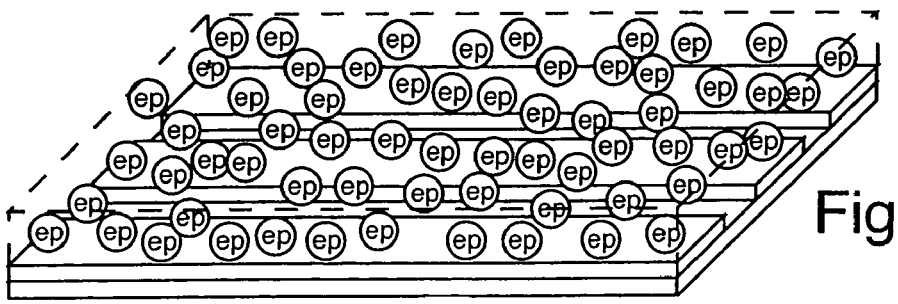
Figure 149:
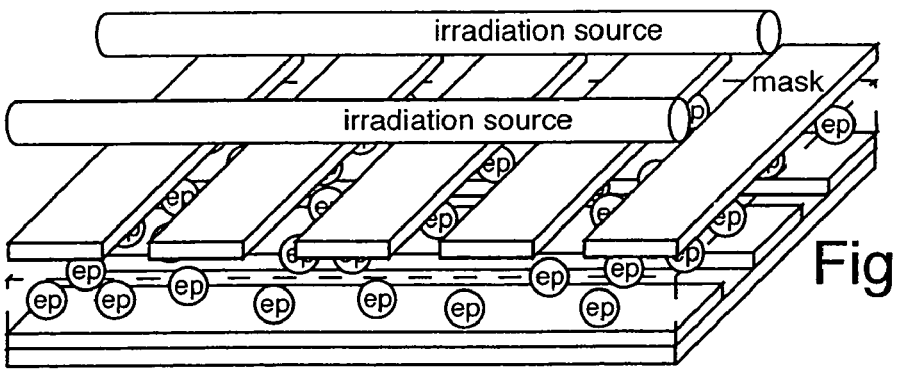
Figure 150:
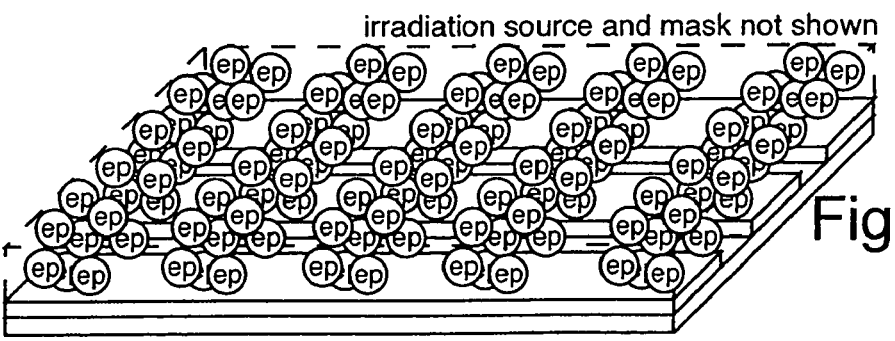
Figure 156:
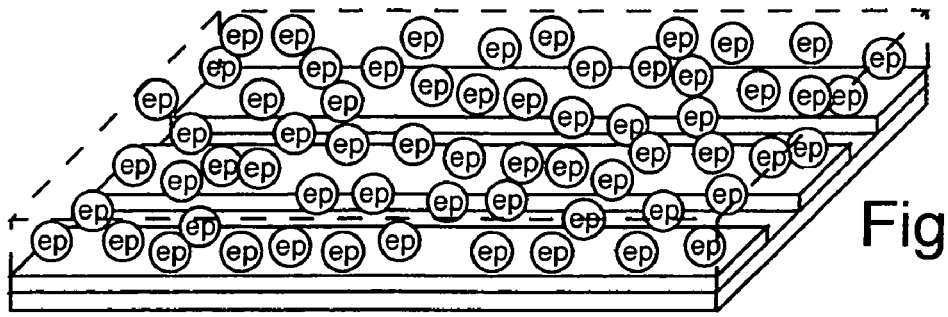
Figure 157:
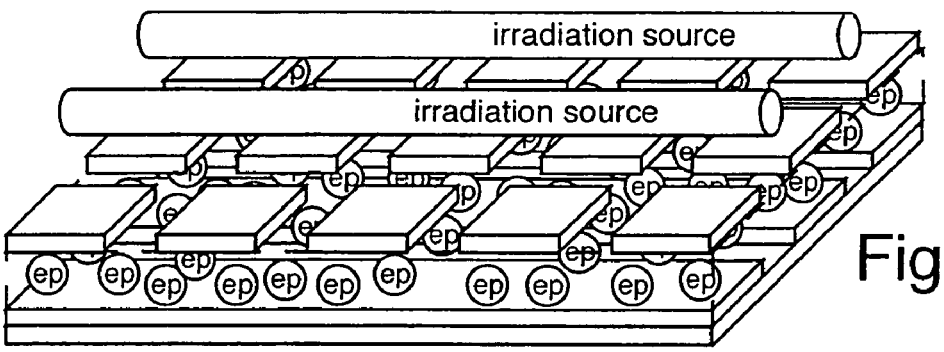
Figure 158:
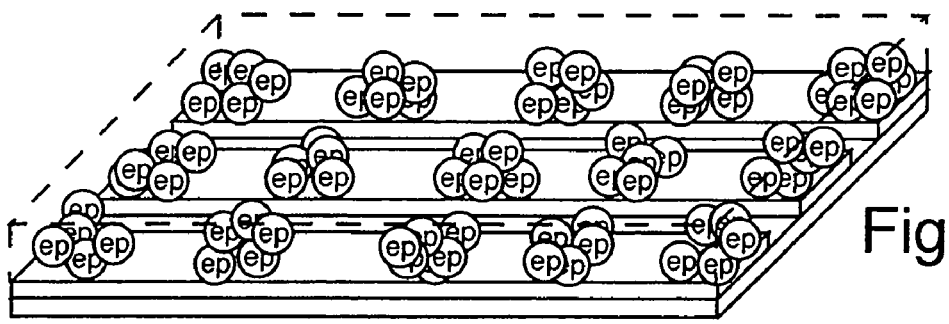
Figure 159:
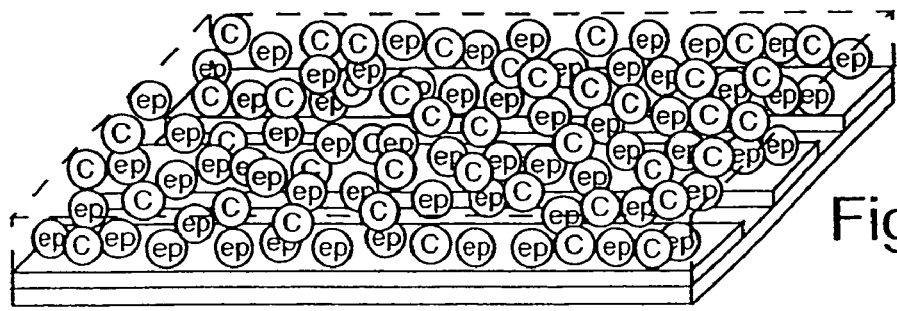
Figure 160:
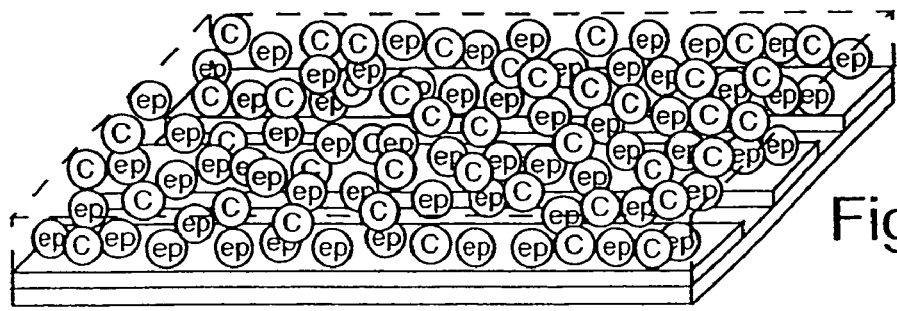
Figure 161:
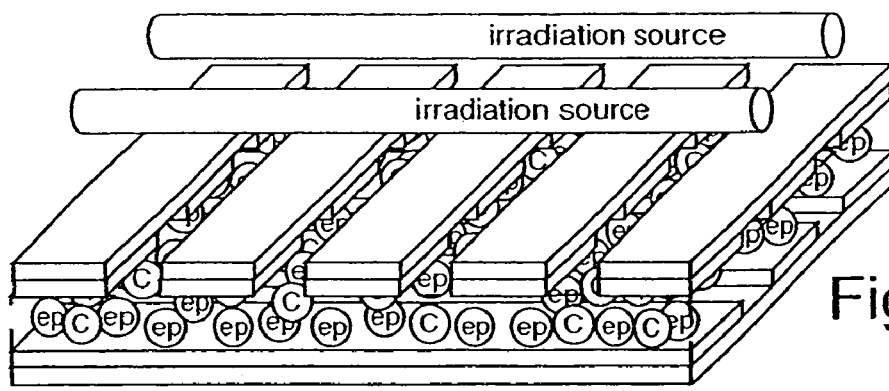
Figure 162:
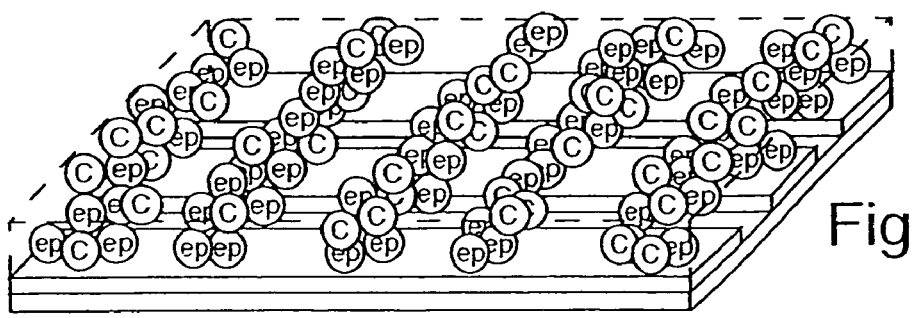
Figure 163:
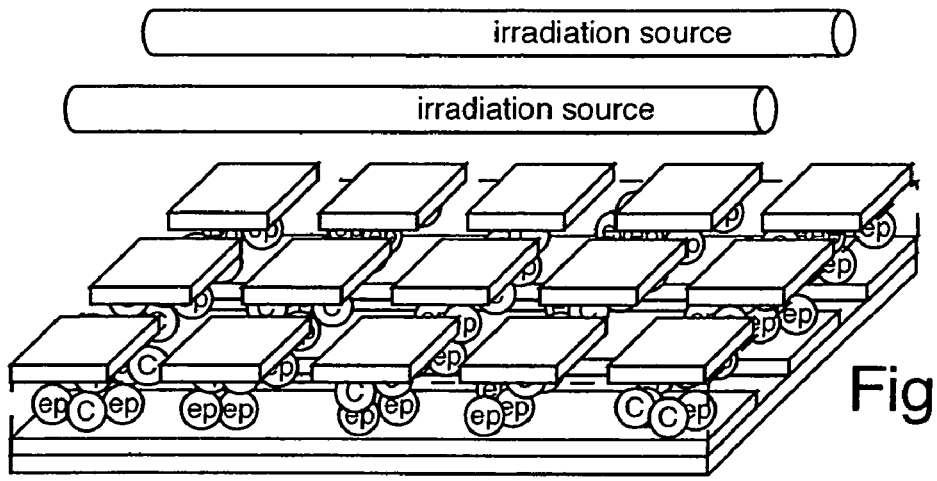
Figure 164:
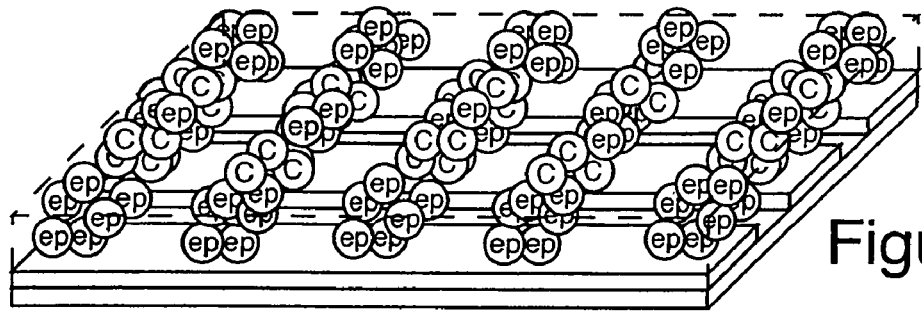
Figure 165:
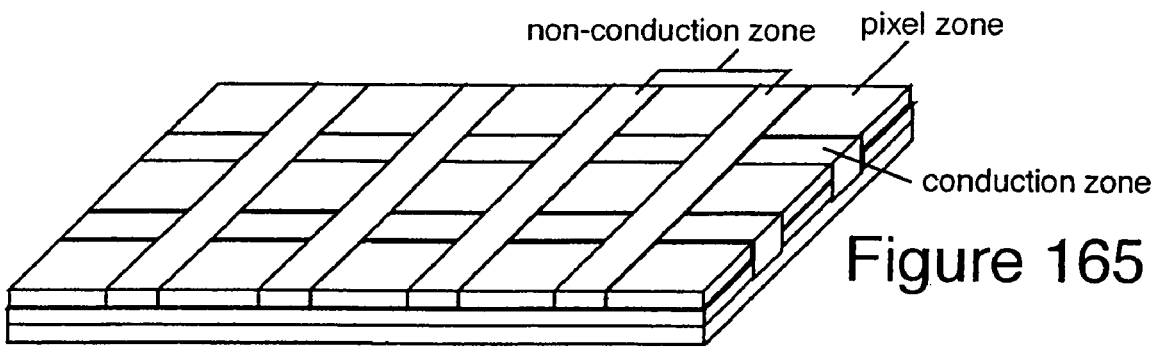
Figure 166:
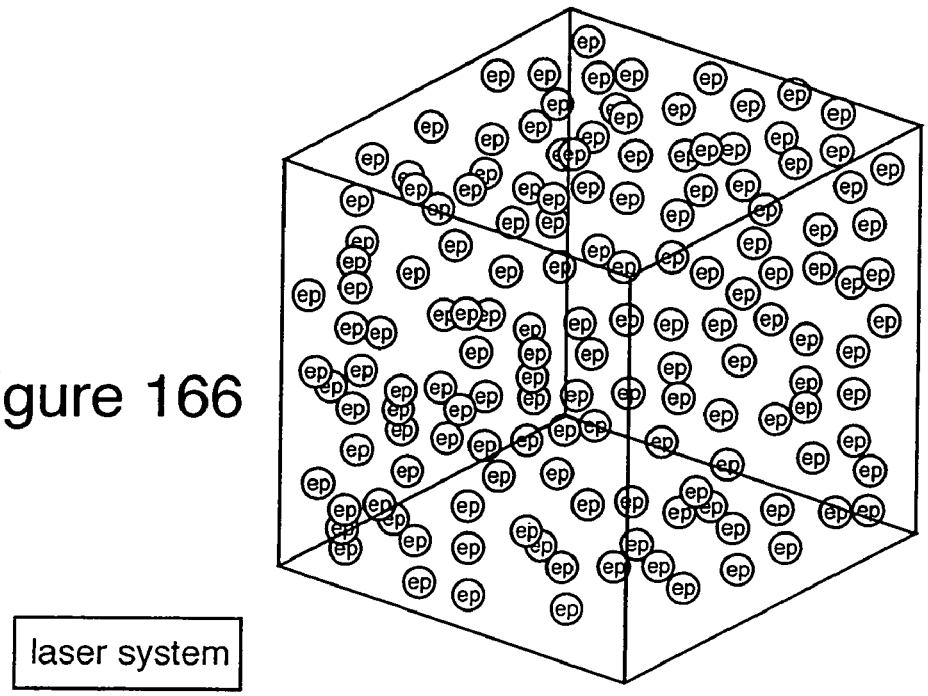
Figure 167:
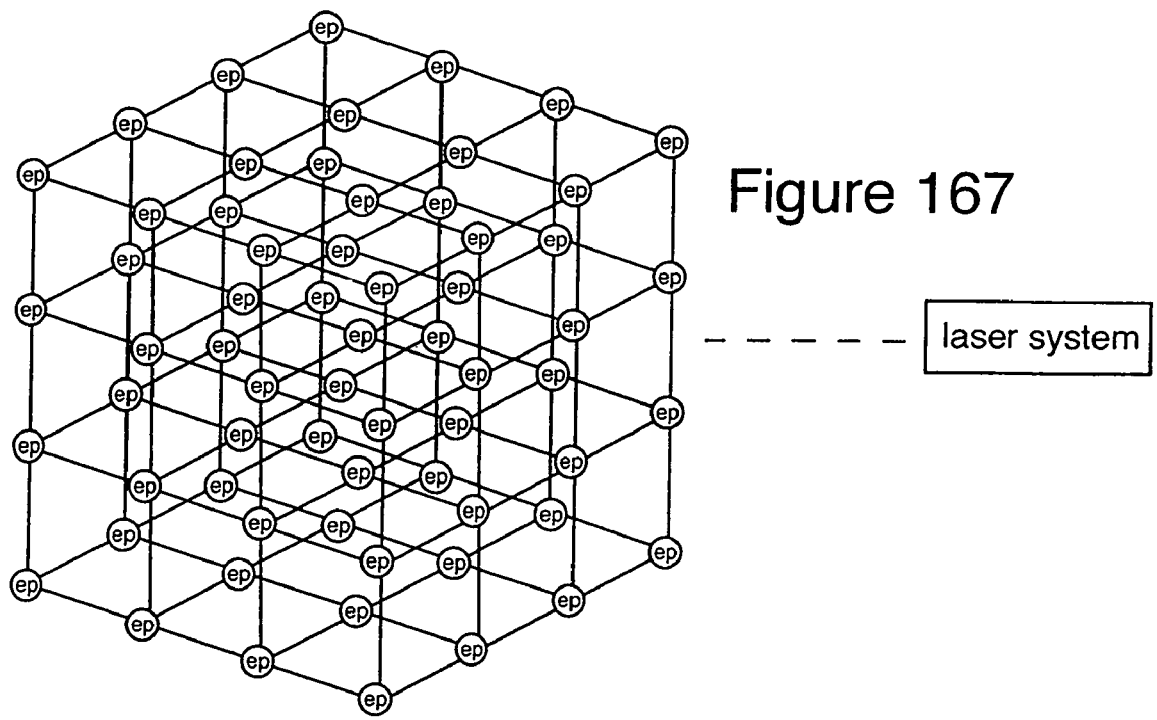

FIG. 127 illustrated the OLED light active fibers aligned between the two electrodes;

FIG. 128 illustrates OLED light active fibers randomly dispersed between two electrodes having a gap distance close to the uniform length of the fibers;

FIG. 129 illustrated the OLED light active fibers aligned between the two electrodes having a gap distance close to the uniform length of the fibers;

FIG. 130 illustrates light active fibers woven into carpeting;

FIG. 131 illustrates a light active cloth weave;

FIG. 132 illustrates a curved large format surround display formed in accordance with the present invention by tiling length of display sections;

FIG. 133 illustrates a method of forming two layer ultra-thin multilayered OLED fiber by drawing and thinning;

FIG. 134 illustrates a method of forming four layer ultra-thin multilayered OLED fiber by drawing and thinning;

FIG. 135 is a cross sectional view showing a wire having an electron transport coating layer;

FIG. 136 is a cross sectional view showing a wire having a hole transport coating layer;

FIG. 137 illustrates coated wire intersecting electrodes for forming light emitting pixels at the intersections;

FIG. 138 illustrates the inventive OLED particulate/conductive carrier mixture formulated for being formable into useful products through plastic molding techniques;

FIG. 139 illustrates an inventive OLED solid state light having a conventional light bulb form factor;

FIG. 140 illustrates a step of spray painting a reflective conductive layer of an OLED device;

FIG. 141 illustrates a step of spray painting an emissive layer of an OLED device;

FIG. 142 illustrates a step of spray painting a transparent electrode of an OLED device;

FIG. 143 illustrates a step in an inventive method for making a light active device showing a light active mixture disposed between an x and y electrode grid;

FIG. 144 illustrates another step in the inventive method for making a light active device, showing a polymerization/migration step;

FIG. 145 illustrates another step in the inventive method for making a light active device, showing an aligning step;

FIG. 146 illustrates another step in the inventive method for making a light active device, showing a controlled pixelated light emission;

FIG. 147 illustrates a step in an inventive method for making a light active device, showing a bottom substrate having a bottom electrode pattern formed thereon;

FIG. 148 illustrates another step in the inventive method for making a light active device, showing a light active mixture disposed at a light active layer over the bottom electrode pattern;

FIG. 149 illustrates another step in the inventive method for making a light active device, showing the patterning of the light active layer by irradiation through a mask;

FIG. 150 illustrates another step in the inventive method for making a light active device, showing the migration of light active material into light active regions;

FIG. 151 illustrates the composition of constituents in a multi-color light active mixture;

FIG. 152 illustrates a step in an inventive method for making a multi-color light active device, showing a multi-color light active mixture disposed over a patterned bottom electrode grid;

FIG. 153 illustrates a step in the inventive method for making a multi-color light active device, showing the selective patterning of one of the color light active regions;

FIG. 154 illustrates a step in the inventive method for making a multi-color light active device, showing the patterned color light active regions;

FIG. 155 illustrates a full-color light active device having red, green and blue side-by-side patterned color light active regions;

FIG. 156 illustrates a step in an inventive method for making a pixilated light active device; showing a mixture of light active material disposed over a patterned bottom electrode grid;

FIG. 157 illustrates another step in the inventive method for making a pixilated light active device, showing selective patterning through a pixel grid mask;

FIG. 158 illustrates another step in the inventive method for making a pixilated light active device, showing the migration of light active material to pixel regions;

FIG. 159 illustrates the composition of constituents in a light active device having pixels and conductive pathways formed by a self-assembly process;

FIG. 160 illustrates a step in an inventive method for making a light active device having pixels and conductive pathways formed by a self-assembly process;

FIG. 161 illustrates another step in the inventive method for making a light active device by self-assembly, showing the selective patterning of the conductive pathways by irradiation through a mask;

FIG. 162 illustrates another step in the inventive method for making a light active device by self-assembly, showing the patterned conductive pathways;

FIG. 163 illustrates another step in the inventive method for making a light active device by self-assembly, showing the selective patterning of pixel regions by irradiation through a mask;

FIG. 164 illustrates another step in the inventive method for making a light active device by self-assembly, showing the patterned pixel regions and conductive pathways;

FIG. 165 schematically illustrates a light active device made by self-assembly, showing emissive/more conductive zones, non-emissive/more conductive zones and non-emissive/lass conductive zones;

FIG. 166 illustrates a cubic volume of a randomly dispersed light active material in a light polymerizable monomer carrier; and FIG. 167 illustrates the cubic volume shown in FIG. 166, showing the light active material and polymerized carrier after holographic patterning using an interference pattern generated by laser beams.

DETAILED DESCRIPTION OF THE INVENTION

For purposes of promoting an understanding of the principles of the invention, reference will now be made to the embodiments illustrated in the drawings and specific language will be used to describe the same. It will nevertheless be understood that no limitation of the scope of the invention is thereby intended, there being contemplated such alterations and modifications of the illustrated device, and such further applications of the principles of the invention as disclosed herein, as would normally occur to one skilled in the art to which the invention pertains.

Figure 1:
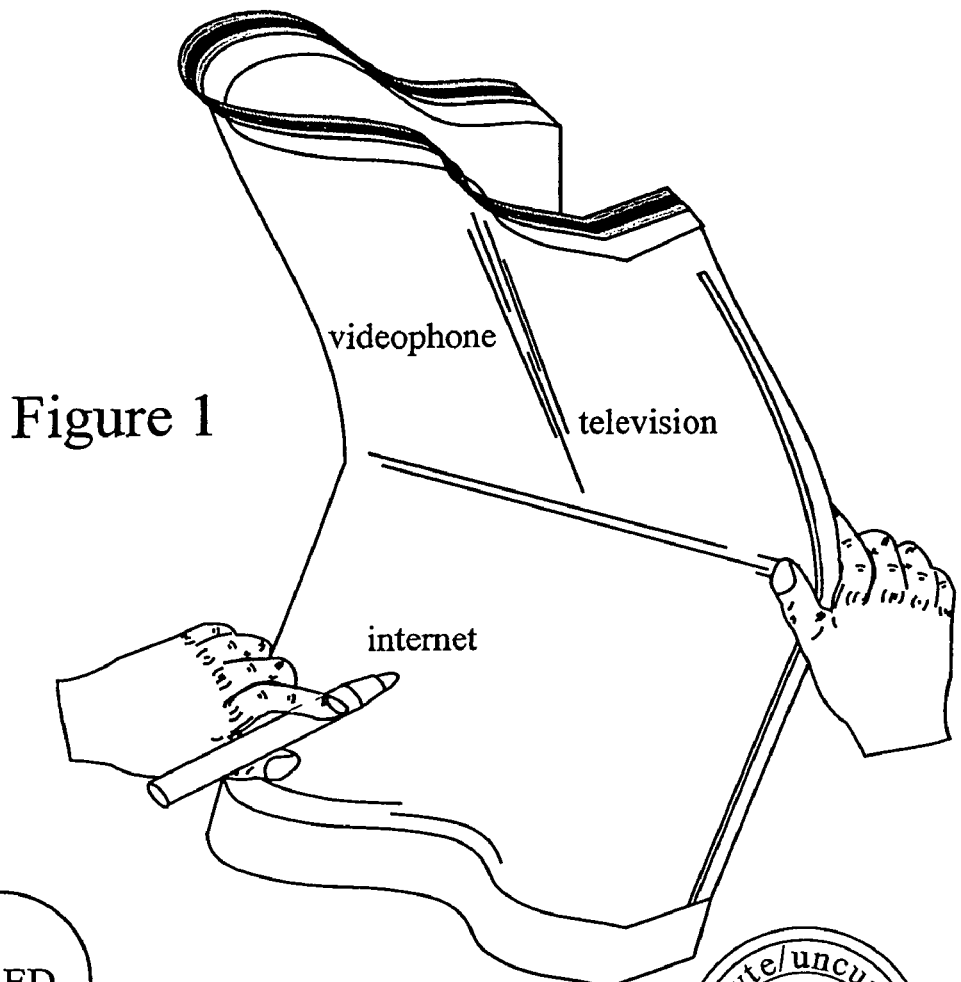
FIG. 1 illustrates an embodiment of the inventive thin, lightweight, flexible, bright wireless display having components capable of being manufactured by the inventive display fabrication method, showing the simultaneous display of mapped hyperlinked content, a videophone stream and a broadcast TV stream.

FIG. 1 illustrates an embodiment of the inventive thin, lightweight, flexible, bright wireless display having components capable of being manufactured by the inventive display fabrication method, showing the simultaneous display of mapped hyperlinked content, a videophone stream and a broadcast TV stream. FIG. 1 illustrates an embodiment of an inventive thin, lightweight, flexible, bright, wireless display showing the simultaneous display of three received display signal. The wireless display utilizes a simple DSP and transceiver. It has a unique printed battery power supply and printed user-input mechanism.

The inventive thin, lightweight, flexible, bright, wireless display includes a flexible substrate to provide a support structure upon which components can be manufactured by a fabrication method. As described in the co-owned U.S. patent application Ser. No. 10/234,302, entitled "A Thin, Lightweight, Flexible, Bright, Wireless Display", the disclosure of which is incorporated by reference herein, a unique and effective method for transmitting display information to a single or multiple displays enables such displays to not have to have substantial onboard storage or processing power. In accordance with this aspect of the invention, the energy drain, bulk, weight and cost normally associated with such devices is avoided, and the durability and convenience of the display is increased. Further, as shown schematically in FIG. 1, multiple streams of display information can be simultaneously received and displayed. For example, broadcast video content such as a television program may be shown at a first portion of the display, personalized video content, such as a videophone conversation may be shown at a second portion and a web page, including mapped hyperlink content, may be shown at a third portion. Most of the processing, networking, signal tuning, data storage, etc., etc., that it takes to create such a set of displayed content streams is not performed by the inventive wireless display. Other devices, such as a centralized computer, A/V or gateway device perform these functions thus allowing the opportunity for the inventive display to have tremendous mobility and convenience.

FIG. 1 illustrates an embodiment of the inventive thin, lightweight, flexible, bright wireless display having components capable of being manufactured by the inventive fabrication method, showing the simultaneous display of mapped hyperlinked content, a videophone stream and a broadcast TV stream. In accordance with the present invention, a thin, lightweight, flexible, bright wireless display is obtained having components capable of being manufactured by the inventive fabrication method. The present invention enables a low cost, flexible, robust, full color video display to be obtained. This wireless display is capable of receiving multiple display information signals and displaying the simultaneous screens of the received display information in re-configurable formats. A relatively simple signal receiving and processing circuit, using, for example, a digital signal processor such as those available from Texas Instruments, Texas or Oxford Microdevices, Connecticut, enables multiple video and still image screens to be displayed. An inventive manufacturing method described herein and in the co-owned patent application Ser. No. 10/234,301, filed Sep. 4, 2002 entitled "Printer and Method for Manufacturing Electronic Circuits and Displays" (incorporated by reference herein) enables the inventive wireless display to be fabricated at low cost and with the advantageous features described herein. As will be described in more detail, a flexible substrate provides a support structure upon which components can be manufactured by a fabrication method. A display stratum includes light emitting pixels for displaying information. The light emitting pixels are formed, by printing or otherwise forming a pixel layer(s) of light-emitting conductive polymer. An electronic circuit stratum includes signal transmitting components for transmitting user input signals to a display signal generating device for controlling display information transmitted from the display signal generating device. Signal receiving components receive the display information transmitted from the display signal-generating device. Display driving components drive the display layer according to the received display information. A user input stratum receives user input and generates the user input signals. A battery stratum provides electrical energy to the electronic circuit stratum, the user input stratum and display stratum components. The signal receiving components may include first radio frequency receiving components for receiving a first display signal having first display information carried on a first radio frequency and second radio frequency receiving components for receiving a second display signal having second display information carried on a second radio frequency. In this manner, two or more simultaneously transmitted video displays can be simultaneously displayed. The display driving components may include signal processor components for receiving the first display signal and the second display signal and generating a display driving signal for simultaneously displaying the first display information at a first location on the display stratum and the second display information at a second location on the display stratum. At least some of the components in the battery, display, user input and electronic circuit stratums can be formed by printing electrically active material to form circuit elements including resistors, capacitors, inductors, antennas, conductors and semiconductor devices.

The inventive thin, lightweight, wireless display includes OLAM fabrication, such as that described herein. In accordance with the present invention, microcapsule 10 or particulate are randomly dispersed within a monomer carrier fluid 12 that is injected or otherwise disposed between two electrodes 14. Generally, the term particulate can refer herein to particles of material or microcapsules 10, and vice-versa. The microcapsules 10 may include additives that impart rheological and/or phoretic properties. The microcapsules 10 form chains between the electrodes 14 when a voltage is applied. Holding the voltage to keep the chains formed, the carrier fluid 12 is polymerized and the OLAM microcapsule chains locked into alignment between the electrodes 14. The thus formed OLAM pixels emit light (or detect or convert light into electricity). The problem of contamination of the OLAM material is the major factor limiting the display life span, and thus far has been a bar to commercial success. The inventive fabrication method results in the moisture sensitive OLAM material being protected by the microcapsule shell and the cured carrier 12. The pixel alignment is automatic, since the microcapsule chains are formed only between the electrodes 14. This pixel array structure also greatly limits cross talk between pixels and the optical properties of the cured monomer can be controlled to improve contrast, display brightness, transparency, etc.

Solar cell components or layers can be used to "recycle" the energy emitted by the OLED emitters. Some of the emitted and ambient light energy impinges on the solar cells and generate electricity. This, along with the inventions described herein and the sheet battery described in the above-referenced co-owned patent application Ser. No. 10/234,301, filed Sep. 4, 2002 entitled "Printer and Method for Manufacturing Electronic Circuits and Displays", can enable lightweight, relatively inexpensive, dichromatic newspapers (as described herein in FIG. 1) that recharge in sunlight (or even indoor ambient light) to enable full-color emissive video display.

Figure 2:
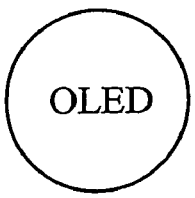
FIG. 2 illustrates a particle of OLED material for being dispersed in a carrier fluid in accordance with the inventive display fabrication method.

FIG. 2 illustrates a particle of OLED material for being dispersed in a carrier fluid 12 in accordance with the inventive display fabrication method. A typical OLED organic stack consists of a layer of hole transport material and a layer of electron transport material. In the conventional art, these layers are formed by spin coating, vacuum deposition or inkjet printing. In accordance with the present invention, the OLED material is provided as particulate dispersed within a carrier 12 material. The carrier 12 material with the dispersed particulate is disposed between electrodes 14.

Electrical potential applied to the electrodes 14 causes light emission to occur within the OLED particulate. In accordance with the present invention, the OLED phenomenon can be used to create general or specialty lighting devices, monochrome or color displays, stereoscopic vision aids, digital maps and newspapers, advanced vehicle windshields and the like. Also, the particulate can be organic light active material ("OLAM.TM.") that is capable of generating a flow of electrons in response to impinging light energy. This phenomenon can be used to create photodetectors, cameras, solar cells and the like. In this application, where appropriate, the term OLED can mean a light emissive or a light detective material configuration.

Figure 3:
FIG. 3 illustrates an inventive microcapsule comprised of an internal phase of OLED material encapsulated within a polymer shell.

FIG. 3 illustrates an inventive microcapsule 10 comprised of an internal phase of OLAM material encapsulated within a polymer shell. To create a path of least resistance through the OLED material, the shell composition is selected to be less conductive than the OLED material.

Figure 4:
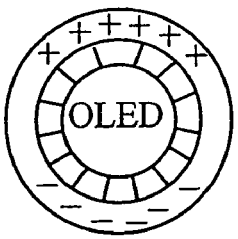
FIG. 4 illustrates an inventive bipolar microcapsule comprised of an internal phase of OLED material encapsulated within a polymer shell.

FIG. 4 illustrates an inventive electrostatically active microcapsule 10 comprised of an internal phase of OLED material encapsulated within a polymer shell. The shell is composed of a material that can be oriented by the application of an electric field. The electrical properties of the shell enable the microcapsules 10 to be aligned into a desired formation within a fluid carrier 12 in response to an applied electric field.

Figure 5:
FIG. 5 illustrates an inventive microcapsule comprised of a first microcapsule including an internal phase of OLED material and magnetic material, along with a mixture of electrolyte and uncured monomer, all encapsulated within a polymer shell.

FIG. 5 illustrates an inventive microcapsule 10 comprised of a first microcapsule 10 including an internal phase of OLED material and magnetic material, along with a mixture of electrolyte and uncured monomer, all encapsulated within a polymer shell. The magnetic properties of the magnetic material enable the microcapsules 10 to be aligned into a desired formation within a fluid carrier 12 in response to an applied magnetic field.

Figure 6:
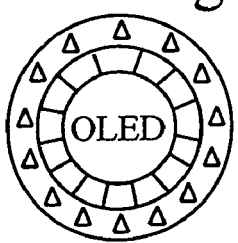
FIG. 6 illustrates an inventive microcapsule comprised of an internal phase of OLED material encapsulated within a double-wall shell, each wall having a composition selected for imparting a desired electrical, optical, magnetic and/or mechanical property to the microcapsule.

FIG. 6 illustrates an inventive microcapsule 10 comprised of an internal phase of OLED material encapsulated within a double-wall shell, each wall having a composition selected for imparting a desired electrical, optical, magnetic and/or mechanical property to the microcapsule. In accordance with the present invention, the OLED particulate comprises microcapsules 10. For example, the microcapsule 10 includes an internal phase and a shell that is composed of material selected according to a desired combination of electrical, mechanical, optical and magnetic properties. The internal phase and/or the shell may include the OLED material. The internal phase and/or the shell may also include a field reactive material. Depending on the OLED fabrication method and the desire OLED characteristics, the field reactive material may be an electrostatic material and/or a magnetically reactive material. The microcapsule 10 composition may be effective for enabling a "self healing" capability of the fabricated OLED device. In this case, the microcapsule 10 includes a composition that causes the microcapsule 10 to rupture if electrical energy above a threshold is applied to the microcapsule. A heat meltable material that heats up when electrical energy above a threshold is applied can be incorporated as the microcapsule shell. For example, if a particular microcapsule 10 ends up positioned so that during use of the OLED device it becomes a short between the electrodes 14, or if the microcapsule 10 is adjacent to a dust particle or other foreign inclusion, creating such a short, when an electric potential is applied between the electrodes 14, energy exceeding a predetermined threshold will pass through the microcapsule 10 causing the capsule to rupture and disconnect the short. By this construction, the microcapsule 10 is automatically removed from the path of conduction of electrical energy in the event of a short.

Figure 7:
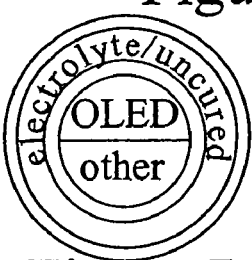
FIG. 7 illustrates an inventive microcapsule comprised of an internal phase consisting of a mixture of OLED material with other components so as to tailor the electrical, optical, magnetic and/or mechanical property of the microcapsule.

FIG. 7 illustrates an inventive microcapsule 10 comprised of an internal phase consisting of a mixture of OLED material with other components so as to tailor the electrical, optical, magnetic and/or mechanical property of the microcapsule. The other components can be field reactive, such as magnetic or electrostatically reactive materials for imparting orientation and aligning properties. Heat expandable materials can be included to provide the microcapsule 10 with the ability to burst or otherwise change shape or electrical characteristic in response to an electrical short to disconnect the microcapsule 10 and overcome the electrical short. Colorants, such as dyes and colored particles can be included to tune the light emitted from the microcapsule. Desiccant and/or scavenger material can be included to provide protection against contamination of the OLED material.

Figure 8:
FIG. 8 illustrates an inventive microcapsule comprised of a first microcapsule including an internal phase comprised of an OLED material, and a corrosion barrier material, all encapsulated within a polymer shell.

FIG. 8 illustrates an inventive microcapsule 10 comprised of a first microcapsule 10 including an internal phase comprised of an OLED material, and a corrosion barrier material, all encapsulated within a polymer shell. In accordance with this aspect of the invention, the microcapsule shell and/or internal phase may include a composition effective to provide a barrier against degradation of the OLED material. The OLED microcapsules 10 are dispersed within a carrier fluid 12. This carrier fluid 12 also provides a barrier against the intrusion of substances which degrade the OLED material.

Figure 9:
FIG. 9 illustrates an inventive microcapsule comprised of a multi-walled microcapsule structure wherein layers of corrosion barrier material are encapsulated within polymer shells with an internal phase of OLED material.

FIG. 9 illustrates an inventive microcapsule 10 comprised of a multi-walled microcapsule 10 structure wherein layers of barrier material are encapsulated within polymer shells with an internal phase of OLED material. As in the microcapsule 10 shown in FIG. 7, within the shell of the microcapsule 10 other components can be included that are field reactive, such as magnetic or electrostatically reactive materials for imparting orientation and aligning properties. Heat expandable materials can be included to provide the microcapsule 10 with the ability to burst in response to an electrical short to disconnect the microcapsule 10 and overcome the electrical short. Colorants, such as dyes and colored particles can be included to tune the light emitted from the microcapsule. Desiccant, getter and scavenger material can be included to provide protection against contamination of the OLED material.

Figure 10:
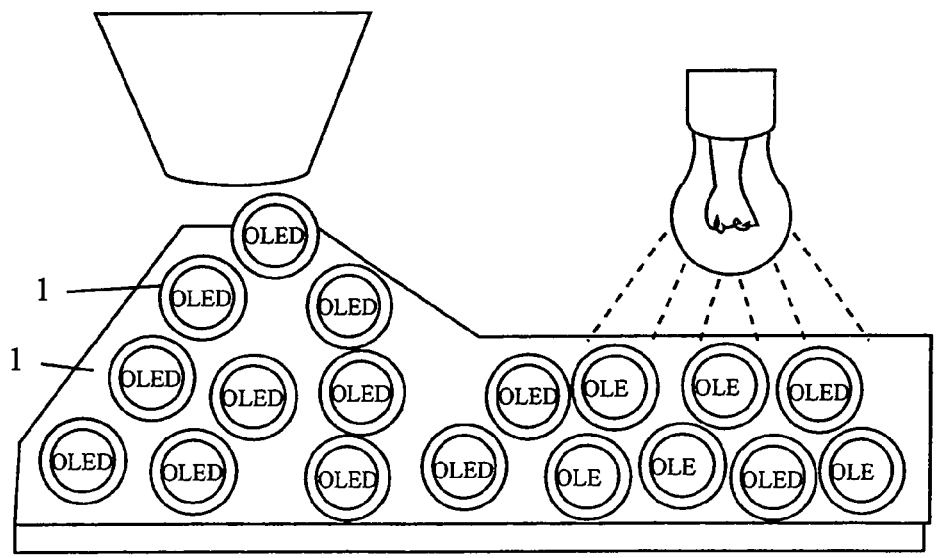
FIG. 10 illustrates an inkjet-type or other nozzle fabrication method for forming a layer of OLED microcapsules dispersed within a light curable monomer carrier.

FIG. 10 illustrates an inkjet-type or other nozzle 36 fabrication method for forming a layer of OLED microcapsules 10 dispersed within a light curable monomer carrier 12. OLED microcapsules 10 dispersed in an uncured monomer carrier fluid 12 can be utilized with inkjet printing technology to create a film of OLED microcapsules 10 contained with flexible cured monomer. The inkjet-type or other nozzle fabrication technique, such as slot-die, can be utilized to form controlled OLED deposition, with the OLED contained within a curable carrier 12. As is described elsewhere herein, desiccant particulate can be included within the carrier 12 to enhance the protection of the OLED material.

Figure 11:
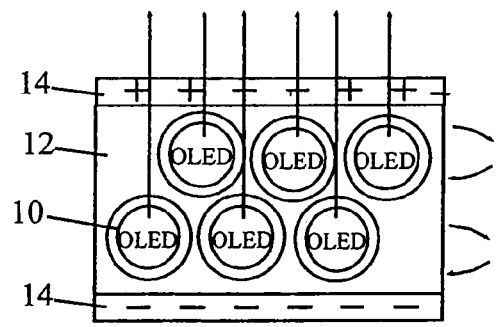
FIG. 11 illustrates a layer of OLED microcapsules fixed within a cured monomer barrier disposed between a top electrode and a bottom electrode.

FIG. 11 illustrates a layer of OLED microcapsules 10 fixed within a cured monomer barrier disposed between a top electrode 14 and a bottom electrode 14. The cured monomer and the shell of the microcapsules 10 provide a barrier to contamination from water vapor and oxygen. The OLED device can be constructed of suitably chosen materials so that the carrier material 12 is relatively less electrically conductive than the OLED particulate, this ensures that the OLED particulate offers a path of less electrical resistance than the carrier material 12. Thus, the electric potential applied to the electrodes 14 will pass through the carrier material 12, which has some electrical conductivity, and through the OLED particulate, which has relatively higher electrical conductivity. In this way, the preferred path of electrical conduction is through the OLED particulate. Likewise, the shell of the OLED microcapsules 10 is relatively less electrically conductive than the OLED material itself, so that the OLED material offers a path of less electrical resistance than the shell. Field-attractive microcapsules 10 containing OLED material randomly dispersed within a monomer carrier fluid 12 are injected or otherwise disposed between two electrodes 14. The microcapsules 10 may include additives that impart electro or magneto rheological-type properties. When used for a pixilated display layer, the microcapsules 10 form chains between the electrodes 14 when an aligning field is applied. Holding the aligning field to keep the chains formed, the carrier fluid 12 is polymerized and the OLED microcapsule chains are locked into alignment between the electrodes 14.

The problem of contamination of the OLED material is the major factor limiting the display life span, and thus far has been a bar to commercial success. The inventive fabrication method results in the moisture and oxygen sensitive OLED material being protected by the microcapsule shell and the cured carrier 12, and the pixel alignment is automatic, since the microcapsule chains are formed only between the electrodes 14 or where the aligning field is applied. This pixel array structure also greatly limits cross talk between pixels and the optical properties of the cured carrier 12 can be controlled to improve contrast, display brightness, transparency, etc. The OLED particulate in a carrier 12 disposed between two or more electrodes 14 can be utilized to create roll-to-roll sheets of displays or lights, used as "filament" in a light bulb, used to form solar cells, solar cell housing shingles, light detectors, cameras, vision aides, heads-up display windshields and the like. This OLAM construction can even be formed as fibers for light emitting flooring, wall coverings, specialty lighting, clothing, shoes, building materials, furniture, etc. The OLAM material can be injection molded, or otherwise formed using known polymer fabrication methods.

Figure 12:
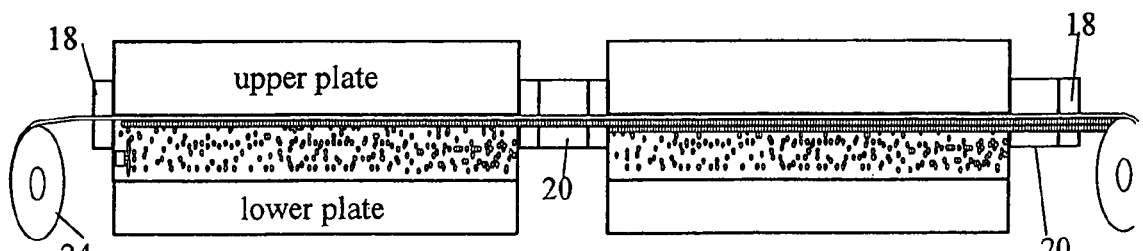
FIG. 12 illustrates sealed fabrication stations for forming a barrier protected OLED microcapsule display stratum.

FIG. 12 illustrates sealed fabrication stations 22 for forming a barrier protected OLED microcapsule display stratum. The microcapsules 10 are dispersed in a carrier fluid 12. The upper and lower plates 16 control the intensity of the attraction toward and/or between the flexible substrate 24 and sheet electrode 14. Seals 18 keep out water and air, using a vacuum airlock. The curing station 20 cures the carrier fluid 12 into a flexible water and oxygen barrier: The microcapsules 10 can be for forming emitters, detectors, various electronic circuit elements (as described in the referenced co-owned patent application). The microcapsules 10 may also be for adding other mechanical (structure, expansive, meltable, desiccant, etc.), optical (reflective, diffusive, opaque, colorant, etc.), electrical (conductive, resistive, semi-conductive, insulative, etc.). The upper and lower plate 16s are controlled to vary the attractive and/or aligning field and create controlled accumulations and alignments of the microcapsules 10. The viscosity of the fluid can also be controlled to control the accumulations of microcapsules 10 (for three-dimensional buildup, control spread of pixels, etc.). As an example, lower viscosity carrier fluid 12 with an agitator may be preferred. There can be, for example, two simultaneously applied aligning fields, magnetic and electrostatic. A mix of microcapsules 10 can be dispersed, (e.g., magnetically and conductive OLED microcapsules 10 and electrostatically conductive insulators for creating a more controllable path of least resistance).

Figure 13:
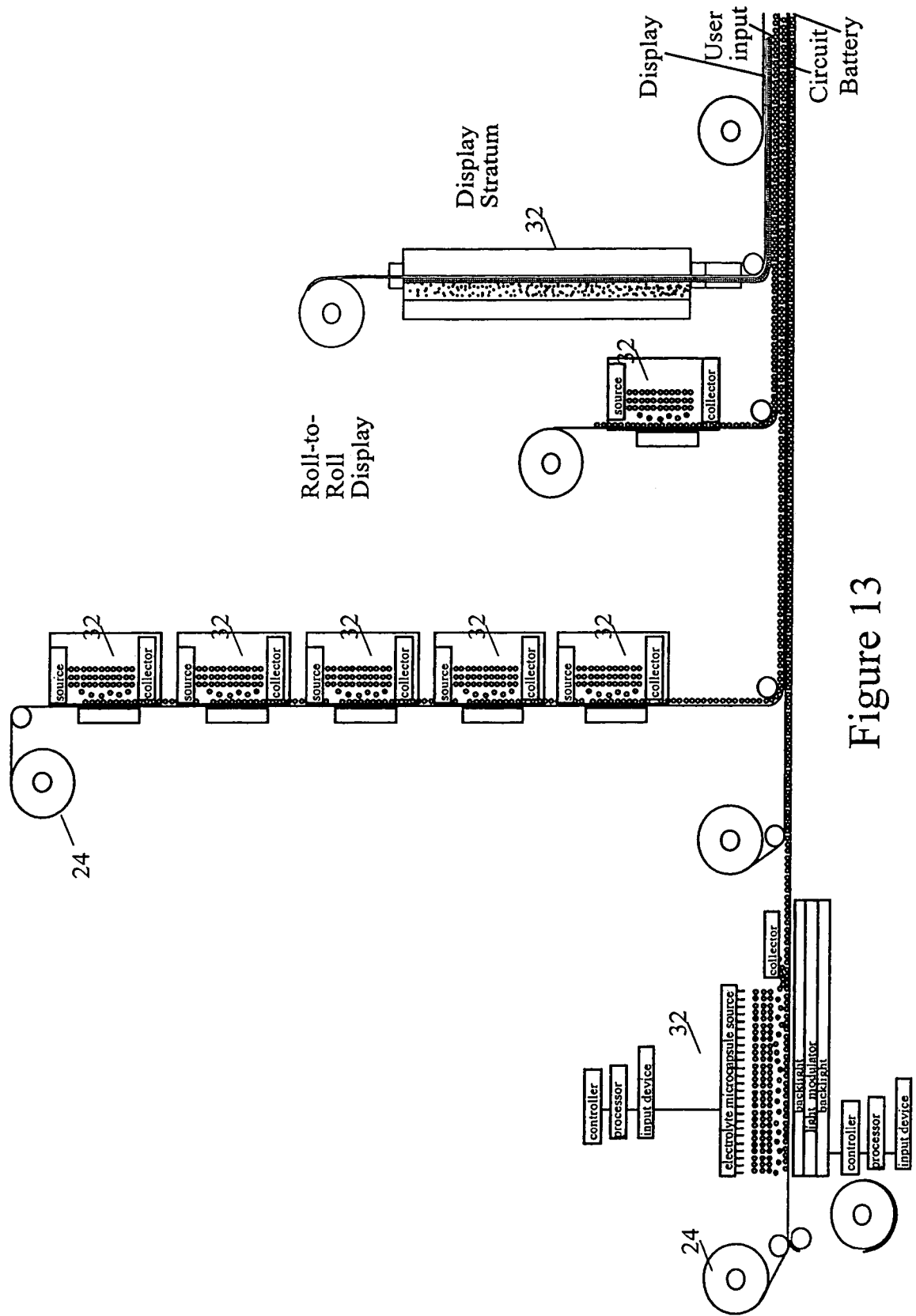
FIG. 13 illustrates an inventive display fabrication line using modular stations for forming various stratum of a thin, lightweight, flexible wireless display.

FIG. 13 illustrates an inventive display fabrication line using modular printers for forming various stratum of a thin, lightweight, flexible wireless display. Display fabrication line uses mix of different fabrication stations 22. Examples of fabrication stations 22 can be found in co-owned U.S. patent application Ser. No. 10/234,301, filed Sep. 2, 2002 entitled "Printer and Method for Manufacturing Electronic Circuits and Displays". The various layers of a display include battery, electronic circuit, user input and display stratums are formed at different fabrication stations 22. In accordance with the present invention, fabrication stations 22 for forming an OLED light emissive device is provided. A top electrode 14 and a bottom electrode 14 define a gap there between. Disposed within the gap, field reactive OLED particulates are randomly dispersed within a fluid carrier 12. Depending on the device being fabricated, an aligning field may be applied between the top electrode 14 and the bottom electrode 14 to form a desired orientation of the field reactive OLED particulate within the fluid carrier 12 between the top electrode 14 and the bottom electrode 14. The carrier 12 comprises a hardenable material, such as a light-curable liquid monomer. The carrier 12 is cured to form a hardened carrier 12 for maintaining the desired orientation of the field reactive OLED particulate within the hardened carrier 12. The OLED particulate may comprise a bipolar OLED microcapsule 10 or other OLED-based structure that is capable of forming chains between the electrodes 14.

Depending on the quality of the barrier created by the inventive fabrication method, there may be no need for additional barrier layers 30 other than substrates 24 since cured carrier 12 and microcapsule shells protect OLED material from water vapor and oxygen. Alternatively, additional barrier layers 30, including monomer, polymer, ceramic or thin metal layers can be included in the structure as needed to protect the OLED material from contamination. Each color layer can be built on the previous by fabrication method. The conductors 26 that make up the pixel electrodes 14 can also be used to fabricate the OLED microcapsule 10 structure. In this case the substrate 24 and pixel electrode 14 grid become integral parts of the completed OLED device. Further, the electric field created by applying voltage to the electrodes 14 can be used to align the OLED microcapsules 10 in chains as shown elsewhere herein. The mechanism for this alignment is similar to the phenomenon that causes electro-rheological fluids to form chains within a carrier fluid 12. In this case, the OLED microcapsule 10 or the OLED particle itself includes the appropriate material component that enables the electro-rheological effect. In addition, or alternatively, magnetic material can be employed with a magnetic field being applied as the aligning field. The light emitted from the OLED material when energized by the applied voltage can be used to cure the monomer surrounding the microcapsules 10. Thus, the voltage applied to the electrodes 14 during device fabrication are utilized to form the pixel orientation and simultaneously cure the barrier material.

Figure 14:
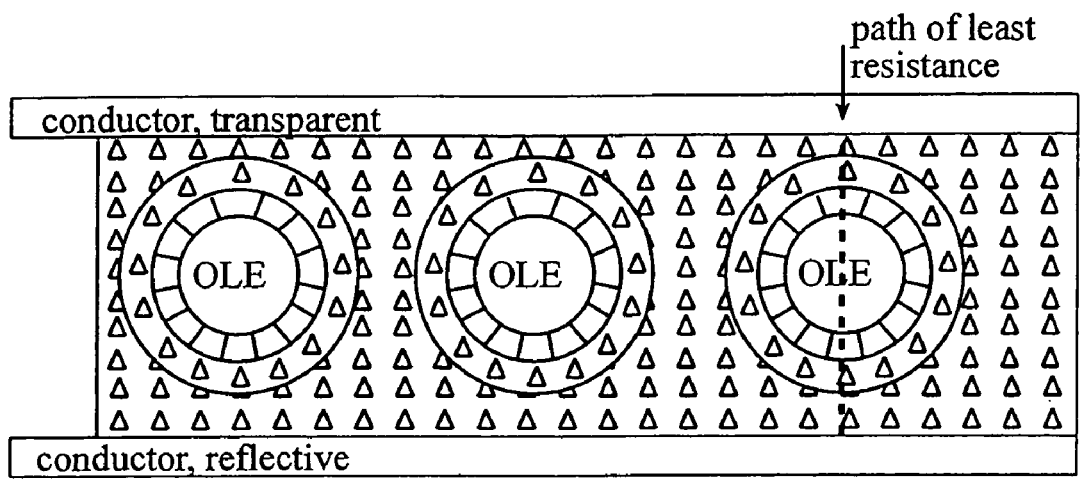
FIG. 14 illustrates a highly organized OLED microcapsule structure formed in accordance with the inventive OLED device fabrication method.

FIG. 14 illustrates a highly organized OLED microcapsule 10 structure formed in accordance with the inventive OLED device fabrication method. Pixels can be controlled down to the microcapsule 10 size, spaced apart as needed. The conductive shell having a semi-insulative or semi-conductive electrical property. The insulative or semiconductor shell creates a preferred path for the electron movement. By controlling the conductivity of the cured carrier fluid 12, the preferred path can be more pronounced through the OLED material.

Figure 15:
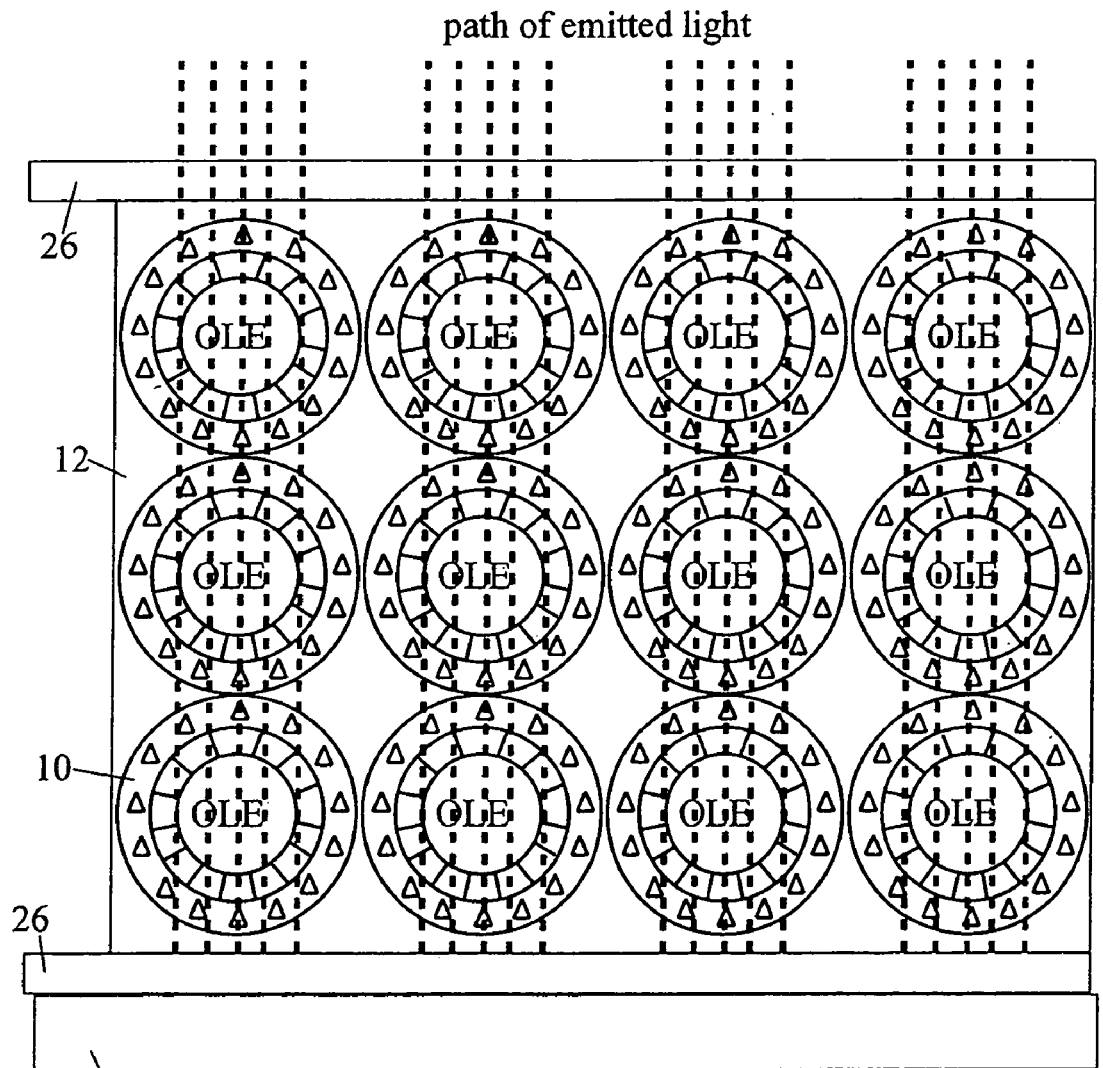
FIG. 15 illustrates a chain structure of OLED microcapsules formed in accordance with the inventive OLED device fabrication method.

FIG. 15 illustrates a chain structure of OLED microcapsules 10 formed in accordance with the inventive OLED device fabrication method. Chains of microcapsules 10 can be formed encased in a somewhat opaque cured carrier 12, creating more intense columns of light and defined pixels, or the carrier 12 can be an optical diffusion layer to create a mixing of light from adjacent pixels (with electrical cross talk between the pixels reduced or eliminated by the inventive OLED device structure). Depending on the desired optical qualities of the fabricated OLED device, the carrier material can be selected so that it has optical properties during use of the OLED device that are transparent, diffusive, absorptive, and/or reflective to light energy. During the hardening process of the carrier, it can be selectively cured so that it is more light transmissive through the volume between the top and bottom electrodes and less light transmissive or more light absorbing through the volume that is not between the electrodes. With this construction, the contrast of the display is improved and ambient light is absorbed rather than reflected from the display to reduce glare. Also, depending on the composition of the carrier material and characteristic enhancing material incorporated in it, the selective curing of the carrier fluid can control the conduction of electrical energy through it. In this way, the volume between the pixels is controlled to be less conductive than the volume between the top and bottom electrodes of each pixel. This mechanism further reduces cross talk between the pixels. In accordance with the present invention, an OLED device includes a first electrode 14 and a second electrode 14. The second electrode 14 is disposed adjacent to the first electrode 14 so that a gap is defined between them.

An OLED particulate is dispersed within a carrier material 12, which is disposed within the gap. When an electric potential is applied to the electrodes 14, the electrical energy passes through the carrier material 12 raising the energy state of the OLED particulate, resulting in the emission of light. The typical OLED includes an OLED component that is a hole transport material and an OLED component that is an electron transport material. In accordance with a formulation of the inventive microcapsules 10, the shell comprises an OLED component material that is either the hole transport material or the electron transport material, and the internal phase of the microcapsule 10 includes the OLED component material that is the other of the hole transport material or the electron transport material. Depending on the desired optical qualities of the fabricated OLED device, the carrier 12 material can be selected so that it has optical properties during use of the OLED device that are transparent, diffusive, absorptive, and/or reflective to light energy, and/or have such optical properties tuned for specific wavelengths of light.

Figure 16:
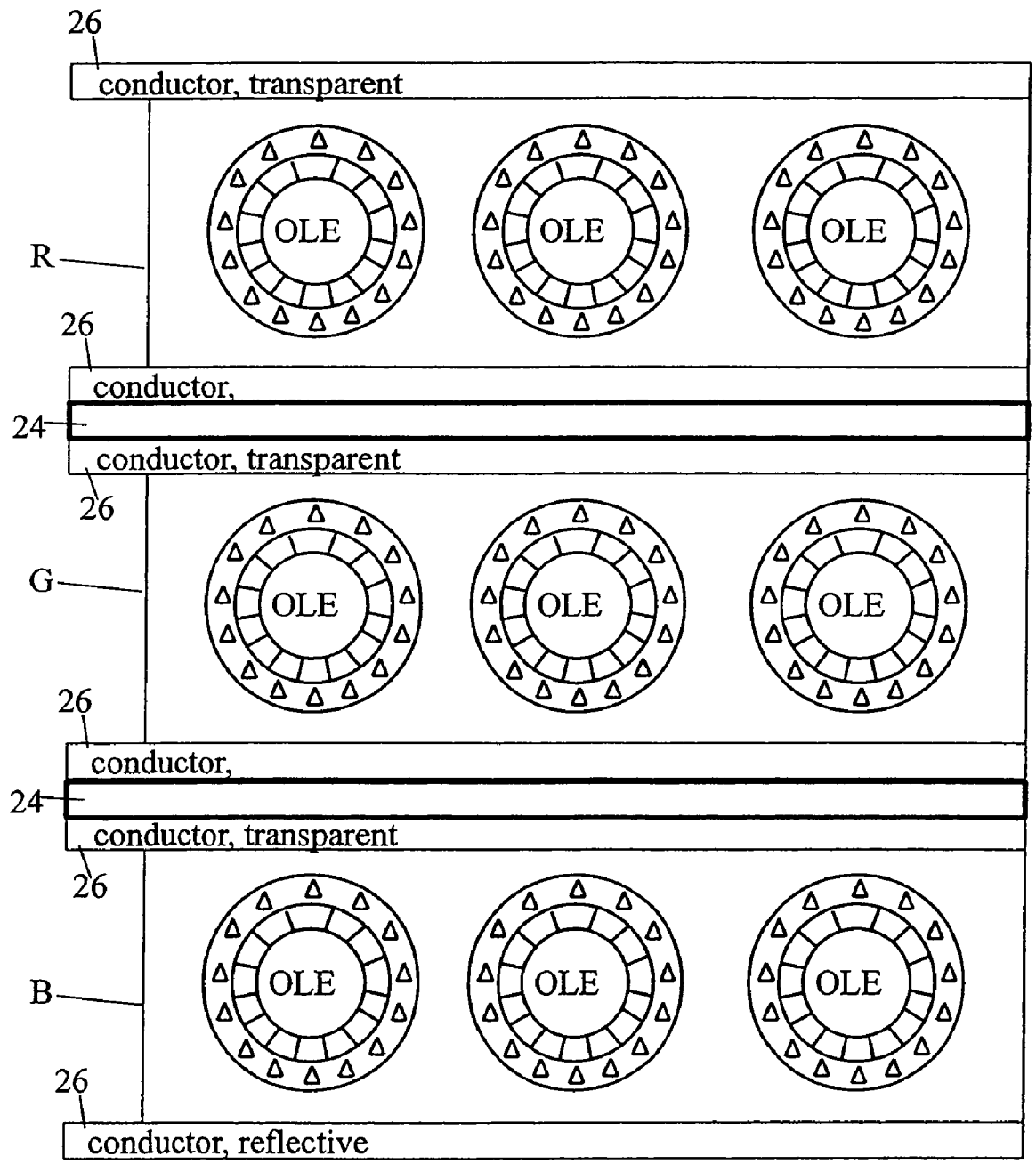
FIG. 16 illustrates a full color OLED display formed in accordance with the inventive OLED device fabrication method.

FIG. 16 illustrates a full color OLED display formed in accordance with the inventive OLED device fabrication method. The inventive microcapsule/particulate fabrication is used to create a full color emissive display. Pixels can be controlled down to the microcapsule/particulate size, spaced apart as needed. The conductive shell can have a semi-conductive, conductive or an insulative over shell. The composition creates a preferred path for the electron movement. By controlling the conductivity of the cured carrier fluid 12, the preferred path can be more pronounced. The inventive OLED device includes a first OLED pixel layer comprised of a first layer electrode 14. A second layer electrode 14 is disposed adjacent to the first layer electrode 14. A first layer gap is defined between the electrodes 14. An OLED particulate is dispersed within a carrier 12 and contained within the first layer gap. At least one subsequent OLED pixel layer is formed over the first OLED pixel layer. Each subsequent OLED pixel layer includes a first subsequent layer electrode 14. A second subsequent layer electrode 14 is disposed adjacent to the first subsequent layer electrode 14 defining a second layer gap there between. An OLED particulate in a carrier material 12 is disposed between the electrodes 14. To achieve a full color OLED display, the OLED particulate of the first OLED pixel layer emits light of a first wavelength range in response to a drive voltage being applied to the first layer electrode 14 and the second layer electrode 14. Each subsequent OLED pixel layer emits light of a different wavelength range in response to the driving voltage applied to the respective electrode 14 pairs so that an RGB color display can be formed.

Figure 17:
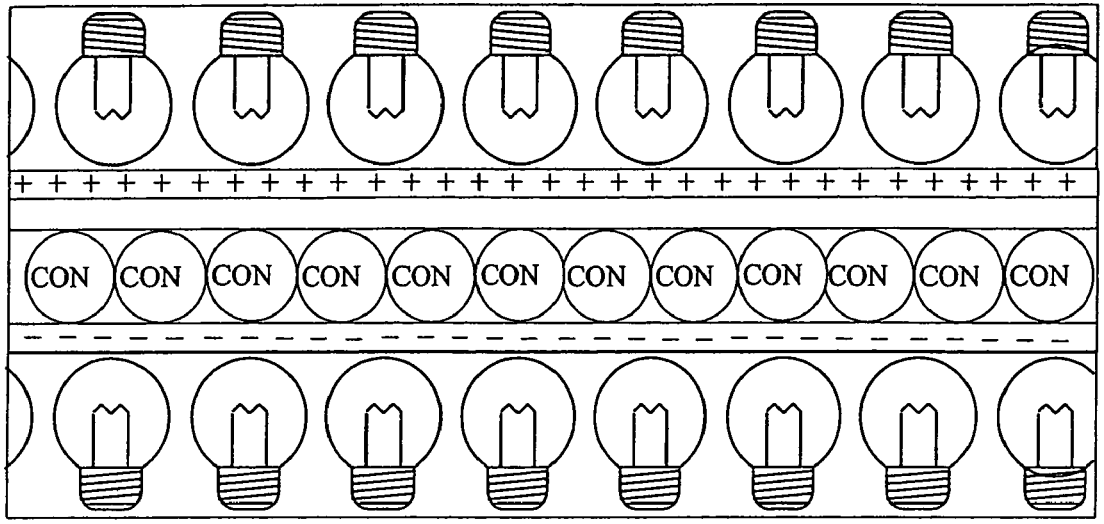
FIG. 17 illustrates a layer of conductive microcapsules for forming an electrode layer in accordance with the inventive device fabrication method.

FIG. 17 illustrates a layer of conductive microcapsules 10 for forming an electrode layer in accordance with the inventive device fabrication method. The buildup of microcapsule layers may occur in successive fabrication steps. The conductor 26 may be microencapsulated, or just a field attractive material. For example, a ferrous metal powder can be magnetically attracted to form one or more of the conductors. The OLED microcapsule 10 can be electrostatic or magnetically attractive. The carrier substrate 24 has to pass the applied field, and a second, more robust substrate may be added later, or barrier layers may be formed as needed. The carrier fluid 12 is heat or light hardenable by energy emitted from a curing source 28 to lock the microcapsules 10 in place. Alternatively, the carrier fluid 12 can be a plastic material capable of being injection molded, or a multi-part mixture such as an epoxy, a conductive powder and a hardener.

Figure 18:
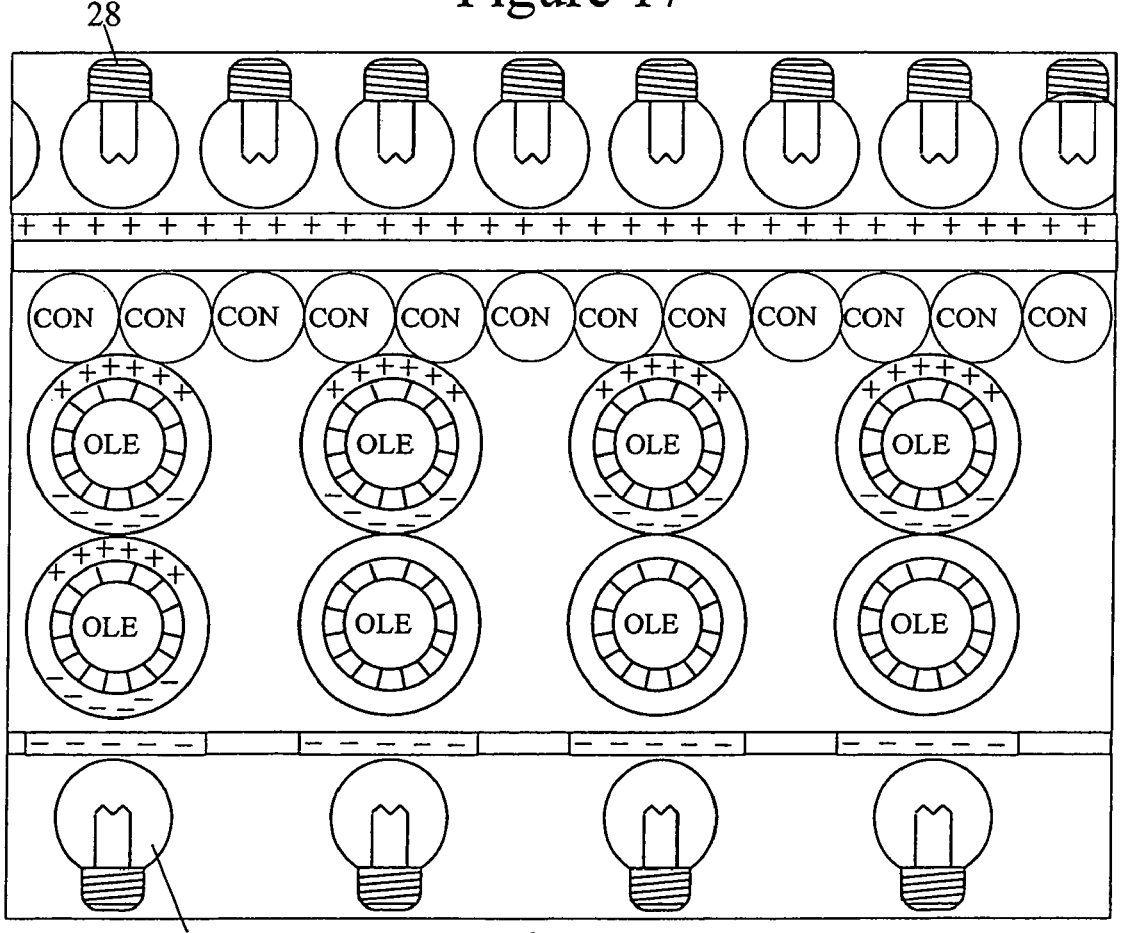
FIG. 18 illustrates the formation of OLED microcapsule chains formed on an electrode layer.

FIG. 18 illustrates the formation of OLED microcapsule chains formed on an electrode layer. Conductive pixels can be etched into optomagnetic or optoelectric coating to improve resolution. Or the location of the pixel that is energized can be controlled by light or laser pulse or other mechanism. The light curable polymer can be cured to a desired depth to capture the microcapsules 10 that have been attracted, and thus lock in, for example, a microcapsule chain having a desired length.

Figure 19:
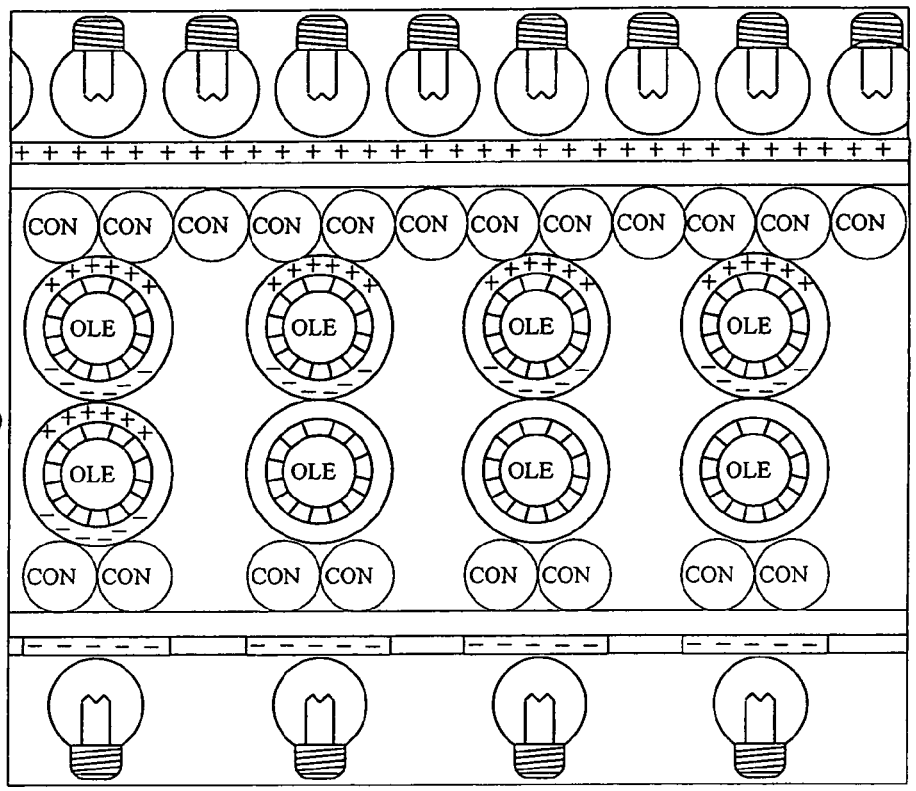
FIG. 19 illustrates the formation of OLED microcapsule chains formed between top and bottom electrode layers.

FIG. 19 illustrates the formation of OLED microcapsule chains formed between top and bottom electrode layers. The electrodes 14 can be formed in previous fabrication steps, and may be attracted by a mechanism other than the mechanism that orients the OLED particulate.

Figure 20:
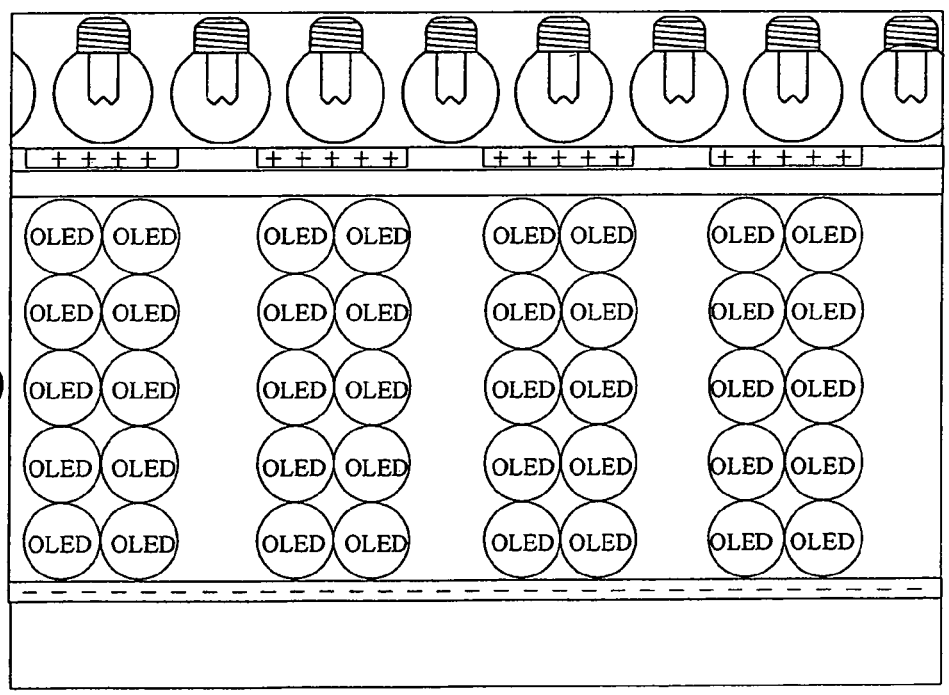
FIG. 20 illustrates the formation of OLED microcapsule chains within a cured carrier for forming a corrosion barrier.

FIG. 20 illustrates the formation of OLED microcapsule chains within a cured carrier 12 for forming a corrosion and/or contamination barrier. The substrate 24 upon which the microcapsules 10 are printed may be a multi-layered composition of polymer, cured monomer, ceramic and fiber, such as glass, creating a durable, flexible substrate 24 that is also a barrier to corrosion for the OLED (as is the microcapsule shell and the cured carrier fluid 12). The conductors 26 that make up the pixel electrodes 14 can also be used to apply the aligning field used to fabricate the OLED microcapsule structure.

Figure 21:
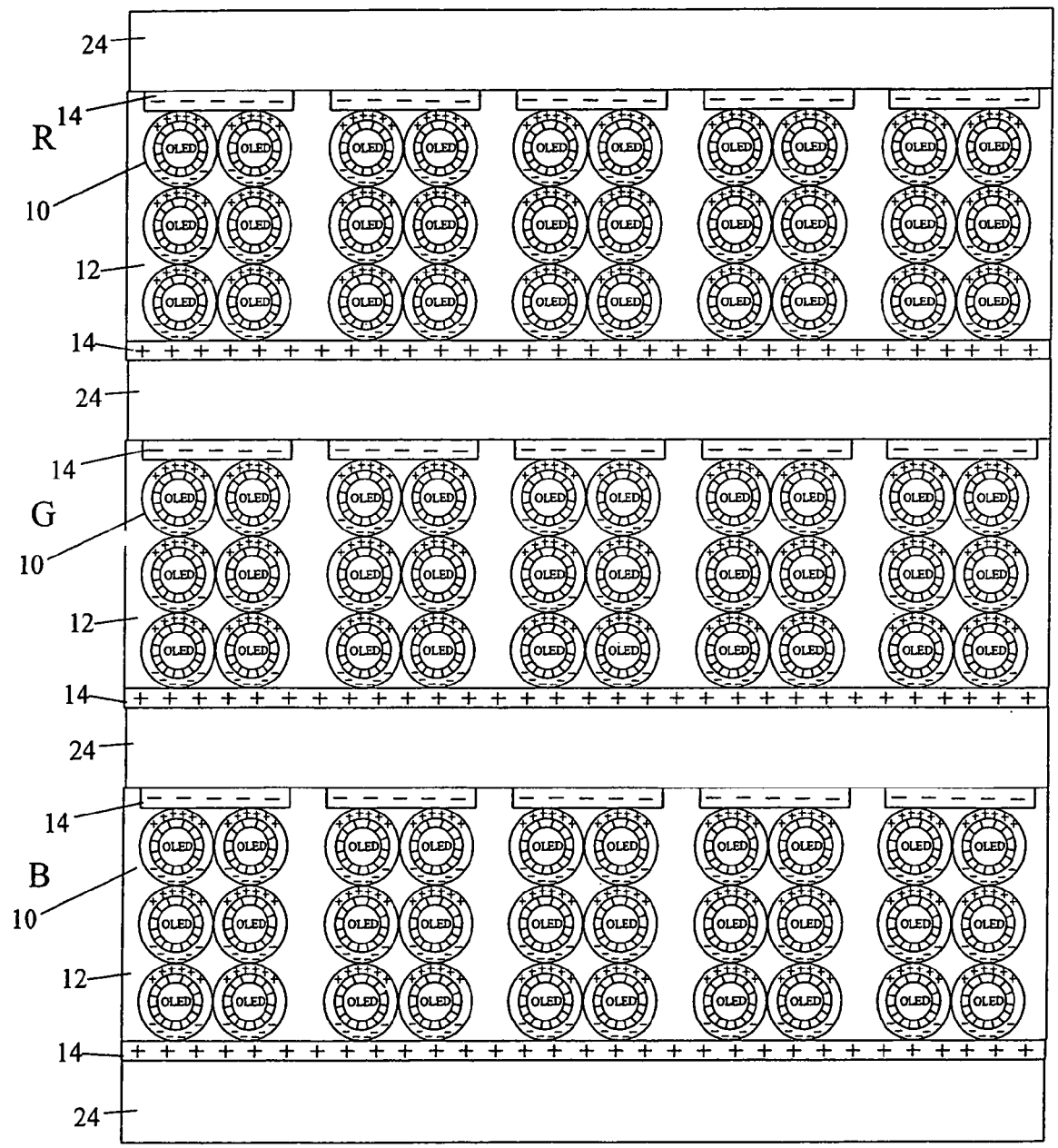
FIG. 21 illustrates a full color display formed in accordance with the inventive OLED device fabrication method.

FIG. 21 illustrates a full color display formed in accordance with the inventive OLED device fabrication method. Depending on the quality of the barrier created by the inventive fabrication method, there may be no need for additional barrier layers 30 other than substrates 24 since cured carrier 12 and microcapsule shells protect the OLED material from water vapor and oxygen. Alternatively, additional barrier layers 30, including monomer, polymer, ceramic, fiber, desiccant, getter, scavenger and/or thin metal layers can be included in the structure as needed to protect the OLED material from contamination. Each color layer can be built on the previous, by a fabrication station. The conductors 26 that make up the pixel electrodes 14 can also be used to fabricate the OLED microcapsule structure. In this case, he substrate 24 and pixel electrode grid become integral parts of the completed OLED device. The electric field created by applying voltage to the electrodes 14 can be used to align the OLED microcapsules 10 in chains as shown elsewhere herein. The mechanism for this alignment is similar to the phenomenon that causes electro-rheological particulate to form chains within a carrier fluid 12. In this case, the OLED microcapsule 10 or the OLED particle itself includes the appropriate material component that enables the Theological or phoretic effect (i.e., the movement of the OLED particulate within the carrier). In addition, or alternatively, magnetic material can be used with a magnetic field being applied as the aligning field. The light emitted from the OLED material when energized by the applied driving voltage can be used to cure the monomer surrounding the microcapsules 10. Thus, the voltage applied to the electrodes 14 during device fabrication can be utilized to form the pixel orientation and simultaneously cure the barrier material.

Figure 25:
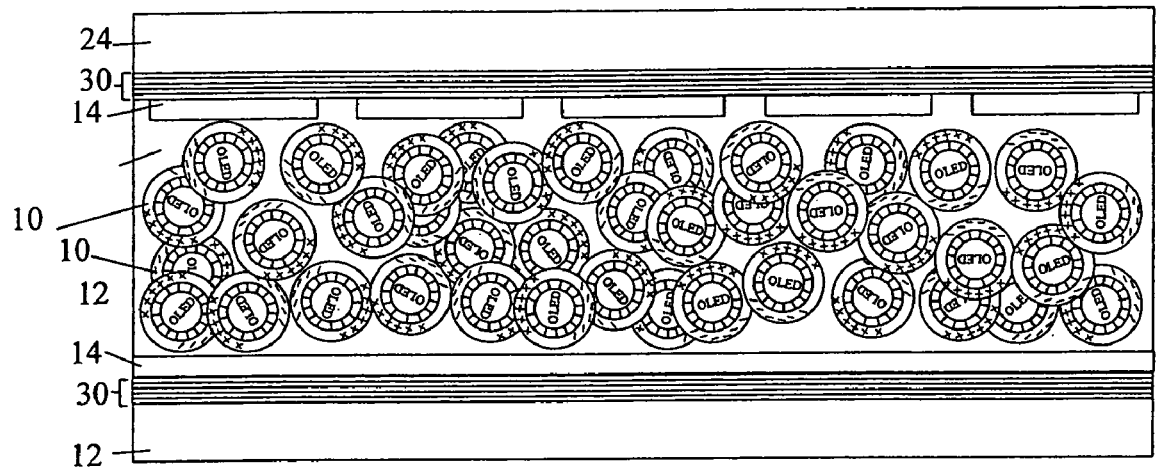
FIG. 25 illustrates step four of an embodiment of the inventive OLED device fabrication method.
Figure 26:
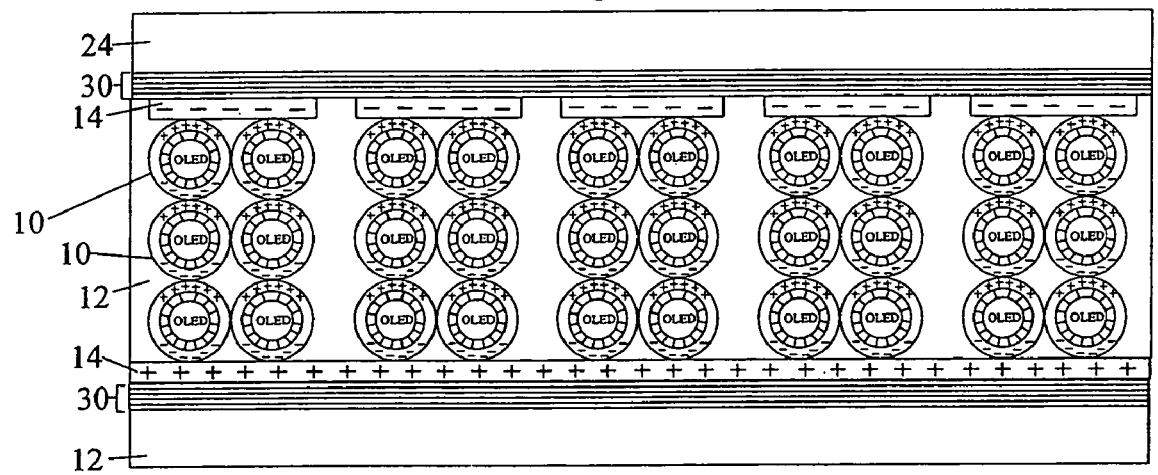
FIG. 26 illustrates step five of an embodiment of the inventive OLED device fabrication method.
Figure 27:
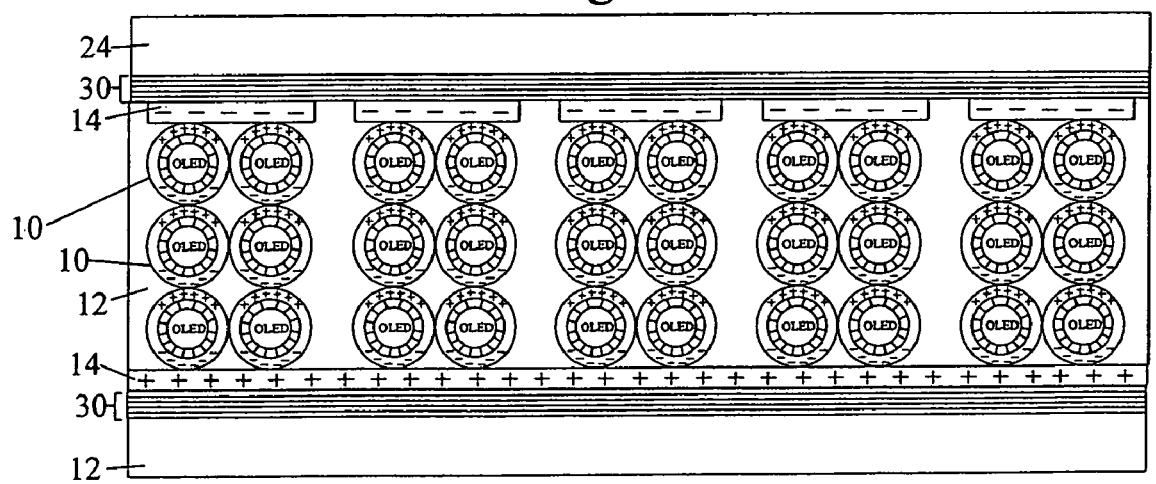
FIG. 27 illustrates step six of an embodiment of the inventive OLED device fabrication method.

FIGS. 22-27 illustrate the steps for forming an OLED device in accordance with an embodiment of the present invention. FIG. 22 illustrates step one of an embodiment of the inventive OLED device fabrication method. Step One: Provide Top and Bottom Flexible Substrates. Step Two: Form Barrier layers 30 on Top and Bottom Flexible Substrates 24 (FIG. 23). Step Three: Form Top and Bottom Electrodes 14 on Barrier layer 30 (FIG. 24). Step Four: Fill Void between Top and Bottom Electrode 14 with OLED microcapsules 10 dispersed in uncured carrier fluid 12 (FIG. 25). Step Five: Apply potential to electrodes 14 to organize OLED microcapsules and/or particulate 10 into chains (FIG. 26). Step Six: Cure carrier 12 to lock OLED microcapsule chains between the electrodes 14 to form pixels (FIG. 27). The composition of the OLED particulate can be selected so that the characteristics of the OLED particulate includes an electro or magneto Theological or phoretic characteristic. This rheological or phoretic characteristic is effective for causing the OLED particulate to orient and/or migrate in an applied aligning field.

FIG. 28 shows a magnetically reactive OLED microcapsule 10 for forming a capacitor OLED microcapsule 10 with the aligning field from an aligning field source 32 turned off. An OLED microcapsule 10 is formed having a capacitor capability.

An OLED material internal phase is encapsulated within a first shell. An electrolyte surrounds the first shell and a second shell encapsulates the first shell and the electrolyte. The OLED material internal phase includes a field reactive material. The field reactive material comprises at least one of a magnetically reactive material and an electrically reactive material effective to orient the OLED microcapsule 10 within an aligning field applied from the aligning field source 32. By this construction, OLED material and field attractive material, such as magnetic material, are microencapsulated within an electrically conductive shell, forming an OLED/Mag internal core. The OLED/Mag internal core is microencapsulated along with a mixture of electrolyte and light curable monomer liquid phase within a second electrically conductive shell. The microcapsule shell material is selected to have the appropriate breakdown voltage at which charge conduction occurs. The microcapsules 10 act as capacitor elements that are, for example, charged up with a charging voltage. A trigger voltage is then applied when the OLED pixel is to emit light.

FIGS. 28-30 illustrate the formation of an OLED/Capacitor microcapsule. OLED material and field attractive material, such as magnetic material, are microencapsulated within an electrically conductive shell, forming an OLED/Mag core. The OLED/Mag core is microencapsulated along with a mixture of electrolyte and light curable monomer liquid phase within a second electrically conductive shell. The microcapsule shell material is selected to have the appropriate breakdown voltage at which charge conduction occurs. FIG. 29 shows a magnetically reactive OLED microcapsule 10 for forming a capacitor OLED microcapsule 10 with the magnetic aligning field turned on with uncured electrolyte mixture. FIG. 30 shows a magnetically reactive OLED microcapsule 10 for forming a capacitor OLED microcapsule 10 with the magnetic aligning field turned on with cured electrolyte mixture. In accordance with this composition of the OLED microcapsule, the internal phase comprises OLED material and a magnetically reactive material disposed within a first shell. An electrolyte and a curable fluid material surround the first shell. A second shell encapsulates the first shell, the electrolyte and the curable material. In response to an applied magnetic field, the position of the first shell is changeable relative to the second shell. Upon curing the curable material, the position of the first shell relative to the second shell is locked in place. This microcapsule 10 structure can be used to form capacitors/OLED microcapsules 10 which may be particularly effective for use in passive matrix displays. Typically, a passive matrix display is driven with a relatively high driving energy so that the emission of light by a driven pixel is intense. This intensity overcomes the short driving time of the pixel (as compared with the more controllable active matrix backplane). This passive matrix driving scheme results in shorter display life, higher power consumption and lower display quality. When a charging voltage is applied (such as during a charging scan of a passive matrix OLED display grid), the capacitor elements of the microcapsule 10 store applied electrical energy. The charging voltage can be controllably applied to selected pixels and in multiple scans to vary the stored charge in the microcapsules 10 associated with each pixel. When a trigger voltage is applied (during the display writing scan), the OLED material emits light in response to the trigger voltage and in a manner dependent on the stored charge. With the proper selection of microcapsule 10 materials, an RC circuit is formed giving the OLED pixel an increased and more controlled light emission time and intensity.

FIG. 31 shows a pixel comprised of a chain of capacitor OLED microcapsules being charged by a charging voltage. FIG. 32 shows a pixel comprised of a chain of capacitor OLED microcapsules being triggered for light emission by a trigger voltage. The microcapsules 10 act as capacitor elements that are charged up with a charging voltage. A trigger voltage is then applied when the OLED pixel is to emit light. Alternatively, the charging voltage may just result in the emission of light, but the RC circuit nature of the OLED microcapsule creates a longer light emission pulse than the voltage charging pulse, resulting in a higher quality passive matrix displayed image.

Figure 33:
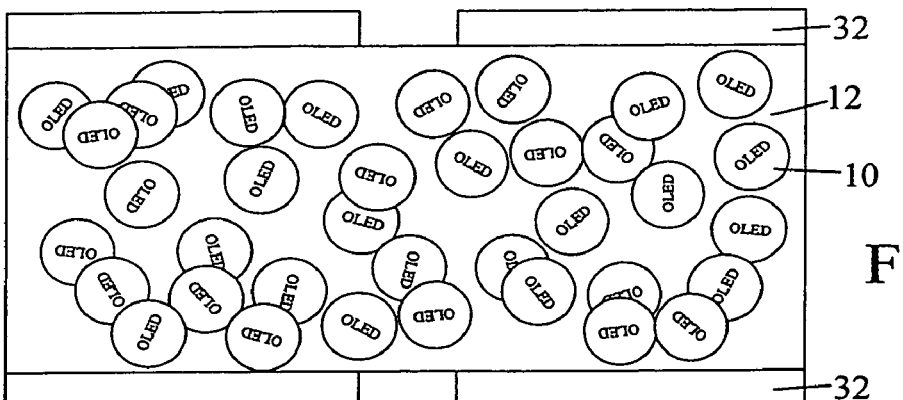
FIG. 33 shows OLED microcapsules randomly dispersed within a fluid but hardenable carrier fluid.

FIG. 33 shows OLED microcapsules 10 randomly dispersed within a fluid but hardenable carrier fluid 12. A first electrode 14 and a second electrode 14 are provided defining a gap there between. Within the gap, field reactive OLED particulate is randomly dispersed within a fluid carrier 12. The electrodes 14 can be preformed on a substrate, such as glass. Alternatively, one or both grids of electrodes 14 can be preformed on a flexible carrier 12 enabling roll-to-roll manufacturing. The inventive fabrication technology overcomes the last hurdles to widespread commercialization of OLED devices. In the first step of the inventive fabrication method, a mixture of randomly dispersed OLED particulate in a fluid conductive carrier is disposed between a grid of x and y electrodes. The electrodes are pre-patterned on a top and bottom substrate (shown, for example, in FIGS. 13, 107 and 108). The substrates are a flexible polymer. Because of the barrier qualities of the carrier, elaborate encapsulation layers are not required.

Figure 34:
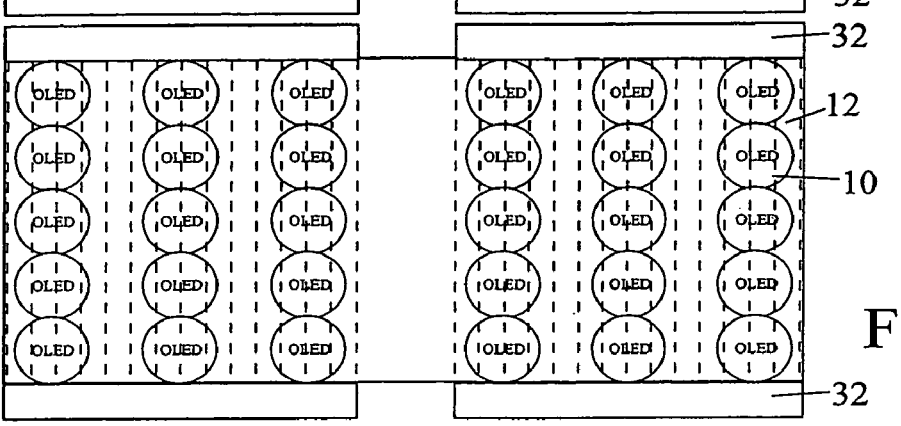
FIG. 34 shows OLED microcapsule chains aligned within an applied aligning field formed within unhardened carrier fluid.

FIG. 34 shows OLED microcapsule chains aligned within an applied aligning field formed within unhardened carrier fluid 12. Upon application of an aligning field, the OLED field-reactive material orient along the field lines and form chains within the still-fluid carrier 12 (analogous to electro rheological fluid mechanics). The next step is to apply an aligning field selectively to the volume between the x- and y-electrodes.

The randomly dispersed particulate orient and migrate under the influence of the aligning field to form pixels of aligned OLED particulate.

Preferably, the spaces between the pixels are devoid of any particulate. The composition of the carrier and the particulate are selected so that the preferred path of electrical conductivity is through the aligned particulate. This structure makes most efficient use of the OLED material and eliminates cross talk between the display pixels.

Figure 35:
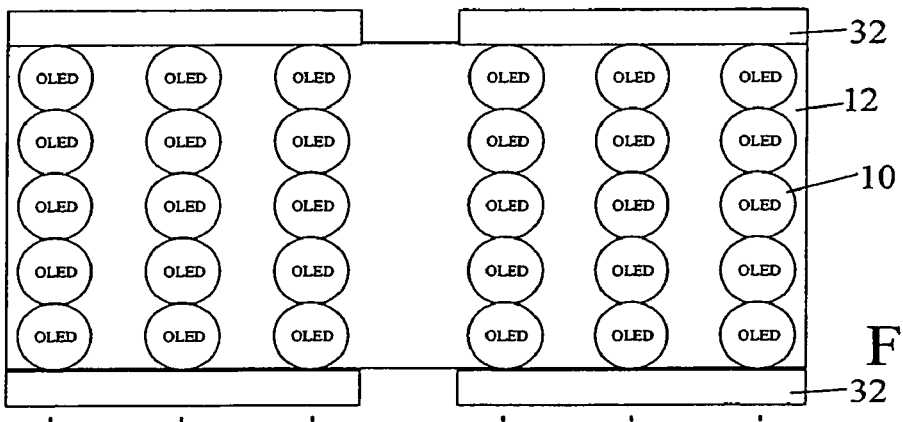
FIG. 35 shows OLED microcapsule chains aligned within an applied aligning field held in alignment within hardened carrier.

FIG. 35 shows OLED microcapsule chains aligned within an applied aligning field held in alignment within hardened carrier 12. With the aligning field still applied, the carrier 12 is cured (for example, using light or heat) to form a solid phase to lock the chains of OLED field-reactive material into position. With the proper selection of carrier 12 material, the OLEDs can be energized to create the curing light to simplify the fabrication process. Alternatively, a light source 28 such as a laser or other light emitter, can be used to controllably apply the curing light. The aligning field maintains the position of the particulate while the carrier is cured. The carrier changes from a fluid monomer to a hardened cross-linked polymer by applying ultraviolet light. The formation and preservation of ultra-thin layers of organic material is not necessary. The gap between the x- and y-electrodes is much wider, so many of the problems of the current state-of-the-art OLED fabrication methods are avoided. The resulting display structure is flexible, solid-state and highly robust.

Figure 36:
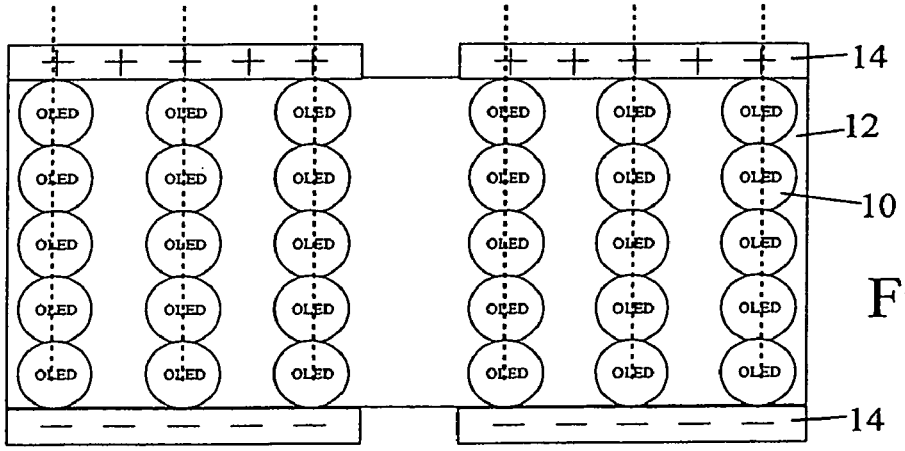
FIG. 36 shows the OLED microcapsule structure shown in FIG. 35 with a drive voltage applied and light being emitted from the OLED microcapsule chains.

FIG. 36 shows the OLED microcapsule 10 structure shown in FIG. 35 with a drive voltage applied and light being emitted from the OLED microcapsule chains. 291

When a voltage is applied to the electrodes 14, the OLED chain enables hole and electron movement, raising the energy state of the OLED material and generating light. The completed display consists of point sources of light emission (aligned particulate) in a solid-state protective matrix (hardened carrier). The resulting device structure is impervious to water and oxygen. The much wider gap between the electrodes greatly reduces the problem of dust and particle contamination. If a short between the electrodes does occur, the structure is self-healing by automatically disconnecting the short without losing a pixel. During fabrication, pixel electrode alignment occurs automatically and precisely. Extremely high resolution, full color, large-sized video displays are obtainable. Cross talk between pixels is eliminated, and there is no need for any elaborate device encapsulation. The inventive fabrication process is readily adaptable to roll-to-roll processing on flexible plastic substrates using the adaptation of well-established polymer film fabrication methods.

Figure 37:
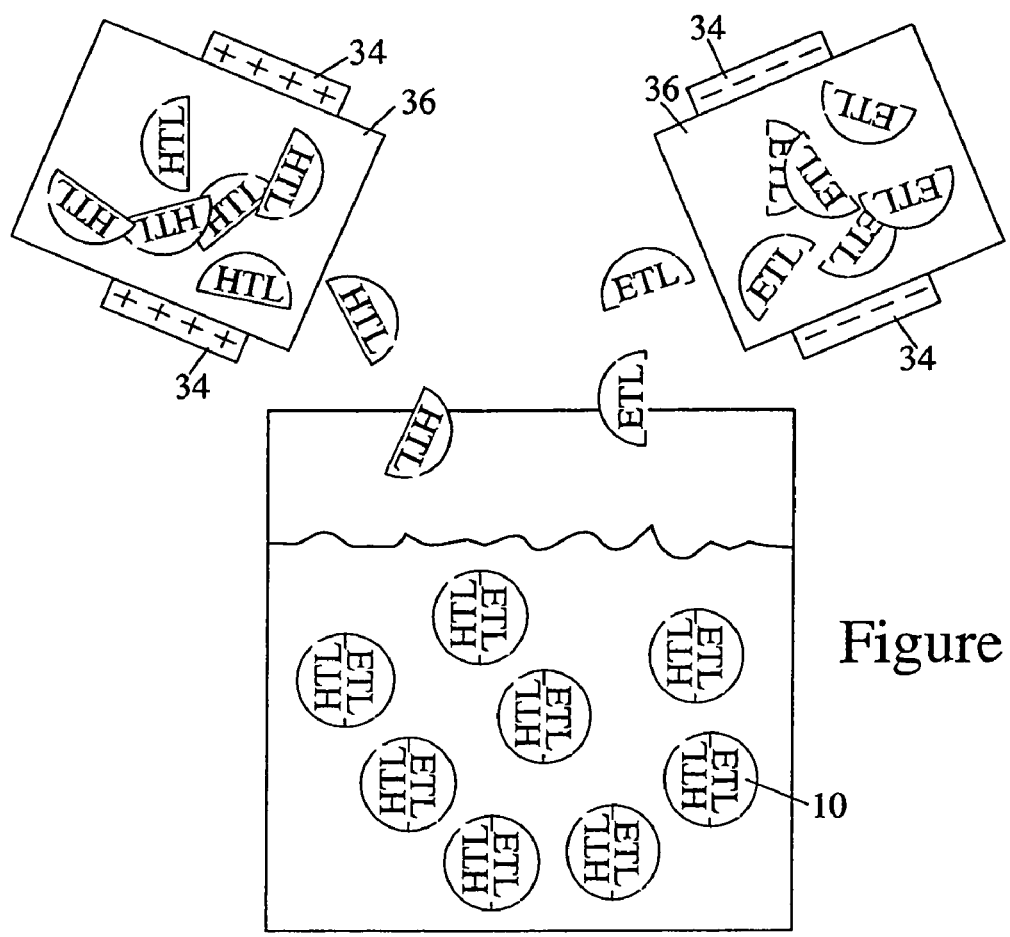
FIG. 37 illustrates a method for forming an OLED particulate having a hole transport layer and an electron transport layer.

FIG. 37 illustrates a method for forming an OLED particulate having a hole transport layer and an electron transport layer. Hole transport material and electron transport material are combined to form stable particles. FIG. 37 illustrates the formation of an OLED particle. Hole transport material having a net positive charge and electron transport material having a net negative charge are mixed together in a liquid so that the opposing polarities of the particles creates an attractive force resulting in electrically stable particles. The OLED particulate is formed by providing a first particle, comprised of a hole transport material that has a net positive electrical charge. A second particle is provided comprised of an electron transport material having a net negative electrical charge. The hole transport particle and the electron transport particle are brought together in a liquid and combined to form a unified OLED particulate having a hole transport layer and an electron transport layer forming a heterojunction between them.

Figure 38:
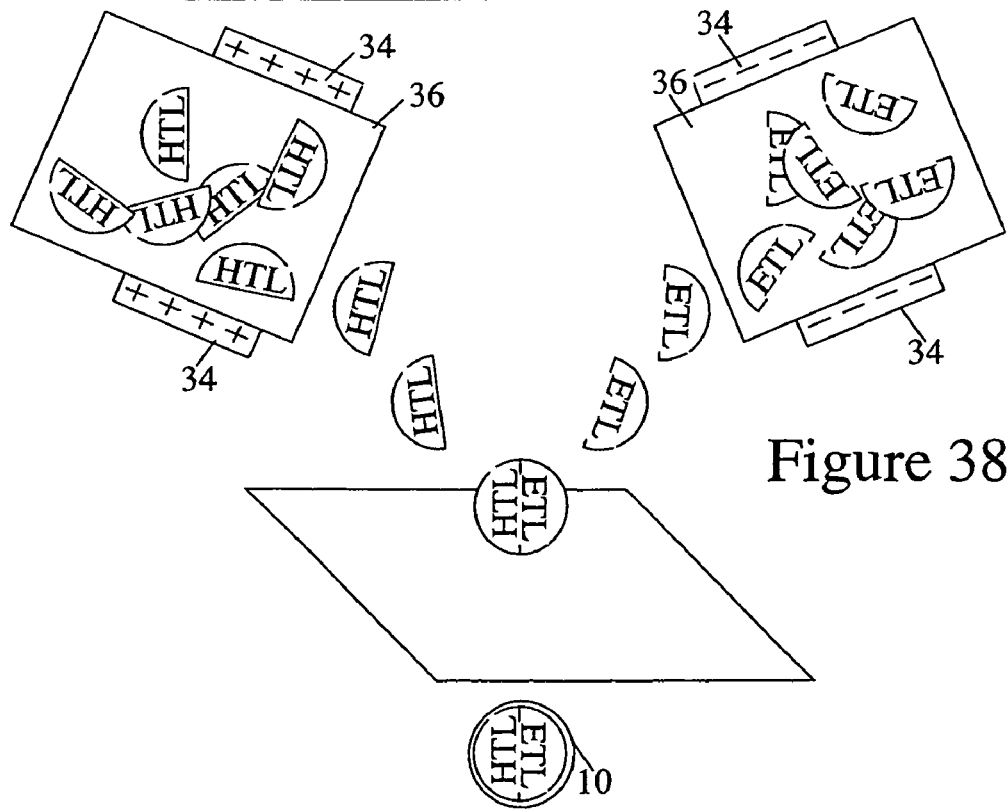
FIG. 38 illustrates a method for forming an encapsulated OLED particulate.

FIG. 38 illustrates a method for forming an encapsulated OLED particulate. The hole transport material and the electron transport material can be combined into a single particle by ejecting the constituent particles towards each other. The positive and negative charges will attract to form an electrically neutral bipolar particle. This particle may be coated with an encapsulating shell or left uncoated.

FIGS. 39-41 show the steps for forming a multi-layered OLED particle. In this case, as shown in FIG. 39, individual particles of electron transport material are imparted with a net negative electrical charge by a charge source 34 and ejected from a nozzle 36. Particles of a blocking material are imparted with a net positive charge and ejected from a second nozzle 36 towards the stream of electron transport material particles. Field applying electrodes 38 may be provided for directing the respective charged particles so that they combine together to form an electrically neutral dual layer particle. The field applying electrodes 38 may also be useful for attracting and removing from the combined particle stream the charged particles that do not combine in the dual layer particle. In a similar manner, a dual layer hole transport and photo active layer particles can be ejected with induced charges and directed to combine into a dual layer particle containing the hole transport material and the photo active material. As shown in FIG. 41, the two dual layer particles are imparted with opposite electrical charge and ejected from nozzle 36 towards each other where they combine to form the completed multi layered OLED particulate. The amount of charge induced in the particles can be controlled to adjust the alignment of attracted constituents. The number of layers and their order can also be controlled as needed.

The OLED particulate comprises layered organic particles, which include a hole transport layer and an electron emitter layer. A heterojunction is formed at the interface between the hole transport layer and the electron emitter layer. Each layered organic particle may also include a blocking layer adjacent to the electron emitter layer and an emissive layer adjacent to the hole transport layer, thereby forming a stacked organic layered structure. The blocking layer is provided for facilitating the proper flow of electrons and hole, and the emissive layer is provided for facilitating the emission of photons when the energy state of the OLED particulate is raised.

FIG. 40 illustrates a second step in forming a multi-layered OLED particulate. The amount of charge induced in particles can be controlled to adjust alignment of attracted constituents. FIG. 41 illustrates a third step in forming a multi-layered OLED particulate. Relatively weak attractive field keeps layered particles properly aligned, without causing attachment of particles to electrodes 14. The relatively more negatively attractive ETL side attracted to a positive attractive force. More positive towards one end, with an overall net positive charge on HTL/EML layered particle and more negative towards another end, with an overall net negative charge on ETL/BL layered particle. With the proper selection of constituent materials, the electrical properties of the HTL and ETL material should be effective to cause the larger degree of induced charge to occur at the ends of the layered particles.

The OLED particulate may comprise a bipolar OLED microcapsule. The OLED particulate is formed by the steps of first providing a first particle comprised of a hole transport material. The hole transport material has a net first electrical charge. A second particle comprised of an electron transport material is provided having a net second electrical charge. The first electrical charge is of opposite polarity from the second electrical charge. The first particle and the second particle are brought together to form a unified OLED particulate having a hole transport layer and an electron transport layer forming a heterojunction between them. The first particle may further include a photon-active layer. This photon-active layer may be a light emissive layer in which case the OLED forms a light emitting device, or a light receptive layer, in which case the OLED forms a light-detecting device.

Figure 42:
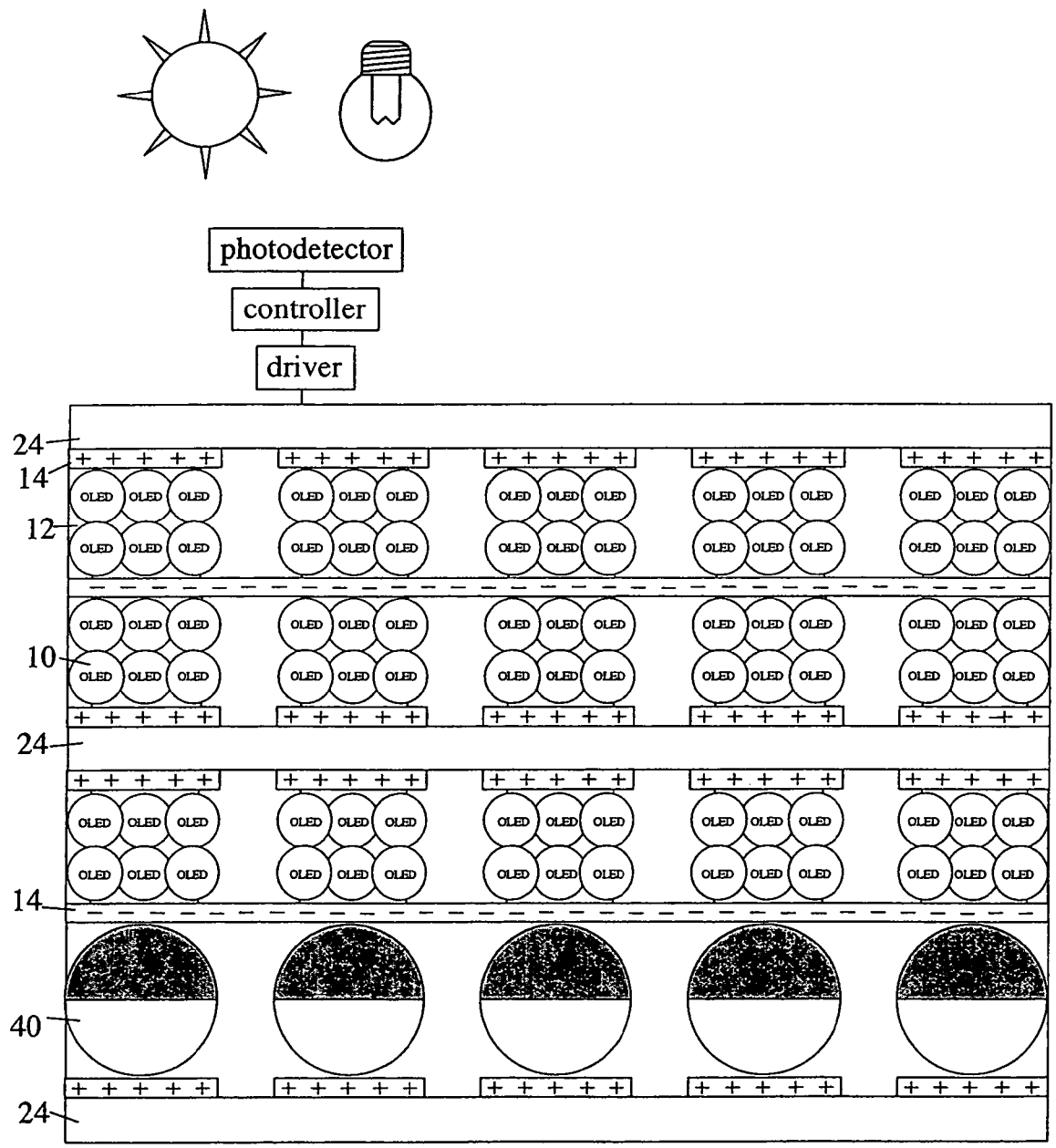
FIG. 42 schematically shows a full-color OLED display constructed in accordance with the present invention, and having a dichromatic display layer for improving the display contrast, power efficiency and for providing display viewing in bright sunlight.

FIG. 42 schematically shows a full-color OLED display, constructed in accordance with the present invention, having a dichromatic display layer for improving the display contrast, power efficiency and for providing display viewing in bright sunlight. The dichromatic display layer may be formed, for example, using a conventional LCD pixilated light modulator layer. Further, the dichromatic display layer can be comprised of dichromatic microcapsules that can be oriented to reflect or absorb impinging light using an aligning field. The microcapsules 40 can be electrophoretic and oriented using an applied electrical field. In this case, the electrophoretic microcapsules 40 are electrically reactive. Alternatively, in accordance with the present invention, the dichromatic microcapsules may be magnetically reactive. In this case, the microcapsule can be constructed having a north magnetic pole and a south magnetic pole, each pole being associated with a respective color of a bi-color microcapsule (e.g., reflective/absorbtive). A construction similar to the capacitor/OLED microcapsule shown in FIGS. 28-32 can be used to create microcapsules that can be controllably oriented in an applied magnetic field. The dichromatic display layer provides a light reflective display for use in bright sunlight and other appropriate ambient light conditions, as well as other display enhancing effects. The dichromatic pixel layer can be formed adjacent to the last subsequent OLED pixel layer. This dichromatic pixel layer results in a display that can be viewed in direct bright sunlight as well as with improved contrast in indoor ambient lighting conditions. Further, additional subsequent OLED pixel layers can be provided which emit light in additional color range having a color and/or light intensity different from the color and/or light intensity of the other OLED pixel layers.

To control the reflection of the emitted light from the OLED RGB pixels in automatic mode the OLED brightness and the reflection/absorption dichromatic microcapsule 40 is automatically controlled to optimize power consumption and display quality. Photodetection elements are used to determine the level of ambient light and adjust the reflection/absorption/image displaying capabilities of the inventive display. Further, the inventive OLED device can be configured so as to detect light impinging on a pixel grid formed in accordance with the present invention. In this case, the OLED particulate of a first OLED pixel layer emits electrical energy in response to the reception of photons and applies the electrical energy as a detectable signal to the first and second layer electrodes 14. Further, a black and white and/or full color CCD-type camera can be formed, by tuning the wavelength range at which subsequent layers of OLED pixels are photo reactive. Photodetectors are used to determine when to use dichromatic display elements. If the dichromatic pixels (e.g., dichromatic microcapsules 40) are turned to the reflection side, OLED emission will be reflected and more light emitted from the display. If turned to the absorption side, better display contrast may be obtained. If the OLED layers are turned off, the dichromatic pixels become a reflective (or two color) display for use in bright light or energy saving conditions. This driving scheme requires very low power—only have to apply power to the pixels to change orientation, then the state remains until power is applied again. For applications such as cell phones, the ability to see a display in bright light is an important consideration. When the phone is in bright sunlight, the dichromatic display elements are used and the OLEDs are off and transparent (the display is reflective and can monochrome (e.g., a black and white display) or full color). When the phone is indoors or in lower ambient light, the emissive pixels are used (full color display). As examples of how the dichromatic display layer improves the inventive display, under normal ambient light (indoor, office lighting) the dichromatic microcapsules 40 can be oriented to absorb the reflection of ambient light to improve the contrast of the display.

In low ambient light (airplane, car, dusk) the dichromatic display elements can be turned oriented to reflect the OLED emission so that the OLED display elements can be driven with lower energy consumption. The dichromatic display elements can be automatically oriented and controlled to provide power savings and improve contrast. Light filters and side/side pixels can be mixed with the display stack to create a variety of display options. Further, IR and other emitters and detectors can also be included to create "invisible" maps that can only be read with night vision aides. Other display possibilities include windshields that automatically block out high light sources like the sun and oncoming high beams; and goggles that enhance vision, provide night vision, and include telescopic and stereoscopic capabilities.

Figure 43:
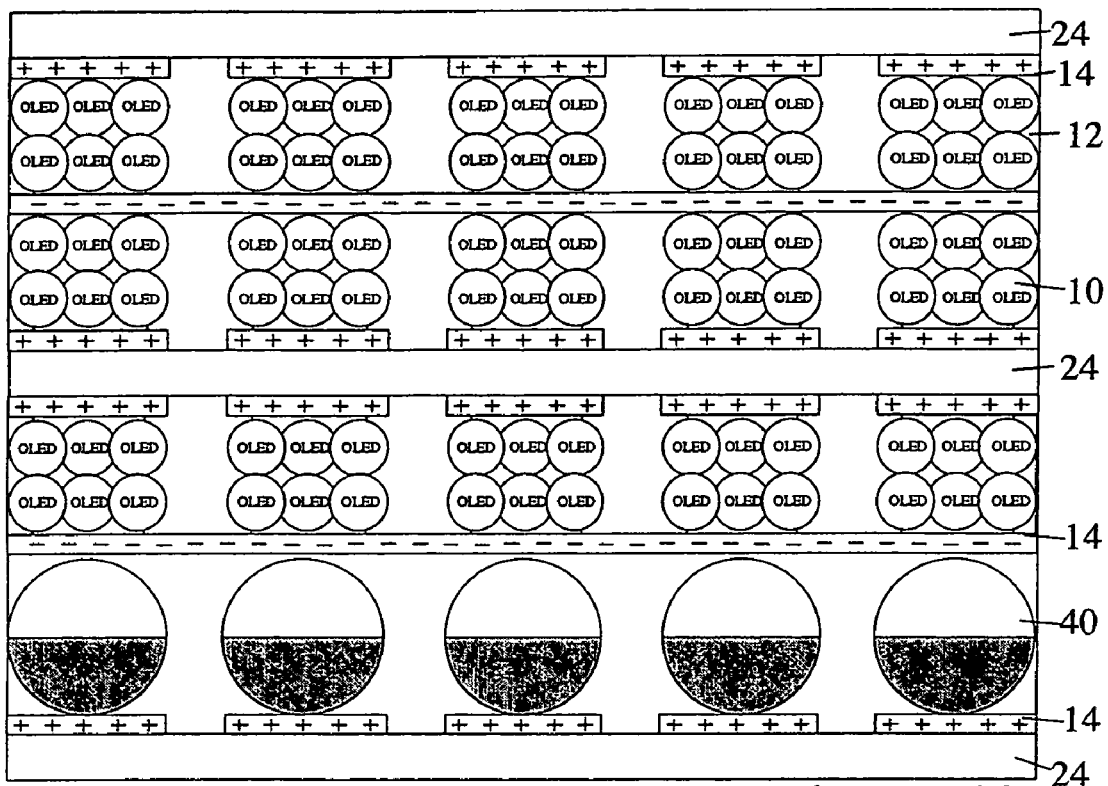
FIG. 43 schematically shows the full-color OLED display shown in FIG. 42, with the dichromatic pixels oriented for reflecting emitted OLED light.

FIG. 43 schematically shows the full-color OLED display shown in FIG. 42, with the dichromatic pixels oriented for reflecting emitted OLED light. When the dichromatic picture elements are reflective (oriented so that the reflective side of the sphere is facing toward the emissive side of the display), then the light emitted from the OLED elements is reflected for use in forming the display image. The orientation of the dichromatic picture elements can be automatically controlled depending on the ambient light detected by a photodetector.

Figure 44:
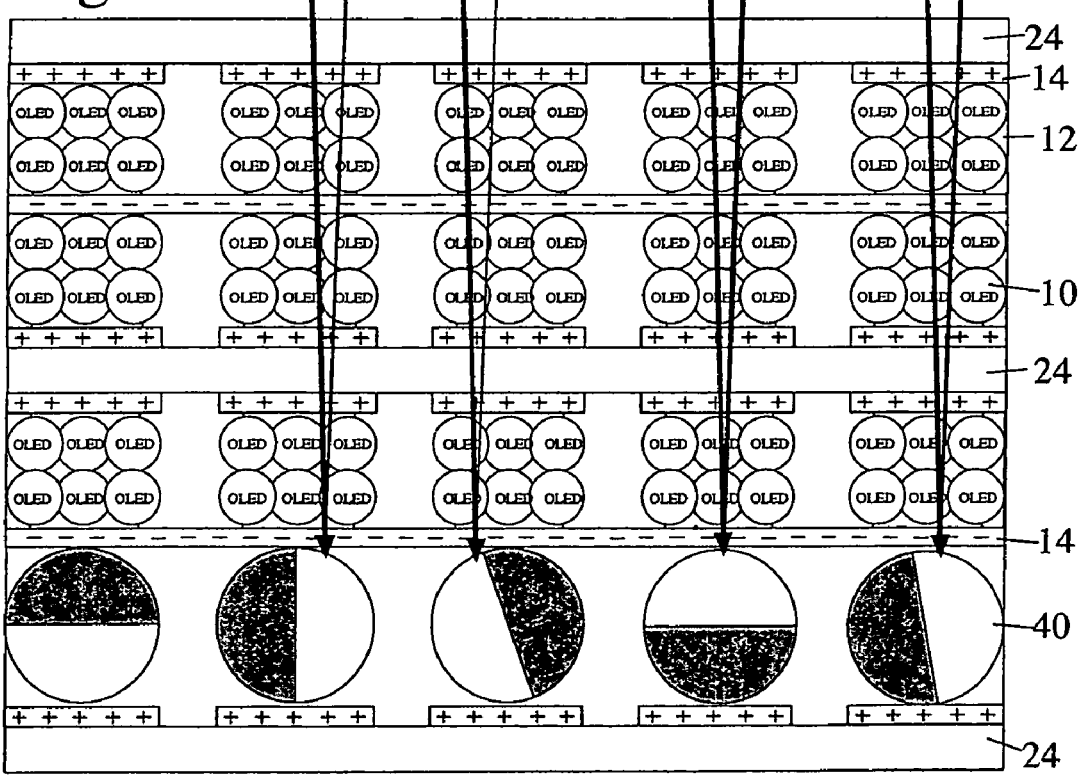
FIG. 44 schematically shows the full-color OLED display shown in FIG. 42, showing the relative strength of reflected light depending on the dichromatic pixel orientations.

FIG. 44 schematically shows the full-color OLED display shown in FIG. 42, showing the relative strength of reflected light depending on the dichromatic pixel orientations. The orientation of each respective pixel stack's dichromatic pixel element, determines the contrast, ambient and emitted light reflectivity.

Figure 45:
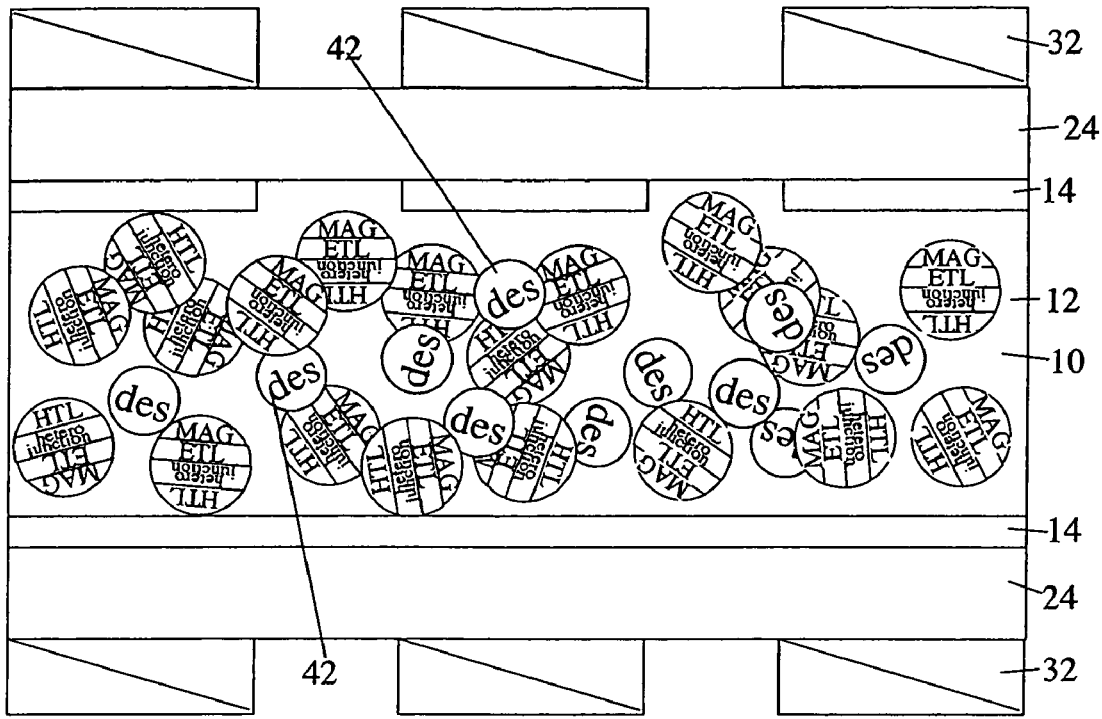
FIG. 45 shows magnetically-active OLED microcapsules randomly dispersed within a fluid but hardenable carrier fluid along with desiccant particulate.

FIG. 45 shows magnetically-active OLED microcapsules 10 randomly dispersed within a fluid but hardenable carrier fluid 12 along with desiccant particulate. The carrier fluid 12 can include a conductive element, carbon or powdered iron for example. The carrier fluid 12 should be selected to have the appropriate electrical properties so that the path of least electrical resistance in the completed display device is through the OLED material, and not through the carrier 12. Accordingly, the carrier fluid 12 may have a semi-conductive composition. Desiccant and/or scavenger particles 42 are included within the carrier fluid 12 to improve protection against contamination. The desiccant can be for example, a finely powdered silica based particulate, and specific oxygen scavenger material can also be included to further enhance the protection of the OLAM and other constituents. Examples of the oxygen scavenger material include dimethylpropanolamine, diethylaminoethanol, cyclohexylamine, n-n-diethylhydroxylamine (DEHA), 2-amino-2-methyl-1-prop-anol, other amines, or other suitable material composition. The specific scavenger material is selected depending on the other components in the device to optimize its effectiveness, taking into consideration factors such as the device optical, electrical and mechanical characteristics. This desiccant/scavenger can be included in the shell and/or the internal phase of the OLAM microcapsules, depending on the microcapsule composition.

Figure 46:
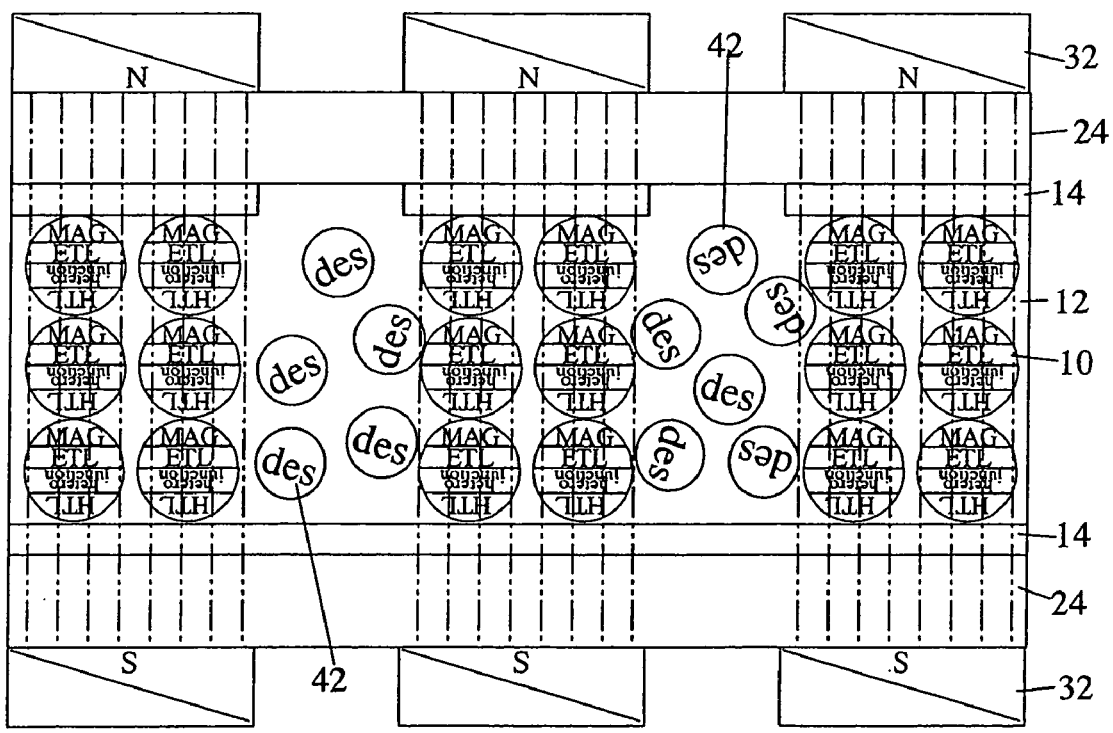
FIG. 46 shows the magnetically-active OLED microcapsule chains aligned within an applied magnetic aligning field within the unhardened carrier fluid.

FIG. 46 shows the magnetically-active OLED microcapsule chains aligned within an applied magnetic aligning field within the unhardened carrier fluid 12. The applied magnetic field can be obtained by permanent magnets brought into position relative to the display electrodes, or electromagnets that are controlled to apply the magnetic field as needed to cause the desired microcapsule alignment and orientation.

Figure 47:
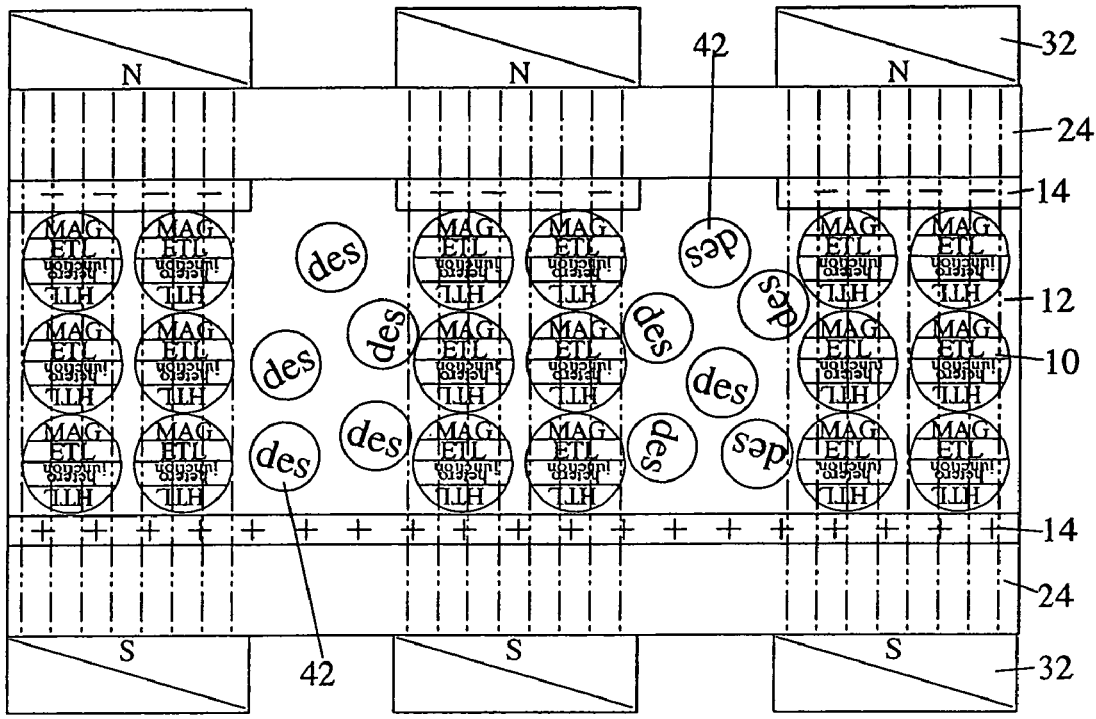
FIG. 47 shows the magnetically-active OLED microcapsule chains aligned within the applied magnetic aligning field held in position within the hardened carrier.

FIG. 47 shows the magnetically-active OLED microcapsule chains aligned within the applied magnetic aligning field held in position within the hardened carrier 12. The carrier fluid 12 can include a conductive element—carbon, for example. Desiccant (water and/or oxygen scavenger) particles 42 are included within the carrier fluid 12 to improve protection against contamination.

Figure 48:
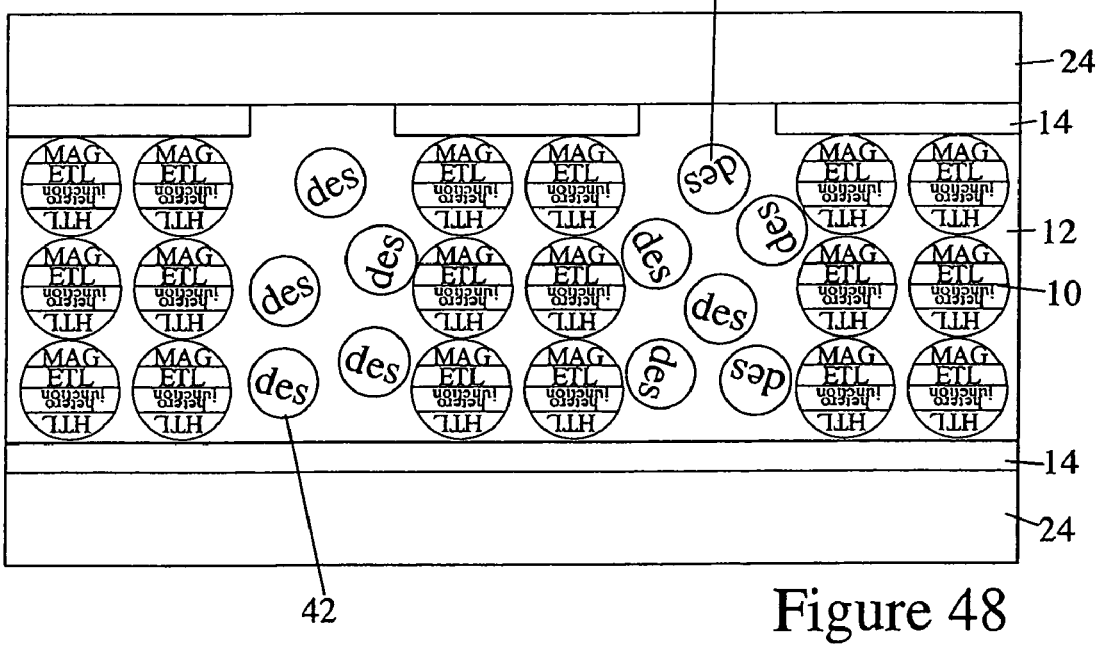
FIG. 48 shows the magnetically-active OLED microcapsule structure with light being emitted from the OLED microcapsule chains.
Figure 49:
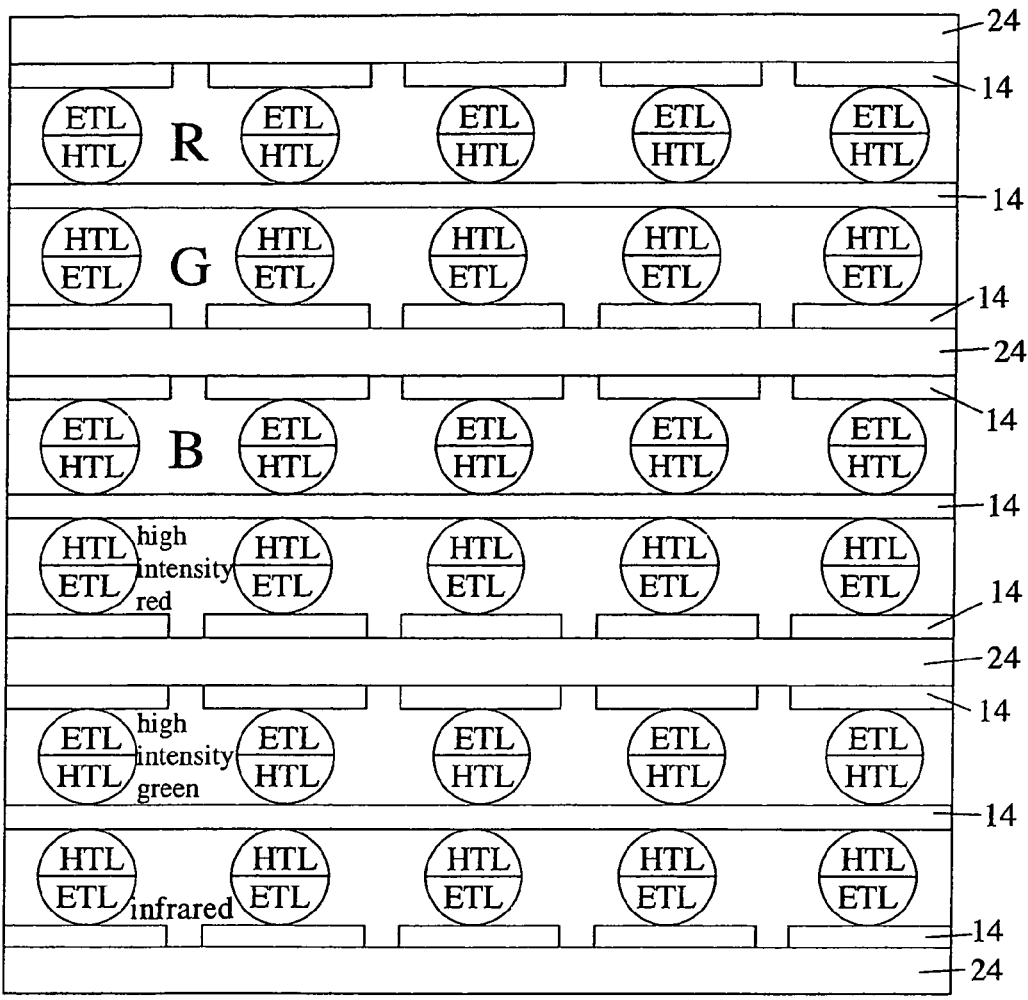
FIG. 49 schematically illustrates a full color OLED display having high intensity visible light display layers and an infrared display layer.

FIG. 48 shows the magnetically-active OLED microcapsule structure with light being emitted from the OLED microcapsule chains in response to a driving voltage applied to the electrodes. FIG. 49 schematically illustrates a full color OLED display having high intensity visible light display layers and an infrared display layer.

Figure 50:
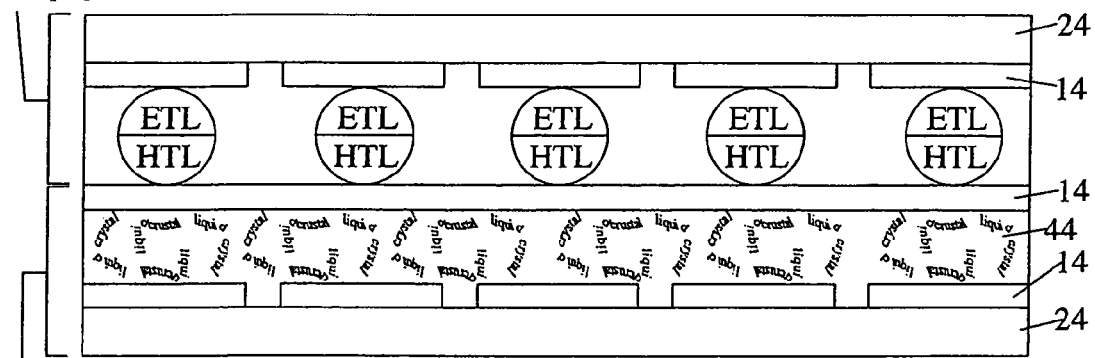
FIG. 50 shows an OLED display layer and a liquid crystal display layer.
Figure 57:
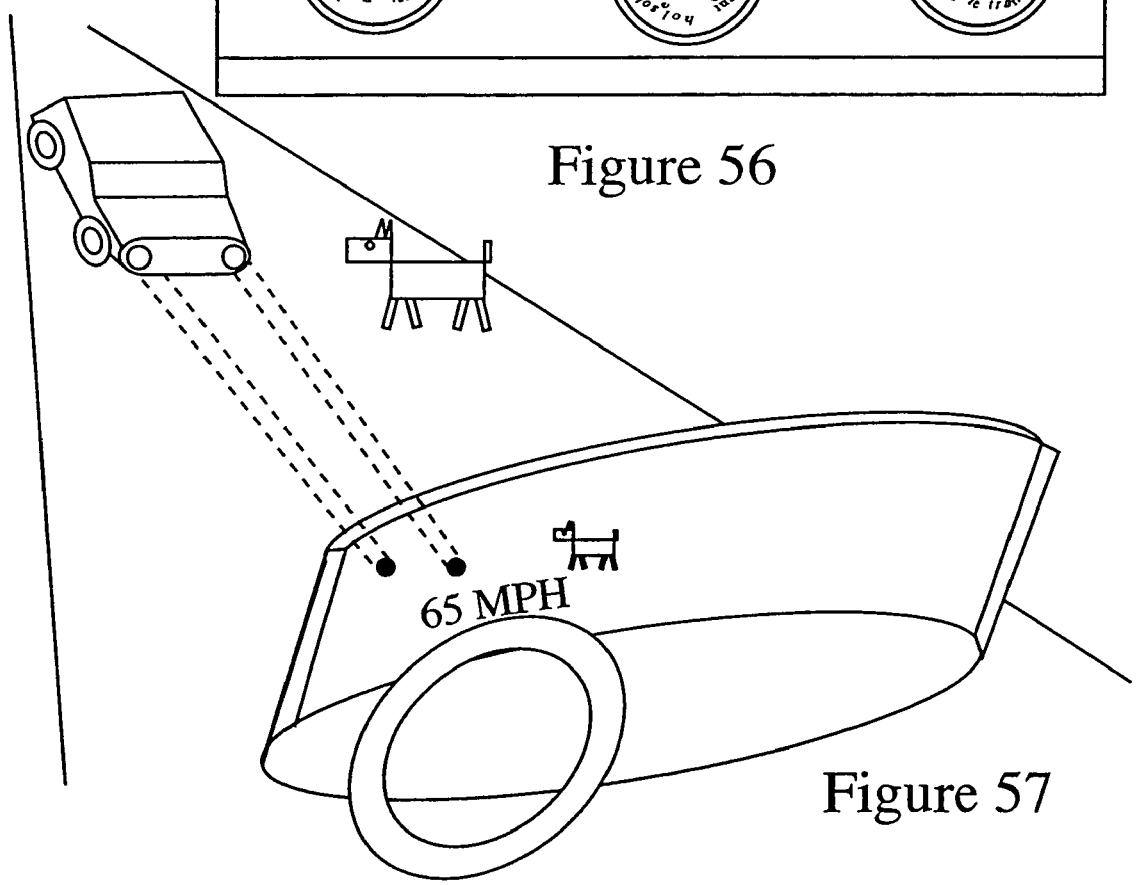
FIG. 57 illustrates a transparent, flexible OLED display fabricated for use as part of a vehicle windshield.
Figure 58:
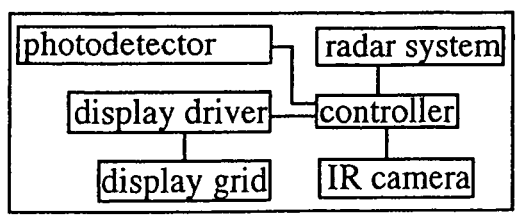
FIG. 58 is a block diagram showing the basic components of an active windshield display system using an OLED display.

FIG. 50 shows an OLED display layer and a liquid crystal light modulating layer 44. The liquid crystal light modulating layer 44 can be used as the dichromatic display layer described above. The liquid crystal light modulating layer 44 can also provide the inventive display with the capability of being selectively reflective. With this capability, the light-blocking windshield described with regard to FIGS. 57 and 58 is obtained. Further, a window can be formed that is transparent when needed, can be switched to being an emissive display (viewable from both or only one side), is selectively light blocking, and can be a bi-color or reflective display.

FIG. 51 shows an inventive OLED display fabricated with thin films of organic material with photodetection elements. Photodetector elements can be incorporated into each pixel stack, or disposed in a different resolution grid. The ambient light, whether sunlight, lamplight or firelight, received by the photodetectors is used to control the optical characteristics of the OLED pixels associated with each photodetector. This construction can be used with microcapsule-based fabrication or any other display constructions. This enables features such as windshields that block out (using, for example, LCD-type shutters) high light sources, such as bright sunshine, overhead streetlights, or headlights beaming from another car. OLED solar cell components or pixel layers can be used to "recycle" the energy emitted by the OLED emitters. Some of the emitted light energy impinges on the solar cells and generate light. This, along with the inventions described herein and the sheet battery described in the above-referenced co-owned patent application Ser. No. 10/234,301, filed Sep. 4, 2002 entitled "Printer and Method for Manufacturing Electronic Circuits and Displays", can enable lightweight, relatively inexpensive, dichromatic newspapers (as described herein in FIG. 1) that recharge in sunlight (or even indoor ambient light) to enable full-color emissive video or still images.

FIG. 52 shows an OLED microcapsule 10 wherein the shell is slightly less conductive than the encapsulated OLED material. The shell is slightly more resistive than the OLED material so that current does not flow around the shell, but instead flows through OLED material. The particulate can be organic or inorganic, with chips of LED material combined and oriented, as necessary, with other materials as is described herein with regard to OLAM materials.

FIG. 53 shows an OLED microcapsule 10 wherein the OLED material is encapsulated along with an electrolyte. A hole transport material comprises the shell, and a shell around MAG is insulative to keep the magnetic material from having unwanted influence of the electrical behavior of microcapsule. OLED material is contained within the electrolyte solution, the electron carriers in the electrolyte can be controlled depending on the needed specification of the microcapsules 10. For example, the microcapsules 10 charge-carrying requirements of the electrolyte can be tailored to match the electrical flow for a particular OLED constituent material. Thus, microcapsules 10 can be formulated based on the empirically or otherwise determined characteristics of a particular formula, or even a particular batch, of OLAM. Other additional material can be included in the internal phase or the shell of the microcapsule, or added to the carrier material, or included as other microcapsules 10 within the carrier 12. For example, a phosphorescent OLED microcapsule 10 may require different light-inducing applied electrical energy. Light of a particular wavelength, for example infrared, can trigger the OLED emission at other wavelengths. In this case, OLAM, or other material such an inorganic semiconductor, is included to generate electricity in response to IR light. The generated electricity is used to cause an emission of other wavelengths of light by the OLED pixel layers. Alternatively, the other wavelengths of light can be generated by particles having florescent or phosphorescent phenomenon. This capability makes possible a map, for example, that can be read with an infrared flashlight (keeping the stealth advantage, while avoiding the need for the map reader to have night vision, as is the case when the map is the IR emitter).

FIG. 54 shows an OLED microcapsule 10 wherein the OLED material and the hole transport material are contained in solution within a conductive shell. This construction may be driven with AC or DC current. The OLED particulate is formed by microencapsulating an internal phase within a shell. The internal phase or the shell includes an OLED material and either the internal phase or the shell includes a field reactive material. The field reactive material comprises either or both an electrostatic and a magnetically reactive material. In accordance with another composition of the inventive microcapsule, the internal phase comprises an OLED emitter material and an OLED hole transport material dispersed in solution. Color dyes may also be included within the internal phase. The solvent may be a fluid organic solvent. In order to provide the alignment capabilities of the microcapsules 10, either the internal phase or the shell may include a field reactive component.

FIG. 55 shows the OLED microcapsules 10 shown in FIG. 54 including a magnetically active material. The magnetic material is included as a separate microcapsule 10 with an electrically insulative shell contained within the internal phase of a second conductive shell that also encapsulates a solution of the OLED material (electron transport material and hole transport material). The electrically insulated magnetic material enables microcapsule alignment within a magnetic field, without it becoming an electrical short within the microcapsule. The OLED microcapsules 10 can have constituent parts including at least one of hole transport material, electron transport material, field reactive material, solvent material, color material, shell forming material, barrier material, desiccant material, scavenger material, colorant material, light curable, heat expandable, heat contracting, heat curable and heat meltable material. The constituent parts of the microcapsule 10 form at least one internal phase and at least one shell. The constituent parts are selected so as to have electrical characteristics that result in a preferred path of electrical conduction (or electron and hole mobility) through the hole transport material and the electron transport material. By this construction, the microcapsule 10 behaves as a pn junction upon application of an electrical potential to the first electrode 14 and the second electrode 14.

Figure 56:
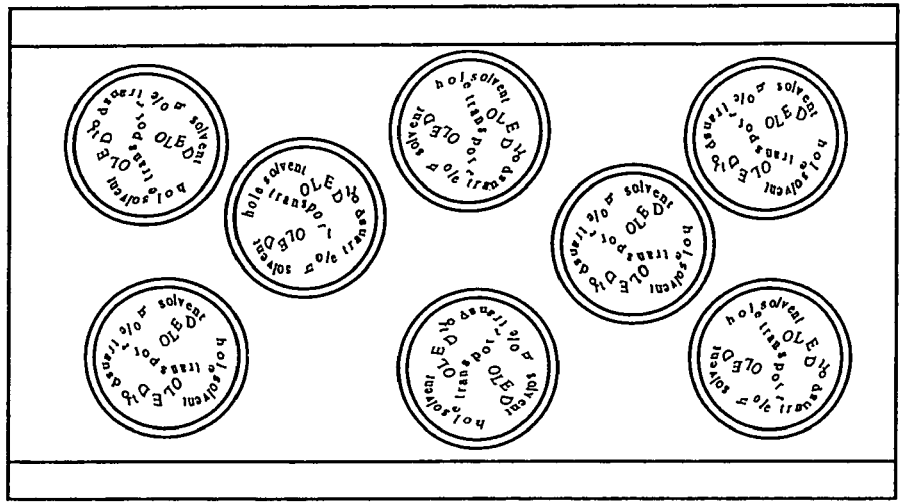
FIG. 56 illustrates the OLED microcapsule shown in FIG. 54 used for creating a general lighting or display back lighting OLED device.

FIG. 56 illustrates the OLED microcapsule 10 shown in FIG. 54 used for creating a general lighting or display back lighting OLED device. For general lighting purposes, OLED and hole transport material can be microencapsulated in solvent form. The microcapsules 10 are randomly dispersed within a conductive carrier 12 material, for example a conductive epoxy mixture. The microcapsules 10 can be disposed between two planer electrodes 14. The "self-healing" capabilities described herein are used to correct electrical shorts between the planar electrodes 14.

FIG. 57 illustrates a transparent, flexible OLED display fabricated for use as part of a vehicle windshield. A liquid crystal (or other) light-modulating grid may also be included. The light-modulating grid is used to provide a shutter for blocking a high intensity light source 28, such as the sun or oncoming headlights. Photodetector elements (which may be included in grid form within the windshield and/or in another arrangement such as an array) detects when a light source 28 is at a higher intensity than the ambient light. At the location of the detected high intensity light source 28, the light is shuttered (e.g., liquid crystal within certain pixels is oriented so that the incoming light is blocked). A radar system, IR camera of other object detecting system can be used to determine when an object is in the road, such as a deer, pedestrian, or a dog. If such an object is detected, its image of that object or some indication is produced in the OLED display at the location on the windshield corresponding to where the object would be viewed by the driver. Information, such as speed, radio channel, incoming cellphone call number, etc., can be displayed by the OLED display as a heads up display image. For an example of a driver circuit for the light shutter, a photoactive grid generates an electrical potential between two electrodes 14. That electrical potential (amplified if necessary) is effective to cause structures (molecules or crystals or molecular chains) to orient so that light is selectively blocked. This mechanism may also be used to create a fresnel-type lens system (creating a curvature (focus ability) of a received light image using an essentially flat optical element.

FIG. 58 is a block diagram showing the basic components of a driver display system using an OLED display. A controller controls a display grid and receives input from a photodetector grid. A display driver drives the display grid, under the control of the controller, in response to the photodetector grid, an IR camera and/or other detection system such as a radar, sonar, ultrasonic, or the like.

Figure 59:
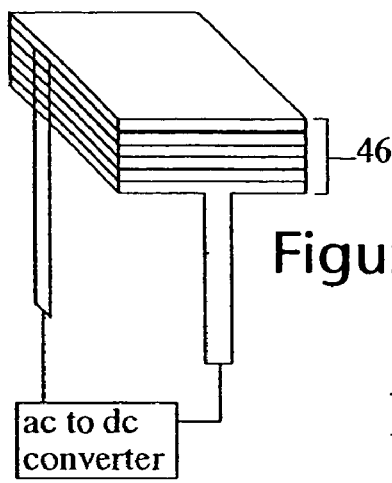
FIG. 59 illustrates an OLED light emissive element.

FIG. 59 illustrates an OLED light emissive element. The OLED element can be constructed from sheets of OLED organic material stacks 46, and can be formed on glass or plastic substrates 24 and cut to size. The electrode leads can be fixed to the cut OLED stack 46 and disposed within an evacuated or inert gas filled bulb. The bulb can be solid and transparent or light diffusive, forming a robust, solid state, light bulb for flashlights or other applications where a conventional LED may otherwise be employed.

Figure 60:
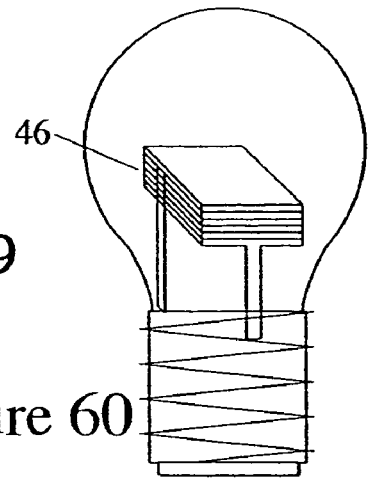
FIG. 60 shows the OLED light emissive element having a conventional light bulb form factor.

FIG. 60 shows the OLED light emissive element having a conventional light bulb form factor. OLED light can be fabricated into the same form factor as a conventional light bulb so that it can be easily installed into existing light sockets. The orientation of the organic stack 46, reflective electrode and transparent electrode enables the light to be projected outward from the bulb. An array of devices can be configured so that the light is emitted in an omni-directional or directional manner. The OLED element can be constructed from sheets of OLED light stacks 46, and can be formed on glass or plastic substrates 24 and cut to size. The electrode leads can be fixed to the cut light stack and disposed within an evacuated or inert gas filled bulb. The threaded portion of the bulb can include an ac to dc converting circuit so that the conventional sockets, lampshades, etc., already in the home or office are still usable. Alternatively, another form factor, such as holiday lighting, rope lighting, etc., can be used. The cut OLED light stack can be shaped as desired, square, long and thin, etc. Also, the same basic structure can be used to make OLED light in a conventional LED package.

Figure 61:
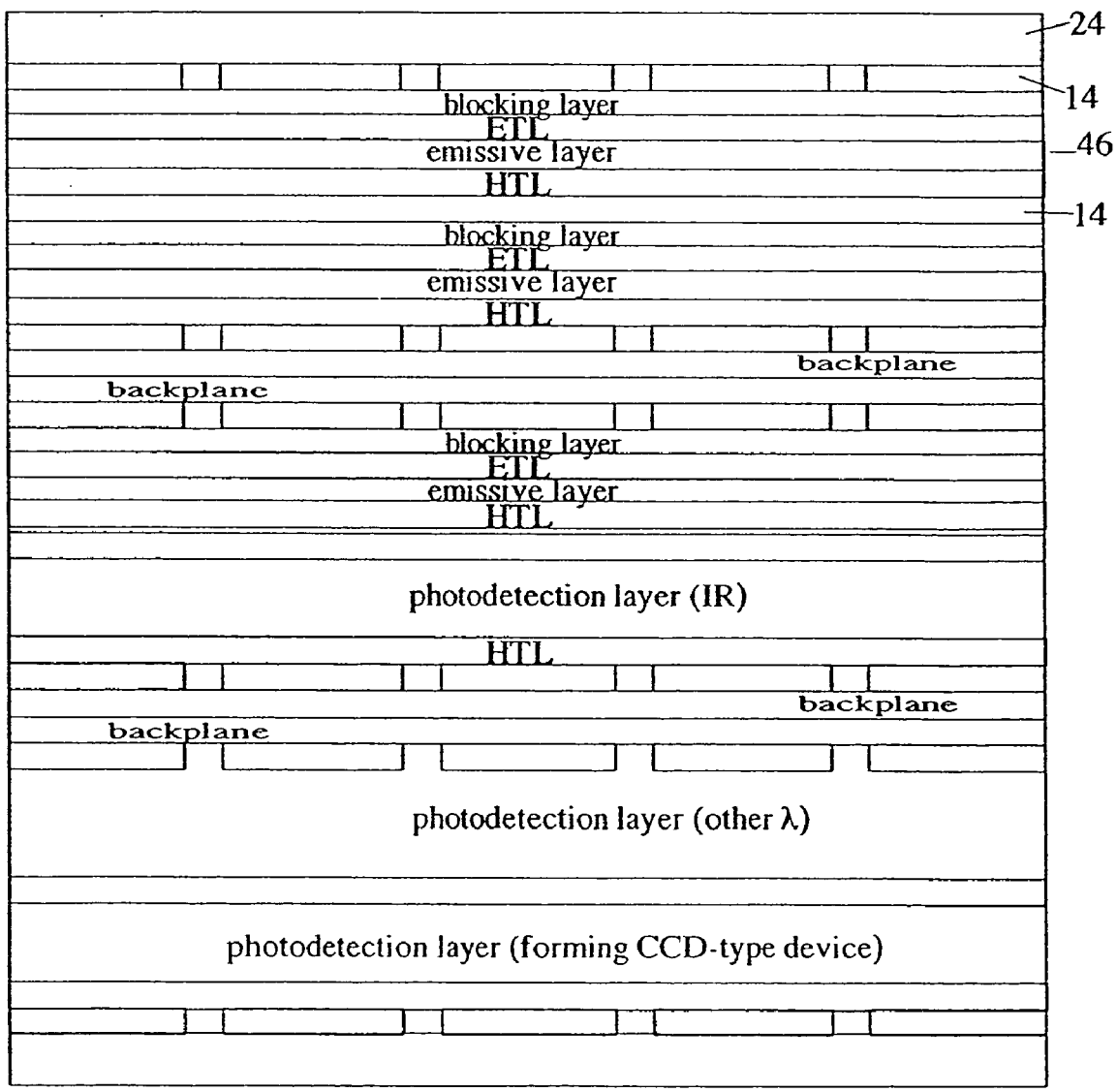
FIG. 61 illustrates an OLED device fabricated using light emissive layers and light detecting layers.

FIG. 61 illustrates an OLED device fabricated using light emissive layers and light detecting layers. The OLED display device can include layers of light emission pixels and layers of light detection pixels. The light detection pixels can be used to detect ambient light and control the intensity of the light emission pixels. As with some of the other device constructions described herein, the formation of the OLED pixel layers can be done using the inventive microcapsule fabrication method and/or a combination with other fabrication methods such as inkjet, spin coating, vacuum deposition, evaporation, etc. for forming an OLED organic stack 46.

Figure 62:
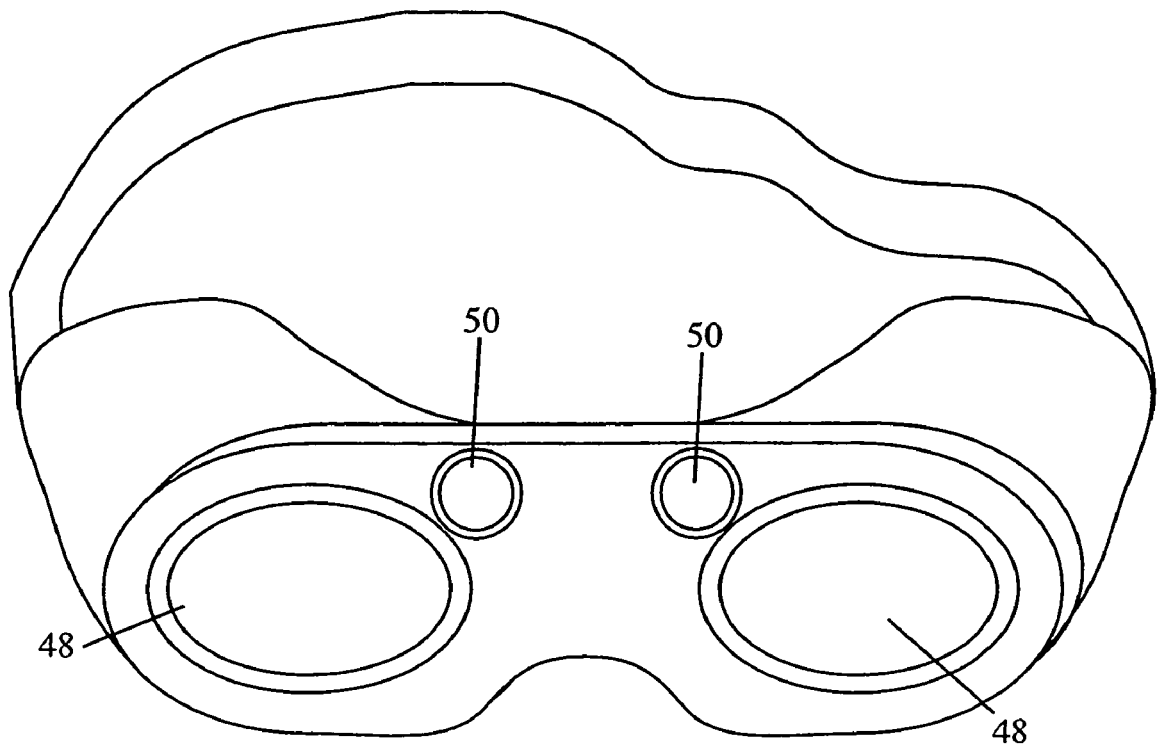
FIG. 62 illustrates stereoscopic goggles having OLED device elements.

FIG. 62 illustrates stereoscopic goggles having OLED display device elements 48. The photodetection pixels can be formed so as to effect a camera incorporated within the OLED display device elements 48. The camera optics can include lenses that change shape and/or focal point depending on whether the image is focusing on the human eye or the camera pixel elements. Alternatively, or in addition, CCD-type cameras 50 can be provided adjacent to the OLED display device elements 48.

Figure 63:
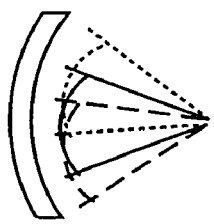
FIG. 63 illustrates a flexible OLED display having a curvature that compensates for the human eye's range of motion.

FIG. 63 illustrates a flexible OLED display having a curvature that compensates for the human eye's range of motion. The image displayed on the curved wraparound OLED display is refreshed so that the eye movement as well as the head movement of the user is accounted for. With this stereoscopic vision aide, the user's head movement can be determined by accelerometers and gyroscopic circuits. The eye movement is determined by reflecting IR (or some wavelength depending on the ambient light) off the retina and detecting the reflection by photodetectors which may be incorporated in or adjacent to the OLED display.

Figure 64:
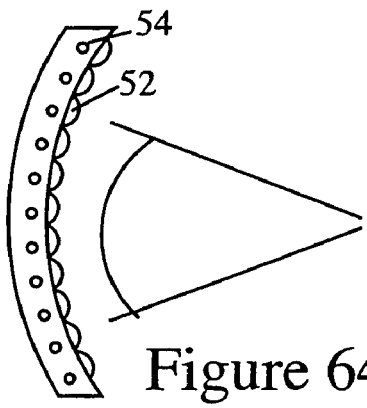
FIG. 64 illustrates a flexible OLED display having optical lens elements for focusing emitted light at the appropriate physical location within a human eye.

FIG. 64 illustrates a flexible OLED display having microlens elements 52 for focusing emitted light at the appropriate physical location within a human eye. An optical lens can be used to focus light onto CCD-type elements to create microlens elements 52 that focus the pixel light source 54 at the focus spot in the human eye. The optical properties of the microlens element 52 can compensate for vision problems.

Figure 65:
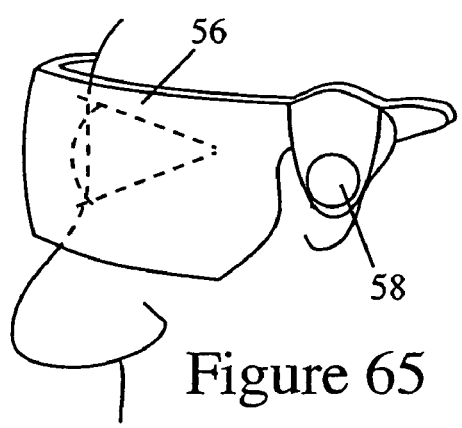
FIG. 65 illustrates a wraparound visor having a curved, flexible OLED display and speakers.

FIG. 65 illustrates a wraparound visor 56 having a curved, flexible OLED display and speakers 58. The inventive stereoscopic vision aid has a high resolution OLED display. The OLED display is shaped so that field of vision is as full as practical.

Figure 66A:
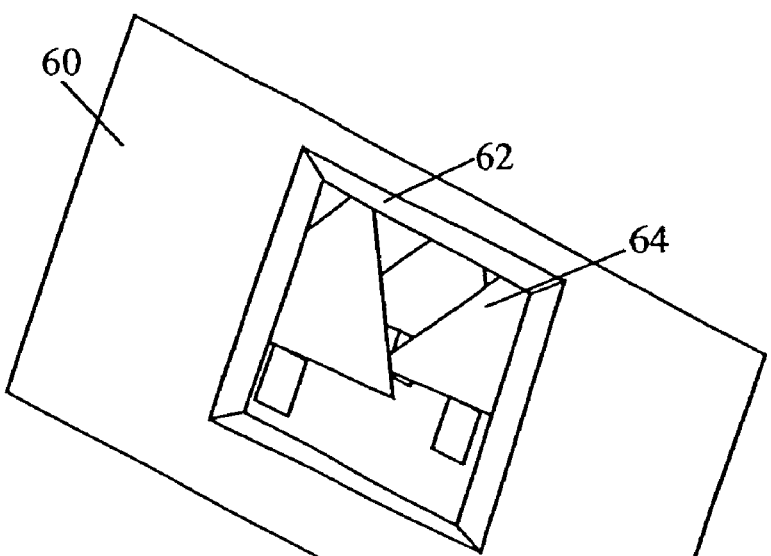
FIG. 66A illustrates a wall of a house having an inventive OLED display window, the window being driven so as to be transparent with trees outside the house visible through the window.

FIG. 66(a) illustrates a wall 60 of a house having an inventive OLED display window 62, the window 62 being driven so as to be transparent with trees 64 outside the house visible through the window 62. The inventive window 62 can be constructed along the lines of the OLED displays described herein. As with all of the applications for the inventive OLED technology, the various elements comprising the various versions of the invention described herein can be mixed and matched depending on the intended use for a particular OLED display or device. Thus, in this case, the inventive window 62 can be driven so that it is transparent when needed, can be switched to being an emissive display (viewable from both or only one side), is selectively light blocking, and can be a full color, multi-color, monochrome or reflective display.

Figure 66B:
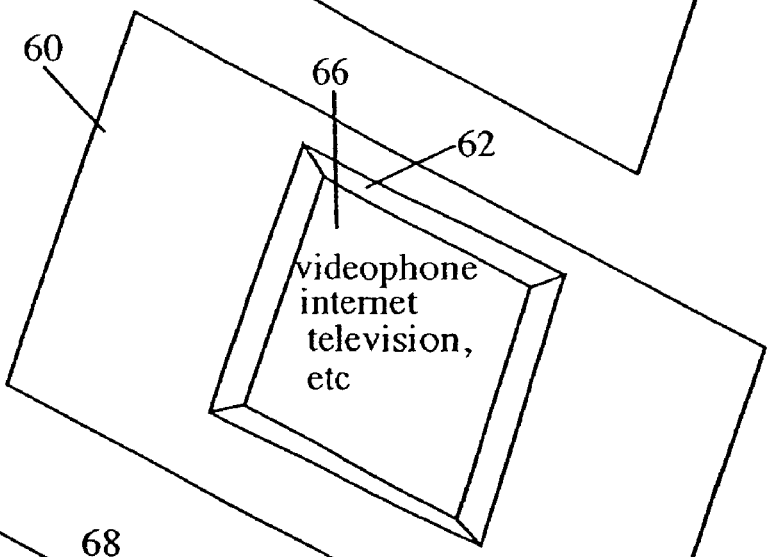
FIG. 66B illustrates the wall of a house having the inventive OLED display window, the window being driven so as to display multiple simultaneous video stream including video phone communication, Internet web page and a television program.

FIG. 66(b) illustrates the wall 60 of a house having the inventive OLED display window 62, the window 62 being driven so as to display multiple simultaneous video streams 66 including videophone communication, Internet web page and a television program. Multiple streams of display information 66 can be simultaneously received and displayed. For example, broadcast video content such as a television program may be shown at a first portion of the display, personalized video content, such as a videophone conversation may be shown at a second portion and a web page, including mapped hyperlink content, may be shown at a third portion. With an LCD light modulating layer, the content displayed on the inventive OLED display window 62 can be viewable from outside the house (from poolside, for example), or LCD light modulating layer can be controlled so that the emitted display light can be blocked from view from outside the house.

Figure 66C:
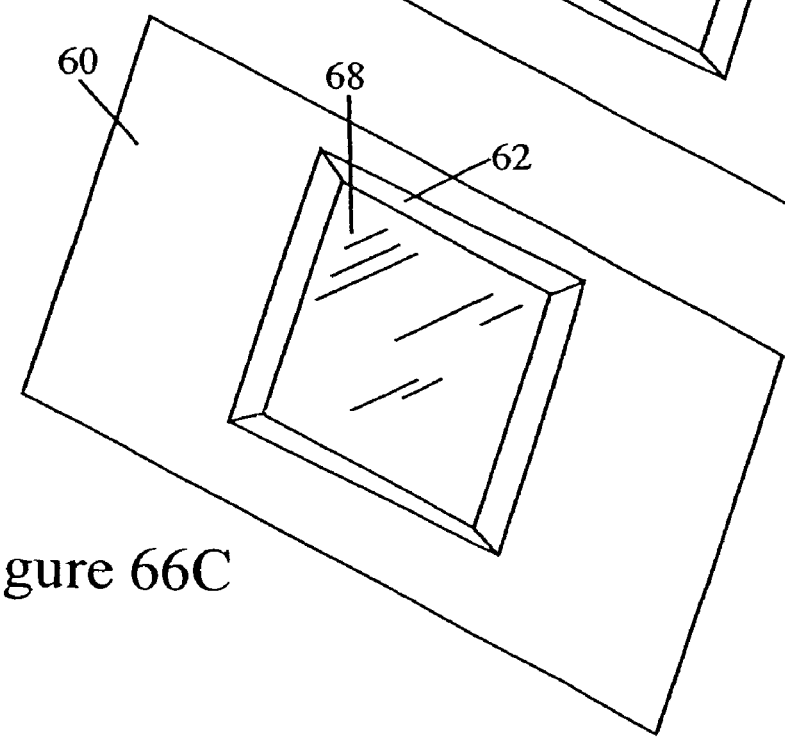
FIG. 66C illustrates the wall of a house having the inventive OLED display window, the window being driven so as to be a mirror.

FIG. 66(c) illustrates the wall 60 of a house having the inventive OLED display window 62, the window being driven so as to be a mirror. In this case, the LCD light modulating layer can be controlled to block light from being transmitted through the window. Further, as shown in FIG. 57, relatively high intensity light (such as from sun beaming onto the window) can be selectively blocked to prevent glare within the house and to keep the house cooler in the summer.

Figure 67A:
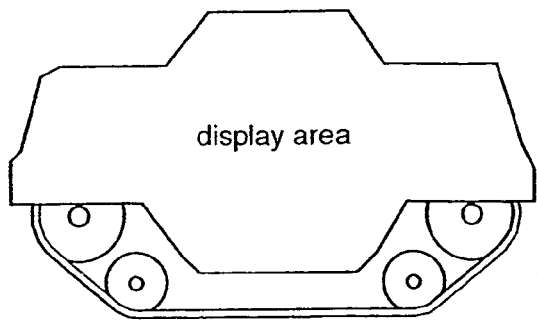
FIG. 67A illustrates the use of an inventive flexible large format display as part of a camouflage system for a vehicle, such as a military tank.
Figure 67B:
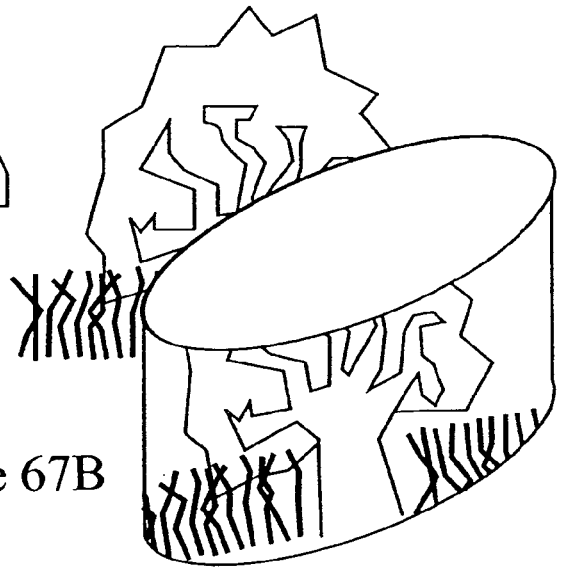
FIG. 67B illustrates the camouflage system shown in FIG. 67A wherein the display area has a curved viewing area.

FIG. 67(a) illustrates the use of an inventive flexible large format display as part of a camouflage system for a vehicle, such as a military tank. In accordance with this aspect of the present invention, a camouflage system is provided that includes a video camera system that captures a field of view in a direction away from the object to be camouflaged, such as a military tank. On the opposite side of the tank relative to the field of view, a flexible large format display is used to display to an external viewer the captured image of the field of view. FIG. 67(b) illustrates the camouflage system shown in FIG. 67(a) wherein the display area has a curved viewing area. As shown in FIG. 67(b), the effect of displaying the captured field of view on the flexible display is to create the illusion for the external viewer that enables the military tank to effectively disappear into the background scene.

Figure 67C:
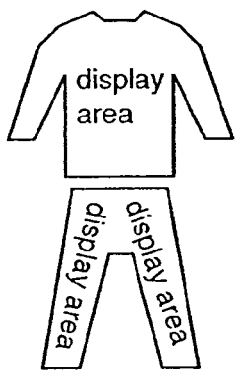
FIG. 67C illustrates the use of an inventive flexible clothing display as part of a camouflage system for a person.

FIG. 67(c) illustrates the use of an inventive flexible clothing display as part of a camouflage system for a person. As described above, a camera system captures a field of view. This captured image is displayed on the clothing of the wearer so that an illusion is created that the wearer disappears into the background scene.

Figure 67D:
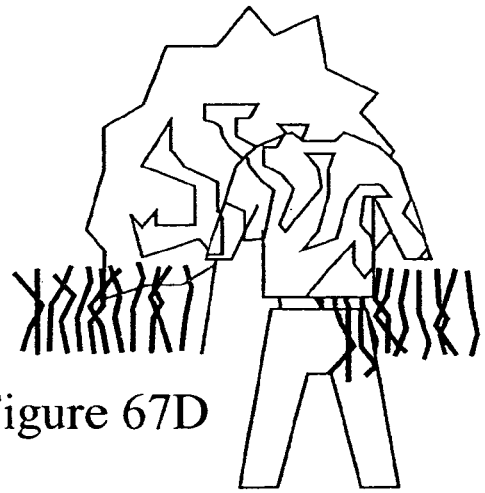
FIG. 67D shows the inventive clothing camouflage system shown in FIG. 67B in use.

FIG. 67(d) shows the inventive clothing camouflage system shown in FIG. 67(b) in use. The clothing may be fabricated in the manner described herein.

Figure 68B:
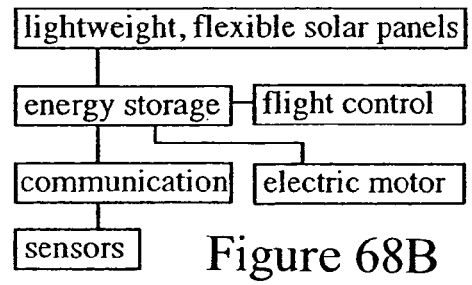
FIG. 68B is a block diagram illustrating some system elements of the military observation drone shown in FIG. 68A.
Figure 68A:
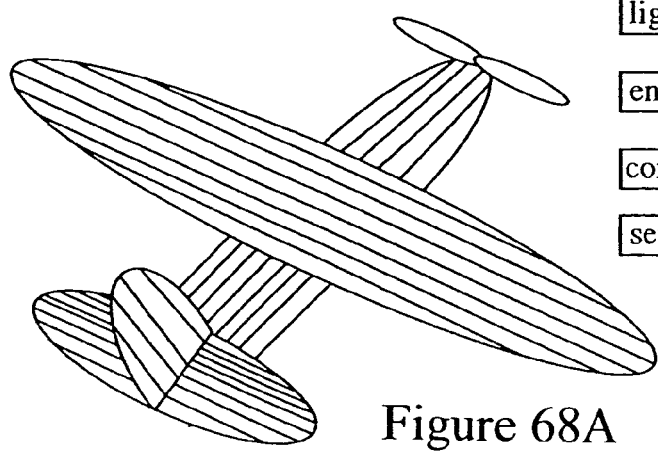
FIG. 68A shows the use of flexible, lightweight solar panels as a sunlight-to-energy system for powering an aircraft, such as a military observation drone.

FIG. 68(a) shows the use of flexible, lightweight solar panels as a sunlight-to-energy system for powering an aircraft, such as a military observation drone. FIG. 68(b) is a block diagram illustrating some system elements of the military observation drone shown in FIG. 68(a). The flexible, lightweight solar panels fabricated in accordance with the present invention enable an aircraft, such as an observation drone, to continuously fly while being propelled, for example, by a propeller driven by an electric motor. The electric motor and other onboard electrical systems receive power directly from the solar panels, or from a battery that is recharged by the solar panels.

Figure 69:
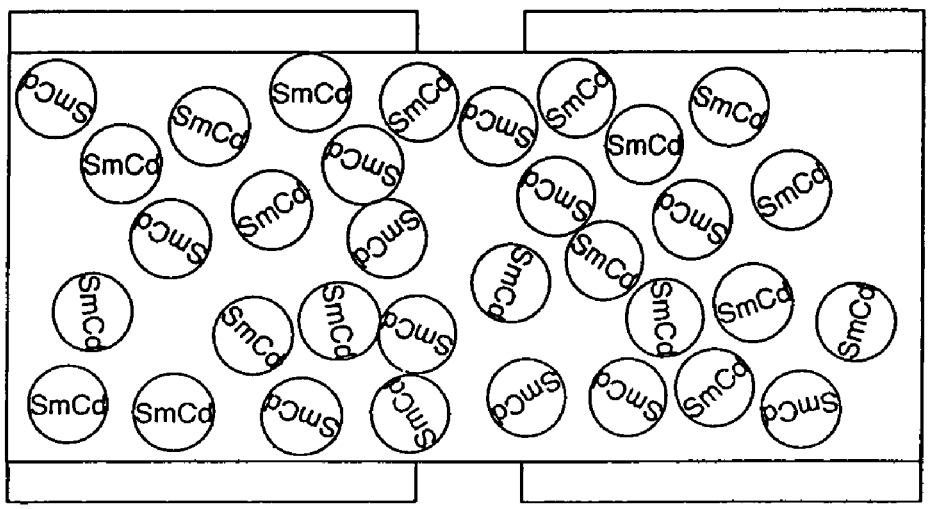
FIG. 69 illustrates an embodiment of the inventive light active device showing a semiconductor particulate randomly dispersed within a conductive carrier.

FIG. 69 illustrates an embodiment of the inventive light active device showing a semiconductor particulate randomly dispersed within a conductive carrier. A light active device includes a semiconductor particulate dispersed within a carrier material.

The carrier material may be conductive, insulative or semiconductive and allows charges to move through it to the semiconductor particulate. The charges of opposite polarity moving into the semiconductive material combine to form charge carrier pairs. The charge carrier pairs decay with the emission of photons, so that light radiation is emitted from the semiconductor material. Alternatively, the semiconductor material and other components of the inventive light active device may be selected so that light received in the semiconductor particulate generates a flow of electrons. In this case, the light active device acts as a light sensor.

A first contact layer or first electrode is provided so that on application of an electric field charge carriers having a polarity are injected into the semiconductor particulate through the conductive carrier material. A second contact layer or second electrode is provided so that on application of the electric field to the second contact layer charge carriers having an opposite polarity are injected into the semiconductor particulate through the conductive carrier material. To form a display device, the first contact layer and the second contact layer can be arranged to form an array of pixel electrodes. Each pixel includes a portion of the semiconductor particulate dispersed within the conductive carrier material. Each pixel is selectively addressable by applying a driving voltage to the appropriate first contact electrode and the second contact electrode.

The semiconductor particulate comprises at least one of an organic and an inorganic semiconductor. The semiconductor particulate can be, for example, a doped inorganic particle, such as the emissive component of a conventional LED. The semiconductor particulate can be, for another example, an organic light emitting diode particle. The semiconductor particulate may also comprise a combination of organic and inorganic materials to impart characteristics such as voltage control emission, aligning field attractiveness, emission color, emission efficiency, and the like.

The electrodes can be made from any suitable conductive material including electrode materials that may be metals, degenerate semiconductors, and conducting polymers. Examples of such materials include a wide variety of conducting materials including, but not limited to, indium-tin-oxide ("ITO"), metals such as gold, aluminum, calcium, silver, copper, indium and magnesium, alloys such as magnesium-silver, conducting fibers such as carbon fibers, and highly-conducting organic polymers such as highly-conducting doped polyaniline, highly-conducting doped polypyrrole, or polyaniline salt (such as PAN-CSA) or other pyridyl nitrogen-containing polymer, such as polypyridylvinylene. Other examples may include materials that would allow the devices to be constructed as hybrid devices through the use of semiconductive materials, such as n-doped silicon, n-doped polyacetylene or n-doped polyparaphenylene.

In accordance with another aspect of the present invention, a photon receptive light active device is provided. A first electrode and a second electrode are provided disposed adjacent defining a gap there between. A light active mixture is provided comprised of a carrier material and a photon receptive particulate for receiving a photon of light and converting the photon of light into electrical energy. The light active mixture being disposed within the gap between the first electrode and the second electrode so that when light energy is received by the photon receptive particulate, electrical energy is produced that can be derived from an electrical connection with the first electrode and the second electrode. With this composition and construction, a light-to-energy device is obtained from which a solar cell, photodetector or camera element can be made.

The photon receptive particulate may include at least one of an organic photon receiver; an inorganic photon receiver, hole transport material, blocker material, electron transport material, and performance enhancing materials. The carrier can include at least one of an organic photon receiver; an inorganic photon receiver, hole transport material, blocker material, electron transport material, and performance enhancing materials. Further, additional layers may be formed within the gap between the first electrode and the second electrode. These additional layers help to define the mechanical, electrical and optical characteristics of the inventive device. The additional layers may include at least one of an organic photon receiver, an inorganic photon receiver, hole transport material, blocker material, electron transport material, and performance enhancing materials (e.g., the characteristic controlling additives).

Figure 70:
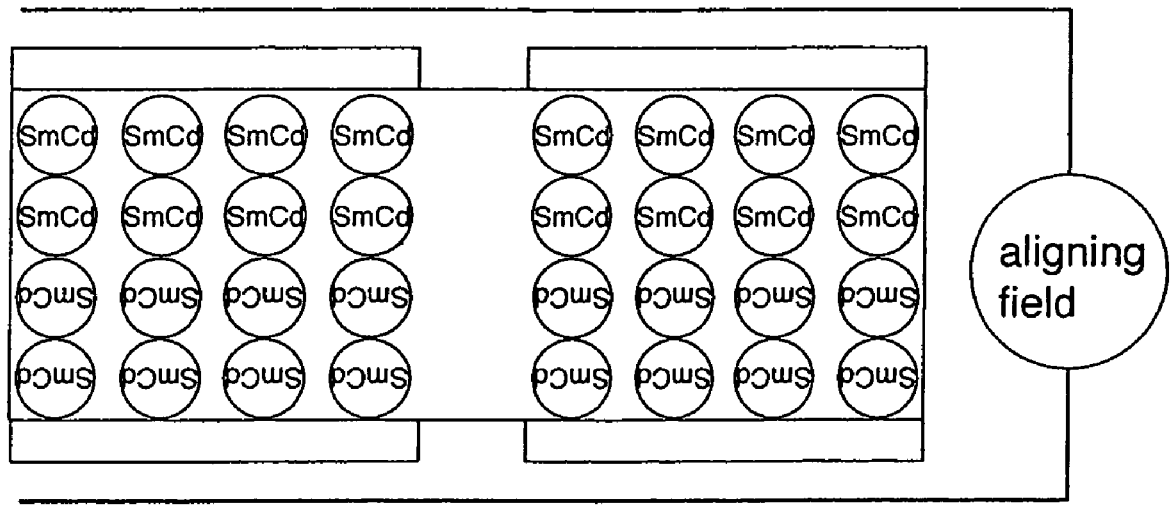
FIG. 70 illustrates an embodiment of the inventive light active device showing the semiconductor particulate aligned between electrodes.

As shown in FIG. 70, an embodiment of the inventive light active device may have the semiconductor particulate aligned between electrodes. The emissive particulate acts as point light sources within the carrier material when holes and electrons are injected and recombine forming excitons. The excitons decay with the emission of radiation, such as light energy. In accordance with the present invention, the emissive particulate can be automatically aligned so that a significant majority of the point light sources are properly oriented and disposed between the electrodes (or array of electrodes in a display). This maximizes the light output from the device, greatly reduces cross-talk between pixels, and creates a protected emissive structure within the water, oxygen and contamination boundary provided by the cured carrier material.

In this case, the mixture disposed within the gap between the top and bottom electrodes includes a field reactive OLED particulate that is randomly dispersed within a fluid carrier. An aligning field is applied between the top electrode and the bottom electrode. The field reactive OLED particulate move within the carrier material under the influence of the aligning field. Depending on the particulate composition, carrier material and aligning field, the OLED particulates form chains between the electrodes (similar to the particulate in an electrical or magnetic Theological fluid in an electric or magnetic field), or otherwise becomes oriented in the aligning field. The aligning field is applied to form a desired orientation of the field reactive OLED particulate within the fluid carrier. The fluid carrier comprises a hardenable material. It can be organic or inorganic. While the desired orientation of the field reactive OLED particulate is maintained by the aligning field, the carrier is cured to form a hardened support structure within which is locked in position the aligned OLED particulate.

Figure 71:
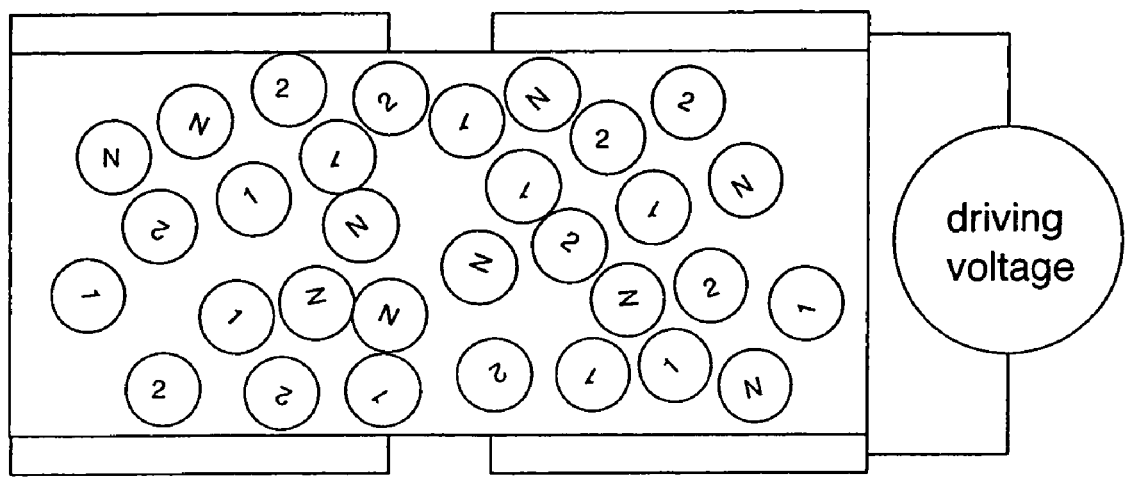
FIG. 71 illustrates an embodiment of the inventive light active device showing semiconductor particulate and other performance enhancing particulate randomly dispersed within the conductive carrier material.

FIG. 71 illustrates an embodiment of the inventive light active device showing semiconductor particulate and other performance enhancing particulate randomly dispersed within the conductive carrier material. The semiconductor particulate may comprise an organic light active particulate that includes at least one conjugated polymer. The conjugated polymers having a sufficiently low concentration of extrinsic charge carriers. An electric field applied between the first and second contact layers causes holes and electrons to be injected into the semiconductor particulate through the conductive carrier material. For example, the second contact layer becomes positive relative to the first contact layer and charge carriers of opposite polarity are injected into the semiconductor particulate. The opposite polarity charge carriers combine to form in the conjugated polymer charge carrier pairs or excitons, which emit radiation in the form of light energy.

Depending on the desired mechanical, chemical, electrical and optical charactistics of the light active device, the conductive carrier material can be a binder material with one or more characteristic controlling additives. For example, the binder material may be a cross-linkable monomer, or an epoxy, or other material into which the semiconductor particulate can be dispersed. The characteristic controlling additives may be in a particulate and/or a fluid state within the binder. The characteristic controlling additives may include, for example, a desiccant, a scavenger, a conductive phase, a semiconductive phase, an insulative phase, a mechanical strength enhancing phase, an adhesive enhancing phase, a hole injecting material, an electron injecting material, a low work metal, a blocking material, and an emission enhancing material. A particulate, such an ITO particulate, or a conductive metal, semiconductor, doped inorganic, doped organic, conjugated polymer, or the like can be added to control the conductivity and other electrical, mechanical and optical characteristics. Color absorbing dyes can be included to control the output color from the device. Florescent and phosphorescent components can be incorporated. Reflective material or diffusive material can be included to enhance the absorption of received light (in the case, for example, of a display or photodetector) or enhance the emitted light qualities. In the case of a solar collector, the random dispersal orientation of the particulate may be preferred because it will enable a solar cell to have light receiving particulate that are randomly oriented and the cell can receive light from the sun efficiently as it passes over head. The orientation of the particulate may also be controlled in a solar cell to provide a bias for preferred direction of capture light.

The characteristic controlling additives may also include materials that act as heat sinks to improve the thermal stability of the OLED materials. The low work metal additives can be used so that more efficient materials can be used as the electrodes. The characteristic controlling additives can also be used to improve the mobility of the carriers in the organic materials and help improve the light efficiency of the light-emitting device.

Figure 72:
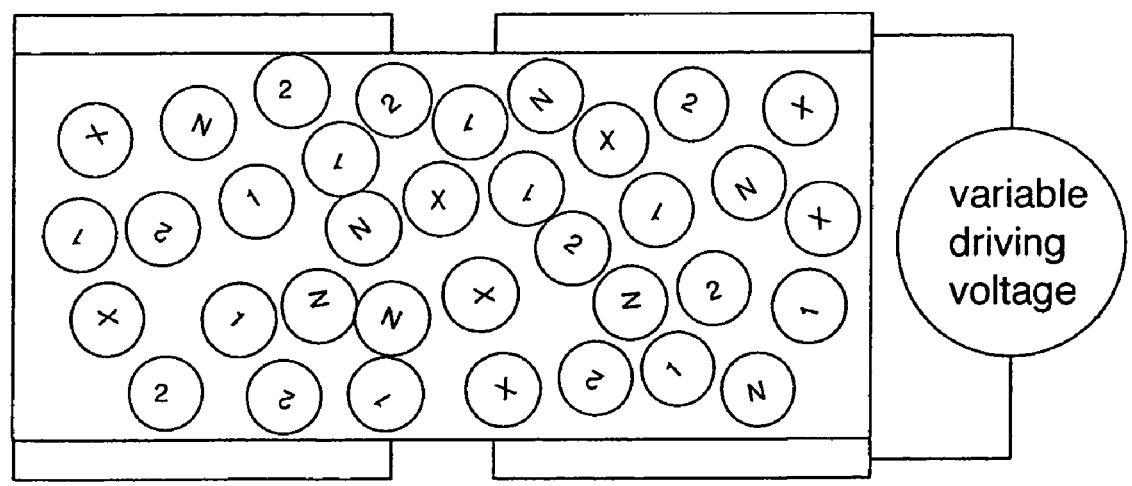
FIG. 72 illustrates an embodiment of the inventive light active device showing different species of organic light active particulate dispersed within a carrier material.

FIG. 72 illustrates an embodiment of the inventive light active device showing different species of organic light active particulate dispersed within a carrier material. The turn-on voltage for each species can be different in polarity and/or magnitude. Emissions of different wavelengths or colors can be obtained from a single layer of the mixture of the organic light active particulate and carrier material. The color, duration and intensity of the emission is thus dependent on the controlled application of an electric field to the electrodes. This structure has significant advantages over other full color or multicolor light devices, and can also be configured as a wide spectrum photodetector for applications such as cameras. The organic light active particulate can include organic and inorganic particle constituents including at least one of hole transport material, organic emitters, electron transport material, magnetic and electrostatic material, insulators, semiconductors, conductors, and the like. As is described herein, a multi-layered organic light active particulate can be formed so that its optical, chemical, mechanical and electrical properties are controlled by the various particle constituents.

Figure 73:
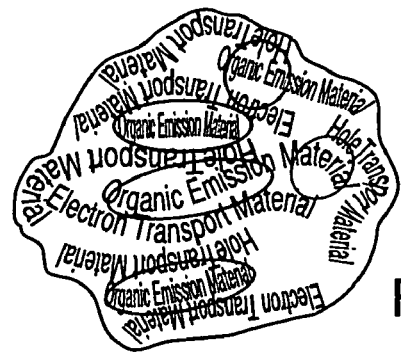
FIG. 73 illustrates an organic light active particle formed from a polymer blend.
Figure 74:
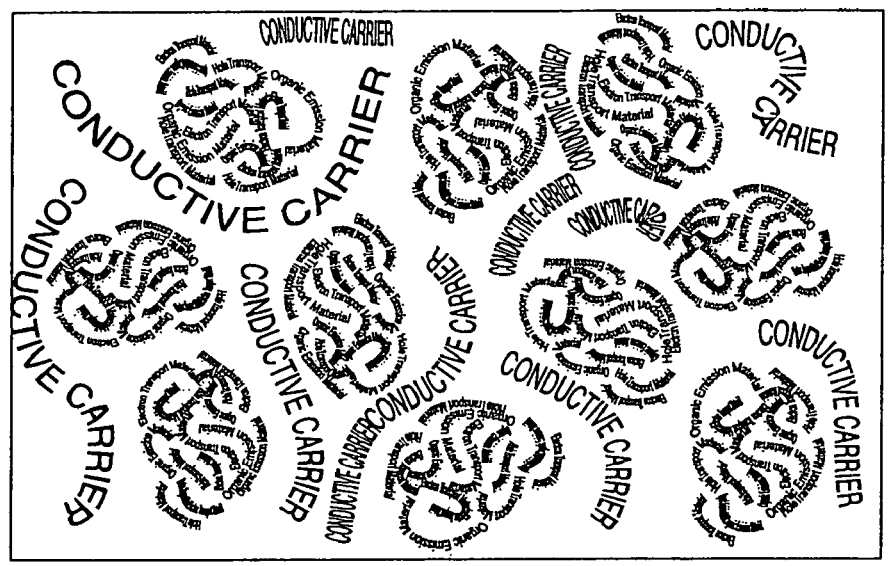
FIG. 74 illustrates the polymer blend organic light active particulate dispersed within a conductive carrier.
Figure 75:
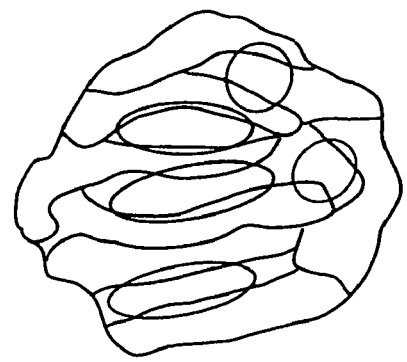
FIG. 75 illustrates the polymer blend organic light active particle showing light active sites.

FIG. 73 illustrates an organic light active particle formed from a polymer blend and FIG. 74 illustrates the polymer blend organic light active particulate dispersed within a conductive carrier. The organic light active particulate may include particles comprised from a polymer blend, including at least one organic emitter blended with at least one of a hole transport material, an electron transport material and a blocking material. The polymer blend may be comprised of emitters that respond to different turn-on voltages to effect a multicolor device. The polymer blend particulate can be dispersed within a carrier that includes at least one of the hole transport, electron transport, hole blocker, or other OLED constituent. The carrier may also include other performance enhancing materials, such as lithium, calcium, low work metals, charge injection facilitators, light-to-light emitters (similar to the coating on a florescent light tube) to obtain the desired light emission. As described elsewhere herein, other particulate and carrier additives can be incorporated to enhance the characteristics of the OLED device. FIG. 75 illustrates the polymer blend organic light active particle showing light active sites. Upon the application of electrical field to the electrodes, sites within the polymer blend particle will act as point sources of light emissions. These light active sights are located where the appropriate constituents of the polymer blend meet so that electrons and holes injected into the semiconductor material combine into excitons and decay with the release of photons. The organic light active particulate may include microcapsules having a polymer shell encapsulating an internal phase. The internal phase and/or the shell can be comprised of the polymer blend including an organic emitter blended with at least one of a hole transport material, an electron transport material and a blocking material. As with the other constructions of the inventive OLAM devices and material compositions, depending on the material compositions and the device structure, this polymer blend can be used to emit radiation of different wavelengths and can also be used for light-to-energy devices, such as solar cell and photodetectors. These structures and compositions can also be used for bio-sensors and other organic light active applications.

One way to make the polymer blend particulate is to precipitate out the particles from a solution comprised of the OLED constituents in a common solvent. Applicant has experimentally formed a polymer blend particulate from the constituents Poly[2-Methoxy-5-(2'-ethylhexyloxy)-1,4--phenylenevinylene]; N,N-Di-(napthalen-a-yl)-N,N-diphenyl-benzidine; and 2,9-Dimethyl-4,7-diphenyl-1,1-phenanthroline. These OLED materials were obtained from H. W., Sands Corp, Jupiter, Fla. The three OLED constituents were first dissolved in a common solvent, chloroform, and then a non-solvent was added to form a precipitant of the blended polymers.

Nanoparticles are used in applications, such as drug deliver devices. Others have shown that very small polymer-based particles can be made by a variety of methods.

These nanoparticles vary in size, typically from 10 to 1000 nm. A drug can be dissolved, entrapped, encapsulated or attached to a nanoparticle matrix. Depending on the method of preparation, nanparticles, nanospheres or nanocapsules can be obtianed. (see, Biodegradable Polymeric Nanoparticles as Drug Delivery Devices, K. S., Soppimath et al., Journal of Controlled Release, 70(2001) 1-20, incorporated by reference herein). In accordance with the present invention, an OLED particulate can be formed having a very small particle size. The small particle size offers a number of advantages. For example, the ultimate resolution available of a display may be dependent on the size limitation of the OLED particles. Thus OLED nanoparticles utilized in accordance with the inventive fabrication methods will enable extremely high resolution display devices. Also, the very small OLED particle size will enable more light point sources within a given volume, such as the volume making up a display pixel.

A large number of light point sources can result in more uniform pixel characteristics, longer device lifetimes and more efficient power consumption. In accordance with the present invention, various methods can be employed to form the OLED nanoparticles. The various methods disclosed in this reference for the formation of drug delivery nanoparticles can be adapted for the formation of OLED nanoparticles. These methods include the solvent evaporation method, spontaneous emulsification, solvent diffusion method, salting out/emulsification-diffusion method, production of OLED nanoparticles using supercritical fluid technology, the polymerization of monomers, and nanoparticles prepared from hydrophilic polymers.

FIG. 76 illustrates a polymer blend organic light active particulate having a field attractive constituent for aligning the particle in an aligning field. In this case, the particulate includes a field reactive material, such as a magnetically reactive speck.

The magnetically reactive speck can be included in the particulate through an appropriate encapsulation, mixing, blending or coating technique.

FIG. 77 illustrates composite microcapsules containing multi-layered organic light active particles, each having a different light wavelength emission and turn-on voltage. The composite microcapsules or different species of particulate can be used to form a single layer voltage controlled light active device for emitting two or more colors of light. Instead of needing a separate set of electrodes and a separate layer of the semiconductor and carrier material mixture, the present invention enables a single layered device with a single pair of electrodes to controllably emit two or more colors of light.

FIG. 78 illustrates another composite microcapsule containing multi-layered organic light active particles, at least one having a field attractive constituent. The field attractive constituent may be required to enable alignment of the particles between the driving electrodes. When an aligning field is applied, the field reactive OLED particulate moves within the carrier material under the influence of the aligning field. The aligning field is applied to form a desired orientation of the field reactive OLED particulate within the fluid carrier.

FIG. 79 illustrates three light emitting microcapsule species, each species having a turn-on voltage controlled by the internal phase composition and the encapsulating shell composition. The shell may be formed of a polymer having a conductivity based on thickness and/or composition so that the specific turn-on voltage of the encapsulated conjugated polymer particulate is of a desired magnitude. By this additional turn-on voltage control enabled by the shell/internal phase electrical characteristics, the photons emitted by each species of conjugated polymer in response to an applied voltage can be tailored as required. The carrier fluid can be formulated so that it is more of an insulator prior to curing, and has the proper degree of conductivity after curing. In this case, the carrier fluid can act, more or less, like the oil in an oil/particulate electrical rheological fluid. The high voltage required to align the particulate between the electrodes can be applied without too much current passing through the particulate and burning them out. Once aligned, the electrical field can be reduced or eliminated as the carrier fluid cures. The carrier fluid can also have additives that affect the turn-on voltages of the different emitter species so that the appropriate number of photons is emitted from each point light source for each applied turn-on voltage.

Figure 80:
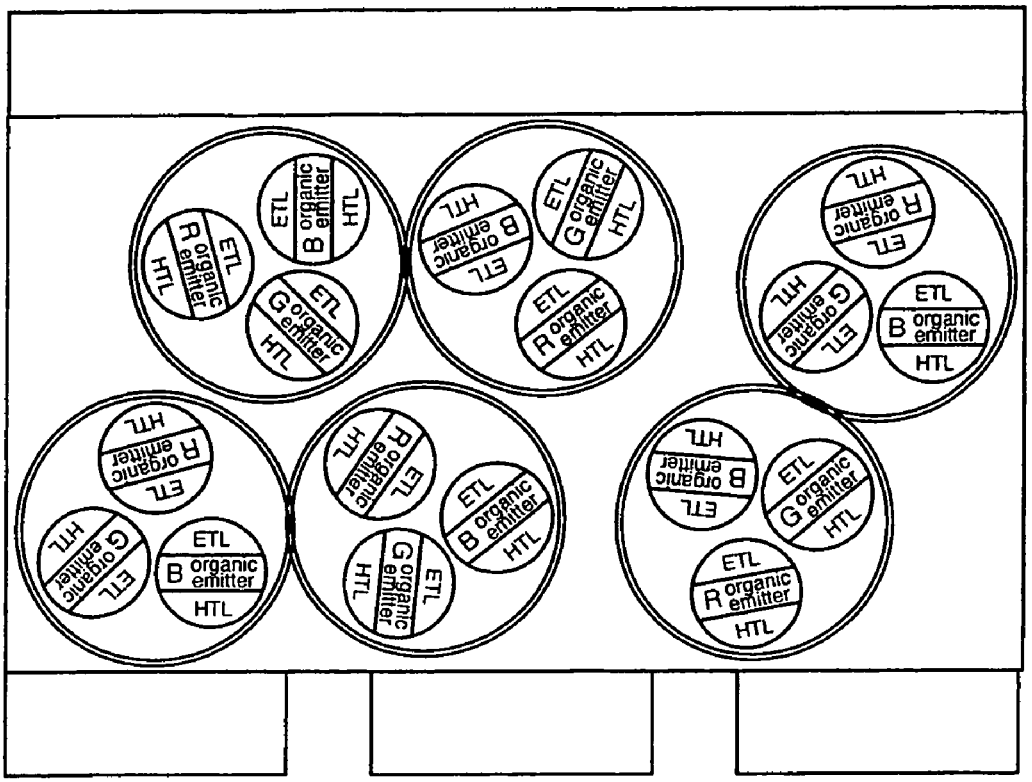
FIG. 80 illustrates an embodiment of the inventive voltage controlled light active device showing the composite microcapsule particulate randomly dispersed within a carrier.

FIG. 80 illustrates an embodiment of the inventive voltage controlled light active device showing the composite microcapsule particulate randomly dispersed within a carrier. The internal phase may be a polymer blend containing two or more conjugated polymers, each with a specific turn-on voltage for the controlled emission of color light. In an embodiment of a voltage controlled multi-colored light emitting device, a first electrode is provided with a second electrode disposed adjacent to it and defining a gap there-between. A mixture of an organic light active particulate and a conductive carrier material is disposed within said gap. The organic light active particulate is comprised of first emitting particles including a first electroluminescent conjugated polymer. The first emitting particles emit a number of photons of a first color in response to a first turn-on voltage applied to the electrodes. The first emitting particles also emit a different number of photons, zero or more, of the first color in response to other turn-on voltages. The organic light active particulate further comprises second emitting particles including a second conjugated polymer. The second emitting particles emit a number of photons of a second color in response to a second turn-on voltage and a different number of photons of the second color in response to other turn-on voltages. Thus, in the case of a multi-colored diode or display, different colors are perceivable by the human eye depending on the applied turn-on voltage. The organic light active layer may also include third emitting particles including a third electroluminescent conjugated polymer. The third emitting particles emit a number of photons of a third color and/or intensity in response to a third turn-on voltage applied to the electrodes and a different number of photons of the third color and/or intensity in response to other turn-on voltages. A full color display can be obtained by having the first color red, the second color green and the third color blue.

The composite microcapsule can contain three OLED particles or microcapsules, or it may be made from conjugated polymers and other material, such as non-conjugated polymers, organic light active materials, field attractive materials, inorganic light active material, etc. Each emitter emits light of a specific color range, R, G or B. Each color particle is formulated so that it emits light when a voltage in a specific voltage range is applied between the electrodes. A plurality of composite microcapsules are dispersed within a carrier fluid. The carrier fluid may be a hardenable material, such as an epoxy, resin, curable organic or inorganic material, heat or light curable monomer, and the like.

Figure 81:
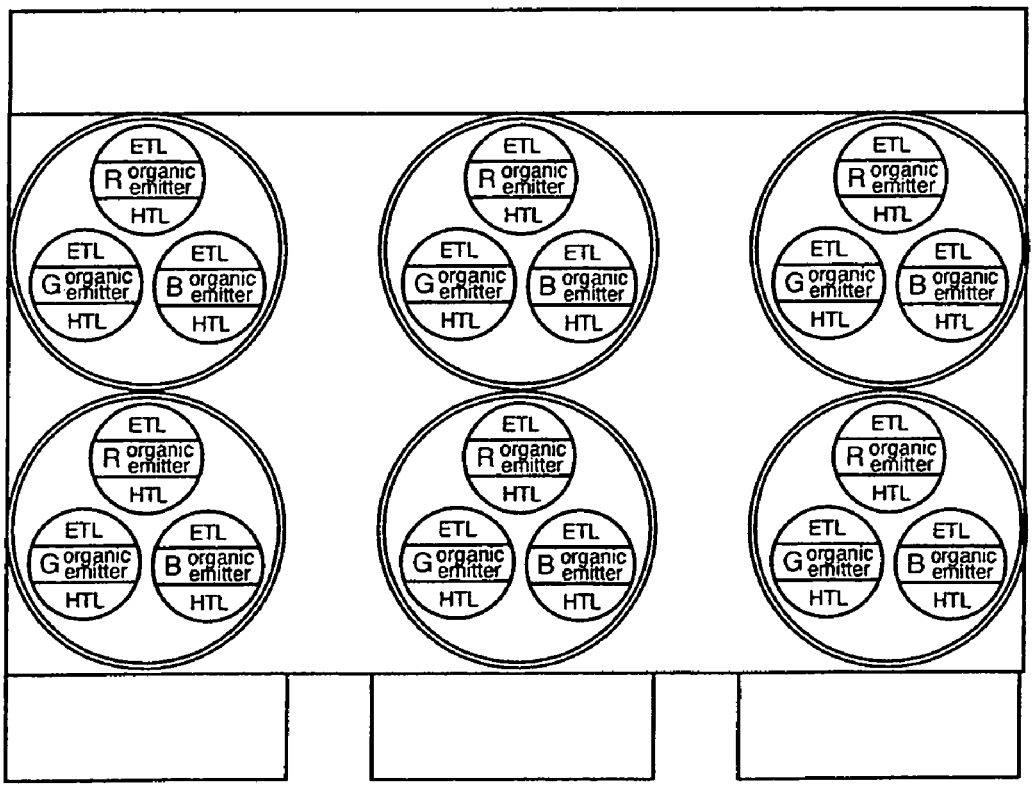
FIG. 81 illustrates an embodiment of the inventive voltage controlled light active device showing the composite microcapsule particulate aligned between electrodes.

FIG. 81 illustrates an embodiment of the inventive voltage controlled light active device showing the composite microcapsule particulate aligned between electrodes. An aligning field applied between the top electrode and the bottom electrode causes the field reactive OLED particulate to move under the influence of the aligning field. Depending on the particulate composition, carrier material and aligning field, the OLED particulate forms chains between the electrodes (similar to the particulate in an electrical or magnetic rheological fluid when an electrical or magnetic field is applied), or otherwise becomes oriented in the aligning field. The aligning field is applied to form a desired orientation of the field reactive OLED particulate within the fluid carrier. The fluid carrier may comprise a hardenable material. While the desired orientation of the field reactive OLED particulate is maintained by the aligning field, the carrier is cured to form a hardened support structure within which is locked in position the aligned OLED particulate.

Figure 82:
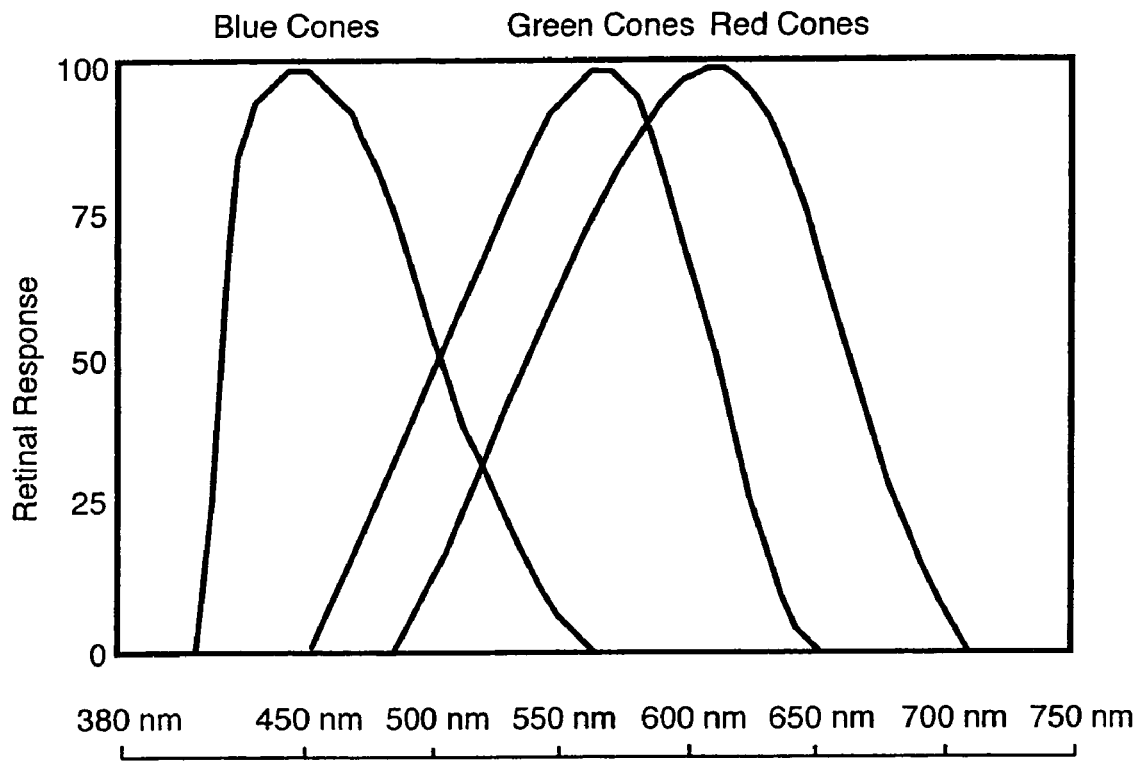
FIG. 82 illustrates the retinal response of the human eye to wavelengths of light in the visible spectrum.

FIG. 82 illustrates the retinal response of the human eye to wavelengths of light in the visible spectrum. When light enters the eye, it first passes through the cornea at the front of the eye and ultimately reaches the retina at the back of the eye. The retina is the light-sensing structure of the eye. The retina includes two types of cells, called rods and cones. Rods are responsible for vision in low light, and cones responsible for color vision and detail. There are three types of cones, each type responsive primarily to a specific segment of the visual spectrum. The light received by these rod and cone cells sets off complex chemical reactions. The chemical that is formed (activated rhodopsin) creates electrical impulses in the optic nerve. The brain interprets these electrical impulses in the visual cortex. The color-responsive chemicals in the cones are called cone pigments and are very similar to the chemicals in the rods. There are three kinds of color-sensitive pigments, red-sensitive pigment, green-sensitive pigment and blue-sensitive pigment.

Each cone cell has one of these pigments so that it is sensitive to that color. The human eye can sense almost any gradation of color when red, green and blue are mixed. Humans are able to perceive color throughout the visual spectrum because of the responsiveness of the three types of cones. Red absorbing cones absorb best at the relatively long wavelengths peaking at 565 nm. Green absorbing cones have a peak absorption at 535 nm and blue absorbing cones have a peak absorption at 440 nm.

The three types of cones are each most responsive to different portions (R,G,B) of the visible spectrum, but the segment of responsiveness overlap. Light of a given wavelength (color), for example 500 nm (green), stimulates all three types of cones, but the green-absorbing cones will be stimulated most strongly.

Typically, a full color display has side by side RGB pixels and generates three simultaneous emissions of RGB colored light, producing a mixture of wavelengths of light. Color is perceived by the eye through the simultaneous stimulation of the three types of cones by the color light mixture. In accordance with the present invention, a color is obtained by driving a multi-color producing light active device with an emission cycle during which the appropriate number of photons of different colors are produced in successive bursts of light emissions. A predominance of photons of a color is produced during a burst of emission in response to the application of a turn-on voltage. Another burst of a predominance of photons of another color is produced in response to the application of a different turn-on voltage. A fraction of the emission cycle is determined during which each turn-on voltage is applied so that an appropriate number of photons for each color is produced for each burst. The eye perceives the desired color by the successive predominate stimulation of each type of cone cell. Color is obtained by the combination of Xd # of photons of Red+Yd # of photons of Green+Zd # of photons of Blue. It may turn out experimentally that other wavelengths of light can be used to stimulate the vision system to perceive variable colors from the burst emission of photons, in which case the number and wavelength of the different colors along the emissive spectrum can be employed.

The shell of each particle may be a controlling effect on the turn-on voltage of the encapsulated OLED. The composition of the encapsulated OLED controls the color of the light emitted. The shell thickness and composition can be controlled so that the turn-on voltage of each primary color particulate is distinct from the turn-on voltage of the others. For example, each RGB particle can have a specific shell structure selected so that when a high turn-on voltage is applied, the electrons move too slowly through the lower voltage shell and/or internal phase to cause complete or partial turn-on (i.e., reduced number of emitted photons) of the encapsulated emitter.

Each color emitter can be formulated so that it has a different threshold turn-on voltage and/or a different threshold turn-on pulse width and/or a different threshold turn-on polarity. As an example, since more electrons and holes move at higher voltage potential, the higher voltage emitter made to have a lower pulse width would emit the same number of photons as the lower voltage, longer pulse width emitters. But, even though the voltage threshold for lower voltage emitters is exceeded when the higher voltage emitter is driven, the pulse width of the higher voltage is too short to turn-on the lower voltage emitter. As an example, the hole and/or electron transport material can be formulated to slow down the progress of the electrons and holes in the lower voltage material so that even though more electrons and holes are injected at the higher voltage, are not able to cross through the material and recombine in the lower voltage emitter (the recombination of the holes and electrons results in a photon).

A variable DC/AC voltage/current source applies electrical energy to the electrodes. In response to the applied energy, light is emitted from the particulate through the top electrode. In an AC voltage application, each cycle has a predetermined voltage. With each cycle, a predominant color of light (for example, R, G, B) is emitted in response to the predetermined voltage (or no color is emitted). The color emitted depends on the turn-on voltage of the R, G or B particles. Dual color particles or tri color particles (or 4 colors, including IR, for example) are obtainable by the various known particulate construction techniques and those described herein. The burst emission cycles are fast enough that the eye perceives the desired color of the visible spectra. For example, rods and cones of the eye are stimulated by the three primary colors separately but in quick succession so that each frame of a video, for example, is perceived in full color. Because of the very fast turn-on times of the emitting particles, and the burst emission driving scheme, a passive matrix can be used while still obtaining superior video images. Each individual scan cycle of an electrode pair can have a large number of burst cycles. With each burst cycle, a particular predominant color is emitted. Thus, in each scan cycle, the eye see separate colored light bursts but the cones and rods are stimulated in such quick succession that a mix of the primary colors (or, if preferable other two or more colors) is perceived by the brain from the optic nerve.

By selecting the appropriate formula of the conductive carrier, it can be a hole transport vehicle and an electron transport vehicle. The organic emitter may not have to be a multi-layered particulate, but rather, it may be just particles of pure organic emitter.

Depending on the configuration and composition of the various components, the inventive voltage controlled light active device can be AC driven, with the first turn-on voltage having a polarity and the second turn-on voltage having an opposite polarity. The different turn-on voltages can be a mix of voltages of different polarities and magnitudes.

The organic light active layer may also comprise at least one additional emitting particles containing another electroluminescent conjugated polymer. The additional emitting particles emitting a number of photons in response to a turn-on voltage and a different number of photons in response to other turn-on voltages. The photons emitted by the additional emitting particles can have a color that is within the visible spectrum. In this case, the additional emitting particles can enhance the visible display capabilities. For example, the intensity of the light emitted by one of the primary color emitters may become diminished because of the emitter service lifetime. Other emitters having the same color, but different turn-on voltage can be put into service to maintain the effectiveness of the total display. The photons emitted by the emitting particles may also be outside the range of the visible spectrum. For example, infra-red photons can be controllably emitted to enable stealth military application of the inventive display.

The voltage controlled organic light active device can be constructed as a display. In this case, the first electrode is part of an x-grid of electrodes and the second electrode is part of a y-grid of electrodes. The mixture of the organic light active particulate and the conductive carrier material in the gap between the first electrode and the second electrode make up an emissive component of a pixel of a display device.

As an example of voltage controlled emitter, the first and the second electroluminescent conjugated polymers may include a plurality of members selected from the group consisting of polythiophenes, poly(paraphenylenes), and poly(paraphenylene vinylene), at least some of said members having substituents selected from the group consisting of alkyl, alkoxy, cycloalkyl, cycloalkoxy, flouroalkyl, alkylphenylene, and alkoxyphenylene vinylene.

An organic light active display device includes a substrate with a first grid of driving electrodes formed on the substrate. A second grid of electrodes is disposed adjacent to the first grid of electrodes and defining a gap there-between. A mixture of an organic light active particulate and a conductive carrier material is disposed within the gap. The organic light active particulate comprising first particles including a first electroluminescent conjugated polymer having a first turn-on voltage and second particles including a second electroluminescent conjugated polymer having a second turn-on voltage different than the first turn-on voltage. When the first turn-on voltage is applied, a first color is emitted by the first electroluminescent conjugated polymer. Light having a second color is emitted by the second electroluminescent conjugated polymer in response to the second turn-on voltage applied to the first electrode and the second electrode.

Figure 83:
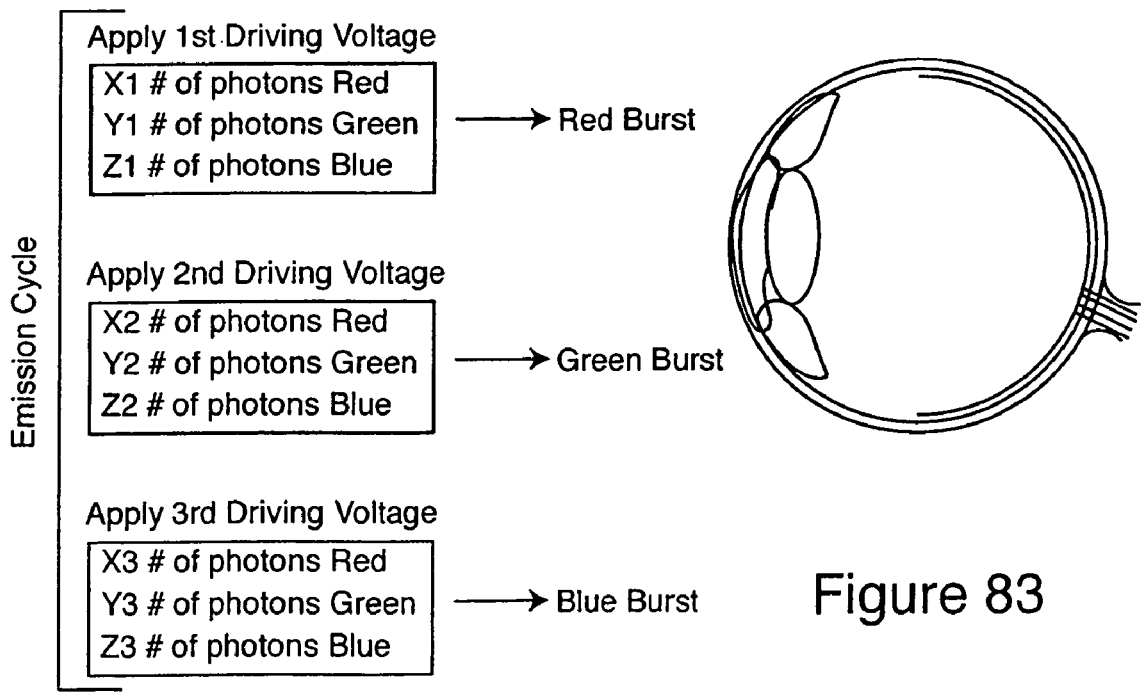
FIG. 83 illustrates the inventive primary color burst driving method for producing a perceived full color image by the rapid and sequential bursts of primary colored light emission.

FIG. 83 illustrates the inventive primary color burst driving method for producing a perceived full color image by the rapid and sequential bursts of primary colored light emission. In accordance with the present invention, a method is provided for driving a multi-color light emitting device, the multi-color light emitting device capable of emitting two or more colors in sequence. Each color is emitted in response to a respective different applied turn-on voltage. During an emission cycle, a first turn-on voltage is applied having a duration to the light emitting device so that a first burst of a predominant number of photons of a first color are emitted. A second turn-on voltage is then applied during the emission cycle having a duration and at least one of a magnitude and a polarity different than a magnitude and polarity of the first turn-on voltage. For the second turn-on voltage duration, a second burst of a predominant number of photons of a second color are emitted. In this way, during the emission cycle the first burst and the second burst occur in rapid succession. A human eye receiving the first burst and the second burst is stimulated to perceive a color that is different than the first color and the second color.

During the emission cycle, a third turn-on voltage can be applied having a duration and at least one of a magnitude and a polarity different than the magnitude and polarity of the other turn-on voltages. A third burst of a predominant number of photons of a third color are emitted. During the emission cycle, the first burst, the second burst and the third burst occur in rapid succession and the human eye receiving the bursts is stimulated to perceive a color different than the first color, the second color and the third color.

In accordance with the present invention, the first color is in the red portion of the visible spectrum, the second color is in the green portion of the visible spectrum and the third color is in the blue portion of the visible spectrum. The light-emitting device is controlled so that the number of photons of each color emitted during each burst of the emission cycle results in a predetermined color within the visible spectrum being perceivable by the human eye. Even though there is not the three simultaneous emissions of R,G,B emitted by a typical full color display, in accordance with the present invention, the successive burst emission results in the perception of a predetermined color in the visible spectrum.

FIG. 84 illustrates the inventive retinex burst driving method for producing a perceived full color image by the rapid and sequential bursts of colored light emission. In accordance with another aspect of the present invention, the intensity, duration and color emitted by the multi-color light emitting device is adjusted according to a retinex display operation. Edwin Land introduced a theory of color vision based on center/surround retinex (see, An Alternative Technique for the Computation of the Designator in the Retinex Theory of Color Vision," Proceedings of the National Academy of Science, Volume 83, pp. 3078-3080, 1986). Land disclosed his retinex theory in "Color Vision and The Natural Image," Proceedings of the National Academy of Science, Volume 45, pp. 115-129, 1959. These retinex concepts are models for human color perception. The earlier retinex concepts involved the computations based on when color boundaries were crossed in the light emitted from an image. Land's retinex concept of human vision has a center/surround spatial computation with a center having 2-4 arc-minutes in diameter and a surround that is an inverse square function with a diameter of about 200-250 times that of the center. Others have shown that a digital image can be improved utilizing the phenomenon of retinex (see, U.S. Pat. No. 5,991,456 issued to Rahman et al, the disclosure of which is incorporated by reference herein). The inventors of the U.S. Pat. No. 5,991,456 used Land's retinex theory and devised a method of improving a digital image where the image is initially represented by digital data indexed to represent positions on a display. The digital data is indicative of an intensity value $I_i(x,y)$ for each position $(x,y)$ in each i-th spectral band. The intensity value for each position in each i-th spectral band is adjusted to generate an adjusted intensity value for each position in each i-th spectral band in accordance with an equation based on the total number of unique spectral bands. A surround function is used to improve some aspect of the digital image, e.g., dynamic range compression, color constancy, and lightness rendition. The adjusted intensity value for each position in each i-th spectral band is filtered with a common function. According to the inventors of the U.S. Pat. No. 5,991,456, an improved digital image can then be displayed based on the adjusted intensity value for each i-th spectral band so-filtered for each position.

FIG. 85 illustrates the inventive adjusted color burst driving method for producing a perceived full color image by the rapid and sequential bursts of adjusted colored light emission. The retinex display operation may include the steps of providing digital data indexed to represent positions on a display. The digital data is indicative of an intensity for each position in each spectral band. The intensity of each position in each spectral band is adjusted to generate an adjusted intensity value in accordance with a predetermined mathematical equation. The adjusted intensity value is filtered for each position with a common function. The turn-on voltages are controlled so that the emission of photons of each color is based on the adjusted intensity value for each filtered spectral for each position.

Figure 87:
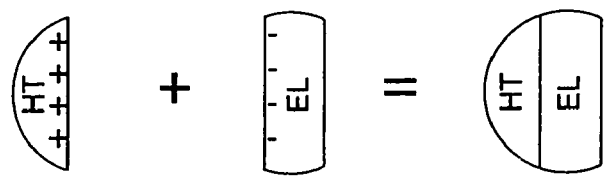
FIG. 87 illustrates a layered organic light active material particulate formed by the commingling of a particle of hole transport material with a particle of emissive layer material.
Figure 88:
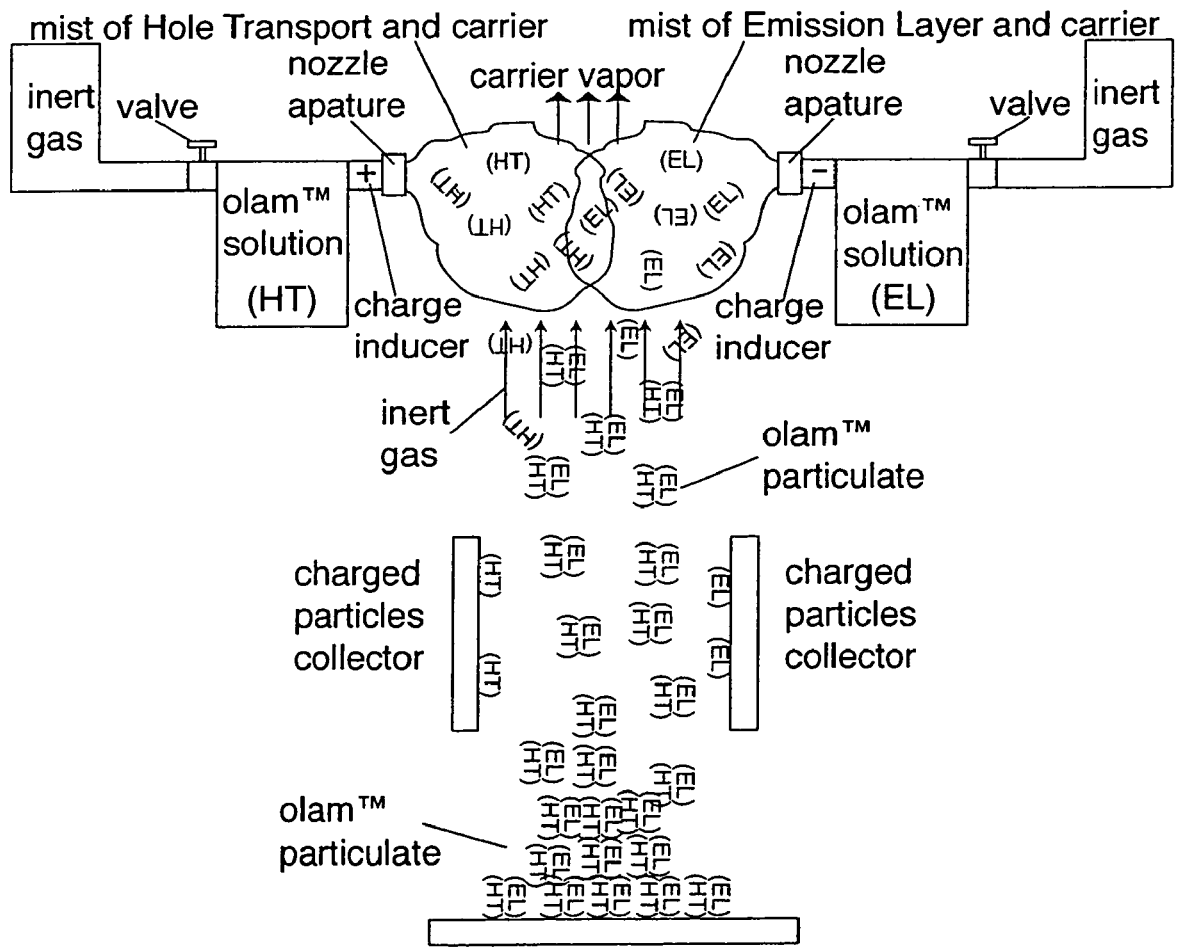
FIG. 88 illustrates the inventive method of forming a layered organic light active material particulate from a hole transport constituent and an emissive layer constituent.

FIG. 86 is a flow chart showing the steps of the inventive method for forming a multi-layered organic light active material particulate. FIG. 87 illustrates a layered organic light active material particulate formed by the commingling of a particle of hole transport material with a particle of emissive layer material. In this example, a first mist comprises a hole transport material (HT) and carrier, and a second mist comprises an emission layer material (EL) and carrier. FIG. 88 illustrates the inventive method of forming a layered organic light active material particulate from a hole transport constituent and an emissive layer constituent. Referring to FIGS. 86-88, a first mixture ((HT) and carrier) is formed of a first organic light active component material and a first carrier fluid (step one). A second mixture ((EL) and carrier) is formed of a second organic light active component material and a second carrier fluid (step two). A first mist or very fine droplets is generated of the first mixture in an environment so that a first particulate of the first organic light active component material is temporarily suspended in the environment (step three). A second mist of the second mixture is generated in the environment so that a second particulate of the second organic light active component material is temporarily suspended in the environment (step four). The first particulate and the second particulate are allowed to commingle and attract together in the environment to form a first layered organic light active material particulate ((HT)(EL)) (step six). The layered organic light active particulate has a first layer of the first organic light active component material and a second layer of the second organic light active component material.

Figure 89:
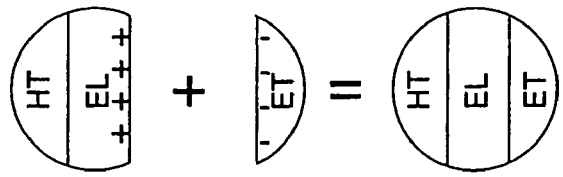
FIG. 89 illustrates a multi-layered organic light active material particulate formed by the commingling of a layered particle of hole transport/emissive layer material with a particle of electron transport material.
Figure 90:
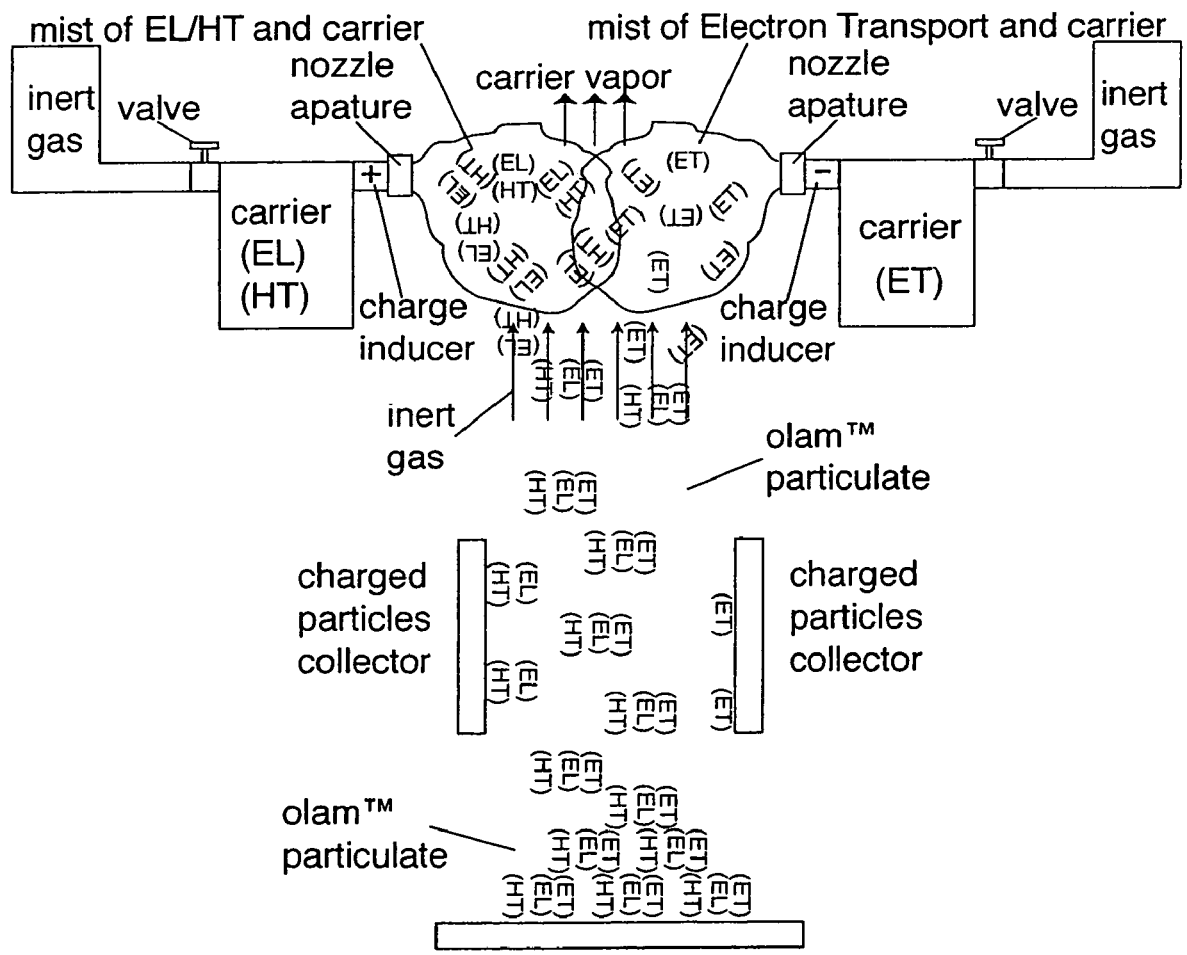
FIG. 90 illustrates the inventive method of forming a multi-layered organic light active material particulate from a hole transport/emissive layer constituent and an electron transport constituent.

FIG. 89 illustrates a multi-layered organic light active material particulate formed by the commingling of a layered particle of hole transport/emissive layer material with a particle of electron transport material. FIG. 90 illustrates the inventive method of forming a multi-layered organic light active material particulate from a hole transport/emissive layer constituent and an electron transport constituent. An organic light active material particulate can be formed having multiple layers. A third mixture is formed of a third organic light active component material (ET) and a third carrier fluid. A fourth mixture is formed of the first layered organic light active material particulate ((HT)(EL)) and a fourth carrier fluid. A mist of the third mixture is generated in the environment so that a third particulate of the third organic light active component material is temporarily suspended. A mist of the fourth mixture is generated so that the first layered organic light active material particulate is temporarily suspended in the environment. The third particulate and the first layered organic light active material particulate are allowed to commingle and attract together in the environment to form a second layered organic light active material particulate. This second layered organic light active material particulate includes the first organic light active material particulate and the third organic light active component material. Thus the resulting organic light active material particulate has a multi-layered structure that includes all three of the organic light active component materials arranged in a desired order ((HT)(EL)(ET)).

Figures 91, 92:
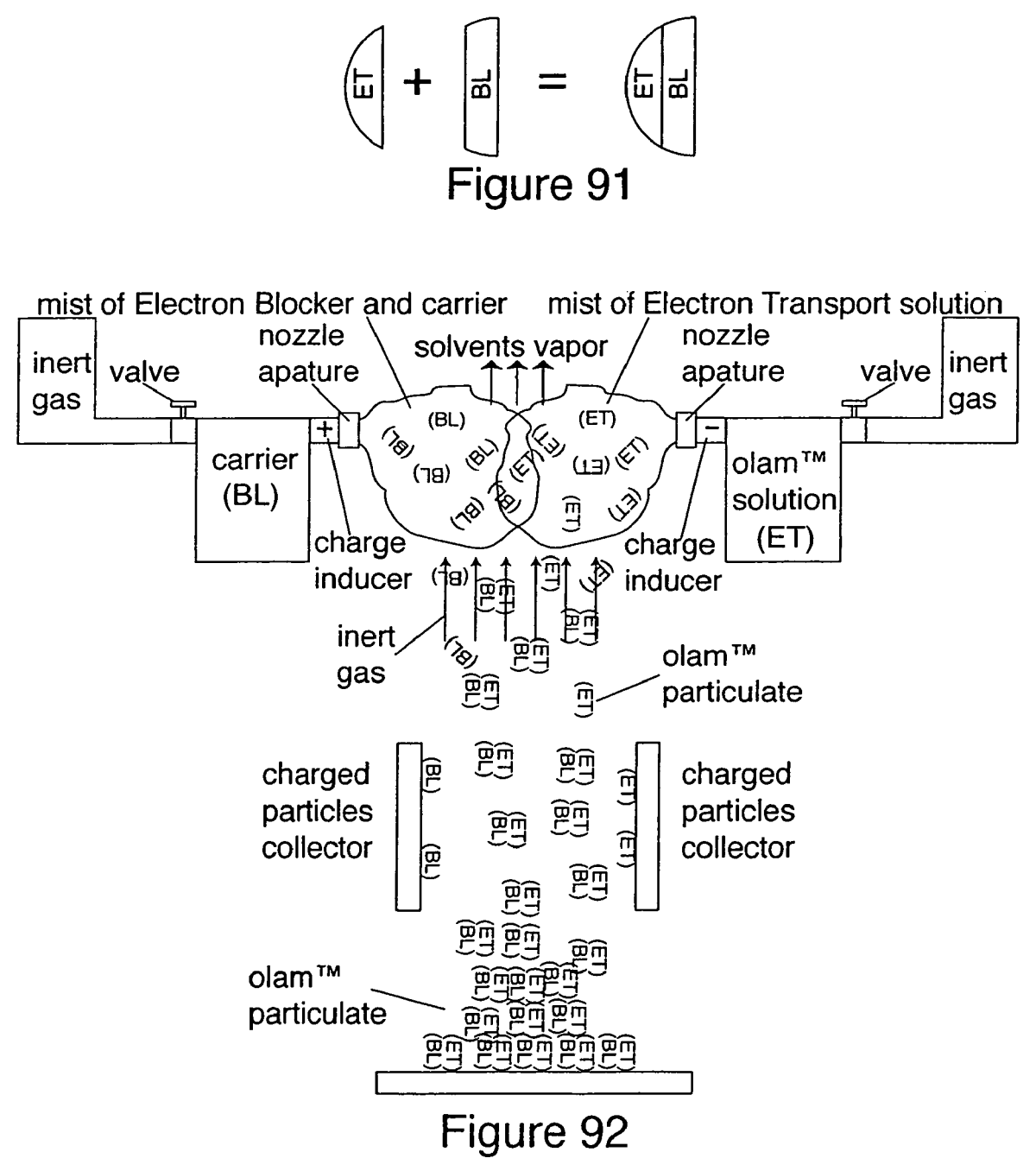
Figure 93:
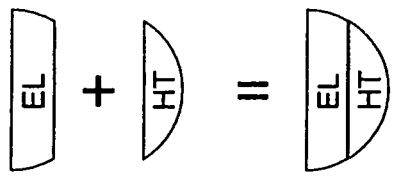
FIG. 93 illustrates a layered organic light active material particulate formed by the commingling of a particle of emissive layer material with a particle of hole transport material.
Figure 94:
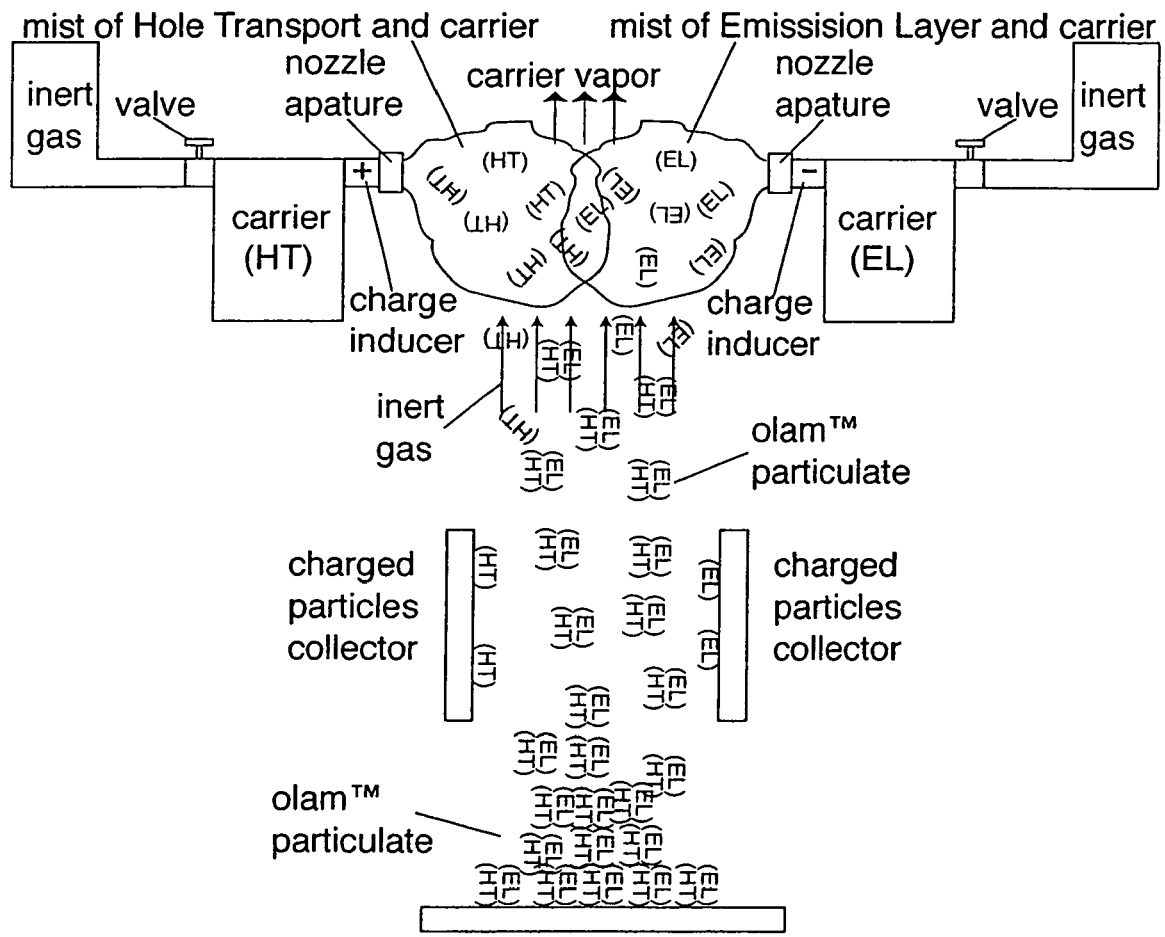
FIG. 94 illustrates the inventive method of forming a layered organic light active material particulate from an emissive layer constituent and a hole transport constituent.
Figure 95:
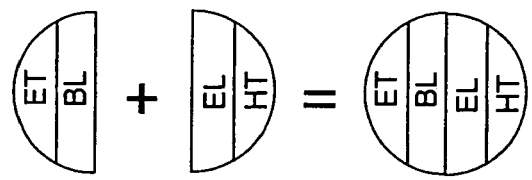
FIG. 95 illustrates a multi-layered organic light active material particulate formed by the commingling of a layered particle of blocking/electron transport material with a layered particle of emissive layer/hole transport material.
Figure 96:
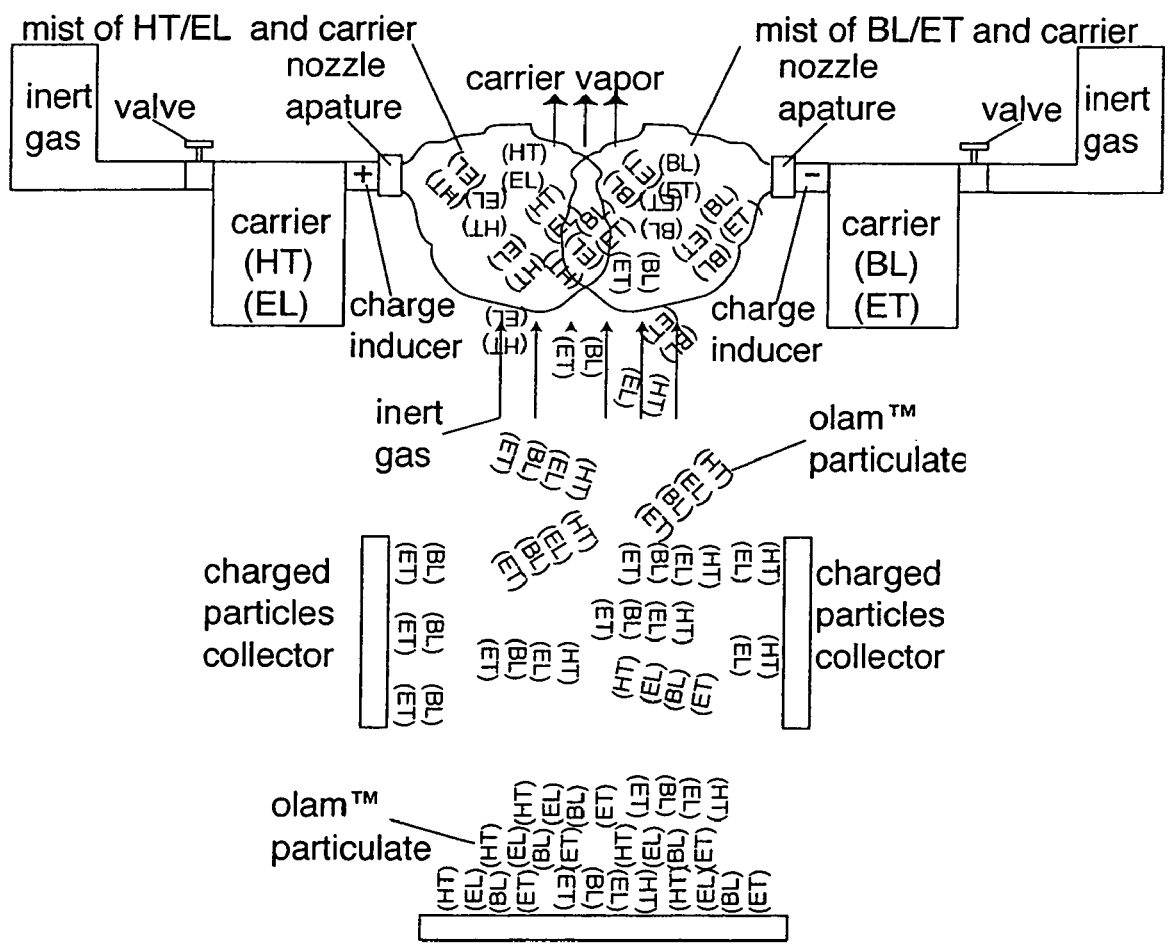
FIG. 96 illustrates the inventive method of forming a multi-layered organic light active material particulate from a blocking/electron transport constituent and a hole transport/emissive layer constituent.

In accordance with the present invention, a multilayered particulate structure can be obtained for obtaining electrophosphorescent OLED particulate. FIG. 91 illustrates a layered organic light active material particulate formed by the commingling of a particle of blocking material with a particle of electron transport material. FIG. 92 illustrates the inventive method of forming a layered organic light active material particulate from a blocking constituent and an electron transport constituent. FIG. 93 illustrates a layered organic light active material particulate formed by the commingling of a particle of emissive layer material with a particle of hole transport material. FIG. 94 illustrates the inventive method of forming a layered organic light active material particulate from an emissive layer constituent and a hole transport constituent. FIG. 95 illustrates a multi-layered organic light active material particulate formed by the commingling of a layered particle of blocking/electron transport material with a layered particle of emissive layer/hole transport material. FIG. 96 illustrates the inventive method of forming a multi-layered organic light active material particulate from a blocking/electron transport constituent and a hole transport/emissive layer constituent. As shown in FIGS. 89-96, a multi-layered particle can be built up having the constituent parts ordered in a desired manner so that the multi-layered particle is an effective point source light emitter.

Additional layers can be added to the multi-layered structure by forming another mixture of another organic light active component material and another carrier fluid and forming yet another mixture of a previously formed layered organic light active material particulate and yet another carrier fluid. The resulting particles are suspended in the environment as described above and allowed to commingle and attract together to form the multi-layered particulate structure.

At least one of the first, second and subsequent organic active component material may comprise at least one of a hole transport material, an emission layer material, an electron transport material, and a blocking material. Other organic active component material can include at least one of a magnetic material, an electrostatic material, a desiccant, hole injecting material, and an electron injecting material. Thus, a selection of constituents can be made so that a multi-layered particulate structure can be formed having desired electrical, optical, mechanical, field attractive and chemical properties. The number of layers and their order and composition can be controlled depending on the desired particulate attributes.

Figure 97:
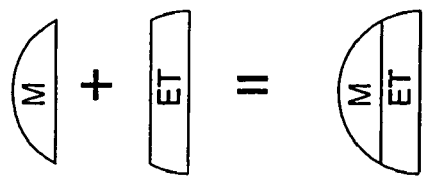
FIG. 97 illustrates a layered organic light active material particulate formed by the commingling of a particle of field attractive material with a particle of electron transport material.
Figure 98:
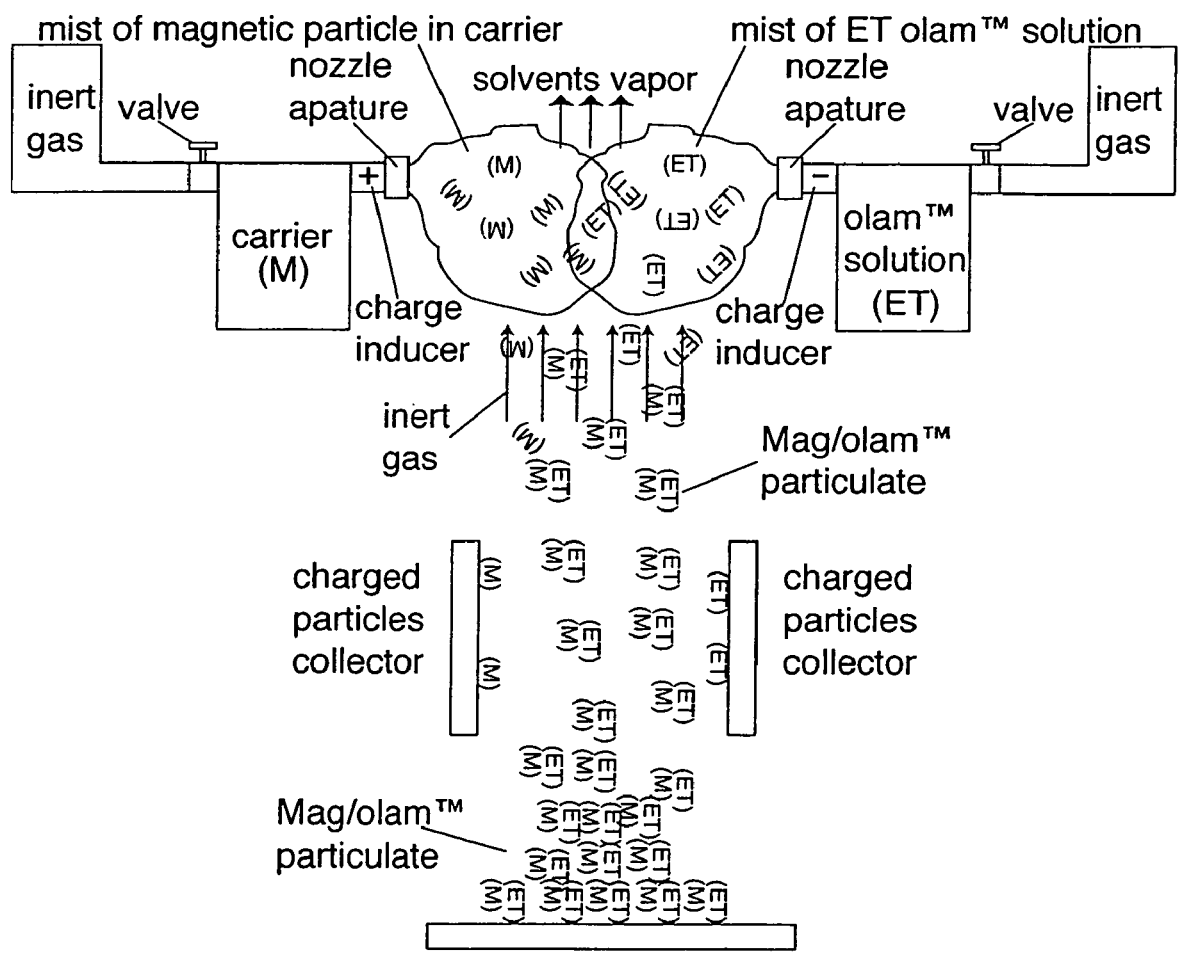
FIG. 98 illustrates the inventive method of forming a layered organic light active material particulate from a field attractive constituent and an electron transport constituent.
Figure 99:
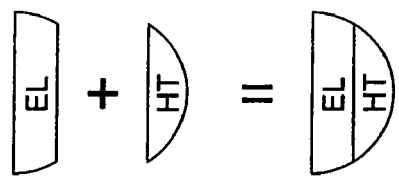
FIG. 99 illustrates a layered organic light active material particulate formed by the commingling of a particle of emissive layer material with a particle of hole transport material.
Figure 100:
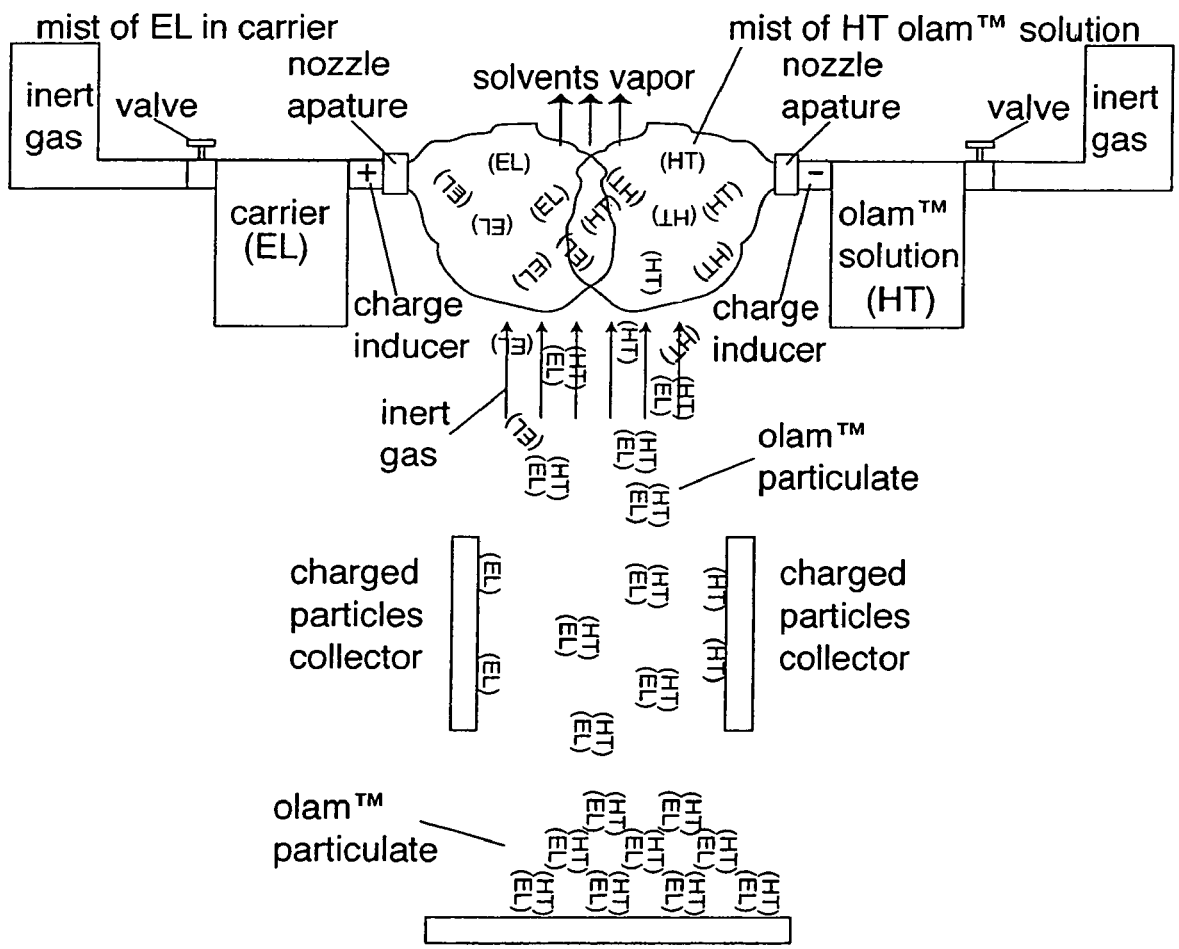
FIG. 100 illustrates the inventive method of forming a layered organic light active material particulate from an emissive layer constituent and a hole transport constituent.
Figures 101, 102:
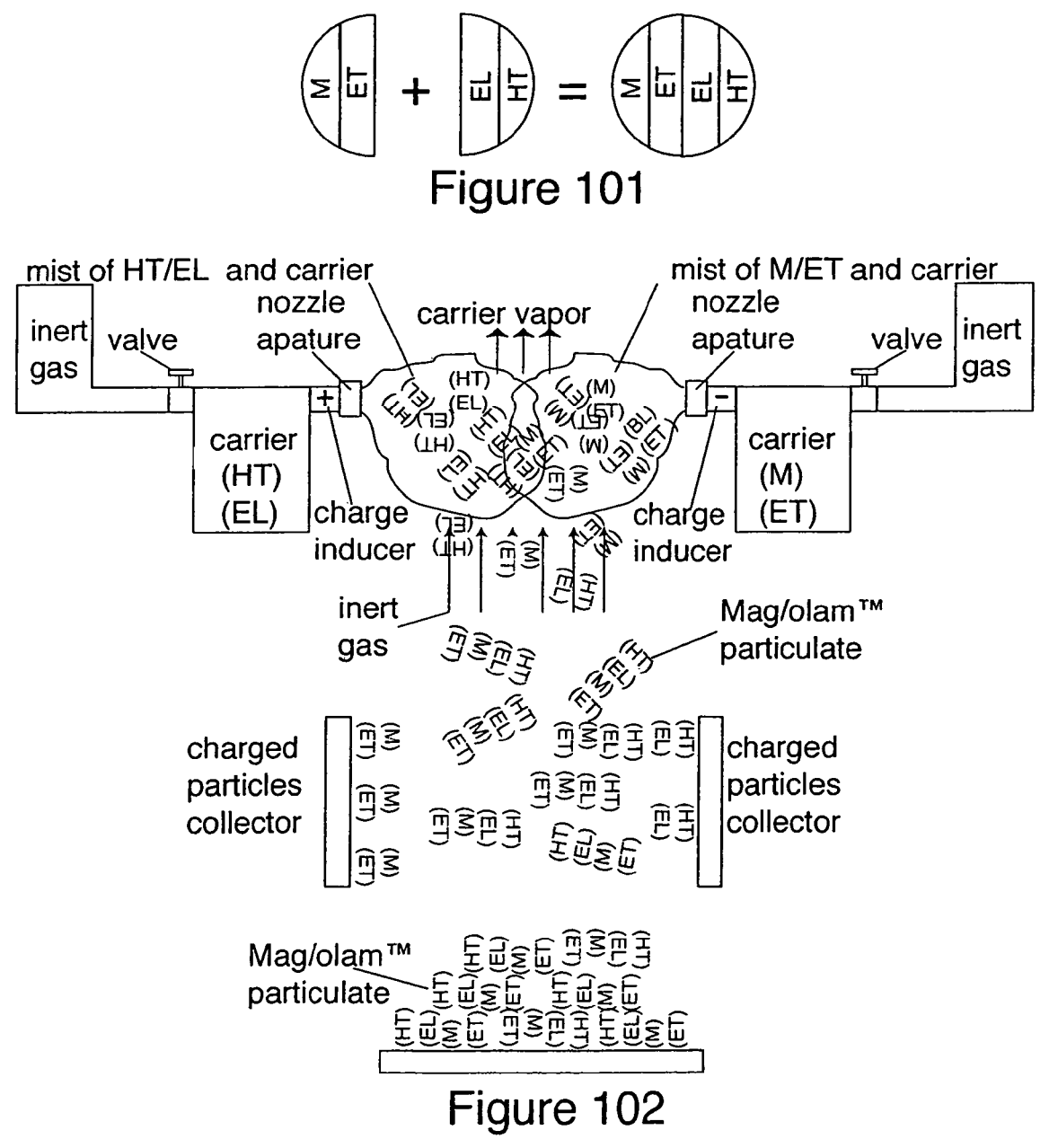

FIG. 97 illustrates a layered organic light active material particulate formed by the commingling of a particle of field attractive material with a particle of electron transport material. FIG. 98 illustrates the inventive method of forming a layered organic light active material particulate from a field attractive constituent and an electron transport constituent. FIG. 99 illustrates a layered organic light active material particulate formed by the commingling of a particle of emissive layer material with a particle of hole transport material. FIG. 100 illustrates the inventive method of forming a layered organic light active material particulate from an emissive layer constituent and a hole transport constituent. FIG. 101 illustrates a multi-layered organic light active material particulate formed by the commingling of a layered particle of field attractive/electron transport material with a layered particle of emissive layer/hole transport material. FIG. 102 illustrates the inventive method of forming a multi-layered organic light active material particulate from a field attractive/electron transport constituent and a hole transport/emissive layer constituent. As shown in FIGS. 97-102, the point source light emitting particulate can be field attractive by the inclusion of a material, such as a magnetically reactive material, as one of the constituents of the particulate.

At least one of the first and the second and subsequent carrier fluids may be a solvent of the organic light active component material, and the solvent removed by evaporation or otherwise to leave the particulate suspended in the environment. Alternatively, a precipitation can be obtained by a suitable chemical reaction depending on the component material and the solvent. The chemical reaction may be caused by the addition of material to the solution prior to or after forming the mist. The chemical reaction may be caused by the carrier material of the opposing mist, or the precipitating material may be otherwise applied when the solution is in the mist form. The environment can be gaseous, liquid or a vacuum. It may have a flow, such as a flow of inert gas, to carry away evaporated solvent and/or to more the very fine droplets and the commingled particulate.

The first, second and subsequent organic light active component material may a fine particulate insoluble in the respective first, second and subsequent carrier fluids. The third and subsequent organic light active particulate may be a multi-layered organic light active material particulate, which may be formed by the inventive method, microencapsulation, chemical reaction of two or more constituents, electric or magnetic attraction of two or more constituents, or other means for forming a multi-layered organic light active material particulate. The organic light active material particulate formed in accordance with the inventive method may also be encapsulated in a shell to impart chemical, magnetic, electrical or optical attributes to the particulate. For example, in the case of a voltage controlled emitter, the microcapsule shell can be composed of a material selected to prevent unwanted photon emission from the internal phase emitter, and/or to promote wanted photon emission from the emitter, depending on the applied turn-on voltage.

The environment in which the particulate is formed can be an inert gas, reactive gas, a vacuum, a liquid or other suitable medium. For example, it may be advantageous for the environment to include elements that perform a catalytic function to promote a chemical reaction in or between the constituents in the mists. A characteristic enhancing treatment may be performed on the formed layered organic light active material particulate. The treatment may be a temperature treatment, a chemical treatment, a light energy treatment to cause, for example, light activated cross-linking, or other characteristic enhancing treatment to impart desired attributes to the formed particulate.

The constituents that attract and form the particulate may be given a charge to encourage the commingling into the particulate. For example, the first mist may be given a charge have a polarity and the second mist given a charge having an opposite polarity. The electrical attraction is thus enhanced between the first organic light active particulate and the second organic light active particulate.

Figure 103:
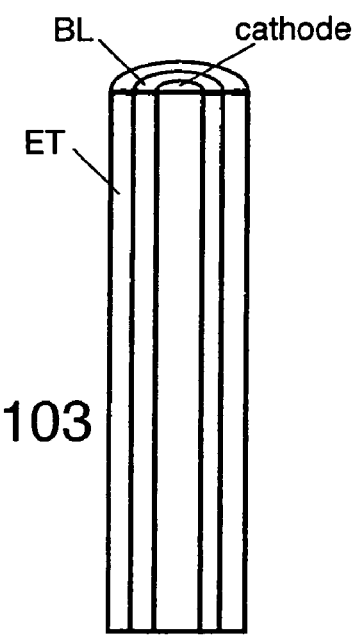
FIG. 103 is a cross section of a coated cathode fiber having a blocking layer formed on the cathode fiber and an electron transport layer formed on the blocking layer.

FIG. 103 is a cross section of a coated cathode fiber having a blocking layer formed on the cathode fiber and an electron transport layer formed on the blocking layer.

Figure 104:
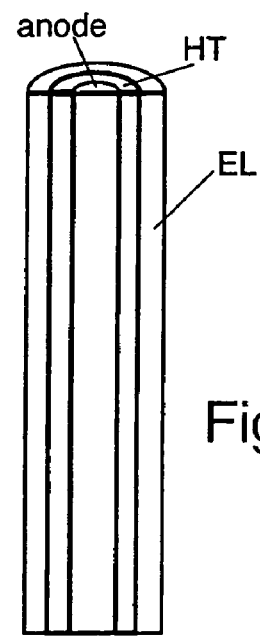
FIG. 104 is a cross section of a coated anode fiber having a hole transport layer formed on the anode fiber and an emissive layer formed on the hole transport layer.

FIG. 104 is a cross section of a coated anode fiber having a hole transport layer formed on the anode fiber and an emissive layer formed on the hole transport layer.

Figure 105:
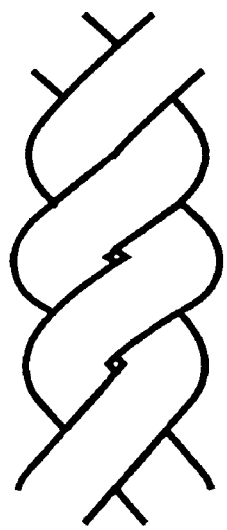
FIG. 105 illustrated the coated cathode fiber and the coated anode fiber twisted together to form an emissive fiber.

FIG. 105 illustrates the coated cathode fiber and the coated anode fiber twisted together to form an emissive fiber. In accordance with this aspect of the invention, a conductive fiber is coated with the organic light emitting material. A single conductive fiber can be coated with all or any number of the layers of the organic stack, including a blocking layer, electron transport layer, emissive layer, hole transport layer, etc. A second conductor can then be formed over the organic stack, such as ITO, so that light generated in the organic stack is emitted through the transparent ITO layer. Alternatively, a conductive wire can be coiled around the organic stack to act as the second conductor. As shown in FIGS. 35 and 36, as another alternative, the cathode and anode fibers can be coated with respective layers of the organic stack and then, as shown in FIG. 105, twisted together to form an emissive fiber.

Figure 106:
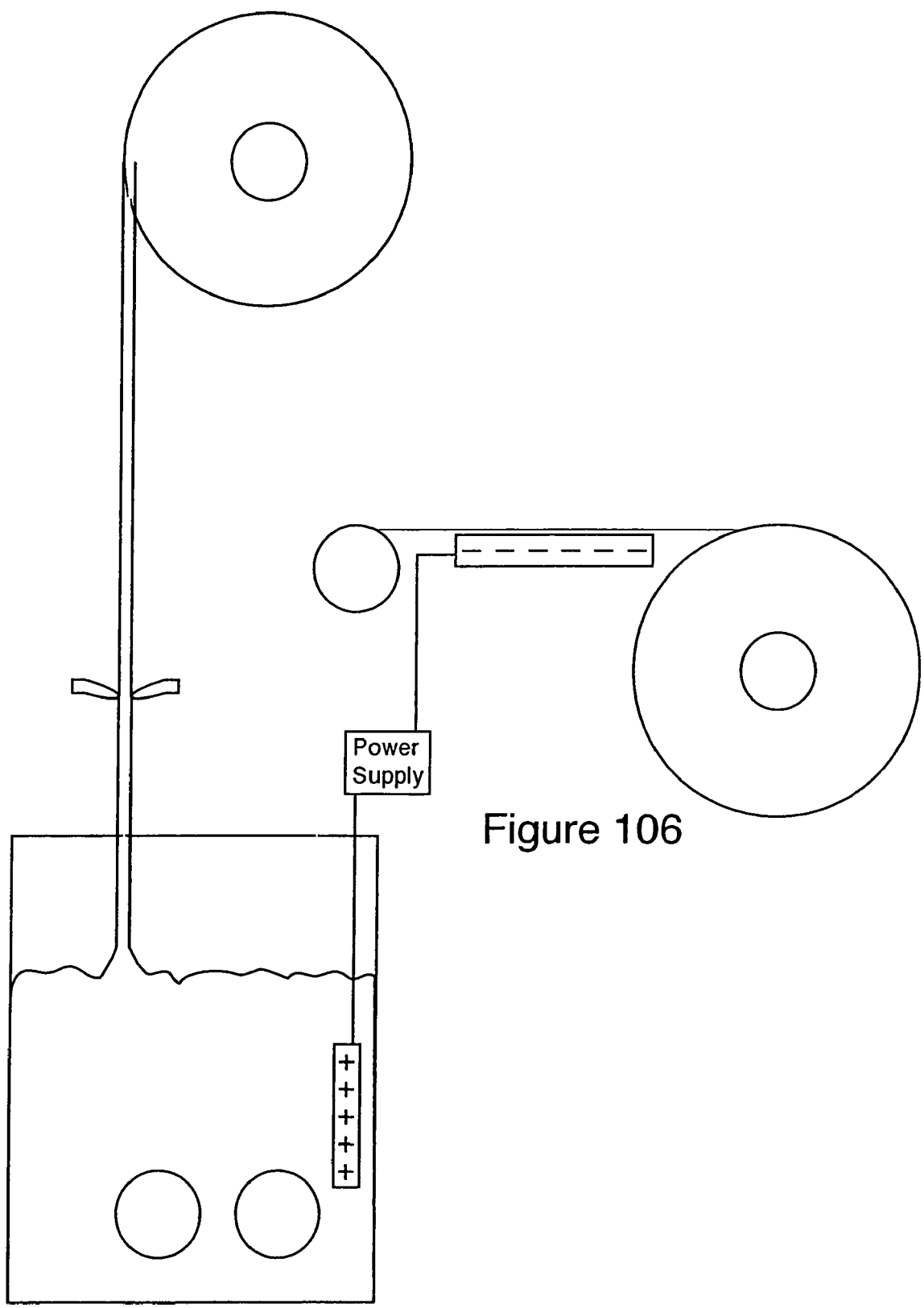
FIG. 106 shows a method for coating an electrode wire with organic light active device material.

FIG. 106 shows a method for coating an electrode fiber with organic light active device material. The electrode fiber can be spray coated, spin coated, dip coated and/or plated with the appropriate layers of the organic stack. Alternatively, the electrode fiber can be vacuum coated, evaporation coated, etc. These emissive fibers can be used for making items, such as lights, clothing, wall hangings and carpeting that emit light.

Figure 107:
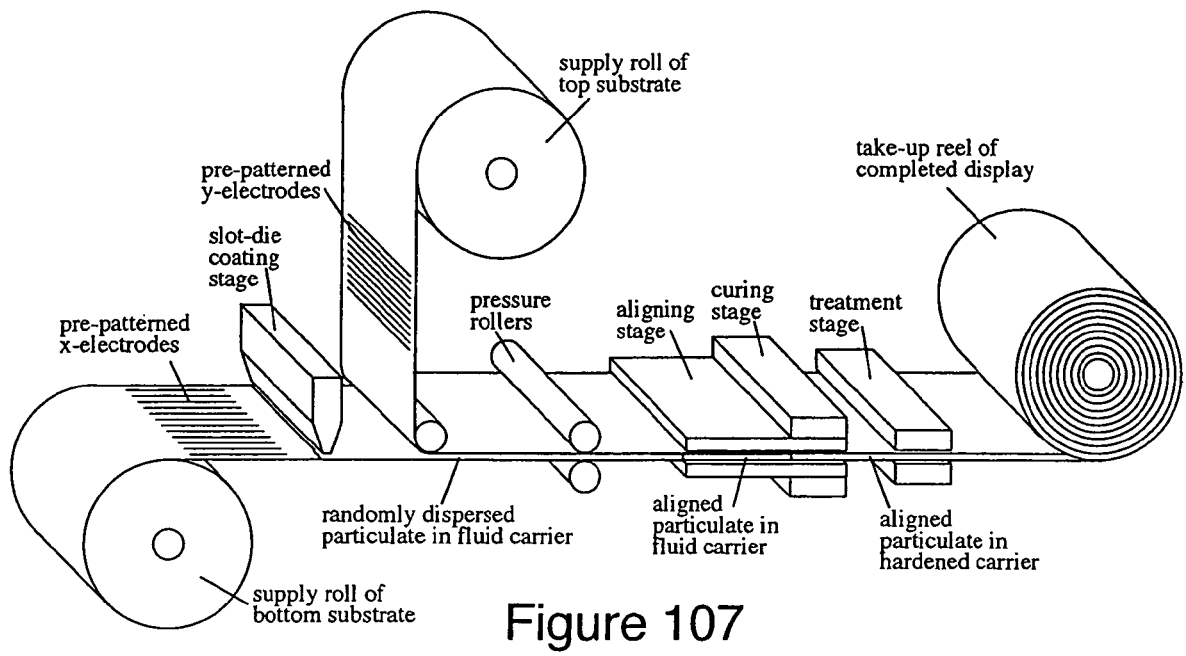
FIG. 107 is a schematic view of a fabrication line utilizing the inventive OLED particulate/conductive carrier mixture.

FIG. 107 is a schematic view of a fabrication line utilizing the inventive OLED particulate/conductive carrier mixture. In accordance with the present invention, traditional polymer film fabrication techniques can be applied to the formation of a solid state, flexible, high resolution display. These fabrication techniques can also be used to form other solid state light active devices such as lighting components and solar panels.

An example of the inventive fabrication method in a roll-to-roll process begins with a supply roll of bottom substrate and a supply roll of top substrate. The substrates have pre-formed on them transparent electrode patterns. A slot-die coating stage introduces onto the bottom substrate a film of a fluid carrier containing randomly dispersed OLED particulate. The top substrate is placed over this film. Pressure rollers ensure the proper uniform thickness of the particulate/carrier mixture between the substrates. At an aligning stage, an aligning field is applied to the OLED particulate. This applied field causes the particulate to orient and align within the still fluid carrier. With the applied field maintaining the position of the aligned particulate, the carrier is hardened at the curing stage. The aligned particulate is locked in position between the top and bottom electrode grids within the now solid-state carrier. A treatment stage can be provided, as necessary, to perform a heat or pressure treatment, or other process, on the completed display before it is rolled up by the take-up reel.

Our fabrication method has the advantage of utilizing existing polymer film substrates, and mature roll-to-roll processing technology. Further, our OLED particulate/carrier fluid composition can be used in other fabrication processes, including screen and lithographic printing, injection molding, and resin casting.

Using the inventive OLED material composition and fabrication method, the problems of OLED display encapsulation are overcome by the combination of the barrier properties of our cured carrier, desiccant and scavenger protective particulate (if necessary), and the well-known water/oxygen polymer film barriers used in other applications, like pharmaceuticals. Delicate organic thin films are replaced by robust OLED particulate or microcapsules that are protected within a solid-state matrix. Display contrast is enhanced by selecting the appropriate optical qualities of the cured carrier, avoiding the need for costly alternatives such as anti-reflection layers. The inventive fabrication method will be extremely fast and material efficient, and will make the manufacture of an inexpensive, thin, lightweight, bright, flexible display a near-term practical reality.

Figure 108:
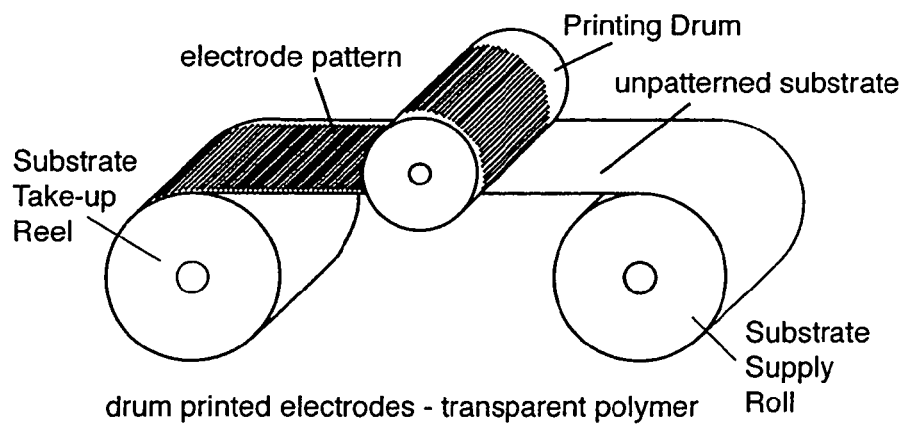
FIG. 108 shows the step of printing an electrode pattern on a polymer sheet substrate.
Figure 109:
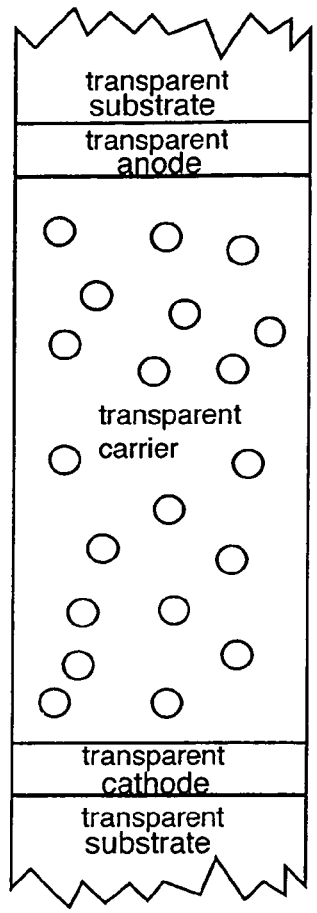
FIG. 109 illustrates the expanded gap distance between electrodes in accordance with the present invention.

FIG. 108 shows a polymer sheet substrate having printed on it an electrode pattern. The pre-patterned electrodes can be formed on the substrate using a drum printing method, screen printing, spray, offset, inkjet or other suitable printing technique. The electrode may be comprised of a conductive printable ink that include, for example, a conductive polymer in solution. After printing the electrode pattern, the solvent evaporates leaving behind the patterned conductive electrode. Electrochemically prepared polythieno[3,4-b]thiophene is highly transparent and conductive. This material, or other suitable conductive polymer, metal, or other material can be used as the conductive pre-patterned electrode.

Figure 111:
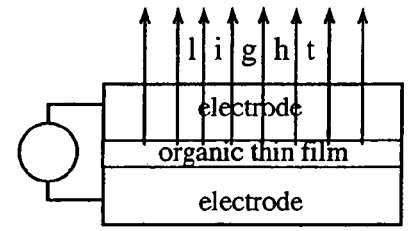
FIG. 111 illustrates a prior art OLED device.

One of the biggest challenges to the OLED display industry is from contamination by water and oxygen. The materials involved in small molecule and polymer OLEDs are vulnerable to contamination by oxygen and water vapor, which can trigger early failure. This issue is exacerbated when non-glass substrates are used. Since OLEDs offer the promise of a bendable display, attempts have been made to use plastic substrates in place of glass. Elaborate barrier mechanisms have been proposed to encapsulate the OLED device and protect the organic stack from the ingress of water and oxygen. Also, externally applied desiccants have been used to reduce the contamination. Neither of these solutions is adequate, adding to the cost and complexity of forming an OLED device. In the end, the problems caused by the ingress of water and oxygen to the organic stack continue to pose serious technical issues. FIG. 111 illustrates a prior art OLED device. Very basically, an OLED is comprised of extremely thin layers of organic material forming an organic stack. These layers are sandwiched between an anode electrode and a cathode electrode. When voltage is applied to the electrodes, holes and electrons are injected into the organic stack. The holes and electrons combine to from unstable excitons. When the excitons decay, light is emitted.

Figure 112:
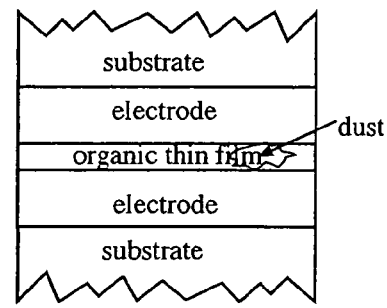
FIG. 112 illustrates a prior art OLED device showing a dust particle creating an electrical short between electrodes.
Figure 113:
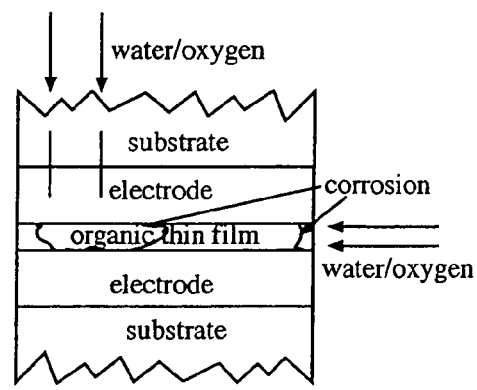
FIG. 113 illustrates a prior art OLED device showing the degradation of the organic thin film stack by the ingress of oxygen and water through the substrates.

The current state of every available OLED fabrication technology requires the formation of very thin films of organic light emitting material. These thin films are formed by a variety of known techniques such as vacuum deposition, screen printing, transfer printing and spin coating, or by the re-purposing of existing technology such as ink jet printing. In any case, the current state of the art has at its core the formation of very thin film layers of organic material. These thin films must be deposited uniformly and precisely. Such thin layers of organic material are susceptible to major problems, such as loss of film integrity, particularly when applied to a flexible substrate. FIG. 112 illustrates a prior art OLED device wherein a dust spec creates an electrical short between the electrodes. The extreme thinness of the layers of organic material between conductors also results in electrical shorts easily forming due to even very small specks of dust or other contaminants. Because of this limitation, costly cleanroom facilities must be built and maintained using the conventional OLED thin film fabrication techniques. Currently, inkjet printing has gained ground as a promising fabrication method for making OLED displays. However, there are some serious disadvantages to the adaptation of inkjet printing to OLED display fabrication. Inkjet printing does not adequately overcome the problem of material degradation by oxygen and water vapor. FIG. 113 illustrates a prior art OLED device wherein the thin organic film stack is degraded by the ingress of oxygen and/or water. Elaborate and expensive materials and fabrication processes are still required to provide adequate encapsulation to protect and preserve the thin organic films. It is difficult to align display pixel-sized electrodes and inkjet printed OLED material with the accuracy needed to affect a high-resolution display.

FIG. 1 illustrates the expanded gap distance between electrodes in accordance with the present invention. For illustrative purposes, the difference between the gap distance of the electrodes in a thin film organic stack is shown in prior art FIG. 111, as compared with the much greater gap distance between the electrodes in accordance with the present invention as shown in FIG. 1. In fact, the gap distance difference can be much greater than even that illustrated, depending on the composition of the particle/carrier matrix and the applied voltage. A thin film OLED device typically has organic stack layers that are deposited with a thickness on the order of about 100 nm. Some layers are less, some are more depending on the material, the desired structure and the thin film forming method. However, in any case all the conventional methods for forming thin film OLED devices result in extremely thin amounts of material disposed between electrodes that are spaced very close apart. One of the salient points is that the greatly expanded gap distance between electrodes enabled by the inventive OLED device structure translates into many advantages over the thin film OLED device structures. Among the advantages are the reduction or elimination of cross talk between pixels, much greater tolerance for inclusions of foreign particles, the additional of performance enhancing materials into the matrix structure, as well as the many mechanical, electrical and optical advantages discussed elsewhere herein and other such advantages that are not enumerated. Further, the composition of the particulate and the carrier can be tailored depending on the desired OLED characteristics. The particulate can include a mixture or single component of organic and inorganic emitter(s), hole transport, blocker, electron transport, and performance enhancing materials. Also, the carrier can include a mixture or single component of organic and inorganic emitter(s), hole transport, blocker, electron transport, and performance enhancing materials. Additional layers can be formed between the electrodes and the particulate/carrier layer. These additional layers can include a mixture or single component of organic and inorganic emitter(s), hole transport, blocker, electron transport, and performance enhancing materials.

Applicants have discovered that the ultra thin film nature of a conventional organic light active device results in many disadvantages. These disadvantages include, but are not limited to, electrical shorts caused by the inclusion of small foreign particles, cross talk among pixels in a display array, delamination of the thin film, deterioration of the thin film by the ingress of oxygen and water, and other serious failings. In accordance with the present invention, the disadvantages caused by having an extremely small gap distance between electrodes is overcome by expanding this gap distance. Thus, in accordance with the present invention, an organic light active device includes a first electrode and a second electrode disposed adjacent to the first electrode. The first and second electrode define a gap there between. An organic emissive layer is disposed within said gap. To overcome the thin film issues, and to enhance the performance of the inventive device, a gap expanding composition is also disposed within said gap. This gap expanding composition is effective to increase the gap distance between the top and bottom electrode.

The gap expanding composition may include at least one of an insulator, a conductor and a semiconductor. The gap expanding composition can include at least one additional layer which may be formed between the first electrode and the second electrode. The additional layers may include at least one of an organic photon receiver, an inorganic photon receiver, hole transport material, blocker material, electron transport material, radiation emitting material and performance enhancing materials. The gap expanding composition can include at least one of a dessicant; a scavenger, a conductive material, a semiconductive material, an insulative material, a mechanical strength enhancing material, an adhesive enhancing material, a hole injecting material, an electron injecting material, a low work metal, a blocking material, and an emission enhancing material.

The emissive layer can comprise an emissive particulate dispersed within a carrier. The emissive particulate has a first end having an electrical polarity and a second end having an opposite electrical polarity. The particulate can be alignable within the conductive carrier so that charge carriers of a first type are more easily injected into the first end and charge carriers of a second type are more easily injected into the second end.

The emissive layer may be an organic thin film layer. The gap expanding composition can include a conductive, insulative and/or semiconductive material composition that reduces the emission efficiency of the emissive layer while increasing the light active device effectiveness by expanding the gap distance between the electrodes. With a careful selection of constituent components, this reduction in efficiency can be limited so that the benefits of expanding the gap distance between the electrodes can be obtained without too much cost in device efficiency.

Figure 110:
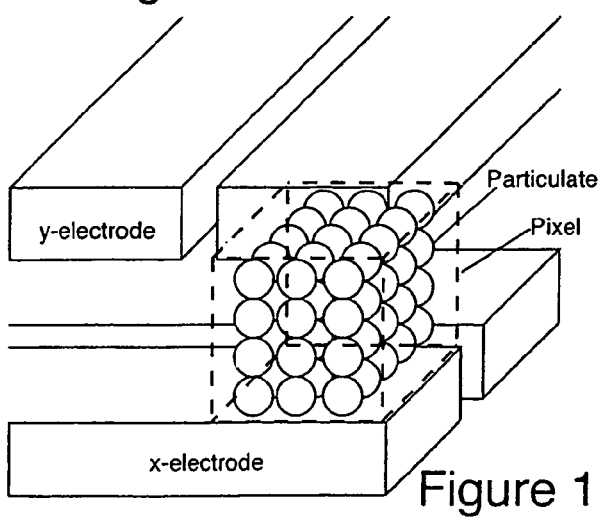
FIG. 110 illustrates a single layered multi-color pixel in accordance with the present invention.

FIG. 110 illustrates a single layered multi-color pixel in accordance with the present invention. In accordance with one of the embodiments of the present invention, a multicolor OLED device is formed that includes particulate that is capable of emitting photons corresponding to a visible (or invisible) spectrum of radiation depending on an applied voltage or other emission triggering mechanism.

FIG. 114 is a cross sectional schematic view illustrating the extrusion of light active fiber having aligned OLED particulate. FIG. 115 is a perspective schematic view illustrating the extrusion of light active fiber. FIG. 7 is a cross section of a segment of extruded light active fiber. FIG. 117 is a schematic view of the segment of extruded light active fiber driven by a voltage applied between electrodes. The inventive light active fiber includes an elongated hardened conductive carrier material. A semiconductor particulate is dispersed within the conductive carrier material. As shown in FIG. 117, a first contact area is provided so that on application of an electric field charge carriers of a first type are injected into the semiconductor particulate through the conductive carrier material. A second contact layer is provided so that on application of an electric field to the second contact layer charge carriers of a second type are injected into the semiconductor particulate through the conductive carrier material. As shown in FIGS. 114 and 115, the randomly dispersed particulate within a carrier is contained within a vessel and may be extruded to form an emissive fiber. The fiber is formed, for example, in a manner similar to the formation of monofiliment fishing line. The particulate/carrier mixture exits the vessel through an exit port and, may then be subjected to an aligning field so that the particulate is aligned prior to the carrier being hardened. The semiconductor particulate may comprise at least one of an organic and an inorganic semiconductor. The particulate can include an organic light active particulate including at least one conjugated polymer. The conjugated polymer has a sufficiently low concentration of extrinsic charge carriers so that on applying an electric field between the first and second contact layers to the semiconductor particulate (through the conductive carrier material) the second contact layer becomes positive relative to the first contact layer and charge carriers of said first and second types are injected into the semiconductor particulate. The injected charge carriers combine to form in the conjugated polymer charge carrier pairs which decay radiatively so that radiation is emitted from the conjugated polymer. The organic light active particulate can include particles including at least one of hole transport material, organic emitters, and electron transport material. The organic light active particulate can include particles including a polymer blend. The polymer blend includes an organic emitter blended with at least one of a hole transport material, an electron transport material and a blocking material. Depending on the phrasing, the emitter can be considered an electron transport material and/or a blocking material, etc. The salient point being the formation of a particulate that is capable of photon emission in response to an applied voltage. The organic light active particulate may comprise microcapsules including a polymer shell encapsulating an internal phase. The internal phase may comprise, for example, a polymer blend including an organic emitter blended with at least one of a hole transport material, an electron transport material and a blocking material. The conductive carrier material may comprise a binder material with one or more characteristic controlling additives. The characteristic controlling additives are a particulate and/or a fluid and may include a dessicant; a conductive phase, a semiconductive phase, an insulative phase, a mechanical strength enhancing phase, an adhesive enhancing phase, a hole injecting material, an electron injecting material, a low work metal, a blocking material, and an emission enhancing material. For example, a low work function metal particulate can be included as a characteristic controlling material within the carrier material and/or as a constituent of the emissive particulate.

The light active fiber can be used, for example, in lighting, light-to energy devices, displays (as described below) or other uses. For example, the fiber can be an active component in a light fiber data transmission line. A section of the light active fiber which converts light to energy can be provided for receiving a light signal and converting it into electrical energy. This electrical energy can be amplified and used as a signal to drive another section of light active fiber which is emissive. In this way, along the pathway of the light fiber data transmission line, the inventive light active fiber can be used to amplify the signal and improve transmission quality and distance.

Figure 118:
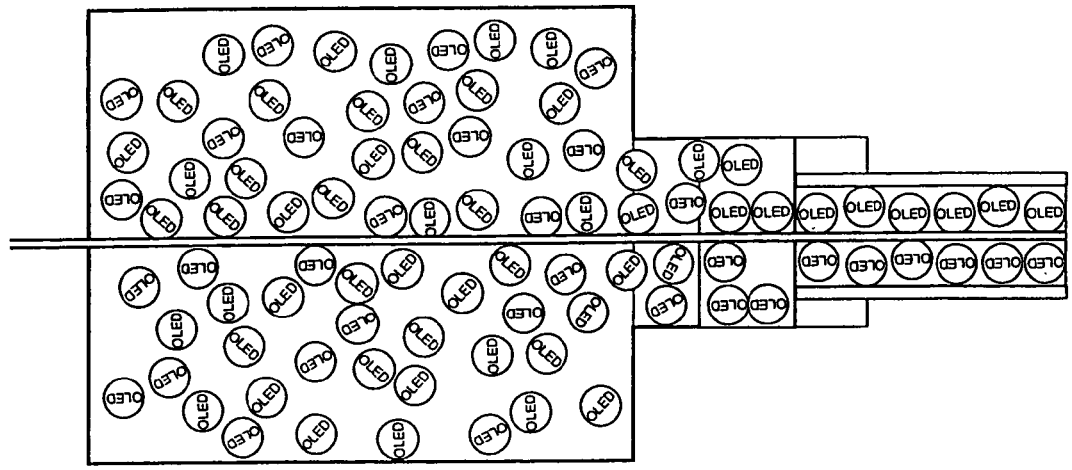
Figure 119:
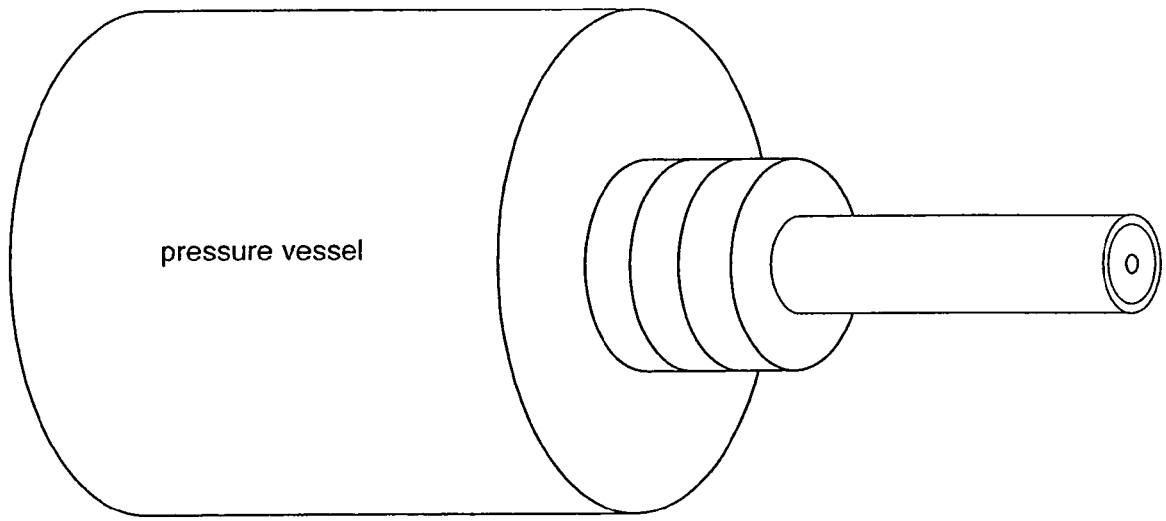
Figure 120:
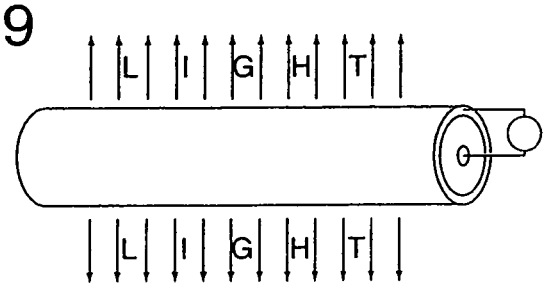

FIG. 118 is a cross sectional schematic view illustrating an extruded light active fiber having a conductive electrode core and a transparent electrode coating. FIG. 119 is a perspective schematic view illustrating the extrusion of the light active fiber having a conductive electrode core and a transparent electrode coating. FIG. 120 illustrates an extruded light active fiber having a conductive electrode core and a transparent electrode coating connected with a voltage source. The first and the second contact may comprise a first conductive member disposed longitudinally within the elongated hardened conductive carrier material. The other of the first and the second contact may comprise a second conductive member disposed adjacent to the first conductive member so that at least a portion of the semiconductor particulate is disposed between the first conductive and the second conductive member. The first conductive member may be a conductive material comprised of at least one of a metal and a conductive polymer disposed in the interior of the elongated hardened conductive carrier material; and the second conductive member comprises a conductive material comprised of at least one of a metal and a conductive polymer disposed as a coating on the exterior of the elongated hardened conductive carrier material. Further, the composition of the particulate and the carrier can be tailored depending on the desired OLED characteristics. The particulate can include a mixture or single component of organic and inorganic emitter(s), hole transport, blocker, electron transport, and performance enhancing materials. Also, the carrier can include a mixture or single component of organic and inorganic emitter(s), hole transport, blocker, electron transport, and performance enhancing materials. Additional layers can be formed between the electrodes and the particulate/carrier layer. These additional layers can include a mixture or single component of organic and inorganic emitter(s), hole transport, blocker, electron transport, and performance enhancing materials.

Figure 121:
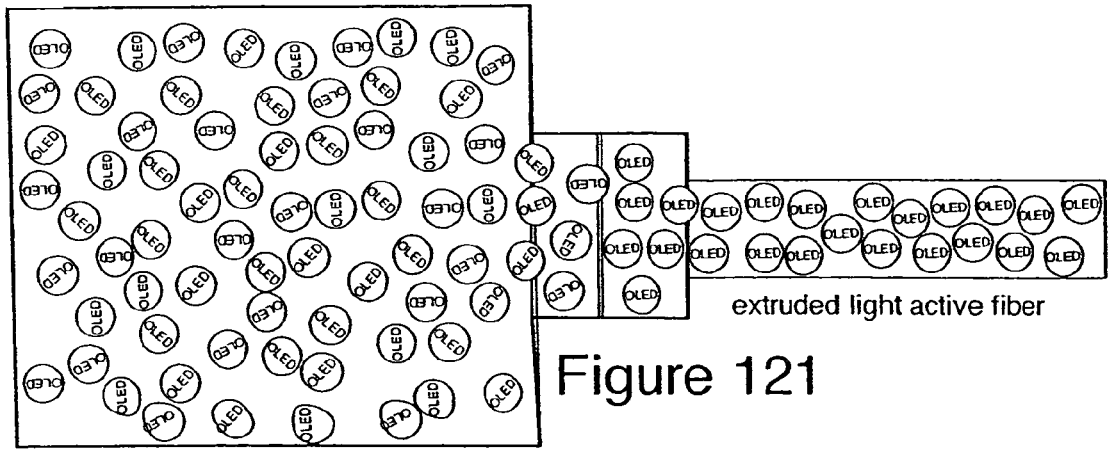
Figure 122:
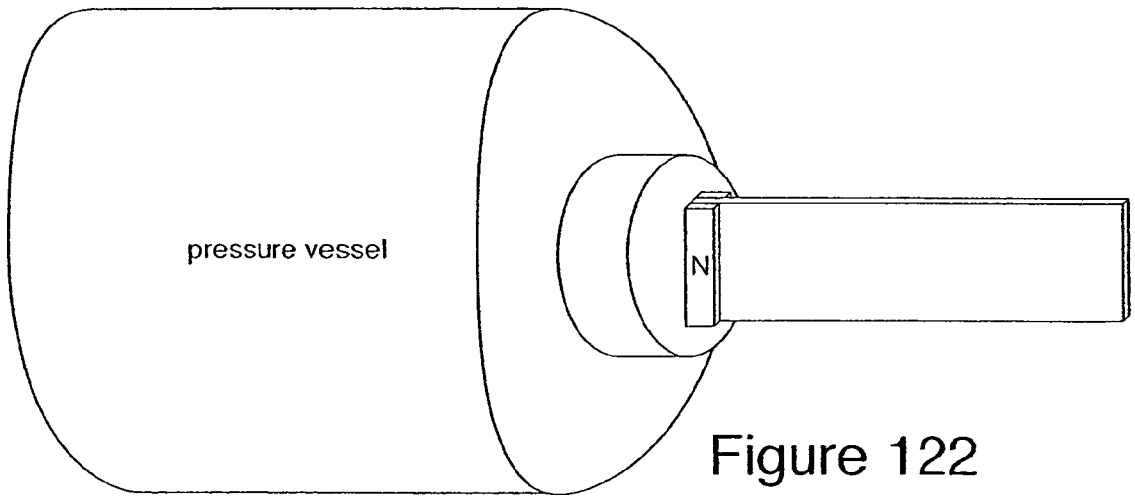
Figure 123:
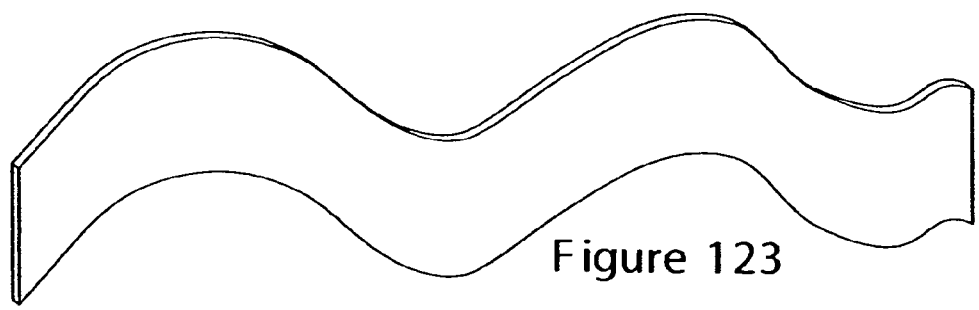
Figure 124:
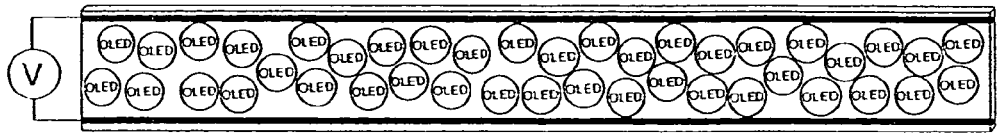

FIG. 121 is a cross sectional schematic view illustrating the extrusion of light active ribbon having aligned OLED particulate. FIG. 122 is a perspective schematic view illustrating the extrusion of light active ribbon. FIG. 123 is a segment of extruded light active ribbon. FIG. 124 is a cross-sectional view of the segment of extruded light active ribbon having wire electrodes incorporated within the ribbon and driven by a voltage applied between electrodes. The extruded shape and orientation of the aligned particulate can be controlled depending on desired characteristics of the light active fiber.

FIG. 125 illustrates a light active fiber extrusion and chopping mechanism for forming uniform lengths of OLED light active fiber. In this case, the extruded fiber can be formed and chopped into uniform lengths. These lengths can be dispersed within a carrier and become the particulate in the particulate/carrier mixture disclosed herein.

FIG. 126 illustrates OLED light active fiber randomly dispersed between two electrodes. FIG. 127 illustrated the OLED light active fibers aligned between the two electrodes. FIG. 128 illustrates OLED lit active fibers randomly dispersed between two electrodes having a gap distance close to the uniform length of the fibers. FIG. 129 illustrates the OLED light active fibers aligned between the two electrodes having a gap distance close to the uniform length of the fibers. As shown elsewhere herein, in accordance with the present invention, emissive particulate dispersed within a carrier can be used to form an organic light active device. In accordance with this embodiment, the emissive particulate can be elongated fiber having the composition described herein. The advantages of the elongated particulate can be the formation of light channels within the carrier. These light channels may be effective for increasing the efficiency and/or the display or device qualities.

FIG. 130 illustrates light active fibers woven into carpeting. FIG. 131 illustrates a light active cloth weave. The light active fiber described herein can be spun into thread then woven into yarn. These light active threads and yarn can be formed into various articles, including carpeting, wall hangings, clothing and other like articles.

FIG. 132 illustrates a curved large format surround display formed in accordance with the present invention by tiling length of display sections. One of the many advantages of a flexible display is the ability to create a wrap around display and provide more complete immersion within the display content. In accordance with the present invention, the length of display that can be fabricated is extremely long due to the roll-to-roll fabrication processing. By tiling strips of roll-to-roll fabricated displays together, large format, surround displays can be obtained.

FIG. 133 illustrates a method of forming a two layer ultra-thin multi-layered OLED fiber by drawing and thinning. FIG. 134 illustrates a method of forming four layer ultra-thin multi-layered OLED fiber by drawing and thinning. By pulling the constituent OLED materials into fibers through a die (if necessary) and adjacent to each other a multi-layer thin fiber can be formed. Electrode layers can be simultaneously formed, later coated or otherwise applied, or the multi-layered fiber can be particlized to form the particulate of the inventive particle/carrier mixture. The particlization can include low temperature to improve the process. Further, another method for making the particles is to form layers of the constituent OLED materials on a slippery surface, such as a teflon surface, or a smooth surface, such as glass, and then scrap the layers and chop the scrapping, as necessary into particles or fibers.

FIG. 135 is a cross sectional view showing a wire having an electron transport coating layer. FIG. 136 is a cross sectional view showing a wire having a hole transport coating layer. FIG. 137 illustrates coated wire intersecting electrodes for forming light emitting pixels at the intersections. By coating appropriate electrode wires, and then intersecting the coated wires, the OLED layered stack can be obtained at the wire intersection. These wires can then be driven to form a display or light.

FIG. 138 illustrates the inventive OLED particulate/conductive carrier mixture formulated for being formable into useful products through plastic molding techniques. The carrier material can be composed so that it is formable into items using conventional plastic molding techniques, such as injection or vacuum molding. The particulate can be aligned, or remain random, while the carrier is fluid, depending on the desired characteristics of the molded device. In accordance with this aspect of the present invention, an injection moldable light active material is provided comprising: a semiconductor light active particulate dispersed within a hardenable carrier material. The semiconductor light active particulate may include at least one of an organic and an inorganic semiconductor. The organic light active particulate can include particles including at least one of hole transport material, organic emitter, and electron transport material. The organic light active particulate can include particles including a polymer blend. The polymer blend may include an organic emitter blended with at least one of a hole transport material, an electron transport material and a blocking material. Additional organic emitters can be included within the polymer blend. The organic light active particulate can comprise microcapsules including a polymer shell encapsulating an internal phase comprised of a polymer blend.

The carrier material can be a hardenable binder material with one or more characteristic controlling additives. The characteristic controlling additives may include at least one of a particulate and a fluid. The characteristic controlling additives may include a dessicant, a scavenger, a conductive phase, a semiconductive phase, an insulative phase, a mechanical strength enhancing phase, an adhesive enhancing phase, a hole injecting material, an electron injecting material, a low work metal, a blocking material, and an emission enhancing material. The particulate may include at least one of an organic emitter, an inorganic emitter, hole transport material, blocker material, electron transport material, and performance enhancing materials. The carrier may include at least one of an organic emitter, an inorganic emitter, hole transport material, blocker material, electron transport material, and performance enhancing materials (e.g., the characteristic controlling additives).

In accordance with the present invention, the injection moldable light active material can be provided wherein the semiconductive light active particulate is comprised of first emitting particles for emitting a number of photons of a first color in response to a first turn-on voltage applied to the electrodes and emitting a different number of photons of the first color in response to other turn-on voltages. The semiconductive light active particulate may further include second emitting particles. The second emitting particles emit a number of photons of a second color in response to a second turn-on voltage and a different number of photons of the second color in response to other turn-on voltages. By this composition and construction, a multi-colored light active material is obtained.

The particulate can be composed so as to have a first end having an electrical polarity and a second end having an opposite electrical polarity. The particulate is alignable within the conductive carrier so that charge carriers of a first type are more easily injected into the first end and charge carriers of a second type are more easily injected into the second end.

FIG. 139 illustrates an inventive OLED solid state light having a conventional light bulb form factor. Global lighting is currently a 40 billion dollar industry world-wide, posting sales of over 12 billion a year. The U.S. Dept. of Energy predicts that LED's will account for 20% of all illumination by 2010, and slash energy use worldwide 10% by 2025. The inventive OLED solid state light can include a self-contained voltage converter so that a conventional light bulb form factor can be used, and the OLED solid state light easily substituted for the convention, inefficient, light bulb.

FIG. 140 illustrates a step of spray painting a reflective conductive layer of an OLED device. FIG. 141 illustrates a step of spray painting an emissive layer of an OLED device. FIG. 142 illustrates a step of spray painting a transparent electrode of an OLED device. A reflective electrode can be applied or sprayed onto a surface to form a first electrode. A particulate/carrier mixture can next be sprayed or rolled over the first electrode layer. The carrier can be composed of a solvent and material having an adhesive quality so that the mixture acts like a conventional spray paint. A second electrode can be formed over the particulate/carrier mixture. Appropriate contact lands and insulative components are also applied to drive the electrodes so that the light active particulate emits radiation, and/or converts light to energy.

FIG. 143 illustrates a step in an inventive method for making a light active device showing a light active mixture disposed between an x and y electrode grid. In accordance with another aspect of the present invention, a method is provided for making a light active device. A mixture is provided containing a monomer and light active material. The light active material contains at least one of an energy-to-light material for emitting light in response to an applied electrical energy and a radiation-to-energy material and generating electrical energy in response to irradiation.

In accordance with the present invention, a light active device is manufactured using a self-assembly technique. Light active material is provided in a first region. A polymer is provided in a second region. The polymer is formed by selectively cross-linking a monomer from a mixture containing the monomer and the light active material. The selective cross-linking causes a concentration of the light active material at the first region and a concentration of the polymer at the second region. A first electrode and a second electrode may be provided having the polymer and the light active material disposed there between.

The light active material may be organic light emitting diode material for emitting light when a voltage is applied to the first electrode and the second electrode. The light active material may comprise inorganic light emitting diode material for emitting light when a voltage is applied to the first electrode and the second electrode. The light active material may comprise a radiation-to-energy material for generating an electrical current in response to radiation, depending on the intended use, the radiation may be in the visible and/or invisible spectrum.

The light active material may comprise an organic light active material including at least one conjugated polymer. The conjugated polymer having a sufficiently low concentration of extrinsic charge carriers so that on applying an electric energy to the light active material charge carriers are injected into the light active material and combine to form in the conjugated polymer charge carrier pairs which decay radiatively so that radiation is emitted from the conjugated polymer. The light active material may comprise an organic and/or an inorganic semiconductor. The light active material may comprise organic particles including a polymer blend. The polymer blend can be an organic emitter blended with at least one of a hole transport material, an electron transport material; a blocking material and a liquid crystal. The light active material can be provided as nanostructures, and could include molecules synthesized having constituent parts that provide different functionality to the nanostructure. For example, a liquid crystal molecule can provide alignment and migration properties, a chromophore molecule can provide light emission properties, and a cross-linkable monomer can provide selective hardening and migration properties.

The light active material may comprise microcapsules including a polymer shell encapsulating an internal phase including an organic emitter. The mixture may also include characteristic controlling additives. The characteristic controlling additives may include, for example, a dessicant; a conductive phase, a semiconductive phase, an insulative phase, a mechanical strength enhancing phase, an adhesive enhancing phase, a hole injecting material, an electron injecting material, a low work metal, a blocking material, an emission enhancing material and a liquid crystal.

FIG. 144 illustrates another step in the inventive method for making a light active device, showing a polymerization/migration step. The monomer is selectively cross-linked in a pattern to form a polymer. As the cross-linking reaction progresses, the monomer migrates in response to the selective cross-linking pattern, causing the cross-linked monomer (a polymer) and the light active material to become concentrated in separate regions. FIG. 145 illustrates another step in the inventive method for making a light active device, showing an aligning step. The end result is a solid polymer with light active regions embedded in a pattern corresponding to the selective cross-linking pattern.

FIG. 146 illustrates another step in the inventive method for making a light active device, showing a controlled pixelated light emission. The mixture may be disposed between a first electrode and a second electrode, which may form the electrode grid of a pixilated display or light sensor. The light active material may comprise organic light emitting diode material for emitting light when a voltage is applied to the first electrode and the second electrode. The light active material may comprise inorganic light emitting diode material for emitting light when a voltage is applied to the first electrode and the second electrode. The light active material may comprise a radiation-to-energy material for generating an electrical current in response to radiation in the visible spectrum, and/or it may be responsive to radiation in the invisible spectrum, such as x-ray, ultraviolet or infrared radiation.

FIG. 147 illustrates a step in an inventive method for making a light active device, showing a bottom substrate having a bottom electrode pattern formed thereon. In accordance with another aspect of the present invention, a method is provided for making a light-emitting device. The inventive steps include providing a bottom substrate, with a bottom electrode over the bottom substrate.

FIG. 148 illustrates another step in the inventive method for making a light active device, showing a light active mixture disposed at a light active layer over the bottom electrode pattern. An emissive layer is disposed over the bottom electrode. The emissive layer includes a mixture of a dispersed OLED particulate in a monomer fluid carrier. FIG. 149 illustrates another step in the inventive method for making a light active device, showing the patterning of the light active layer by irradiation through a mask. The monomer is selectively polymerized causing the OLED particulate to concentrate in emissive regions and the polymerized monomer to concentrate in polymerization regions.

FIG. 150 illustrates another step in the inventive method for making a light active device, showing the migration of light active material into light active regions. The light active material may include at least one of an organic emitter, an inorganic emitter, hole transport material, blocker material, electron transport material, and performance enhancing materials. The particles of the light active material may have a first end having an electrical polarity and a second end having an opposite electrical polarity. The particulate may be alignable within the carrier so that charge carriers of a first type are more easily injected into the first end and charge carriers of a second type are more easily injected into the second end.

FIG. 151 illustrates the composition of constituents in a multi-color light active mixture. In accordance with the present invention, energy-to-light, or light-to-energy material can be a constituent of, or be formulated as, a cross-linkable monomer material. As shown in FIG. 151, red, green and blue emissive components can be associated with respective monomers or hardenable material, each having a specific polymerization parameter such as a wavelength or radiation, a catalyst, a temperature, or the like.

The light active material may comprise first emitting particles emitting a number of photons of a first color in response to a first turn-on voltage and emitting a different number of photons of the first color in response to other turn-on voltages. The light active material may further comprise second emitting particles. The second emitting particles emitting a number of photons of a second color in response to a second turn-on voltage, and a different number of photons of the second color in response to other turn-on voltages. The light active material may further comprise third emitting particles. The third emitting particles emitting a number of photons of a third color in response to a third turn-on voltage applied to the electrodes and a different number of photons of the third color in response to other turn-on voltages.

As shown in FIGS. 152-155, the inventive method can be used to form a full color light active device. As shown in FIG. 152, the inventive method for making a multi-color light active device includes disposing a multi-color light active mixture disposed over a patterned bottom electrode grid. Red, green and blue emissive components can be associated with respective monomers or hardenable material, each having a specific polymerization parameter such as a wavelength or radiation, a catalyst, a temperature, or the like. The emissive components can also be associated with a migration assisting material, such as a liquid crystal.

FIG. 153 illustrates a step in the inventive method for making a multi-color light active device, showing the selective patterning of one of the color light active regions. In this case, the red emissive components migrate into rows (or into pixels) by the selective patterning and polymerization of monomer1 associated with the red emissive component.

FIG. 154 illustrates a step in the inventive method for making a multi-color light active device, showing the patterned color light active regions. As shown, when the mixture is irradiated through the patterned mask, at the bright regions in the pattern, the monomer1 undergoes polymerization. As the polymerization reaction progresses, monomer1 and the red component migrates from the dark regions to the bright regions, causing the other components, green and blue, to become concentrated in the dark regions. The end result is a solid polymer containing the red emissive component formed in the selective pattern.

FIG. 155 illustrates a full-color light active device having red, green and blue side-by-side patterned color light active regions. By patterning and irradiating the mixture in a manner similar to the patterning of the red component, the green and blue components are formed into rows. A fourth monomer (not shown), having yet another polymerization parameter can also be included which is then polymerized between the emissive rows.

FIG. 156 illustrates a step in an inventive method for making a pixilated light active device; showing a mixture of light active material disposed over a patterned bottom electrode grid. A mixture containing a light active material, such as an emissive particulate (ep) dispersed in a monomer carrier. The monomer may be selectively polymerized using a radiation source transmitted through a patterned mask to form light and dark regions corresponding to the polymerization regions and the emissive regions. FIG. 157 illustrates another step in the inventive method for making a pixilated light active device, showing selective patterning through a pixel grid mask. The emissive regions can be formed into individual pixels surrounded by the polymerization regions. FIG. 158 illustrates another step in the inventive method for making a pixilated light active device, showing the migration of light active material to pixel regions. The patterned mask includes at least one of the bottom electrode and a top electrode provided over the emissive layer.

FIG. 159 illustrates the composition of constituents in a light active device having pixels and conductive pathways formed by a self-assembly process. The light active materials, such as emissive components (ep) can be associated with a monomer or hardenable material, each having a specific polymerization parameter such as a wavelength or radiation, a catalyst, a temperature, or the like. Or, the light active material can be associated with a migration facilitating material, such as a liquid crystal, magnetic, paramagnetic or electrostatic material. A conductive material (C) can also be provided. The conductive material can be associated with another or hardenable material, each having a specific polymerization parameter such as a wavelength or radiation, a catalyst, a temperature, or the like. Or, the light active material can be associated with a migration facilitating material, such as a liquid crystal, magnetic, paramagnetic or electrostatic material.

FIG. 160 illustrates a step in an inventive method for making a light active device having pixels and conductive pathways formed by a self-assembly process. A light active mixture is disposed over a bottom electrode formed on a substrate. FIG. 161 illustrates another step in the inventive method for making a light active device by self-assembly, showing the selective patterning of the conductive pathways by irradiation through a mask. A non-conductive monomer (not shown) can be selectively patterned into the emissive regions to form conductive pathways between the polymerization regions. The conductive pathways can form an electrode grid of a display device. The mixture can further include a conductive material capable of being patterned into the conductive pathways. FIG. 162 illustrates another step in the inventive method for making a light active device by self-assembly, showing the patterned conductive pathways. The conductive components ((ep) and (C)) patterned into the conductive pathways.

FIG. 163 illustrates another step in the inventive method for making a light active device by self-assembly, showing the selective patterning of pixel regions by irradiation through a mask. The monomer can be polymerized under a first polymerization condition such as a first irradiation wavelength, temperature or other polymerization causing parameter. The conductive material can include a second monomer capable of being polymerized under a second polymerization condition, such as a second irradiation wave-length, temperature or other polymerization causing parameter. FIG. 164 illustrates another step in the inventive method for making a light active device by self-assembly, showing the patterned pixel regions and conductive pathways. The emissive particulate and the conductive material can be patterned in the conductive pathways by selectively polymerizing the conductive material, causing the emissive particulate to concentrate in emissive pixels and the conductive material to concentrate in non-emissive regions between the emissive pixels. An aligning field can be applied during the polymerization step or other time when emissive or light active particulate is able to migrate. The aligning field can be magnetic or electric, and the patterned electrodes can be used to define the aligning fields.

FIG. 165 schematically illustrates a light active device made by self-assembly, showing emissive/more conductive zones, non-emissive/more conductive zones and non-emissive/less conductive zones. The light active particulate can include a liquid crystal constituent and a chromophore constituent. A top electrode over the emissive layer, the top electrode can be patterned into an electrode grid so that the device acts as a pixilated display or light sensor. At least one performance enhancing layer (not shown) can be provided between the bottom substrate and the emissive layer. This performance enhancing layer can include, for example, a light absorbing or reflecting layer, a charge injection inhibiting or facilitating layer, and/or a barrier layer for preventing the ingress of, for example, moisture or oxygen. In accordance with the invention, a light-emitting device can be manufactured using self-assembly techniques. A bottom substrate is provided and a bottom electrode provided over the bottom substrate. An emissive layer comprising a mixture including an emissive/more-conductive material and a non-emissive/less-conductive material is disposed over the bottom substrate. The mixture is selectively patterned causing the emissive/more-conductive material to concentrate in emissive regions and the non-emissive/less-conductive material to concentrate in non-emissive regions.

FIG. 166 illustrates a cubic volume of a randomly dispersed light active material in a light polymerizable monomer carrier. A mixture of a light active material and a light polymerizable monomer fill a volume. The mixture is irradiated with two or more laser beams. The laser beams are aligned and polarized to generate a specific holographic interference pattern having alternating dark and light areas. FIG. 167 illustrates the cubic volume shown in FIG. 166, showing the light active material and polymerized carrier after holographic patterning using an interference pattern generated by laser beams. At the bright regions in the pattern, the monomers undergo polymerization. As the polymerization reaction progresses, the monomer migrates from the dark regions to the bright regions, causing the light active material to become concentrated in the dark regions. The end result is a solid polymer with droplets of liquid crystal embedded in a pattern corresponding to the dark regions of the holographic interference pattern.

Thus, in accordance with the present invention, a laser interference pattern can be used to selectively pattern the mixture to form a three dimensional arrangement of light and dark regions corresponding to the non-emissive regions and the emissive regions. The three-dimensional pattern can be used to selectively pattern the mixture to form a three dimensional structure containing the light active material (ep), and may also include other components, such as the conductor material (C) not shown, making a desired pattern of conductive pathways and emissive material within the mixture volume. The emissive regions are formed into individual pixels surrounded by the non-emissive regions. The mixture can further comprise a non-emissive/more-conductive material. The emissive/more-conductive material and the non-emissive/more-conductive material can be patterned into conductive pathways between the non-emissive regions. The emissive/more-conductive material and/or the non-emissive/more-conductive material can include a liquid crystal constituent.

With respect to the above description, it is realized that the optimum dimensional relationships for parts of the invention, including variations in size, materials, shape, form, function, and manner of operation, assembly and use, are deemed readily apparent and obvious to one skilled in the art. All equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described. Accordingly, all suitable modifications and equivalents may be resorted to, falling within the scope of the invention.

What is claimed is:

1. A method for making a light active device, comprising:
providing a mixture of light active material and a monomer in a first region and a second region;
forming chains of the light active material in the first region;
curing the monomer to form a polymer in the first region and in the second region to lock the chains of the light active material in the first region;
wherein the light active material comprises electro-statically active microcapsules comprising an ILED material encapsulated within a polymer shell; and wherein the chains of the electro-statically active microcapsules are formed by application of an electric field to the mixture of the light active material and the monomer.

2. The method of claim 1, further comprising providing a first electrode and a second electrode having the polymer and the light active material disposed there-between, wherein the chains of the electro-statically active_microcapsules form pixels between the first electrode and second electrode.

3. A method of making a light active device according to claim 1 further comprising providing a first electrode and a second electrode having the polymer and the light active material disposed there-between.

4. A method for making a light active device according to claim 3; wherein the ILED material emits light when a voltage is applied to the first electrode and the second electrode.

* * * * *